United States Patent [19]
Asai et al.

[11] Patent Number: 6,161,277
[45] Date of Patent: *Dec. 19, 2000

[54] CIRCUIT-COMPONENT MOUNTING SYSTEM

[75] Inventors: Koichi Asai, Nagoya; Shinsuke Suhara, Kariya, both of Japan

[73] Assignee: Fuji Machine Co., Ltd., Chiryu, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/977,662

[22] Filed: Nov. 24, 1997

[30] Foreign Application Priority Data

Nov. 27, 1996 [JP] Japan .................................. 8-315859

[51] Int. Cl.$^7$ .................................................. B23P 19/00
[52] U.S. Cl. ................................ 29/740; 29/741; 29/832; 198/586
[58] Field of Search ............................ 29/703, 712, 740, 29/741, 742, 743, 759, 760, 832, 833, 834; 198/586

[56] References Cited

U.S. PATENT DOCUMENTS

| | | | |
|---|---|---|---|
| 4,014,428 | 3/1977 | Ossbahr ................................... | 198/345 |
| 4,794,689 | 1/1989 | Seno et al. .................................. | 29/740 |
| 4,858,308 | 8/1989 | Komori ....................................... | 29/740 |
| 4,875,285 | 10/1989 | Haan et al. . | |
| 4,938,337 | 7/1990 | Jowitt et al. ............................. | 198/377 |
| 4,951,388 | 8/1990 | Eguchi et al. ............................. | 29/832 |
| 5,060,366 | 10/1991 | Asai et al. ................................ | 29/739 |
| 5,136,776 | 8/1992 | Yanagisawa ............................. | 29/740 |
| 5,172,468 | 12/1992 | Tanaka ....................................... | 29/721 |
| 5,184,397 | 2/1993 | Hidese ....................................... | 29/740 |
| 5,249,356 | 10/1993 | Okuda et al. ............................. | 29/833 |
| 5,323,528 | 6/1994 | Baker ........................................ | 29/721 |
| 5,379,514 | 1/1995 | Okuda et al. ............................. | 29/833 |
| 5,400,497 | 3/1995 | Watanabe et al. ......................... | 29/705 |
| 5,628,107 | 5/1997 | Nushiyama et al. . | |
| 5,850,683 | 12/1998 | Okazaki et al. .......................... | 29/740 |

FOREIGN PATENT DOCUMENTS

| | | |
|---|---|---|
| 0-424-641-A1 | 5/1991 | European Pat. Off. . |
| 2-53954 | 11/1990 | Japan . |
| 6-196546 | 7/1994 | Japan . |
| 7-45995 | 2/1995 | Japan . |
| 8-195589 | 7/1996 | Japan . |
| 9-64104 | 3/1997 | Japan . |

*Primary Examiner*—Lee Young
*Attorney, Agent, or Firm*—Oliff & Berridge, PLC

[57] ABSTRACT

A system for mounting circuit components on a circuit substrate, including a supplying device which supplies the components, a supporting device which supports the substrate, component holders each for holding one component, a revolving device which revolves the holders around an axis line, and stops the holders at a component receiving position and a component mounting position predetermined on the locus of revolution of the holders, a moving device which includes a support member supporting the revolving device and moves the support member, thereby moving the revolving device to a desired position in a plane facing the supplying device and the supporting device, an elevating and lowering device which is supported by the support member and which elevates and lowers each holder at the receiving and mounting positions, a first control device which controls each holder to receive, at the receiving position, the component supplied from the supplying device and mount, at the mounting position, the component on the substrate supported by the supporting device, and a second control device which controls the revolving device, the moving device, the elevating and lowering device, and the first control device.

22 Claims, 40 Drawing Sheets

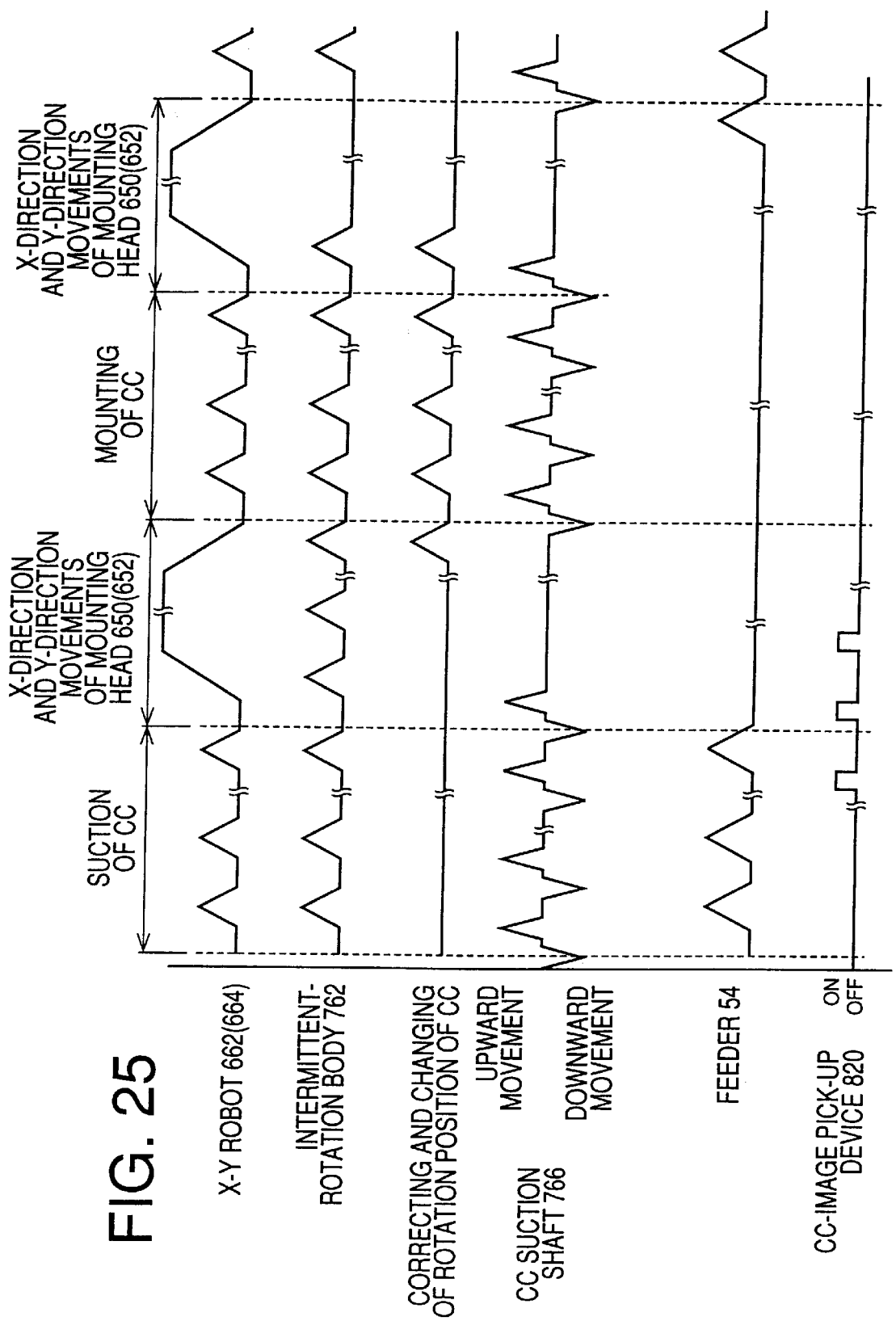

FIG. 26

| CYLINDERS | | OPERATION OF MOUNTING HEAD 650 (652) | | |
|---|---|---|---|---|
| | | SUCTION OF CC | MOUNTING OF CC (CC HEIGHT: FROM 0 TO 3 mm) | MOUNTING OF CC (CC HEIGHT: FROM 3 TO 6 mm) |
| MAIN AIR CYLINDER 930 | OPERATION STATES | ADVANCED POSITION | RETRACTED POSITION | RETRACTED POSITION |
| | DRIVE COMMANDS | ON | OFF | OFF |
| MAIN AIR CYLINDER 974 | OPERATION STATES | ADVANCED POSITION | RETRACTED POSITION | RETRACTED POSITION |
| | DRIVE COMMANDS | OFF | ON | ON |
| AUXILIARY AIR CYLINDER 984 | OPERATION STATES | RETRACTED POSITION | ADVANCED POSITION | RETRACTED POSITION |
| | DRIVE COMMANDS | ON | OFF | ON |

FIG. 30

| NO. | ROTATION-POSITION ERROR ANGLES | IMAGE-BASED RECOGNIZED ANGLES | ROTATION-POSITION-ERROR CORRECTING ANGLES | ROTATION-POSITION CHANGING ANGLES | SUMMED CC-SUCTION-SHAFT ROTATING ANGLES |
|---|---|---|---|---|---|
| 1 | $\theta 1a$ | | | | |
| 2 | $\theta 2a$ | | | | |
| 3 | $\theta 3a$ | | | | |
| 4 | $\theta 4a$ | | | | |
| 5 | $\theta 5a$ | | | | |
| 6 | $\theta 6a$ | $\theta 1a$ | | | |
| 7 | $\theta 7a$ | $\theta 2a$ | | | |
| 8 | $\theta 8a$ | $\theta 3a$ | | | |
| 9 | $\theta 9a$ | $\theta 4a$ | | | |
| 10 | $\theta 10a$ | $\theta 5a$ | | | |
| 11 | $\theta 11a$ | $\theta 6a$ | | | |
| 12 | $\theta 12a$ | $\theta 7a$ | | | |
| 13 | $\theta 13a$ | $\theta 8a$ | | | |
| 14 | $\theta 14a$ | $\theta 9a$ | | | |
| 15 | $\theta 15a$ | $\theta 10a$ | | | |
| 16 | $\theta 16a$ | $\theta 11a$ | | | |
| 17 | $\theta 17a$ | $\theta 12a$ | | | |
| 18 | $\theta 18a$ | $\theta 13a$ | | | |
| 19 | $\theta 19a$ | $\theta 14a$ | | | |
| 20 | $\theta 20a$ | $\theta 15a$ | | | |
| 21 | | $\theta 16a-\theta 1a+\theta 1b$ | $-\theta 1a$ | $\theta 1b$ | $-\theta 1a+\theta 1b$ |
| 22 | | $\theta 17a-\theta 2a+\theta 2b$ | $-\theta 2a$ | $\theta 2b$ | $-\theta 2a+\theta 2b$ |
| 23 | | $\theta 18a-\theta 3a+\theta 3b$ | $-\theta 3a$ | $\theta 3b$ | $-\theta 3a+\theta 3b$ |
| 24 | | $\theta 19a-\theta 4a+\theta 4b$ | $-\theta 4a$ | $\theta 4b$ | $-\theta 4a+\theta 4b$ |
| 25 | | $\theta 20a-\theta 5a+\theta 5b$ | $-\theta 5a$ | $\theta 5b$ | $-\theta 5a+\theta 5b$ |
| 26 | | | $-\theta 6a$ | $\theta 6b$ | $-\theta 6a+\theta 6b$ |
| 27 | | | $-\theta 7a$ | $\theta 7b$ | $-\theta 7a+\theta 7b$ |
| 28 | | | $-\theta 8a$ | $\theta 8b$ | $-\theta 8a+\theta 8b$ |
| 29 | | | $-\theta 9a$ | $\theta 9b$ | $-\theta 9a+\theta 9b$ |
| 30 | | | $-\theta 10a$ | $\theta 10b$ | $-\theta 10a+\theta 10b$ |
| 31 | | | $-\theta 11a$ | $\theta 11b$ | $-\theta 11a+\theta 11b$ |
| 32 | | | $-\theta 12a$ | $\theta 12b$ | $-\theta 12a+\theta 12b$ |
| 33 | | | $-\theta 13a$ | $\theta 13b$ | $-\theta 13a+\theta 13b$ |
| 34 | | | $-\theta 14a$ | $\theta 14b$ | $-\theta 14a+\theta 14b$ |
| 35 | | | $-\theta 15a$ | $\theta 15b$ | $-\theta 15a+\theta 15b$ |
| 36 | | | $-\theta 16a+\theta 1a-\theta 1b$ | $\theta 16b$ | $(-\theta 16a+\theta 1a-\theta 1b)+\theta 16b$ |
| 37 | | | $-\theta 17a+\theta 2a-\theta 2b$ | $\theta 17b$ | $(-\theta 17a+\theta 2a-\theta 2b)+\theta 17b$ |
| 38 | | | $-\theta 18a+\theta 3a-\theta 3b$ | $\theta 18b$ | $(-\theta 18a+\theta 3a-\theta 3b)+\theta 18b$ |
| 39 | | | $-\theta 19a+\theta 4a-\theta 4b$ | $\theta 19b$ | $(-\theta 19a+\theta 4a-\theta 4b)+\theta 19b$ |
| 40 | | | $-\theta 20a+\theta 5a-\theta 5b$ | $\theta 20b$ | $(-\theta 20a+\theta 5a-\theta 5b)+\theta 20b$ |

FIG. 31

| NO. | ROTATION-POSITION ERROR ANGLES | IMAGE-BASED RECOGNIZED ANGLES | ROTATION-POSITION-ERROR CORRECTING ANGLES | ROTATION-POSITION CHANGING ANGLES | SUMMED CC-SUCTION-SHAFT ROTATING ANGLES |
|---|---|---|---|---|---|
| 1 | $\theta 1a$ | | | | |
| 2 | $\theta 2a$ | | | | |
| 3 | $\theta 3a$ | | | | |
| 4 | $\theta 4a$ | | | | |
| 5 | $\theta 5a$ | | | | |
| 6 | $\theta 6a$ | $\theta 1a$ | | | |
| 7 | $\theta 7a$ | $\theta 2a$ | | | |
| 8 | $\theta 8a$ | $\theta 3a$ | | | |
| 9 | $\theta 9a$ | $\theta 4a$ | | | |
| 10 | $\theta 10a$ | $\theta 5a$ | | | |
| 11 | $\theta 11a$ | $\theta 6a$ | | | |
| 12 | $\theta 12a$ | $\theta 7a$ | | | |
| 13 | $\theta 13a$ | $\theta 8a$ | | | |
| 14 | $\theta 14a$ | $\theta 9a$ | | | |
| 15 | $\theta 15a$ | $\theta 10a$ | | | |
| 16 | $\theta 16a$ | $\theta 11a$ | | | |
| 17 | $\theta 17a$ | $\theta 12a$ | | | |
| 18 | $\theta 18a$ | $\theta 13a$ | | | |
| 19 | $\theta 19a$ | $\theta 14a$ | | | |
| 20 | $\theta 20a$ | $\theta 15a$ | | | |
| 21 | | $\theta 16a$ | | | |
| 22 | | $\theta 17a$ | | | |
| 23 | | $\theta 18a$ | | | |
| 24 | | $\theta 19a$ | | | |
| 25 | | $\theta 20a$ | | | |
| 26 | | | $-\theta 1a$ | $\theta 1b$ | $-\theta 1a+\theta 1b$ |
| 27 | | | $-\theta 2a$ | $\theta 2b$ | $-\theta 2a+\theta 2b$ |
| 28 | | | $-\theta 3a$ | $\theta 3b$ | $-\theta 3a+\theta 3b$ |
| 29 | | | $-\theta 4a$ | $\theta 4b$ | $-\theta 4a+\theta 4b$ |
| 30 | | | $-\theta 5a$ | $\theta 5b$ | $-\theta 5a+\theta 5b$ |
| 31 | | | $-\theta 6a$ | $\theta 6b$ | $-\theta 6a+\theta 6b$ |
| 32 | | | $-\theta 7a$ | $\theta 7b$ | $-\theta 7a+\theta 7b$ |
| 33 | | | $-\theta 8a$ | $\theta 8b$ | $-\theta 8a+\theta 8b$ |
| 34 | | | $-\theta 9a$ | $\theta 9b$ | $-\theta 9a+\theta 9b$ |
| 35 | | | $-\theta 10a$ | $\theta 10b$ | $-\theta 10a+\theta 10b$ |
| 36 | | | $-\theta 11a$ | $\theta 11b$ | $-\theta 11a+\theta 11b$ |
| 37 | | | $-\theta 12a$ | $\theta 12b$ | $-\theta 12a+\theta 12b$ |
| 38 | | | $-\theta 13a$ | $\theta 13b$ | $-\theta 13a+\theta 13b$ |
| 39 | | | $-\theta 14a$ | $\theta 14b$ | $-\theta 14a+\theta 14b$ |
| 40 | | | $-\theta 15a$ | $\theta 15b$ | $-\theta 15a+\theta 15b$ |
| 41 | | | $-\theta 16a$ | $\theta 16b$ | $-\theta 16a+\theta 16b$ |
| 42 | | | $-\theta 17a$ | $\theta 17b$ | $-\theta 17a+\theta 17b$ |
| 43 | | | $-\theta 18a$ | $\theta 18b$ | $-\theta 18a+\theta 18b$ |
| 44 | | | $-\theta 19a$ | $\theta 19b$ | $-\theta 19a+\theta 19b$ |
| 45 | | | $-\theta 20a$ | $\theta 20b$ | $-\theta 20a+\theta 20b$ |

FIG. 32

| NO. | ROTATION-POSITION ERROR ANGLES | IMAGE-BASED RECOGNIZED ANGLES | ROTATION-POSITION-ERROR CORRECTING ANGLES | ROTATION-POSITION CHANGING ANGLES | SUMMED CC-SUCTION-SHAFT ROTATING ANGLES |
|---|---|---|---|---|---|
| 1 | θ1a | | | | |
| 2 | θ2a | | | | |
| 3 | θ3a | | | | |
| 4 | θ4a | | | | |
| 5 | θ5a | | | | |
| 6 | θ6a | θ1a | | | |
| 7 | θ7a | θ2a | | | |
| 8 | θ8a | θ3a | | | |
| 9 | θ9a | θ4a | | | |
| 10 | θ10a | θ5a | | | |
| 11 | θ11a | θ6a | | | |
| 12 | θ12a | θ7a | | | |
| 13 | θ13a | θ8a | | | |
| 14 | θ14a | θ9a | | | |
| 15 | θ15a | θ10a | | | |
| 16 | θ16a | θ11a | | | |
| 17 | θ17a | θ12a | | | |
| 18 | | θ13a | | | |
| 19 | | θ14a | | | |
| 20 | | θ15a | | | |
| 21 | | θ16a-θ1a+θ1b | -θ1a | θ1b | -θ1a+θ1b |
| 22 | | θ17a-θ2a+θ2b | -θ2a | θ2b | -θ2a+θ2b |
| 23 | | | -θ3a | θ3b | -θ3a+θ3b |
| 24 | | | -θ4a | θ4b | -θ4a+θ4b |
| 25 | | | -θ5a | θ5b | -θ5a+θ5b |
| 26 | | | -θ6a | θ6b | -θ6a+θ6b |
| 27 | | | -θ7a | θ7b | -θ7a+θ7b |
| 28 | | | -θ8a | θ8b | -θ8a+θ8b |
| 29 | | | -θ9a | θ9b | -θ9a+θ9b |
| 30 | | | -θ10a | θ10b | -θ10a+θ10b |
| 31 | | | -θ11a | θ11b | -θ11a+θ11b |
| 32 | | | -θ12a | θ12b | -θ12a+θ12b |
| 33 | | | -θ13a | θ13b | -θ13a+θ13b |
| 34 | | | -θ14a | θ14b | -θ14a+θ14b |
| 35 | | | -θ15a | θ15b | -θ15a+θ15b |
| 36 | | | -θ16a+θ1a-θ1b | θ16b | (-θ16a+θ1a-θ1b)+θ16b |
| 37 | | | -θ17a+θ2a-θ2b | θ17b | (-θ17a+θ2a-θ2b)+θ17b |
| 38 | | | | | |
| 39 | | | | | |
| 40 | | | | | |

CIRCUIT-COMPONENT MOUNTING SYSTEM

BACKGROUND OF THE INVENTION

1. Field of the Invention

The present invention relates to a system for mounting a circuit component such as an electric-circuit or an electronic-circuit component on a circuit substrate such as a printed circuit board.

2. Related Art Statement

There are known various types of circuit-component ("CC") mounting systems.

For example, Japanese Patent Application laid open for opposition under Publication No. 2(1990)-53954 discloses a CC mounting system which includes a plurality of component holders, a holder revolving device which revolves the component holders around a vertical common axis line, a CC supplying device which supplies CCs, and a circuit-substrate ("CS") supporting device which supports a CS.

The holder revolving device includes (a) a rotatable body which is rotatable about the vertical axis line and which holds the plurality of component holders on a circle whose center rides on the axis line, such that the component holders are equiangularly spaced from each other about the center of the circle, i.e., the axis line; and (b) an intermittently rotating device which intermittently rotates the rotatable body such that the rotatable body is continuously rotated by a predetermined intermittent-rotation angle in a first step and then is stopped in a second step and the first and second steps are repeated. The intermittent-rotation angle is equal to a predetermined regularly-spacing angle at which the component holders are equiangularly spaced from each other about the vertical axis line. As the rotatable body is intermittently rotated about the axis line, the component holders are sequentially stopped at each of the same number of stop positions as the number of the component holders. Those stop positions include a CC receiving position where each of the component holders receives a CC from the CC supplying device, and a CC mounting position where each component holder mounts the CC on a CS supported by the CS supporting device. The CC supplying device includes a plurality of CC supplying cartridges which are set on a movable table such that respective CC supplying portions of the CC supplying cartridges are arranged along a straight line. When the movable table is moved by a table moving device in a direction parallel to the above straight line, one of the CC supplying cartridges is moved to, and positioned at, a CC supplying position, that is, the CC receiving position. The CS supporting device currently positioning and supporting the CS is moved by a CS moving device to appropriate positions in a horizontal plane, so that a plurality of CC-mount places on the CS where CCs are mounted are positioned, one by one, at the CC mounting position at which the component holders are positioned one by one. Thus, each component holder mounts a CC at a CC-mount place on the CS at the CC mounting position. In this CC mounting system, the plurality of component holders can successively reach the CC receiving or mounting position, at a short interval of time, so that each component holder receives or mounts a CC.

In this CC mounting system, however, it is required to move the movable table supporting the CC supplying cartridges, and the CS supporting device positioning and supporting the CS. Since the movable table and the CS supporting device are of a large size, a large space is needed for allowing the movement of each of the table and the supporting device, which leads to increasing the overall size of the CC mounting system. Meanwhile, the movable table of the CC supplying device and the CS supporting device are provided at respective positions where the movement of one of the two elements does not interfere with the movement of the other element. However, the CS must be moved such that all the CC-mount places thereon are moved to the CC mounting position where the component holders are sequentially positioned, that is, the CS must be moved in a wide area, which leads to increasing the distance between the CC receiving position and the CC mounting position which is prescribed at the center of a range in which the CS is moved in a direction in which the CC supplying device and the CS supporting device are arranged. Thus, it is difficult to reduce the size of the rotatable body and accordingly is difficult to increase the speed of intermittent rotation of the rotatable body.

Japanese Patent Application No. 6(1994)-196546 discloses another CC mounting system which includes a rotatable body which holds a plurality of component holders and which is intermittently rotatable about a vertical axis line, and a moving device which moves the rotatable body to a desired position in a horizontal plane, so that the component holders take CCs from a CC supplying device which is provided at a fixed position, and mount the CCs on a CS. The component holders are held by the rotatable body such that each component holder is moved up and down, and the rotatable body is equipped with a plurality of elevating and lowering devices each of which elevates and lowers a corresponding one of the plurality of component holders between its lower, operative position where the one component holder receives and mounts a CC and its upper, inoperative position where the one holder does not. The elevating and lowering devices are supported on a support member which is fitted in the rotatable body such that the support member is not rotatable about its axis line, and is movable in its axial direction, relative to the rotatable body. When the support member is lowered in the state in which one of the elevating and lowering devices holds a corresponding one of the component holders at its operative position, the one component holder as a selected component holder receives and mounts a CC.

In the second CC mounting system, as the rotatable body is intermittently rotated, the plurality of component holders are sequentially positioned at a CC receiving position, as one of the plurality of stop positions, where each component holder receives a CC and, after all the component holders receive CCs, respectively, the rotatable body is moved to above the CS, for mounting the CCs on the CS. However, the component holders have no predetermined CC mounting position, that is, each of the component holders can mount a CC on a CS at any one of the stop positions on the locus of revolution of the holders. Since the plurality of elevating and lowering devices are provided for the plurality of component holders, respectively, each component holder can mount a CC at any stop position.

The second CC mounting system enjoys various advantages. For example, since the second system does not need any movement of a support table supporting CC supplying cartridges, or any movement of a CS supporting device supporting a CS, the second system does not need any large space for allowing the large-size support table or the large-size CS supporting table to move, which contributes to reducing the overall size of the second system. This advantage is maximized in those particular cases where many sorts of CCs are supplied from many CC supplying cartridges or where large-size CSs are used, because no large is needed for allowing a large-size support table supporting the CC supplying cartridges or a large-size CS supporting device supporting a large-size CS to move. In addition, since the CC supplying device and the CS supporting device can be arranged side by side with substantially no clearance being provided therebetween, the second system can enjoy a compact construction.

Moreover, since the rotatable body of the second system is just required to have a size sufficient to support the component holders, it can be smaller than that of the first system disclosed in the above-identified Japanese document No. 2-53954. Accordingly, it is possible to increase the speed of intermittent rotation of the rotatable body and thereby shorten a cycle time between the time when the preceding one of adjacent two component holders finishes its CC holding or mounting operation and the time when the following component holder finishes its CC holding or mounting operation. The more component holders the second system employs, the more benefit the second system gains from shorting the above cycle time.

However, the second system disclosed in the above-identified Japanese document No. 6-196546 has no predetermined CC mounting position, which leads to increasing the time needed for mounting CCs on a CS, because the rotatable body must be moved by not only the distance between two CC-mount places on the CS where two CCs are successively mounted but also the distance between two component holders holding the two CCs. Meanwhile, in the case where each component holder receives and mounts a CC at different stop positions, respectively, the angular or rotation position of the CC received by each component holder at one stop position is changed to a different rotation position of the CC when each component holder mounts the CC at another stop position. If the rotatable body is rotated for correcting the rotation position of each CC, such rotation may lead to increasing the distance of movement of the rotatable body and thereby increasing the time needed for mounting CCs. Even if each CC may have no need to correct its rotation position, the rotatable body may be rotated for changing the position of the CC in a horizontal plane, and thereby moving the CC nearer to a position corresponding to a CC-mount place on the CS. However, this rotation results in changing the current rotation position of each CC, and additionally it is difficult to calculate the distance by which the moving device moves the rotatable body.

SUMMARY OF THE INVENTION

It is therefore an object of the present invention to provide a circuit-component mounting system which includes a plurality of component holders that are revolvable around a common axis line and are movable between a component supplying device and a circuit-substrate supporting device for receiving and mounting circuit components, and which reduces the time needed for mounting the circuit components on a circuit substrate.

The present invention provides a circuit-component mounting system which has one or more of the technical features which are described below in respective paragraphs given parenthesized sequential numbers (1) to (54). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a system for mounting circuit components on a circuit substrate, comprising a component supplying device which supplies the circuit components; a substrate supporting device which supports the circuit substrate; a plurality of component holders each of which holds one of the circuit components; a holder revolving device which holds the component holders, revolves the holders around a common axis line, and sequentially stops the holders at a component receiving position and a component mounting position which are predetermined on a locus of the revolution of the component holders; a holder-revolving-device moving device which includes a movable support member supporting the holder revolving device and which moves the movable support member, thereby moving the holder revolving device to a desired position in a holder-revolving-device moving plane facing the component supplying device and the substrate supporting device; an elevating and lowering device which is supported by the movable support member and which elevates and lowers the each component holder at at least the component receiving position and the component mounting position; a component-receiving-and-mounting control device which controls the each component holder to receive, at the component receiving position, the circuit component supplied from the component supplying device and mount, at the component mounting position, the circuit component on the circuit substrate supported by the substrate supporting device; and a devices control device which controls the holder revolving device, the holder-revolving-device moving device, the elevating and lowering device, and the component-receiving-and-mounting control device. In the present circuit-component ("CC") mounting system, the plurality of component holders are sequentially moved, by the revolution of the component holders by the holder revolving device and the movement of the holder revolving device, to the component receiving position where each of the component holders is positioned at a position corresponding to a component supplying portion of the component supplying device for receiving a CC from the supplying device. At the component receiving position, each of the component holders is moved up and down by the elevating and lowering device for taking a CC from the component supplying device. After the component holders receive a predetermined number of CCs from the component supplying device, the holder revolving device is moved by the holder-revolving-device moving device to above a circuit substrate ("CS") where the plurality of component holders are sequentially moved, in a manner similar to that in which they are done for receiving CCs from the component supplying device, to the component mounting position where each of the component holders is positioned at a position corresponding to a CC-mount place on the CS where the CC held by the holder is to be mounted. At the component mounting position, each of the component holders is moved up and down by the same or a different elevating and lowering device for mounting the CC on the CS. After all the CCs held by the holder revolving device are mounted on the CS, the revolving device is moved by the holder-revolving-device moving device to the component supplying device, for receiving CCs from the supplying device again. Thus, the present CC mounting system enjoys, like the prior system disclosed in the above-identified Japanese document No. 6-196546, the advantage resulting from its feature that the plurality of component holders are moved for taking CCs from the component supplying device and are moved for mounting the CCs on a CS, that is, the advantage of reducing the overall size thereof. In addition, since the present system receives CCs from the component supplying device, and mounts the CCs on a CS, at positions predetermined on the locus of revolution of the component holders, the distance by which the holder revolving device is moved for mounting a certain CC on the CS does not include the distance between two component holders holding that CC and its preceding CC, respectively, which are successively mounted on the CS, in contrast to the prior system. That is, in the present system, the holder revolving device is moved, for mounting the CC, over only the shorter distance between two CC-mount places where the CC and its preceding CC are successively mounted on the CS. Thus, the present system can mount CCs on a CS more quickly. That the elevating and lowering device elevates and lowers each component holder at at least the component receiving position and the component mounting position means that the present invention encompasses not only an embodiment in which each component holder is lowered after it is moved to, and stopped, at the component receiving or mounting position but also an embodiment in which each component holder is lowered while being revolved and accordingly the lowering of each component holder is started before it is moved to the component receiving or mounting position, and an embodiment in which each component holder is lowered at a position remote from the component receiving or mounting position. The elevating and lowering device may be one which directly elevates and lowers each component holder, or one which indirectly elevates and lowers each component holder, for example, elevates and lowers a member holding each component holder. The holder-revolving-device moving plane may be a horizontal plane, or a plane inclined with respect to a horizontal plane. The moving plane may be defined in one of various manners, for example, is defined by an X-Y coordinate system, a polar coordinate system, or the like. The holder-revolving-device moving device may be provided by one of various devices such as an X-Y robot, a robot having a rotary arm whose position is defined by polar coordinates, or a surface stepper motor. The surface stepper motor is disclosed in, e.g., Japanese Patent Application laid open for inspection under Publication No. 7-45995. This motor includes a planar stator which is formed of, e.g., a magnetic material and provides a magnetic path. The planar stator has a number of projecting poles over an entire range within which a movable member is movable. The movable member has a plurality of electromagnetic elements each of which is provided by a yoke and a coil wound around the yoke for forming a magnetic field. When the electromagnetic elements are selectively energized, the movable motor member is moved to a desired position in a plane parallel to the planar stator. Therefore, if the movable support member of the holder-revolving-device moving device is fixed to the movable motor member, or if the support member is provided by the motor member, the holder revolving device can be moved to any desired position in the holder-revolving-device moving plane. In addition, in the case where the surface stepper motor is employed, the planar stator functions as a guide for guiding the movement of the movable support member to any position corresponding to the area of the stator. In particular, in the case where a plurality of surface stepper motors are employed with a plurality of holder revolving devices and a plurality of holder-revolving-device moving devices, the respective planar stators of the surface stepper motors which function as the guides for guiding the respective movable support members of the holder-revolving-device moving devices, do not interfere with each other, which leads to increasing the degree of freedom of moving of the holder revolving devices, increasing the degree of freedom of receiving of CCs from a plurality of component supplying devices, and increasing the degree of freedom of mounting of CCs on a CS, and eventually increasing the efficiency of mounting of CCs. Therefore, this arrangement enables two holder revolving devices to mount contemporaneously CCs on a single CS, or enables the present system to employ three or more holder revolving devices, as needed. Each of the component holders may be a component sucker, or a component chuck which has a plurality of grasping members and a grasping-member opening and closing device for symmetrically opening and closing the grasping members for grasping and releasing a CC.

(2) According to a second feature of the present invention which includes the first feature (1), the holder revolving device sequentially stops the component holders at a component receiving and mounting position as both the component receiving position and the component mounting position, and wherein the elevating and lowering device elevates and lowers the each component holder at at least the component receiving and mounting position. Since the single component receiving and mounting position functions as both the component receiving position and the component mounting position, the single elevating and lowering device suffices, which leads to reducing the production cost of the present CC mounting system. In addition, since the rotation position of the CC held by each component holder is not changed between when it is received from the component supplying device and when it is mounted on the CS. Thus, it is unnecessary to correct the rotation position of the CC, in contrast to the conventional manner in which the two positions are remote from each other on the locus of revolution of the component holders. Thus, the present system mounts the CCs on the CS more easily and more quickly.

(3) According to a third feature of the present invention which includes the first or second feature (1) or (2), the circuit-component mounting system comprises two component supplying devices which are provided on both sides of the substrate supporting device, respectively; and two component mounting units each of which comprises the component holders, the holder revolving device, the holder-revolving-device moving device, the elevating and lowering device, and the component-receiving-and-mounting control device, wherein respective positions of the two component supplying devices and the substrate supporting device are not changed during at least a time duration in which the two component mounting units mount the circuit components supplied from the two component supplying devices, on the circuit substrate supported by the substrate supporting device, and wherein the devices control device comprises an alternate-component-mounting control means for controlling one of the two component mounting units to receive circuit components from a corresponding one of the two component supplying devices and mounting the circuit components on the circuit substrate and controlling the other component mounting unit to receive circuit components from the other component supplying device and mounting the circuit components on the circuit substrate, such that the two component mounting units alternately receive the circuit components from the corresponding component supplying devices, respectively, and alternately mount the circuit components on the circuit substrate, and such that while the one component mounting unit receives the circuit components from the one component supplying device, the other component mounting unit mounts the circuit components on the circuit substrate and, while the other component mounting unit receives the circuit components from the other component supplying device, the one component mounting unit mounts the circuit components on the circuit substrate. In the present CC mounting system, while one of the two CC mounting units mounts CCs on a CS, the other CC mounting unit can receive CCs from the corresponding component supplying device. Therefore, immediately after the one mounting unit finishes mounting the CCs, the other mounting unit can start mounting the CCs. If the present system employs a single CC mounting unit, no CC can be mounted on the CS while the single mounting unit receives CCs from the component supplying device. This is a waste of time. In contrast, since the present system employs two CC mounting units, it can mount CCs on a CS without any pause, which contributes to improving the efficiency of mounting of CCs. In addition, since the present system has two component supplying devices on both sides of the substrate supporting device, respectively, the two holder revolving devices can be easily prevented from interfering with each other, when one of the two revolving devices is moved to the corresponding component supplying device and the other revolving device is moved to the CS. Thus, the present system enjoys the advantage that the holder-revolving-device moving device or devices can be easily designed and the advantage that the CC mounting program used in the system can be easily produced. The two component supplying devices may be ones which supply a same sort of CCs, or ones which supply different sorts of CCs, respectively. In either case, the two mounting units cooperate with each other to mount CCs on a single CS. In the case where the two component supplying devices supply a same sort of CCs, the present system enjoys the advantage that it does not necessarily matter which one of the two supplying devices initially mounts CCs on a CS. Meanwhile, in the case where the two component supplying devices supply different sorts of CCs, the two devices can share even a number of sorts of CCs. Additionally, since the two devices are provided on both sides of the CS, respectively, the present system enjoys a more compact arrangement than the case where a single component supplying device which supplies a number of sorts of CCs is provided on one side of a CS. The employment of two component supplying devices does not necessarily require the employment of two CC mounting units, and vice versa. According to the first or second feature (1) or (2), the CC mounting system may employ a single component supplying devices in combination with two CC mounting units, or a single CC mounting unit with two component supplying devices.

(4) According to a fourth feature of the present invention which includes any one of the first to third features (1) to (3), the circuit-component mounting system further comprise a component-image pick-up device which is supported by the movable support member such that the component-image pick-up device can be opposed to the circuit component held by the each component holder and which takes an image of the circuit component; and a position correcting means for obtaining, based on the image of the circuit component taken by the component-image pick-up device, a position error of the circuit component held by the each component holder, and correcting, based on the obtained position error, a position to, and at, which the holder-revolving-device moving device moves, and stops, the holder revolving device relative to the substrate supporting device. In the present system, an image of the CC held by each component holder is taken, and a possible position error of the CC is corrected based on the taken image. Thus, the CC is mounted at a CC-mount place on the CS, with accuracy. Since the component-image pick-up device is supported by the support member of the holder-revolving-device moving device and is moved with the holder revolving device, the pick-up device can take the image of a CC held by one component holder while another component holder receives another CC. Thus, the present system can secure the time needed for calculating a position error of each CC based on its image, on one hand, and increase the rate of mounting of CCS, on the other hand. The pick-up device may be one which takes an image of a still CC, or one which takes an image of a moving CC. In the case where the pick-up device is provided by a high-speed camera equipped with a strobe, or a so-called line sensor, the pick-up device can take an image of a moving CC. A high-speed camera equipped with a strobe takes an image of a moving CC, by emitting a high-intensity light to the CC passing thereby. Though the CC is moving, the image of the CC can be taken with a very high shutter speed or with a very short light-emission period, as if the CC were still. A line sensor is provided by a number of image pick-up elements that are arranged in a straight array such that the array of elements extends in a radial direction of a circle whose center is defined by the common axis line of the component holders. The line sensor iteratively and periodically takes an image of a linear portion or "line" of a CC moving at a constant speed. Thus, a full image of the CC consists of respective "line" images of linear portions of the same. When the line sensor takes the line image of the last linear portion of the CC at the time when the last linear portion passes by the sensor, the full image of the CC is obtained. That is, the two-dimensional full image of the CC is obtained by the movement of the CC and the iterative taking of line images of the CC. However, since the CC is revolved around the common axis line of the component holders, the angular or rotation position of the CC relative to the line sensor changes little by little as the line sensor iteratively takes the line images of the CC. Therefore, it is necessary to synthesize the two-dimensional image of the CC based on the respective line images of the same, by taking the change of the rotation-position of the CC into account.

(5) According to a fifth feature of the present invention which includes any one of the first to fourth features (1) to (4), the each component holder is held by the holder revolving device such that the each component holder is rotatable about an axis line thereof, and wherein the system further comprises a holder rotating device which is supported by the movable support member and which rotates the each component holder about the axis line thereof; a component-image pick-up device which is supported by the movable support member such that the component-image pick-up device can be opposed to the circuit component held by the each component holder and which takes an image of the circuit component; and a rotation-position correcting means for obtaining, based on the image of the circuit component taken by the component-image pick-up device, a rotation-position error of the circuit component held by the each component holder, and controlling, based on the obtained rotation-position error, the holder rotating device to rotate the each component holder and thereby correct the rotation-position error of the circuit component. In the present system, the rotation-position error of the CC held by each component holder is corrected, and the CC is mounted at its accurate rotation position on the CS. The holder rotating device may be one which contemporaneously rotates the plurality of component holders, or one which individually rotates each one of the component holders. According to this feature, it is required that the holder rotating device be supported anyway by the support member of the holder-revolving-device moving device so that the rotating device is movable with the support member. Therefore, the holder rotating device may be supported by the holder revolving device. In addition, the holder rotating device may be used for not only correcting the rotation-position error of each CC but also changing the current rotation position of the CC to a predetermined rotation position.

(6) According to a sixth feature of the present invention which includes the fourth or fifth feature (4) or (5), the elevating and lowering device comprises a cam member having a cam surface which extends along the locus of revolution of the component holders and includes a height-changing portion; and a plurality of cam followers each of which is provided on a corresponding one of the component holders such that the corresponding one component holder is movable upward and downward together with the each cam follower, and each of which is engaged with the cam surface, wherein when the one component holder is revolved by the holder revolving device, the one component holder is moved upward and downward because of the engagement of the each cam follower and the cam surface, wherein the component-image pick-up device is provided at a position corresponding to a first portion of the cam surface which is higher than a second portion of the cam surface which corresponds to at least one of the component receiving position and the component mounting position. In the present system, the component holders are revolved by the holder revolving device, and each of the component holders is moved up and down by the engagement of the cam follower thereof with the cam member. Thus, a space is created under some of the component holders, and the component-image pick-up device can be accommodated in this space. Consequently the pick-up device is effectively prevented from interfering with each component holder and/or the CC held thereby, and with the component supplying device and the CS and, additionally, the distance by which each component holder is moved up and down for receiving and mounting a CC can be reduced. From the standpoints of simplification and downsizing, it is preferred that the cam member and the cam followers be provided by an end-face cam and spherical cam followers (i.e., cam-follower balls), respectively. However, they may be provided by a groove or ridge cam and cam-follower rollers. Generally, the term "height" is used to indicate the position of an article in a vertical direction. Therefore, in the case where the common axis line of the component holders is vertical, it can be said that the height of each of the component holders is changed by the engagement of the cam follower thereof with the height-changing portion of the cam surface. However, the common axis line may be inclined with respect to the holder-revolving-device moving plane. In the latter case, the cam surface may be formed along the surface of a circular cone whose center line is defined by the inclined common axis line, and the height-changing portion of the cam surface may be defined as a portion whose distance from the vertex of the circular cone changes. In the last case, each of the component holders is revolved along the cam surface such that the axis line of the holder always passes through the vertex of the cone though the position thereof relative to the vertex may change. As far as the present invention is concerned, this change of position is regarded as the change of height.

(7) According to a seventh feature of the present invention which includes any one of the first to sixth features (1) to (6), the elevating and lowering device comprises a cam member having a cam surface which extends along the locus of revolution of the component holders and includes a height-changing portion; and a plurality of cam followers each of which is provided for a corresponding one of the component holders such that the corresponding one component holder is movable upward and downward together with the each cam follower, and each of which is engaged with the cam surface, wherein when the one component holder is revolved by the holder revolving device, the one component holder is moved upward and downward because of the engagement of the each cam follower and the cam surface, wherein a lowest portion of the cam surface corresponds to at least one of the component receiving position and the component mounting position. In the present system, the component holders are revolved by the holder revolving device, and each of the component holders is moved up and down by the engagement of the cam follower thereof with the cam member. Thus, the distance by which each component holder is moved up and down by the elevating and lowering device for receiving a CC at the component receiving position and/or mounting the CC at the component mounting position, can be reduced, and accordingly the time needed for receiving a CC and/or mounting the CC can be reduced. In addition, the component holders other than the component holder or holders being positioned at the component receiving and/or mounting positions can be positioned higher than the latter holder or holders, and the component-image pick-up device can be accommodated in a space created under the higher holders. If all the component holders take the same height position, that position should be higher than the highest portion of the respective portions of the component supplying device, the substrate supporting device, and the CCs already mounted on the CS which can oppose the component holders. In this case, therefore, each component holder cannot be positioned sufficiently near to the component supplying portion of the component supplying device, and/or a CC-mount place on the CS, at the component receiving position and/or the component mounting position. Consequently the distance of upward and downward movements of each component holder for receiving and/or mounting a CC is increased. In contrast, in the present system, the component holders other than the component holder or holders being at, or in the vicinity of, the component receiving and/or mounting positions can take the higher positions. Thus, each component holder can be positioned sufficiently near to the component supplying portion of the component supplying device, and/or a CC-mount place on the CS, at the component receiving and/or mounting positions, while the other component holders are effectively prevented from interfering with the component supplying device and/or the substrate supporting device.

(8) According to an eighth feature of the present invention which includes any one of the fourth to seventh features (4) to (7), the holder revolving device comprises an intermittently rotatable body which is intermittently rotatable such that the intermittently rotatable body is rotated about an axis line thereof by a predetermined intermittent-rotation angle in a first step and is stopped in a second step and the first and second steps are repeated, the intermittently rotatable body holding the component holders such that the component holders are equiangularly spaced from each other about the axis line of the intermittently rotatable body, at a predetermined regularly-spacing angle which is equal to an integral-number multiple of the predetermined intermittent-rotation angle, wherein the component-image pick-up device is provided at a component-image taking position as one of a plurality of stop positions at each of which the each component holder is stopped while the intermittently rotatable body is intermittently rotated, and wherein the holder revolving device stops the each component holder at the component receiving position and the component mounting position as two stop positions different from the one stop position as the component-image taking position. In the present system, the component-image pick-up device can take an image of a CC being stopped, and can take an image of a CC held by one component holder while another component holder receives or mounts another CC. Thus, the present system enjoys improved CC-mounting efficiency. The regularly-spacing angle may be changed depending upon the number of component holders employed. The holder revolving device may be one which includes an exclusive drive source (e.g., an electric motor such as a servomotor) for rotating the intermittently rotatable body, or one which includes a common drive source that is shared by another device such as the elevating and lowering device and which additionally includes a motion converting device including a cam and a cam follower for transmitting the drive force of the common drive source to the rotatable body and thereby rotating the same. In the latter case, the drive force of the common drive source is converted by another motion converting device including a cam and a cam follower, into the upward and downward movements of each component holder by the elevating and lowering device. In the case where the holder revolving device includes its exclusive drive source, the rotatable body can be rotated at any desired intermittent-rotation angle. In addition, the component holder which holds, e.g., the first CC which is initially mounted on the CS can be revolved in the reverse direction, so that the revolution of the holder over the smallest angle moves the holder to the component receiving or mounting position. This leads to improving the CC-mounting efficiency. When a first number of components holders of one sort are replaced with a second number of component holders of another sort on the rotatable body, the regularly-spacing angle at which the first number of holders are equiangularly spaced from each other about the axis line of the rotatable body is changed to that for the second number of holders. In this case, the rotatable body can be rotated by the exclusive drive source at a new intermittent-rotation angle equal to the regularly-spacing angle of the second number of holders. In the case where the rotatable body holds a plurality of component holders such that the component holders are located on a circle those center rides on the axis line of the rotatable body and the respective axis lines of the holders extend parallel to the axis line of the body, the body can hold a greater number of holders, without having to increase the diameter thereof, than the case where the respective axis lines of the holders extend in radial directions of the circle, respectively. Thus, the rotatable body enjoys a small size, and a short time needed for each intermittent rotation, which lead to improving the CC-mounting efficiency.

(9) According to a ninth feature of the present invention which includes the eighth feature (8), the each component holder is held by the holder revolving device such that the each component holder is rotatable about an axis line thereof, and wherein the system further comprises a holder rotating device which is supported by the movable support member and which concurrently rotates the component holders about the respective axis lines thereof; and a concurrent-mounting-and-image-taking control means for, in a state in which the component holders have received all the circuit components supplied from the component supplying device in a circuit-component supplying operation thereof and the component-image pick-up device have taken the image of at least one of the circuit components held by the component holders and have not taken the respective images of all the circuit components, controlling the holder-revolving-device moving device to move the holder revolving device to above the circuit substrate and controlling the elevating and lowering device to lower the component holder being at the component mounting position, for mounting the circuit component held thereby, on the circuit substrate, while controlling the component-image pick-up device to take the image of the circuit component held by the component holder being at the component-image taking position. In the present system, when the rotatable body is intermittently rotated, the component-image pick-up device can take an image of a CC held by one component holder, while another component holder concurrently receives another CC. Since the component receiving position and the component-image taking position are angularly distant from each other, the image or images of the CC or CCs held by one or more component holders present between the two positions has or have not been taken by the pick-up device yet, when all of a predetermined number of CCs to be received by the component holders each time have been received by the same. In this case, it is possible that the mounting of CCs be started after the image or images of the CC or CCs held by the component holder or holders present between the two positions has or have been taken. However, the mounting of CC or CCs may be carried out while the taking of the image or images is carried out. In the last case, the overall time needed for mounting all the CCs can be reduced by the time during which the mounting of CC or CCs is carried out concurrently with the taking of the image or images. This advantage is maximized in the case where, immediately after all the component holders have held CCs, the holder revolving device is moved by the holder-revolving-device moving device to above the CS.

(10) According to a tenth feature of the present invention which includes any one of the first to ninth features (1) to (9), the each component holder includes an axial portion and a component holding portion which is provided at a lower end of the axial portion and which holds the circuit component.

(11) According to an eleventh feature of the present invention which includes the tenth feature (10), the holder revolving device comprises a plurality of rotary members which are rotatable about the common axis line, independent of each other; and a rotary-motion applying device which applies a rotary motion to each of the rotary members such that the each rotary member is rotated while having a predetermined time difference from the preceding rotary member and that while the each rotary member is rotated by 360 degrees about the common axis line, the each rotary member is stopped at least one time, the rotary members having, at a common distance from the common axis line, respective holding portions each of which holds a corresponding one of the component holders such that the one component holder is movable in an axial direction thereof. Each of the rotary members may hold a movable holding member for holding a corresponding one of the component holders, such that the movable holding member is movable in a direction parallel to the axis line of the holder. In this case, each component holder is moved in a direction parallel to the axis line thereof by the movement of the movable holding member. The holding portions of the rotary members may have respective holding holes in which the component holders are fitted such that the holders are rotatable about their axis lines. In the latter case, the current rotation position of the CC held by each component holder can be changed, and/or the rotation-position error of the CC can be corrected, by rotating the holder about its axis line. A holder revolving device including a plurality of rotary members which are rotatable about a common axis line, independent of each other, and which hold a plurality of component holders, respectively, is disclosed in U.S. patent application Ser. No. 08/769,700 assigned to the Assignee of the present U.S. patent Application. The rotary-motion applying device may be one which includes a plurality of cam followers which are provided on the plurality of rotary members, respectively, and a rotary-motion applying cam device which sequentially engages the cam followers and moves them for rotating the corresponding rotary members about the common axis line. It is preferred that the rotary-motion applying cam device include a plurality of concave globoidal cams which are disposed at respective positions axis-symmetric with each other with respect to the common axis line such that lines of intersection of respective outer circumferential surfaces of the concave globoidal cams with a plane including respective axis lines of the concave globoidal cams and perpendicular to the common axis line cooperate to define a substantially continuous circle which has a center at the common axis line.

(12) According to a twelfth feature of the present invention which includes the tenth feature (10), the holder revolving device comprises a rotatable body which is rotatable about the common axis line and which has, at a common distance from the common axis line, a plurality of holding portions each of which holds a corresponding one of the component holders such that the one component holder is movable in an axial direction thereof. In the present system, the rotatable body may hold a plurality of movable holding members each of which holds a corresponding one of the component holders, such that the each movable holding member is movable in a direction parallel to the axis line of the corresponding component holder. In this case, each component holder is moved in a direction parallel to the axis line thereof by the movement of the corresponding movable holding member. The holding portions of the rotatable body may have respective holding holes in which the component holders are fitted such that the holders are rotatable about their axis lines. In the latter case, the current rotation position of the CC held by each component holder can be changed, and/or the rotation-position error of the CC can be corrected, by rotating the holder about its axis line.

(13) According to a thirteenth feature of the present invention which includes the eleventh or twelfth feature (11) or (12), the common axis line is perpendicular to the holder-revolving-device moving plane, and wherein the each holding portion extends parallel to the common axis line.

(14) According to a fourteenth feature of the present invention which includes the eleventh or twelfth feature (11) or (12), the holding portions have respective center lines defined by a plurality of generators of a circular cone whose center line is defined by the common axis line, and wherein the common axis line is inclined with respect to a perpendicular of the holder-revolving-device moving plane, by an angle at which one of the generators is perpendicular to the holder-revolving-device moving plane. In the system according to the thirteenth or fourteenth feature (13) or (14), the holder-revolving-device moving plane in which the holder-revolving-device moving device moves the holder revolving device may be either a horizontal plane, or a plane which is inclined with respect to a horizontal plane. In the case where the holder-revolving-device moving plane is inclined with respect to a horizontal plane, each of the component holders is moved up and down along the common axis line which is inclined with respect to a vertical direction. Meanwhile, there is known a CC mounting system in which a CC supplying device which supplies CC, and/or a CS on which CCs are mounted are inclined with respect to a horizontal plane. In the latter system, if the component holders are moved up and down along the common axis line inclined with respect to the vertical direction, they can be moved toward, and away from, the CC supplying device and/or the CS, while taking their attitudes perpendicular to the inclined CC supplying device and/or the inclined CS, so that they can easily receive the CCs from the CC supplying device and/or mount the CCs on the CS. In the system according to the fourteenth feature (14), the height position of each of the component holders (i.e., the position of each holder in a direction parallel to the axis line thereof) can be changed as the rotatable body is rotated. Accordingly, an image pick-up device may be disposed in a space which is created below some of the component holders. The present system in which the axis line of the rotatable body is inclined can easily change the respective height positions of the component holders with a smaller number of parts than the case where each of the component holders is moved downward and upward by using a cam member which is provided above the locus of revolution of the holders and which has a cam surface including a height-changing portion, and cam followers which follows the cam surface of the cam member. Thus, the rotatable body enjoys a small mass, and the holder revolving device can be moved at high speed by the holder-revolving-device moving device. Thus, the efficiency of mounting of CCs can be improved.

(15) According to a fifteenth feature of the present invention which includes the sixth to fourteenth features (6) or (14), the cam member is provided above the locus of revolution of the component holders and the cam surface is defined by a lower surface of the cam member, wherein the each cam follower comprises a spherical cam follower which is held by an upper end of the corresponding one component holder such that the spherical cam follower is rotatable in all directions and which is rollable on the cam surface of the cam member, and wherein the system further comprises at least one biasing device which biases the component holders toward the cam member. Since the spherical cam follower is rotatable in all directions, it is freely rollable on the cam surface. In contrast, if a roller were employed as each cam follower, then it would be necessary to employ additionally a support shaft which supports the roller such that the roller is rotatable, and a support member which supports the support shaft and which is not rotatable relative to a member holding the component holders, which would lead to complicating the construction of the system. Thus, the present system enjoys a simple construction, and enjoys the advantage of decreasing the total number of parts needed and thereby decreasing the production cost thereof, and the advantage of decreasing the total mass of parts which are moved with the member holding the component holders and thereby increasing the speed of movement of that member. In addition, since the spherical cam follower rolls on the cam surface, the friction produced between the two members and accordingly the wearing of the same are much less than the case where a semi-spherical cam follower would be fixed to the upper end of the axial portion of each component holder. Thus, the life expectancy of the present system is improved. The spherical cam follower held by each component holder allows the rotation of the holder about its axis line. In contrast, if a roller that is rotatable about a predetermined axis line only were employed as each cam follower in place of the spherical member, then the roller could not be directly held by the rotatable holder, that is, must be held by a separate member such that the roller is rotatable about the predetermined axis line. In the present system, each component holder can directly hold the cam follower and can be rotated about its axis line, and the height position of the holder can be changed while the holder is being moved along, or stopped on, the locus of revolution thereof. The holder revolving device enjoys a simple construction and accordingly a low production cost.

(16) According to a sixteenth feature of the present invention which includes the fifteenth feature (15), the holder revolving device sequentially stops the component holders at a component receiving and mounting position as both the component receiving position and the component mounting position, wherein the elevating and lowering device elevates and lowers the each component holder at at least the component receiving and mounting position, wherein the elevating and lowering device comprises a drive member and a drive device which elevates and lowers the drive member, wherein the cam member has a recess in a portion thereof corresponding to the component receiving and mounting position, and wherein the drive device elevates and lowers the drive member between an upper position thereof at which the drive member is fitted in the recess of the cam member such that a lower surface of the drive member is flush with the cam surface, and a lower position thereof at which the lower surface of the drive member is lower than the cam surface. The drive member is normally positioned at its upper position. When each cam follower rolls on the cam surface, it periodically rolls on the lower surface of the drive member. In the state in which the cam follower rolls on the drive member, if the drive member is lowered by the drive device, the component holder is moved downward; and if the drive member is elevated, the component holder is moved upward following the drive member because of the biasing force of the biasing device, so that the cam follower again engages the cam surface. In the case where the holder rotating device is adapted to stop each component holder at a stop position predetermined on the locus of revolution thereof and the drive member is provided at the stop position, the drive device may be one which starts lowering the drive member after the holder is stopped at the stop position and/or elevating the same before the holder starts moving from the stop position, or one which starts lowering and/or elevating the drive member below which the cam follower is present during a time period prior to the stopping of the holder at the stop position and/or a time period subsequent to the stopping. In the latter case, the component holder is revolved by the holder revolving device, while simultaneously being moved upward and/or downward by the elevating and lowering device for receiving and mounting a CC. This contributes to reducing the time period needed for an operation involving the upward and downward movements of the component holders.

(17) According to a seventeenth feature of the present invention which includes the sixteenth feature (16), the drive member is supported by the drive device such that the drive member is normally held at an operative position thereof and such that when the drive member being at the lower position thereof receives a force greater than a predetermined magnitude, in a direction of the movement of the component holder, the drive member is retracted to a retracted position thereof at which the drive member does not interfere with the movement of the component holder.

(18) According to an eighteenth feature of the present invention which includes the seventeenth feature (17), the drive member is supported by the drive device such that the drive member is rotatable about a vertical axis line thereof which is laterally offset from a locus of the movement of the component holder, the drive member being retracted to the retracted position thereof by being rotated about the vertical axis line thereof. The drive member may be held by an output member of the drive device such that the drive member is rotatable about a vertical axis line, and such that a portion of the drive member which is remote from the vertical axis line is engageable with each component holder so that the drive member can be rotated to its retracted position. It is possible to employ, in place of the rotatable drive member, a linearly movable drive member which is linearly movable to its retracted position. However, the rotatable drive member can be held by the drive device having a simpler construction, which contributes to reducing the production cost of the present system.

(19) According to a nineteenth feature of the present invention which includes any one of the sixteenth to eighteenth features (16) to (18), the drive device comprises a drive-member biasing device which provides a biasing force to bias the drive member toward the operative position thereof and a stopper member which stops the drive member at the operative position thereof against the biasing force of the drive-member biasing device.

(20) According to a twentieth feature of the present invention which includes the ninteenth feature (19), the drive device further comprises a drive-member-supporting movable member which supports the drive member, and wherein the stopper comprises an adjustable stopper member which is attached to the drive-member-supporting movable member such that a position of the stopper member relative to the drive-member-supporting movable member is adjustable.

(21) According to a twenty-first feature of the present invention which includes any one of the sixteenth to twentieth features (16) to (20), the recess of the cam member has a depth which assures that the cam follower keep rolling on the cam surface over the recess.

(22) According to a twenty-second feature of the present invention which includes any one of the seventeenth to twenty-first features (17) to (21), the drive device further comprises a drive-member supporting movable member which supports the drive member, and wherein the apparatus further comprises a retraction detector which detects the retraction of the drive member to the retracted position thereof and produces a detection signal indicating that the retraction detector has detected the retraction of the drive member, and a movable-member stopping means for stopping a movement of the drive-member-supporting movable member based on the detection signal. In place of the retraction detector, the present apparatus may further comprise an abnormal-movement detector which detects an abnormal movement of the drive member when the drive member should not be moved up or down. In the latter case, the apparatus may further comprise a means for stopping the movement of the drive-member-supporting movable member based on a detection signal supplied from the abnormal-movement detector.

(23) According to a twenty-third feature of the present invention which includes any one of the first to twenty-second features (1) to (22), the each component holder comprises a component sucker which sucks the circuit component by applying a negative pressure thereto. The component sucker as the component holder enjoys a simple construction, is easily controlled to hold and release a CC, and holds the CC without damaging it. In addition, the image of the CC held by each component sucker can be easily taken.

(24) According to a twenty-fourth feature of the present invention which includes the twenty-third feature (23), the circuit-component transferring apparatus further comprises a pressure control device which controls a pressure in the component sucker so that the component sucker sucks and releases the circuit component.

(25) According to a twenty-fifth feature of the present invention which includes the twenty-fourth feature (24), the elevating and lowering device comprises a drive member and a drive device which elevates and lowers the drive member, and the pressure control device comprises a pressure switching valve which is supported by the holder revolving device and which includes a movable switch member; and a valve control device which is actuated by the elevating and lowering device and which is selectively placed in one of (a) a component-sucking control state thereof in which, when the drive member lowers the component sucker, the valve control device moves the switch member to a negative-pressure supplying position thereof at which the pressure switch valve permits a negative pressure to be supplied to the component sucker and (b) a component-releasing control state thereof in which, when the drive member lowers the component sucker, the valve control device moves the switch member to a negative-pressure removing position thereof at which the pressure switch valve permits a pressure not lower than an atmospheric pressure to be supplied to the component sucker. When the component sucker sucks the CC, it is moved downward by the drive member and, in mechanical synchronism with the downward movement of the sucker, the movable switch member of the pressure switching valve is moved to its NP supplying position, so that the switching valve changes the pressure in the sucker from the pressure not lower than the atmospheric pressure to the NP. Consequently the sucker sucks the CC. On the other hand, when the sucker releases the CC, it is moved downward by the drive member and, in mechanical synchronism with the downward movement of the sucker, the movable switch member is moved to its NP removing position, so that the pressure switching valve changes the pressure in the sucker from the NP to the pressure not lower than the atmospheric pressure. Consequently the sucker releases the CC. Thus, at the same position, the switching valve is selectively switched to one of its NP supplying and removing states, each during the downward movement of the drive member of the single elevating and lowering device. The present CC mounting system can suck and release the CC at appropriate timings, each in mechanical synchronism with the movement of the component sucker. In addition, since the switching of the switching valve and the upward and downward movement of the component sucker can be performed by a common drive source, the present system can be produced at reduced cost. The drive member may be one which directly lowers and elevates the component sucker, or one which is movable in a direction that is not parallel to a direction in which the component holder is moved upward and downward and which lowers and elevates the component sucker via a motion converting device such as a cam device, a link mechanism, or the like. Moreover, the drive member may be one which directly moves the movable switch member, or one which indirectly moves the switch member via another member.

(26) According to a twenty-sixth feature of the present invention which includes the twenty-fifth feature (25), the valve control device comprises two movable members which are movable in a first direction and a second direction opposite to the first direction, respectively, in mechanical synchronism with the upward movement of the drive member and are movable in the second direction and the first direction, respectively, in mechanical synchronism with the downward movement of the drive member; two operative members which are associated with the two movable members, respectively, and which act on the movable switch member on opposite sides thereof, respectively; two actuators which are supported by the two movable members, respectively, and which move the two operative members relative to the corresponding movable members, respectively; and an actuator control device which controls the two actuators such that, when the two movable members are moved in the first and second directions, respectively, a corresponding one of the two operative members acts on the movable switch member on a corresponding one of the opposite sides thereof and, when the two movable members are moved in the second and first directions, respectively, the other operative member acts on the movable switch member on the other side thereof. The movable members may be ones which are linearly movable, and the operative members may be ones which are linearly movable in a direction parallel to the direction of linear movement of the movable members, or in a direction intersecting the direction of linear movement of the movable members. Alternatively, the movable members may be rotatable members which are rotatable about their axis lines, and the operative members may be ones which are rotatable about the respective axis lines of the corresponding movable members, such that the respective loci of rotation of the operative members coincide with the respective loci of the corresponding movable members. The direction of movement of the movable members may be parallel to the direction of movement of the drive member, or may not be parallel to the same, for example, may be perpendicular to the same. The direction of movement of the switch member may be parallel to the direction of movement of the drive member or the operative members, or may not be parallel to the same. The movement of the switch member may be a linear movement, or a rotation about an axis line. The actuators may be ones which linearly move the operative members, or ones which rotate the operative members about their axis lines.

(27) According to a twenty-seventh feature of the present invention which includes the twenty-sixth feature (26), the movable switch member is moved upward and downward for being moved to the negative-pressure supplying position and the negative-pressure removing position, wherein the drive member is elevated and lowered for moving the component sucker upward and downward, wherein one of the two movable members is elevated and lowered together with the drive member, and wherein the system further comprises a coupling device which couples the drive member to the other of the two movable members such the drive member and the other movable member are moved in one of the first and second directions and the other of the first and second directions, respectively. Each of the two movable members may be one which is movable relative to the drive member. However, in the case where one of the two movable members is one which is movable together with the drive member, the valve control device enjoys a simpler construction.

(28) According to a twenty-eighth feature of the present invention which includes the twenty-sixth or twenty-seventh feature (26) or (27), the valve control device further comprises at least one auxiliary actuator which is provided, between at least one of the two movable members and a corresponding one of the two operative members, in series with a corresponding one of the two actuators as two main actuators, and which moves the one operative member relative to the one movable member. In the case where each of the two main actuators and a single auxiliary actuator can selectively take one of two different states, each of the two operative members is selectively moved by a corresponding one of the two main actuators, to one of its operative and inoperative positions, and one of the two operative members which is associated with the auxiliary actuator is selectively moved by the auxiliary actuator, to one of its two different operative positions. In the case where a plurality of auxiliary actuators each of which can selectively take one of two different states are employed and connected in series to each other, the one operative member can be selectively moved to one of three or more different operative positions. For example, in the case where the component sucker sucks or releases different sorts of CCs at different height positions depending upon the different height dimensions of the CCs, the pressure switching valve can be switched at different timings corresponding to the different height dimensions of the CCs, respectively, so that the component sucker can suck, or release, each of the CCs at its most appropriate timing. This contributes to improving the efficiency of transferring of CCs. Although it is required that the auxiliary actuator be connected in series to one of the two main actuators, it does not matter which one of the auxiliary actuator and the one main actuator is provided nearer to the corresponding operative member. The auxiliary actuator may be one which linearly moves the corresponding operative member, or one which rotates the same about an axis line.

(29) According to a twenty-ninth feature of the present invention which includes any one of the twenty-sixth to twenty-eighth features (26) to (28), one of the two operative members has a first positive-pressure supplying passage through which a positive pressure as the pressure not lower than the atmospheric pressure is supplied to the component sucker via a second positive-pressure supplying passage of the movable switch member, so that the positive pressure is supplied to the component sucker in at least an initial period in the component-releasing control state of the valve control device.

(30) According to a thirtieth feature of the present invention which includes any one of the twenty-sixth to twenty-ninth features (26) to (29), the valve control device further comprises at least one relative-movement permitting device which is provided between at least one of the two movable members and a corresponding one of the two operative members and which permits, when a movable-switch-member moving force applied by the one movable member to the one operative member exceeds a reference value, a relative movement between the one operative member and the one movable member, while applying an elastic resistance to the relative movement. The present apparatus assures that the switch member of the pressure switching member is switched with its shortest possible stroke. The switch member may be equipped with two stoppers at respective opposite end portions thereof which correspond to the NP supplying and removing positions thereof, respectively. At each of the NP supplying and removing positions, a corresponding one of the two stoppers stops the movement of the switch member. After the stopping of the switch member, the relative-movement permitting device permits a relative movement between one operative member and the corresponding movable member, thereby accommodating or absorbing an excessive stroke of the movable member.

(31) According to a thirty-first feature of the present invention which includes the twenty-ninth or thirtieth feature (29) or (30), the circuit-component mounting system further comprises an air-leakage permitting device which is provided in a portion of a connected passage resulting from connection of the first positive-pressure supplying passage of the one operative member to the second positive-pressure supplying passage of the movable switch member in a state in which the one operative member is held in contact with the movable switch member, the portion of the connected passage being discommunicated from the component sucker and a negative-pressure supplying device while the movable switch member is held at the negative-pressure supplying position, the air-leakage permitting device permitting air to leak from the connected passage, while applying a resistance to the air leakage.

(32) According to a thirty-second feature of the present invention which includes the thirty-first feature (31), the air-leakage permitting device comprises a communication passage which is formed in the one operative member having the first positive-pressure supplying passage and which communicates the first positive-pressure supplying passage with an atmosphere in the state in which the one operative member is held in contact with the switch member.

(33) According to a thirty-third feature of the present invention which includes the thirty-first or thirty-second feature (31) or (32), the circuit-component transferring apparatus further comprises a variable restrictor which is provided in at least one of the air-leakage permitting device and a portion of the connected passage which is on an upstream side of the air-leakage permitting device in a direction of flow of air. For example, the variable restrictor may have a valve whose degree of opening is variable or adjustable. By adjusting the degree of opening of the valve, the amount of pressurized gas blowing out of the component sucker after the increasing of the pressure in the sucker, and/or the ratio of the amount of pressurized gas flowing to the sucker immediately after the switching of the switching valve to its NP removing state to that after the increasing of the pressure in the sucker can be adjusted.

(34) According to a thirty-fourth feature of the present invention which includes any one of the first to thirty-third features (1) to (33), the each component holder is held by the holder revolving device such that the each component holder is rotatable about an axis line thereof and is movable in an axial direction thereof, wherein the circuit-component mounting system further comprises a drive gear which is coaxial with the common axis line and which is rotated by a desired angle by a drive source; and a plurality of driven gears which are fixed to the component holders, respectively, such that each of the driven gears is concentric with a corresponding one of the component holders and is meshed with the drive gear, and wherein when the elevating and lowering device moves the each component holder in the axial direction thereof, the meshing of the driven gear fixed to the each component holder with the drive gear is maintained. The drive gear, the driven gears, and the drive source cooperate with one another to provide a holder rotating device which simultaneously rotates the component holders while permitting each component holder to be moved in its axial direction.

(35) According to a thirty-fifth feature of the present invention which includes the thirty-fourth feature (34), the drive gear has a width greater than respective widths of the driven gears. Alternatively, the drive gear may have a width smaller than respective widths of the driven gears. However, the former embodiment wherein the width of the drive gear is greater than the respective widths of the driven gears, is more advantageous than the latter embodiment, because only the single drive gear is formed to have a greater width. In addition, a smaller space can allow the component holders to be moved in their axial directions.

(36) According to a thirty-sixth feature of the present invention which includes any one of the first to thirty-fifth features (1) to (35), the circuit-component mounting system further comprising a plurality of main conveyors each of which conveys, positions, and supports a circuit substrate, the plurality of main conveyors being arranged in a direction perpendicular to a circuit-substrate conveying direction in which the each main conveyor conveys the circuit substrate; at least one of (a) a carry-in conveyor which conveys the circuit substrate to the each main conveyor and loads the circuit substrate thereon, and (b) a carry-out conveyor which loads the circuit substrate off the each main conveyor and conveys the circuit substrate away therefrom; and a conveyor shifting device which selectively shifts the at least one of the carry-in conveyor and the carry-out conveyor to one of a plurality of shift positions at each of which the one conveyor is aligned with a corresponding one of the main conveyors. Each of the main conveyors has the function of conveying a CS and the function of positioning and supporting the CS, and a portion of each main conveyor which positions and supports a CS provides a CS supporting device. Since the carry-in conveyor is shifted by the conveyor shifting device, it can receive a CS at each of its shift positions and can hand over the CS to each of the main conveyors at a corresponding one of the shift positions. Meanwhile, since the carry-out conveyor is shifted by the conveyor shifting device, the carry-out conveyor can receive a CS from each of the main conveyors at a corresponding one of the plurality of shift positions thereof, and can carry out the CS at each of the shift positions. Since the present system includes the plurality of main conveyors, the present system can be operated such that immediately after the mounting of CCs is finished on the CS supported by one of the main conveyors, the mounting of CCs is started on the CS supported by another or the other main conveyor. Thus, the present system needs substantially no time for changing CSs with each other. In addition, the single carry-in conveyor and the single carry-out conveyor can carry in CSs to, and carry out the CSs from, the plurality of main conveyors. Therefore, the present CC mounting system performs the CC mounting operation with high efficiency, while enjoying a simple construction. The present system may employ either one, or both, the carry-in and carry-out conveyors. For example, the present system may be a "line" system which includes a plurality of operation performing devices each of which performs a certain operation for a CS and which are arranged in series with each other. At the downstream-side end of the line system, a robot or an operator can take the CSs directly from the main conveyors to store them in a storing device such as a stocking device. In the latter case, the line system does not need any carry-out conveyor, and employs a carry-in conveyor only. However, the single carry-in conveyor can selectively hand over a CS to each of the plurality of main conveyors. Also, at the upstream-side end of the line system, a robot or an operator can place the CSs directly on the main conveyors, or a CS supplying device may be provided which has a plurality of CS-hand-over portions for handing over the CSs to the plurality of main conveyors, respectively. In the last case, the line system does not need any carry-in conveyor, and employs a carry-out conveyor only. However, the single carry-out conveyor can be shifted for selectively receiving a CS from each of the plurality of main conveyors.

(37) According to a thirty-seventh feature of the present invention which includes the thirty-sixth feature (36), the component holders, the holder revolving device, the holder-revolving-device moving device, the elevating and lowering device, and the component-receiving-and-mounting control device cooperate with each other to provide a component mounting unit which mounts circuit components on the circuit substrate positioned and supported by the each main conveyor. Immediately after the CC mounting unit finishes mounting CCs on a CS positioned and supported by one of the plurality of main conveyors, the CC mounting unit can start mounting CCs on a waiting CS positioned and supported by another or the other main conveyor. Thus, the CC mounting unit can mount CCs with high efficiency. Since the single CC mounting unit can mount CCs on a CS on each of the main conveyors, the present system does not need another CC mounting unit. However, the present system may employ a plurality of CC mounting units. In the latter case, while one CC mounting unit takes CCs from a CC supplying device, the other CC mounting unit can mount CCs on a CS. Thus, the CC mounting operation is not interrupted by the CC taking operation, which leads to improving the efficiency of mounting of CCs.

(38) According to a thirty-eighth feature of the present invention which includes the thirty-seventh feature (37), the plurality of main conveyors comprise two main conveyors which are arranged in the direction perpendicular to the circuit-substrate conveying direction, wherein the system comprises two the component supplying devices which are provided outside the two main conveyors such that the two main conveyors are positioned between the two component supplying devices, and wherein the system comprises two component mounting units each of which comprises the component holders, the holder revolving device, the holder-revolving-device moving device, the elevating and lowering device, and the component-receiving-and-mounting control device, and each of which receives circuit components from a corresponding one of the two component supplying devices, conveys the circuit components to above each of the two main conveyors, and mounts the circuit components on the circuit substrate positioned and supported by the each main conveyor. If the present system employs the two CC mounting units which alternately mount CCs on a CS, it can mount the CCs on the CS without any waste of time. However, it is not essentially required that two CC mounting units alternately mount CCs on a CS. For example, in the case where the present system employs a single CC mounting unit, the present system may employ two CC supplying devices each of which is of a considerably small size and supplies various sorts of CCs to the CC mounting unit. In the last case, the present system can provide a circuit which needs various sorts of CCs, while preventing an excessive increase of the distance of movement of the CC mounting unit.

(39) According to a thirty-ninth feature of the present invention which includes any one of the thirty-sixth to thirty-eighth feature (36) to (38), the circuit-component mounting system comprises both (a) the carry-in conveyor provided on an upstream side of the main conveyors in the circuit-substrate conveying direction and (b) the carry-out conveyor provided on a downstream side of the main conveyors in the circuit-substrate conveying direction, and wherein the system further comprises an upstream-side device which is provided in alignment with a reference position as one of the plurality of shift positions of the carry-in conveyor and which hands over the circuit substrate to the carry-in conveyor, and a downstream-side device which is provided in alignment with a reference position as one of the plurality of shift positions of the carry-out conveyor and which receives the circuit substrate from the carry-out conveyor. The upstream-side device may be a CS supplying device, another CC mounting system, or an applying system which applies an adhesive or a solder paste to CSs. The downstream-side device may be another CC mounting system, an adhesive curing furnace which cures or hardens the adhesive temporarily fixing the CCs to the CS, a solder reflowing furnace which reflows or melts the solder for electrically connecting the CCs to the CS. The carry-in conveyor can receive a CS at any one of the plurality of shift positions thereof, and the carry-out conveyor can hand over a CS at any one of the plurality of shift positions thereof. Thus, even in the case where the upstream-side and downstream-side devices have only a single CS-hand-over position and only a single CS-receive position in the directions of shifting of the carry-in and carry-out conveyors, respectively, the carry-in and carry-out conveyors can receive, without any problems, CSs from the upstream-side device and hand over CSs to the downstream-side device, respectively, if the upstream-side and downstream-side devices are connected to the carry-in and carry-out conveyors and the main conveyors, such that the CS-hand-over position of the upstream-side device is aligned with a reference position as one of the shift positions of the carry-in conveyor and the CS-receive position of the downstream-side device is aligned with a reference position as one of the shift positions of the carry-out conveyor.

(40) According to a fortieth feature of the present invention which includes any one of the thirty-sixth to thirty-eighth feature (36) to (38), the operation performing system comprises both (a) the carry-in conveyor provided on an upstream side of the main conveyors in the circuit-substrate conveying direction and (b) the carry-out conveyor provided on a downstream side of the main conveyors in the circuit-substrate conveying direction. If the respective CS-conveying directions of the carry-in and carry-out conveyors are reversed in addition to those of the main conveyors, then they function as the carry-out and carry-in conveyors, respectively.

(41) According to a forty-first feature of the present invention, there is provided a system comprising at least two subsystems, each according to the fortieth feature (40), which are arranged in series with each other, wherein the at least two subsystems comprise a first subsystem comprising the main conveyors as first main conveyors, the operation performing device as a first operation performing device, the carry-in conveyor as a first carry-in conveyor, the carry-out conveyor as a first carry-out conveyor, and the conveyor shifting device as a first conveyor shifting device, and a second subsystem comprising a plurality of second main conveyors each of which conveys, positions, and supports a circuit substrate, the plurality of second main conveyors being arranged in the direction perpendicular to the circuit-substrate conveying direction; a second operation performing device which performs at least one operation for the circuit substrate positioned and supported by the each second main conveyor; a second carry-in conveyor which is provided on an upstream side of the second main conveyors in the circuit-substrate conveying direction and which conveys the circuit substrate to the each second main conveyor and loads the circuit substrate thereon; a second carry-out conveyor which is provided on a downstream side of the second main conveyors in the circuit-substrate conveying direction and which loads the circuit substrate off the each second main conveyor and conveys the circuit substrate away therefrom; and a second conveyor shifting device which selectively shifts each of the carry-in conveyor and the carry-out conveyor to one of a plurality of shift positions at each of which the each conveyor is aligned with a corresponding one of the second main conveyors. In the present system, the carry-out conveyor of the upstream-side subsystem hands over CSs to the carry-in conveyor of the downstream-side subsystem. Each of the carry-out conveyor and the carry-in conveyor can be selectively shifted to one of the plurality of shift positions thereof, so that the carry-out conveyor being positioned at a desired one of its shift positions can hand over a CS to the carry-in conveyor being positioned at a desired one of its shift positions. Thus, it is not required that the carry-out conveyor be positioned at a predetermined one of its shift positions for handing over a CS or that the carry-in conveyor be positioned at a predetermined one of its shift positions for receiving the CS. That is, the carry-out conveyor can hand over a CS at one of its shift positions, and/or the carry-in conveyor can receive the CS at one of its shift positions, which position or positions can be selected depending upon the sorts of the respective operations performed by the first and second subsystems and/or the degree of progress of those operations. Thus, the present system enjoys improved degree of freedom.

(42) According to a forty-second feature of the present invention which includes any one of the thirty-sixth to thirty-eighth feature (36) to (38), the operation performing system comprises (a) the carry-in conveyor and (b) the carry-out conveyor which comprise a carry-in and carry-out conveyor which is provided on an upstream side of the main conveyors in the circuit-substrate conveying direction. The carry-in and carry-out conveyor can convey CSs in both a forward direction and a backward direction. When it conveys CSs in the forward direction, it functions as a carry-in conveyor; and when it conveys CSs in the backward direction, it functions as a carry-out conveyor. The present system is particularly advantageous in a special case where a CS must be carried out to the same side as that from which the CS is carried in.

(43) According to a forty-third feature of the present invention which includes any one of the thirty-ninth to forty-first features (39) to (41), the operation performing system comprises both (a) the carry-in conveyor provided on an upstream side of the main conveyors in the circuit-substrate conveying direction and (b) the carry-out conveyor provided on a downstream side of the main conveyors in the circuit-substrate conveying direction, wherein the conveyor shifting device comprises a carry-in-conveyor shifting device which shifts the carry-in conveyor, independent of the carry-out conveyor, and a carry-out-conveyor shifting device which shifts the carry-out conveyor, independent of the carry-in conveyor. Alternatively, it is possible to employ the conveyor shifting device which simultaneously shifts both the carry-in and carry-out conveyors. However, if the carry-in and carry-out conveyors can be shifted independent of each other, the present system can enjoy improved degree of freedom.

(44) According to a forty-fourth feature of the present invention which includes any one of the thirty-sixth to forty-third features (36) to (43), the conveyor shifting device comprises a conveyor support member which supports the at least one of the carry-in conveyor and the carry-out conveyor, and a fluid-pressure-operated cylinder device which shifts the conveyor support member. Since the fluid-pressure-operated cylinder device is employed, the conveyor shifting device which can quickly shift the carry-in and/or carry-out conveyors can be produced at low cost.

(45) According to a forty-fifth feature of the present invention which includes the forty-fourth feature (44), the fluid-pressure-operated cylinder device comprises a rodless cylinder device which extends over the shift positions of the at least one of the carry-in conveyor and the carry-out conveyor. The conveyor shifting device which employs the rodless cylinder device enjoys a simpler construction than a conveyor shifting device which employs a fluid-pressure-operated cylinder having a piston rod.

(46) According to a forty-sixth feature of the present invention which includes any one of the thirty-sixth to forty-third features (36) to (43), the conveyor shifting device comprises a conveyor support member which supports the at least one of the carry-in conveyor and the carry-out conveyor, and a drive device including an electric motor which shifts the conveyor support member. The electric motor may be a rotary motor, or a linear motor. The rotary motor may be a servomotor or a stepper motor which can be accurately controlled with respect to its rotation angle or position. The rotary motor linear moves the conveyor support member via, e.g., a motion converting device including a threaded shaft and a nut.

(47) According to a forty-seventh feature of the present invention which includes any one of the thirty-sixth to forty-sixth features (36) to (46), each of the main conveyors comprises a circuit-substrate positioning and supporting device which positions and supports the circuit substrate at a position away from a circuit-substrate conveying plane in which the each main conveyor conveys the circuit substrate. The circuit-substrate positioning and supporting device can surely position and support the CS.

(48) According to a forty-eighth feature of the present invention which includes the forty-seventh feature (47), each of the main conveyors comprises at least one conveyor belt which supports and conveys the circuit substrate, and the main conveyors comprise a common belt-driving device which simultaneously moves the conveyor belts of the main conveyors. Since the circuit-substrate positioning and supporting device positions and supports the CS at a position away from the CS conveying plane, the CS for which the operation is being performed is not moved even if the respective conveyor belts of the main conveyors are simultaneously moved. In addition, since the common belt-driving device is employed, the present system can be produced at low cost.

(49) According to a forty-ninth feature of the present invention which includes any one of the thirty-ninth to forty-first and forty-third to forty-eighth features (39) to (41) and (43) to (48), each of the main conveyors, the carry-in conveyor, and the carry-out conveyors comprises a pair of side frames including at least one movable side frame which is movable toward, and away from, the other side frame, and wherein the system further comprises a width changing device which simultaneously changes a circuit-substrate conveying width defined by the pair of side frames of the each of the main conveyors, the carry-in conveyor, and the carry-out conveyor, by moving the movable side frame of the each conveyor relative to the other side frame thereof.

(50) According to a fiftieth feature of the present invention which includes any one of the thirty-ninth to forty-first and forty-third to forty-eighth features (39) to (41) and (43) to (48), each of the main conveyors, the carry-in conveyor, and the carry-out conveyor comprises a pair of side frames including at least one movable side frame which is movable toward, and away from, the other side frame, and wherein the system further comprises a width changing device which simultaneously changes a circuit-substrate conveying width defined by the pair of side frames of each of the carry-in conveyor and the carry-out conveyors, by moving the movable side frame of the each conveyor relative to the other side frame thereof; and a frame connecting device which connects, when the width changing device changes the respective circuit-substrate conveying widths of the carry-in and carry-out conveyors, the respective movable side frames of the main conveyors to the respective movable side frames of the carry-in and carry-out conveyors so that the respective movable side frames of the main conveyors and the carry-in and carry-out conveyors are movable as a unit. The frame connecting device may include a connection member which selectively takes one of an operative position where the connection member connects the respective movable side frames of the main conveyors to the respective movable side frames of the carry-in and carry-out conveyors, and an inoperative position where the connection member does not. The connection member may be one which is manually operable by an operator for being positioned at operator's selected one of the operative and inoperative positions, or one which is driven by a connection-member driving device for being automatically positioned at one of the two positions.

(51) According to a fifty-first feature of the present invention which includes the forty-ninth or fiftieth feature (49) or (50), the width changing device comprises a carry-in-conveyor-side drive shaft which is provided corresponding to the carry-in conveyor and which extends over at least the shift positions thereof; a carry-out-conveyor-side drive shaft which is provided corresponding to the carry-out conveyor and which extends over at least the shift positions thereof; a carry- in-conveyor-side driven rotatable member which is held by the carry-in conveyor such that the carry-in-conveyor-side driven rotatable member is rotatable about an axis line thereof, and is not movable in an axial direction thereof, relative to the carry-in conveyor and which is engaged with the carry-in-conveyor-side drive shaft such that the carry-in-conveyor-side driven rotatable member is not rotatable about the axis line thereof, and is movable in the axial direction thereof, relative to the carry-in-conveyor-side drive shaft; a carry-out-conveyor-side driven rotatable member which is held by the carry-out conveyor such that the carry-out-conveyor-side driven rotatable member is rotatable about an axis line thereof, and is not movable in an axial direction thereof, relative to the carry-out conveyor and which is engaged with the carry-out-conveyor-side drive shaft such that the carry-out-conveyor-side driven rotatable member is not rotatable about the axis line thereof, and is movable in the axial direction thereof, relative to the carry-out-conveyor-side drive shaft; a carry-in-conveyor-side motion converting device which converts the rotation of the carry-in-conveyor-side driven rotatable member into the movement of the movable side frame of the carry-in conveyor; and a carry-out-conveyor-side motion converting device which converts the rotation of the carry-out-conveyor-side driven rotatable member into the movement of the movable side frame of the carry-out conveyor. Even if the carry-in or carry-out conveyor is shifted, the driven rotatable member of the carry-in or carry-out conveyor remains engaged with the corresponding drive shaft. Thus, the CS conveying widths of the carry-in and carry-out conveyors can be changed by the rotation of the driven rotatable members thereof, irrespective of which shift positions are currently taken by the conveyors, respectively.

(52) According to a fifty-second feature of the present invention which includes the fifty-first feature (51), the width changing device further comprises a width-changing-rotation producing device; and a rotation transmitting device which transmits the rotation of the width-changing-rotation producing device to the carry-in-conveyor-side drive shaft and the carry-out-conveyor-side drive shaft. In the present system, the single width-changing-rotation producing device is commonly used by the carry-in and carry-out conveyors, and the CS conveying widths of the two conveyors are simultaneously changed. In addition, the carry-in and carry-out conveyors can be shifted independent of each other.

(53) According to a fifty-third feature of the present invention which includes the fifty-second feature (52), the width changing device further comprises a main-conveyor-side driven rotatable member which is provided for at least one of the main conveyors such that the main-conveyor-side driven rotatable member is rotatable about an axis line thereof, and is not movable in an axial direction thereof, relative to the at least one main conveyor; and a motion converting device which converts the rotation of the main-conveyor-side driven rotatable member into the movement of the movable side frame of the at least one main conveyor. It is possible to employ a driven rotatable member and a motion converting device for each of the main conveyors, and operate the respective motion converting devices in synchronism with each other for simultaneously moving the respective movable side frames of the main conveyors. Alternatively, it is possible to employ no driven rotatable member or no motion converting device for at least one of the main conveyors, and employ a connection member for connecting the movable side frame of the one main conveyor to that of another or the other main conveyor which has its driven rotatable member and motion converting device.

(54) According to a fifty-fourth feature of the present invention which includes any one of the thirty-sixth to fifty-third features (36) to (53), each of the main conveyors and the at least one of the carry-in and carry-out conveyors comprises at least one conveyor belt which supports and conveys the circuit substrate, and where the main conveyors comprise a first belt-driving device which simultaneously drives the conveyor belts of the main conveyors, independent of the conveyor belt of the at least one of the carry-in and carry-out conveyors, and the at least one of the carry-in and carry-out conveyors comprises a second belt-driving device which drives the conveyor belt of the at least one of the carry-in and carry-out conveyors, independent of the conveyor belts of the main conveyors. Since the present system employs the exclusive belt-driving device for the main conveyors, and the exclusive belt-driving device for the at least one of the carry-in and carry-out conveyors, the conveyor belts of the main conveyors can be driven independent of the conveyor belts or belt of the carry-in and/or carry-out conveyors. Thus, the present system enjoys improved degree of freedom.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 25 is a time chart indicating timings at which the movement of an X-Y robot, the rotation of an intermittent-rotation body, the rotation and upward and downward movements of a CC suction shaft, the feeding of CC-carrier tapes by feeders, and the CC-image taking of a CC-image pick-up device are carried out by the CC mounting system of FIG. 1 for sucking CCs, taking the images of the CCs, transferring the CCs, and mounting the CCs on a CS;

FIG. 26 is a table indicating respective operation states of a main air cylinder 930, a main air cylinder 974, and an auxiliary air cylinder 984 of the switch-valve control device which are selected in response to respective drive commands supplied to the cylinders 930, 974, 984 for carrying out a CC sucking operation and two sorts of CC mounting operations;

FIG. 30 is a table indicating respective rotation-position error angles, image-based recognized angles, rotation-position-error correcting angles, rotation-position changing angles, and summed CC-suction-shaft rotating angles for the manner in which the mounting of some of the twenty CCs held by the CC mounting head and the taking of images of other CCs are concurrently carried out;

FIG. 31 is a table indicating respective rotation-position error angles, image-based recognized angles, rotation-position-error correcting angles, rotation-position changing angles, and summed CC-suction-shaft rotating angles for the manner in which the mounting of the twenty CCs is carried out after the taking of images of all the CCs are finished;

FIG. 32 is a table indicating respective rotation-position error angles, image-based recognized angles, rotation-position-error correcting angles, rotation-position changing angles, and summed CC-suction-shaft rotating angles for the manner in which the mounting of some of the seventeen CCs held by the CC mounting head and the taking of images of other CCs are concurrently carried out;

DETAILED DESCRIPTION OF THE PREFERRED EMBODIMENTS

Figure 42:
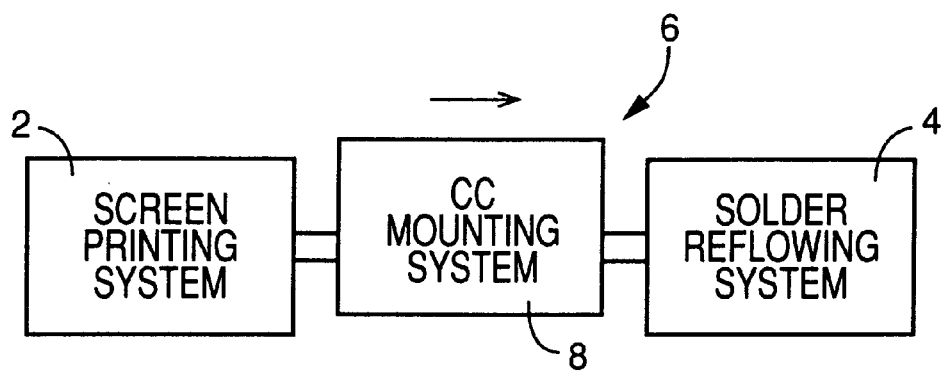
FIG. 42 is a schematic view of an electronic-circuit assembly line including the CC mounting system of FIG. 1.

Referring first to FIGS. 1 to 32 and 42, there will be described a circuit component ("CC") mounting system 8 which is, as shown in FIG. 42, part of an electronic-circuit ("EC") assembly line 6 to which the present invention is applied. The CC mounting system 8 or the EC assembly line 6 is a printed-circuit-board-related-operation performing system as a sort of circuit-substrate-related-operation performing system.

The EC assembly line 6 includes, in addition to the CC mounting system 8, a screen printing system 2 as an upstream-side device provided upstream of the CC mounting system 8 in a direction, indicated at arrow, in which circuit substrates ("CS") are conveyed, and a solder reflowing system 4 as a downstream-side device provided downstream of the CC mounting system 8. The screen printing system 2 is a sort of solder-paste applying system which applies solder paste to each CS, that is, prints the solder paste on the CS, for providing a printed circuit board ("PCB") on which CCs are mounted by the CC mounting system 8. The solder reflowing system 4 includes a reflowing furnace, and reflows or melts the solder paste on the PCB, for electrically connecting the CCs to the PCB.

The CC mounting system 8 will be described below.

Figure 1:
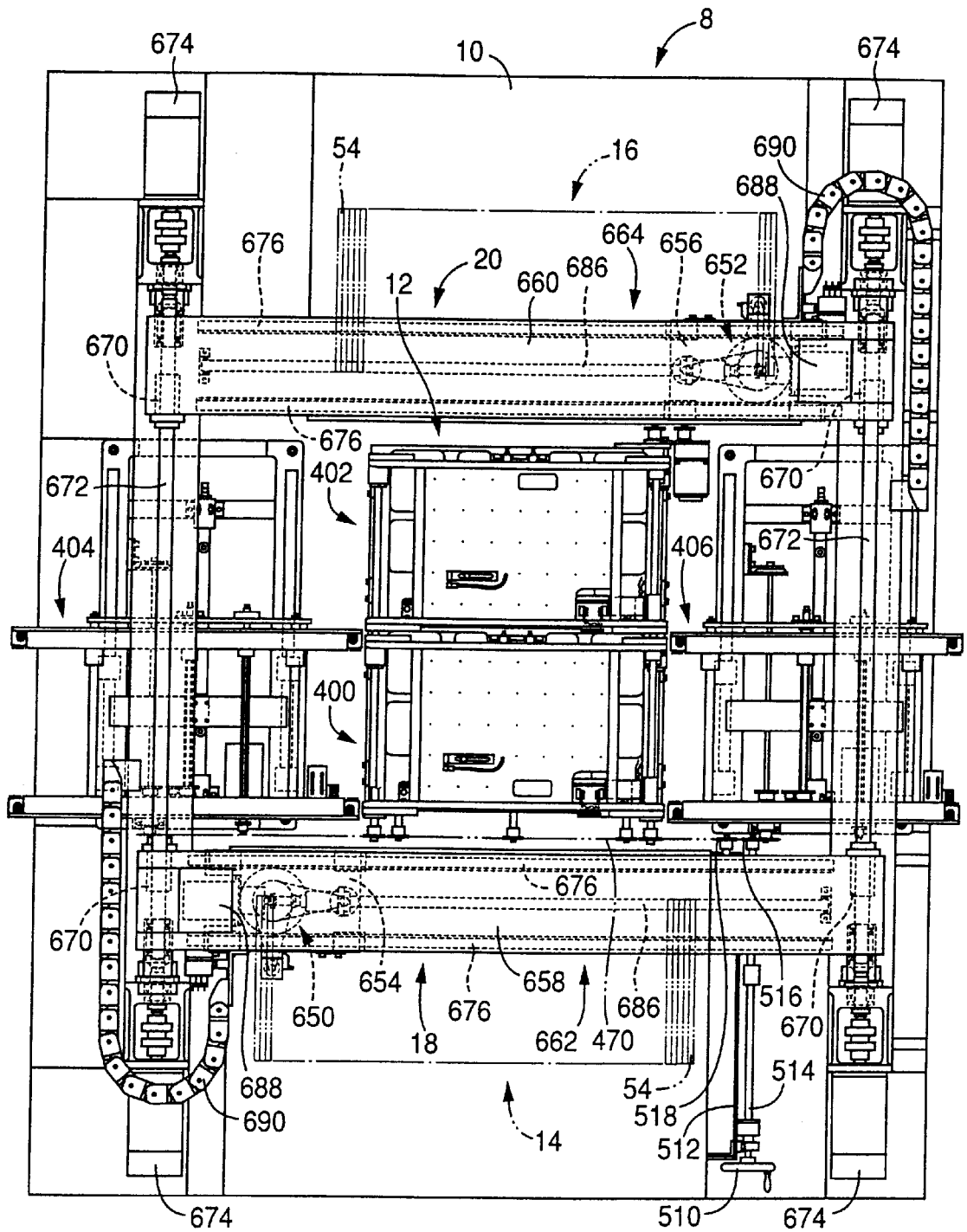
FIG. 1 is a plan view of a circuit-component ("CC") mounting system to which the present invention is applied.

In FIG. 1, reference numeral 10 designates a base 10. On the base 10, a PCB conveying device 12, two CC supplying devices 14, 16, and two CC mounting devices 18, 20 are provided. The PCB conveying device 12 includes two main conveyors 400, 402, a single carry-in conveyor 404, and a single carry-out conveyor 406. The two main conveyors 400, 402 are juxtaposed, that is, provided side by side, in a direction (Y direction) perpendicular to a direction (X direction) in which PCBs 408 (FIG. 3) as CSs are conveyed. The X direction, that is, the PCB conveying direction is the direction from the left-hand side to the right-hand side in FIG. 1.

The carry-in conveyor 404 will be described below.

Figure 2:
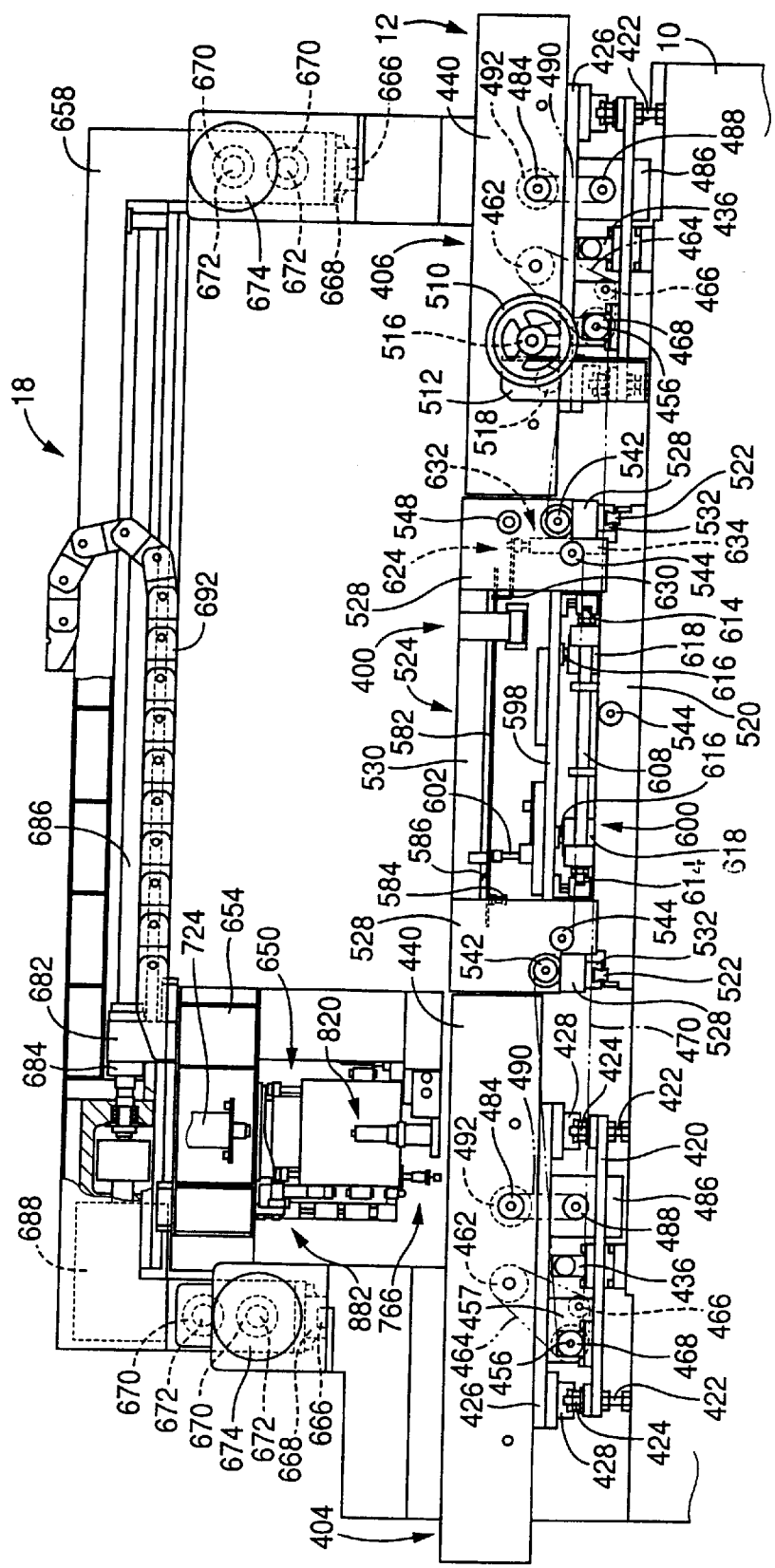
FIG. 2 is a front elevation view of a circuit-substrate ("CS") conveyor device which provides part of the CC mounting system of FIG. 1.
Figure 4:
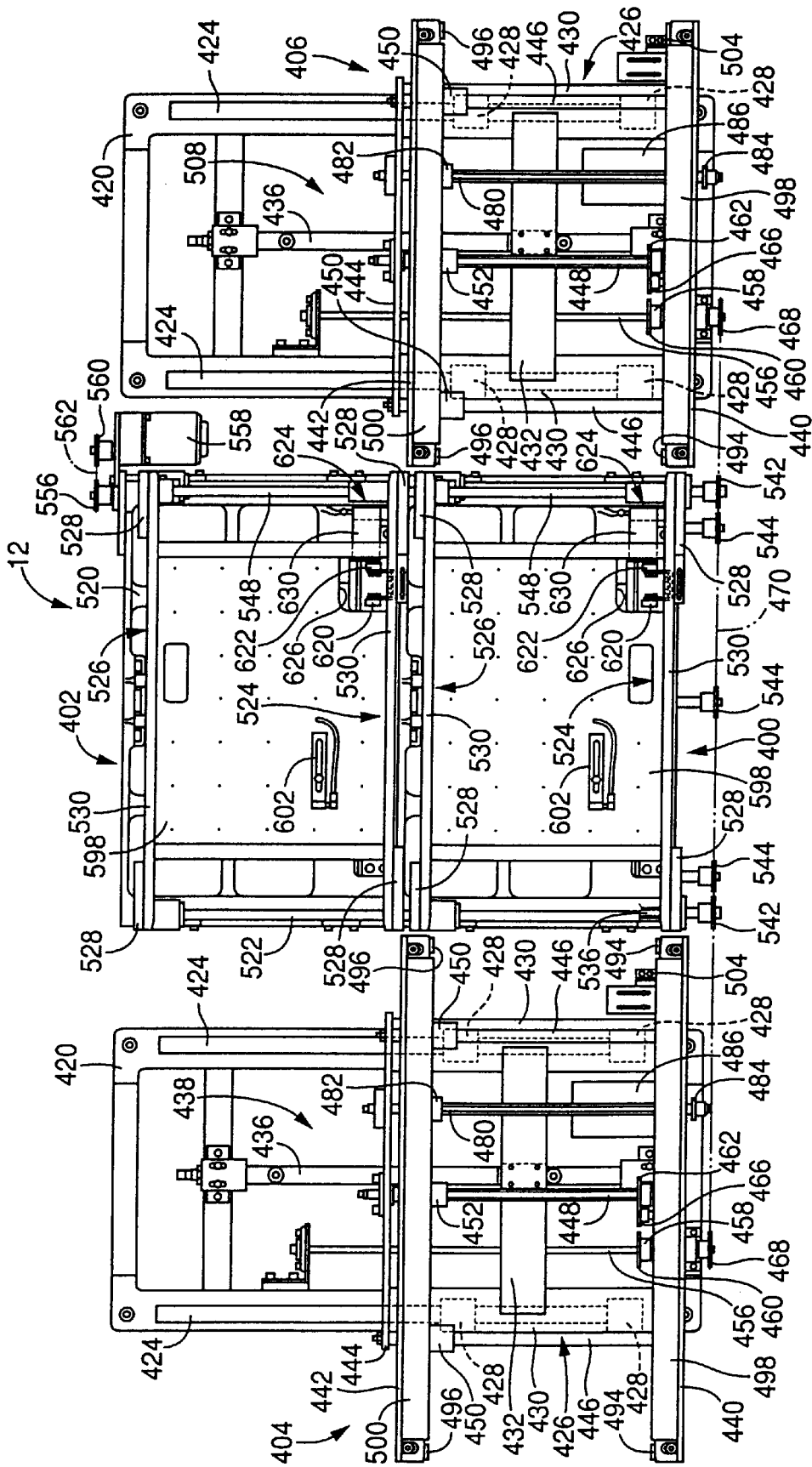
FIG. 4 is a plan view of the CS conveyor device.

As shown in FIG. 2, the carry-in conveyor 404 includes a guide support table 420 as a stationary member which is provided on the base 10 such that the height position of the support table 420 can be adjusted by a plurality of adjustor bolts 422 as height-position adjusting members. As shown in FIG. 4, the support table 420 is a frame-like member having a rectangular shape and a central opening, and has a length sufficient to be adjacent to both the two main conveyors 400, 402. Two straight guide rails 424 as guide members are fixed to a pair of opposite sides of the support table 420, respectively, such that the guide rails 424 extend parallel to the Y direction. As shown in FIGS. 2 and 4, a conveyor support table 426 is fit on the two guide rails 424 via four guide blocks 428 as guided members. The guide rails 424 and the guide blocks 428 cooperate with each other to provide a guiding device. The carry-in conveyor 404 is provided on the support table 426.

The conveyor support table 426 has a frame-like shape having a rectangular shape and a central opening. As shown in FIG. 4, the support table 426 includes a pair of side portions 430 which are parallel to the Y direction, and a connection member 432 which connects the two side portions 430. The support table 426 is fixed, at a longitudinally middle portion of the connection member 432 thereof, to a movable member (not shown) of a rodless cylinder 436 that is an air-pressure-operated cylinder having no piston rod. The movable member of the rodless cylinder 436 that is integral with a piston thereof airtightly projects outward from a housing thereof, and the connection member 432 is fixed to the movable member. The rodless cylinder 436 is provided on the guide support table 420 such that the cylinder 436 extends parallel to the Y direction. When the conveyor support table 426 is moved by the rodless cylinder 436, the carry-in conveyor 404 is moved to a first shift position where the conveyor 404 is aligned with the first main conveyor 400 and to a second shift position where the conveyor 404 is aligned with the second main conveyor 402. The conveyor support table 426 and the rodless cylinder 436 cooperate with each other to provide a carry-in-conveyor shifting device 438. A stroke-end sensor (not shown) identifies which position the carry-in conveyor 404 is taking, the first or second shift position, by detecting the current position of the piston of the rodless cylinder 436, i.e., identifying whether the piston has been moved to its stroke end.

As shown in FIG. 4, the carry-in conveyor 404 includes a fixed frame 440 and a movable frame 442 each as a side frame. The two side frames 440, 442 have an elongate shape longer than the dimension of the conveyor support table 426 in the PCB conveying direction. The fixed frame 440 is fixed to one end portion of the support table 426 which portion extends parallel to the PCB conveying direction, so that the fixed frame 440 extends parallel to the PCB conveying direction. The movable frame 442 is so provided as to extend parallel to the PCB conveying direction, and is attached to the support table 426 such that the movable frame 442 is movable in the Y direction perpendicular to the PCB conveying direction, toward, and away from, the fixed frame 440.

The conveyor support table 426 includes another or second end portion opposite to its one end portion to which the fixed frame 440 is fixed. The second end portion provides a support portion 444 which extends parallel to the PCB conveying direction. Opposite ends of each of a pair of straight guide rails 446 as guide members are fixed to the fixed frame 440 and the support portion 444, respectively. In addition, opposite ends of a threaded shaft 448 are rotatably supported by the two members 440, 444, respectively. The two guide rails 446 and the threaded shaft 448 extend parallel to the direction of movement of the movable frame 442, which fits on the two guide rails 446 via respective guide blocks 450 fixed thereto as guided members and fits on the threaded shaft 448 via a nut 452 fixed thereto. The threaded shaft 448 and the nut 452 cooperate with steel balls (not shown) to provide a ball screw. Therefore, when the threaded shaft 448 is rotated, the movable frame 442 is moved toward, or away from, the fixed frame 440 by being guided by the guide rails 446.

As shown in FIG. 4, the guide support table 420 supports a spline shaft 456 such that the spline shaft 456 is rotatable about an axis line parallel to the Y direction. As shown in FIGS. 2 and 4, the spline shaft 456 extends over the first and second shift positions of the carry-in conveyor 404, and is positioned below the fixed and movable frames 400, 442. A spline tube or a spline member 458 which is attached via a bracket 457 (FIG. 2) to the fixed frame 440 such that the spline member 458 is rotatable relative thereto and is not axially movable relative thereto, fits on the spline shaft 456 such that the spline member 458 is not rotatable relative thereto and is axially movable relative thereto. The spline member 458 has a spline hole which spline-fits on the spline shaft 456, and is meshed with the spline shaft 456 via balls. The spline member 458 and the spline shaft 456 cooperate with each other to provide a ball spline. A sprocket 460 is provided as an integral part of the spline member 458. A chain 464 (shown in FIG. 2 but not shown in FIG. 4) is wound on the sprocket 460 and another sprocket 462 fixed to the threaded shaft 448, so that the rotation of the spline shaft 456 is transmitted to the threaded shaft 448. Reference numeral 466 designates a tension sprocket.

As shown in FIGS. 2 and 4, a sprocket 468 is fixed to an end portion of the spline shaft 456 which portion projects outward from the fixed frame 440 in a direction away from the movable frame 442. When a chain 470 wound on the sprocket 468 is moved, the spline shaft 456 is rotated, so that the threaded shaft 448 is rotated and the movable frame 442 is moved. Thus, the Y-direction width (hereinafter, referred to as the "PCB conveying width") of the carry-in conveyor 404 is adjustable to that of the PCB 408. When the carry-in conveyor 404 is shifted by the movement of the conveyor support table 426, the sprocket 460 fixed to the spline member 458 is moved with the fixed frame 440 relative to the spline shaft 456, in the axial direction of the shaft 456, in such a manner that the sprocket 460 remains spline-fit on the shaft 456 and accordingly the rotation of the sprocket 460 can be transmitted to the threaded shaft 448. Therefore, whether the carry-in conveyor 404 may take the first or second shift position, the rotation of the sprocket 460 can be transmitted to the threaded shaft 448, so that the PCB conveying width of the carry-in conveyor 404 can be adjusted.

The adjusting of PCB conveying width of the carry-in conveyor 404 is carried out simultaneously with the adjusting of PCB conveying width of the main conveyors 400, 402 and the carry-out conveyor 406. The chain 470 and its drive source will be described later.

As shown in FIG. 4, the fixed frame 440 and the support portion 444 of the conveyor support table 426 respectively support opposite end portions of a spline shaft 480 as a rotation transmitting shaft which extends parallel to the Y direction, such that the spline shaft 480 is rotatable about an axis line thereof. One of the two end portions of the spline shaft 480 which is nearer to the movable frame 442 fits in a spline tube or a spline member 482 such that the spline shaft 480 is not rotatable relative to the spline member 482 and is movable relative to the member 482 in the axial direction of the shaft 480. The spline member 482 is attached to the movable frame 442 such that the spline member 482 is rotatable relative to the frame 442 and is not movable relative to the frame 442 in the axial direction of the shaft 480. The spline member 482 and the spline shaft 480 cooperate with each other to provide a ball spline. A sprocket 484 is fixed to an end portion of the spline shaft 480 which portion projects outward from the fixed frame 440 in a direction away from the movable frame 442. As shown in FIG. 2, the sprocket 484 is connected via a chain 490 to a sprocket 488 fixed to an output shaft of a PCB conveying motor 486 as a belt driving device. The PCB conveying motor 486 as an electric rotary motor as a sort of an electric motor is an induction motor as a sort of AC three-phase motor.

A conveyor belt (not shown) is wound on a pulley 492 (FIG. 2) provided as a part integral with one of the two end portions of the spline shaft 480 which is nearer to the fixed frame 440, and a plurality of pulleys 494 (only two pulleys 494 are shown in FIG. 4) attached to the fixed frame 440. Another conveyor belt (not shown) is wound on a pulley (not shown) provided as a part integral with the spline member 482, and a plurality of pulleys 496 (only two pulleys 496 are shown in FIG. 4) attached to the movable frame 442. Therefore, when the PCB conveying motor 486 is actuated, the spline shaft 480 is rotated and accordingly the pulleys 492, 494, 496, etc. are rotated, so that the pair of conveyor belts are moved and the PCB 408 supported on the belts is conveyed or fed forward. The PCB conveying motor 486 which is attached to the conveyor support table 426 is moved with the carry-in conveyor 404, so that whether the carry-in conveyor 404 may take the first or second shift position, the motor 486 can function as the drive source which conveys the PCB 408.

When the PCB 408 is conveyed, opposite end faces of the PCB 408 in the Y direction, i.e., in the widthwise direction thereof are guided by respective vertical guide surfaces of elongate guide members 498, 500 (FIG. 4) which are fixed to the fixed and movable frames 440, 442, respectively. Each of the guide members 498, 500 includes a hold-down portion which projects over the corresponding conveyor belt and prevents the PCB 408 from jumping off the belt.

As shown in FIG. 4, a PCB-arrival sensor 504 which detects the PCB 408 being conveyed is attached to a downstream-side portion of the fixed frame 440 in the PCB conveying direction. The PCB-arrival sensor 504 is a reflection-type photoelectric sensor including a light emitter and a light detector. However, the sensor 504 may be provided by a transmission-type photoelectric sensor including a light emitter and a light detector, a limit switch, a proximity switch, or the like.

The carry-out conveyor 406 has the same construction as that of the carry-in conveyor 404, and accordingly the same reference numerals as used for the carry-in conveyor 404 are used to designate the corresponding elements or parts of the carry-out conveyor 406 and the description thereof is omitted. It is noted that the conveyor support table 426 and the rodless cylinder 438 of the carry-out conveyor 406 cooperate with each other to provide a carry-out-conveyor shifting device 508 which shifts the carry-out conveyor 406 between its first and second shift positions. Thus, each one of the carry-in and carry-out conveyors 404, 406 can be shifted by a corresponding one of the carry-in-conveyor and carry-out-conveyor shifting devices 438, 508, independent of the other conveyor.

As shown in FIG. 1, a handle 510 as a PCB-conveying-width adjusting member is provided near to the carry-out conveyor 406. A rotatable shaft 514 is attached via a bracket 512 to the base 10 such that the shaft 514 is rotatable about an axis line parallel to the Y direction. The handle 510 is fixed to one end portion of the rotatable shaft 514, and a sprocket 516 on which the chain 470 is wound is fixed to the other end portion of the shaft 514. The chain 470 is also wound on a sprocket 518 which is attached to the bracket 512 such that the sprocket 518 is rotatable about an axis line.

Next, there will be described the main conveyors 400, 402. Since the two main conveyors 400, 402 have substantially the same construction, the first main conveyor 400 will be mainly described below.

As shown in FIGS. 2 and 4, a conveyor support table 520 as a stationary member is fixed to the base 10 at a position between the carry-in and carry-out conveyors 404, 406. The conveyor support table 520 has a Y-direction dimension corresponding to the two main conveyors 400, 402, and two straight guide rails 522 (FIG. 2) as guide members are fixed to respective end portions of the support table 520, such that the guide rails 522 extend parallel to the Y direction.

The main conveyor 400 includes, as side frames, a fixed frame 524 and a movable frame 526. The fixed frame 524 shown in FIG. 2 as a representative of the two frames 524, 526 has a gate-like shape including a pair of leg portions 528 and a connection portion 530, and is fixed via the leg portions 528 to the support table 520. Two guide blocks 532 as guided members are fixed to the two leg portions 528 of the movable frame 526, respectively, and fit on the two guide rails 522, respectively, such that the movable frame 526 is movable relative to the fixed frame 524. The guide blocks 532 and the guide rails 522 cooperate with each other to provide a guiding device.

Figure 5:
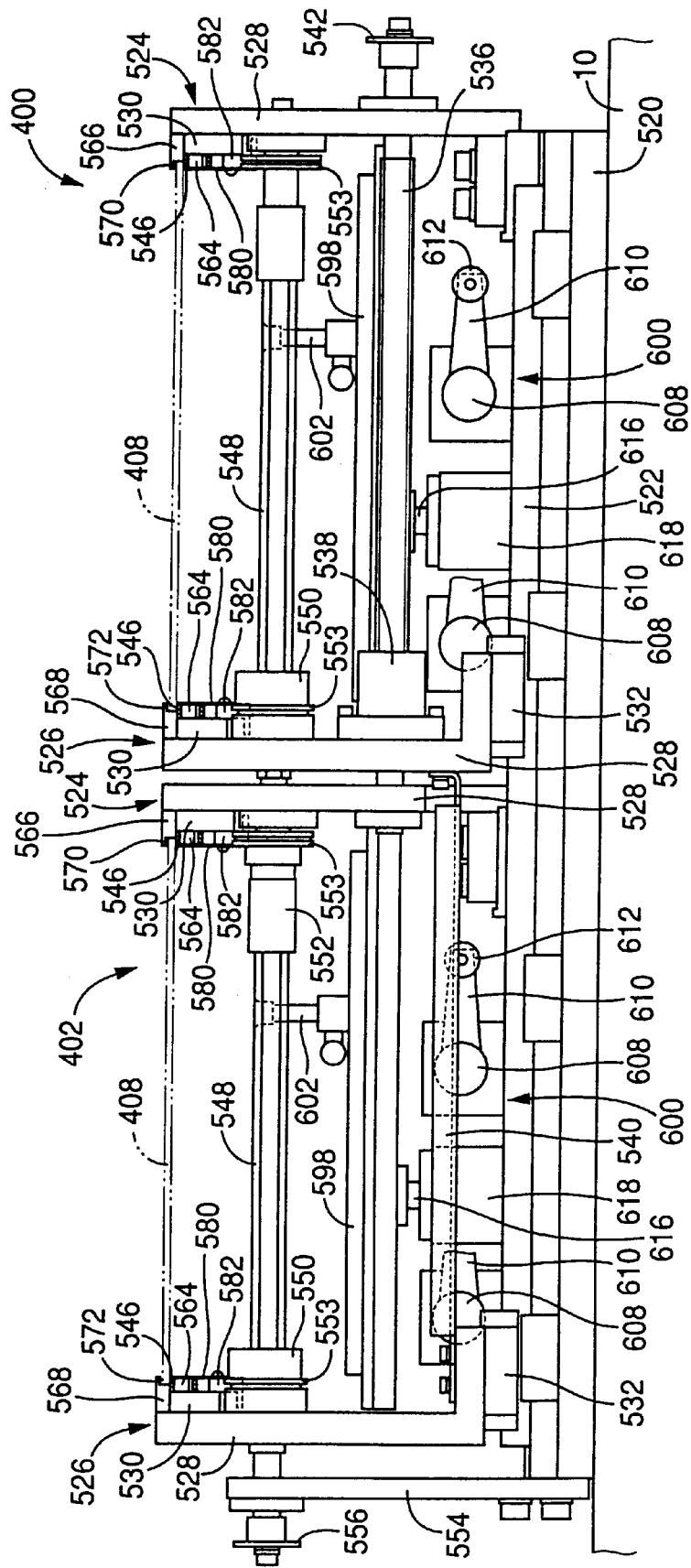
FIG. 5 is a side elevation view of two main conveyors which provide part of the CS conveyor device.

As shown in FIGS. 4 and 5, the two leg portions 528 of the fixed frame 524 of the main conveyor 400 support respective threaded shafts 536 (only one 536 is shown in FIG. 4) such that the threaded shafts 536 are rotatable relative to the fixed frame 524 and is not movable relative to the same 524 in the axial direction of the shafts 536. As shown in FIG. 5, the threaded shafts 536 are threadedly engaged with respective nuts 538 which are fixed to opposite end portions of the movable frame 526 of the first main conveyor 400 in the PCB conveying direction. Respective end portions of the threaded shafts 536 which project from the movable frame 526 of the first main conveyor 400 are rotatably supported by the fixed frame 524 of the second main conveyor 402. Each of the threaded shafts 536 cooperates with a corresponding one of the nuts 538 to provide a ball screw. The respective movable frames 526 of the two main conveyors 400, 402 are connected to each other by a connection member 540, so that the two movable frames 526 are moved with each other as a unit.

Figure 6:
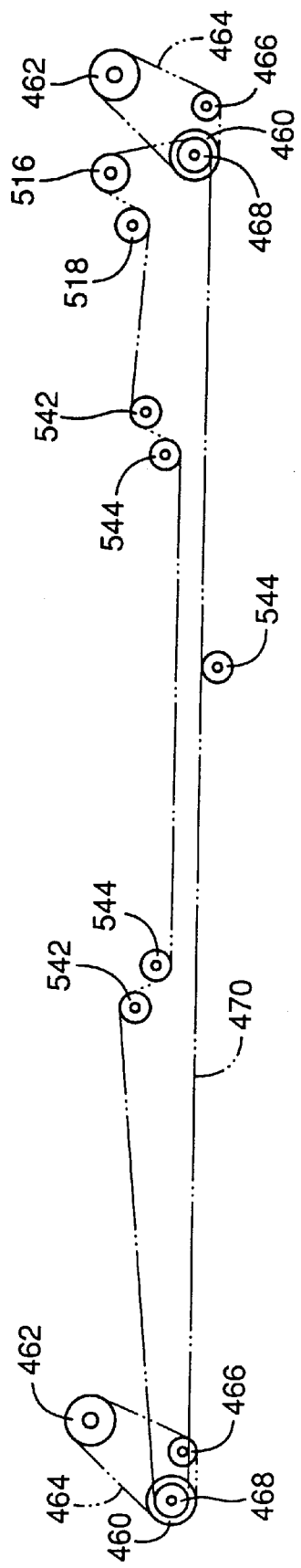
FIG. 6 is a view showing chains and sprockets for adjusting respective CS conveying widths of a carry-in conveyor, two main conveyors, and a carry-out conveyor of the CS conveyor device.

As shown in FIGS. 2 and 5, two sprockets 542 are fixed to respective end portions of the threaded shafts 536 which project outward from the fixed frame 524 of the main conveyor 400. As shown in FIGS. 2 and 6, the chain 470 are wound on the sprockets 542, and a plurality of sprockets 544 which are attached to the conveyor support table 520 and the fixed frame 524. Therefore, when the handle 510 is rotated by an operator, the chain 470 is moved and the two threaded shafts 536 of the main conveyor 400 are rotated, and simultaneously the respective spline shafts 456 of the carry-in and carry-out conveyors 404, 406 are rotated and accordingly the respective threaded shafts 448 are rotated. Consequently the respective movable frames 442, 526 of the four conveyors 400, 402, 404, 406 are moved by the same distance in the same direction. Thus, the four conveyors 400–406 are simultaneously adjusted to the same PCB conveying width. Since the respective movable frames 526 of the two main conveyors 400, 402 are connected to each other by the connection member 540, the movable frame 526 of the second main conveyor 402 is also moved when the movable frame 526 of the first main conveyor 400 is moved by the rotation of the threaded shafts 536.

An endless conveyor belt 546 (FIG. 5) is wound on a plurality of pulleys (not shown) which are attached to opposite end portions of an inner vertical surface of the connection portion 530 of the fixed frame 524 in the PCB conveying direction, and another endless conveyor belt 546 is wound on a plurality of pulleys (not shown) which are attached to opposite end portions of an inner vertical surface of the connection portion 530 of the movable frame 526 in the PCB conveying direction. The respective inner vertical surfaces of the connection portions 530 of the fixed and movable frames 524, 526 are opposed to each other. The conveyor belts 546 are moved when a spline shaft 548 which is rotatably supported by the fixed and movable frames 524, 526 is rotated.

As shown in FIG. 5, the spline shaft 548 of the first main conveyor 400 is rotatably supported by the fixed frame 524 of the same 400. A spline tube or a spline member 550 is attached to the movable frame 526 such that the spline member 550 is rotatable relative to the frame 526 and is not movable relative to the same 526 in the axial direction of the shaft 548. The spline member 550 fits on the spline shaft 548 such that the spline member 550 is not rotatable relative to the shaft 548 and is movable relative to the same 548 in the axial direction of the same 548. The spline member 550 and the spline shaft 548 cooperate with each other to provide a ball spline. A pulley 553 is provided as a part integral with one end portion of the spline shaft 548 which is nearer to the fixed frame 524, and another pulley 553 is provided as a part integral with the spline member 550. One conveyor belt 546 is wound on one pulley 553, and the other conveyor belt 546 is wound on the other pulley 553. The spline shaft 548 projects from the movable frame 526 of the first main conveyor 400, and is rotatably supported by the fixed frame 524 of the second main conveyor 402. A first pulley 553 of the second main conveyor 402 is provided as a part integral with the projecting end portion of the spline shaft 548, and a first conveyor belt 546 of the second main conveyor 402 is wound on the first pulley 553. The spline shaft 548 of the first main conveyor 400 is connected to a spline shaft 548 of the second main conveyor 402 by a coupling member 552, so that the two spline shafts 548 are rotated as a unit.

As shown in FIG. 5, an end portion of the spline shaft 548 of the second main conveyor 402 projects outward from the movable frame 526, and the projecting end portion of the spline shaft 548 is rotatably supported by a support member 554 fixed to the conveyor support table 520. A sprocket 556 is fixed to the projecting end portion of the spline shaft 548, and is connected via a chain 562 to a sprocket 560 (FIG. 4) fixed to an output shaft of a PCB conveying motor 558 attached to the support member 554. The PCB conveying motor 558 as an electric rotary motor as a sort of electric motor is a speed-controllable motor as a sort of AC three-phase motor. A second pulley 553 of the second main conveyor 402 is provided as a part integral with a spline member 550 which fits on the spline shaft 548, and a second conveyor belt of the second main conveyor 402 is wound on the second pulley 553.

Therefore, when the PCB conveying motor 558 is actuated, the two spline shafts 548 are rotated as a unit, and the pulleys 553 of the first main conveyor 400 are rotated, so that the conveyor belts 546 of the first main conveyor 400 are moved and the PCB 408 supported there on is conveyed. When the conveyor belts 546 are moved, the belts 546 are guided by two belt guides 564 (FIG. 5) which are fixed to the fixed and movable frame 524, 526, respectively. When the PCB 408 is conveyed, opposite ends of the PCB 408 in the Y direction are guided by respective vertical guide surfaces of two guide members 566, 568 which are fixed to the fixed and movable frames 524, 526, respectively. The two guide members 566, 568 include two hold-down portions 570, 572, respectively, which cooperate with each other to prevent the PCB 408 from jumping off the conveyor belts 546. A space which has a dimension greater than the thickness of the PCB 408 is provided between each of the two hold-down portions 570, 572 and a corresponding one of the two conveyor belts 546. Therefore, a small clearance remains between each hold-down portion 570, 572 and the upper surface of the PCB 408 placed on the corresponding conveyor belt 546. When the PCB conveying width of the conveyors 400–406 is adjusted, the spline members 550 are moved relative to the spline shafts 548 in the axial direction of the shafts 548, in such a manner that the spline members 550 remain spline-fit on the spline shafts 548. Thus, even if the PCB conveying width may be adjusted or changed, the rotation of the PCB conveying motor 558 can be transmitted to the pulleys 553, so that the PCB 408 can be conveyed on the conveyor belts 546.

As shown in FIG. 5, two thrust-up members 580 are attached to respective inner surfaces of the fixed and movable frames 524, 526 which are opposed to each other, such that each thrust-up member 580 is movable up and down. Each thrust-up member 580 has a thin plate-like shape, and has substantially the same length as that of the fixed or movable frame 524, 526. The two thrust-up members 580 are fixed to two holder members 582, respectively, which are attached to the fixed and movable frames 524, 526, respectively, such that each holder member 582 is movable up and down. Each thrust-up member 580 is provided inside the corresponding conveyor belt 546.

Two engagement members 584 (only one 584 is shown in FIG. 2) project downward from opposite end portions of a lower surface of each of the holder members 582 in the longitudinal direction of the holder 582. Each holder member 582 is biased downward by a compression coil spring 586 (FIG. 2) as an elastic member as a sort of biasing device which is provided between the holder member 582 and the connection portion 530, so that the corresponding thrust-up member 580 normally takes a retracted position in which the upper surface of the member 580 is below the PCB conveying level including the upper surfaces of upper horizontal portions of the conveyor belts 546 and accordingly the member 580 does not interfere with the movement of the PCB 408.

As shown in FIG. 5, the conveyor support table 520 supports two elevator tables 598 and two elevating and lowering devices 600. Each elevator table 598 has dimensions greater than those of the greatest PCBs 408 that are conveyed by the main conveyors 400, 402. The distance between the two leg portions 528 of each movable frame 526 is greater than the X-direction dimension of each elevator table 598. Therefore, when the PCB conveying width is adjusted, each movable frame 526 does not collide with the corresponding elevator table 598. On each elevator table 598, there is provided a plurality of PCB suction devices 602 as PCB support devices (only one 602 is shown in FIGS. 2, 4, and 5). Each PCB suction device 602 utilizes a negative pressure or a vacuum supplied from a vacuum source (not shown), for sucking the PCB 408.

Each elevating and lowering device 600 includes a pair of rotatable axis members 608 which are attached to the conveyor support table 520 such that the axis members 608 are rotatable about respective axis lines parallel to the X direction. Two levers 610 (FIG. 5) are attached, at one end portions thereof, to opposite end portions of each of the rotatable axis members 608, such that each lever 610 is not rotatable relative to a corresponding one of the axis members 608. Four rollers 612 which are rotatably attached to respective free end portions of the four levers 610, rotatably fit in respective engagement recesses 614 formed in the lower surface of the elevator table 598. The two axis members 608 are connected to each other so that they are rotatable as a unit. Therefore, when one of the two axis members 608 is rotated by a drive air cylinder (not shown), the four levers 610 are simultaneously rotated, so that the elevator table 598 is moved upward and downward while maintaining its horizontal attitude. As shown in FIG. 5, the upward and downward movements of the elevator table 598 are guided by a guide rod 616 fixed to the elevator table 598, and a guide cylinder 618 which is fixed to the support table 520 and in which the guide rod 616 fits.

When the elevator table 598 is moved upward, the PCB suction devices 602 suck the PCB 408 by applying the negative pressure thereto, so that respective support surfaces of support portions of the suction devices 602 which are covered by rubber-based suction cups, respectively, support the lower surface of the PCB 408. In addition, the elevator table 598 engages the engagement members 584, and moves up the holder members 582, i.e, the thrust-up members 580 against the biasing forces of the compression coil springs 586, so that the PCB 408 is thrusted up off the conveyor belts 546. Thus, the PCB 408 is sucked and supported by the PCB suction devices 602, and is thrusted up off the conveyor belts 546 so as to be sandwiched between the thrust-up members 580 and the hold-down portions 570, 572 of the guide members 566, 568. In this way, the PCB 408 is fixed by one main conveyor 400, 402 such that a possible warpage of the PCB 408 is corrected. The positions where the PCB suction devices 602 are provided on the elevator table 598 can be adjusted depending upon the dimensions of the PCB 408 and, in the case where small-size PCBs 408 are used, the suction devices 602 may be omitted.

As shown in FIG. 4, each main conveyor 400, 402 is equipped with a deceleration-start-position sensor 620, a PCB-arrival sensor 622, and a PCB stopping device 624 in a downstream-side end portion thereof. Each of the sensors 620, 622 is provided by a reflection-type photoelectric sensor including a light emitter which emits a light toward the PCB 408 and a light detector which detects the light reflected from the PCB 408, and the former sensor 620 detects that the PCB 408 has reached the position where the deceleration of the movement of the PCB 408 should be started, and the latter sensor 622 detects that the PCB 408 has reached the position where the arrival of the PCB 408 should be recognized. Each elevator table 598 has a cutout 626 which permits the light emitted from each sensor 620, 622 to impinge on the PCB 408. However, each of the sensors 620, 622 may be provided by a transmission-type photoelectric sensor including a light emitter which emits a light toward the PCBs 408 and a light detector which detects the light transmitted through a space present between each pair of successive PCBs 408; a proximity switch; a limit switch; or the like.

The PCB stopping device 624 is provided on the downstream side of the two sensors 620, 622, and includes a stopper member 630 and an elevating and lowering device 632 which elevates and lowers the stopper member 630. As shown in FIG. 2, the elevating and lowering device 632 includes, as a drive source thereof, an air cylinder 634 as a sort of fluid-pressure-operated cylinder, and utilizes the air cylinder 634 for thrusting up the stopper member 630 to an operative position thereof at the PCB conveying level where the stopper 630 stops the movement of the PCB 408 and retracting the stopper 630 to an inoperative position thereof below the PCB conveying level where the stopper 630 permits the PCB 408 to be moved thereover.

Thus, the PCB conveyor device 12 includes the two main conveyors 400, 402 whose respective PCB conveying routes are arranged side by side and both extend in the X direction. However, in the present EC assembly line 6, the screen printing system 2 and the solder reflowing system 4 provided on the upstream and downstream sides of the CC mounting system 8, respectively, are aligned with the first main conveyor 400 of the CC mounting system 8. Therefore, the carry-in conveyor 404 receives the PCB 408 from the printing system 2 when the conveyor 404 is at its first shift position, and the carry-out conveyor 406 hands over the PCB 408 to the reflowing system 4 when the conveyor 406 is at its first shift position. In the present embodiment, the operator is required to perform his or her work on the side of not the second main conveyor 402 but the first main conveyor 400 which is aligned with the printing and reflowing systems 2, 4 in the EC assembly line 6.

Next, there will be described the CC supplying devices 14, 16. As shown in FIG. 1, the two CC supplying devices 14, 16 are provided outside the two main conveyors 400, 402 such that the main conveyors 400, 402 are positioned between the two CC supplying devices 14, 16. The two CC supplying devices 14, 16 have the same construction, and supply the same sorts of CCs. There will be described the CC supplying device 14 as a representative of the two CC supplying devices 14, 16.

Figure 3:
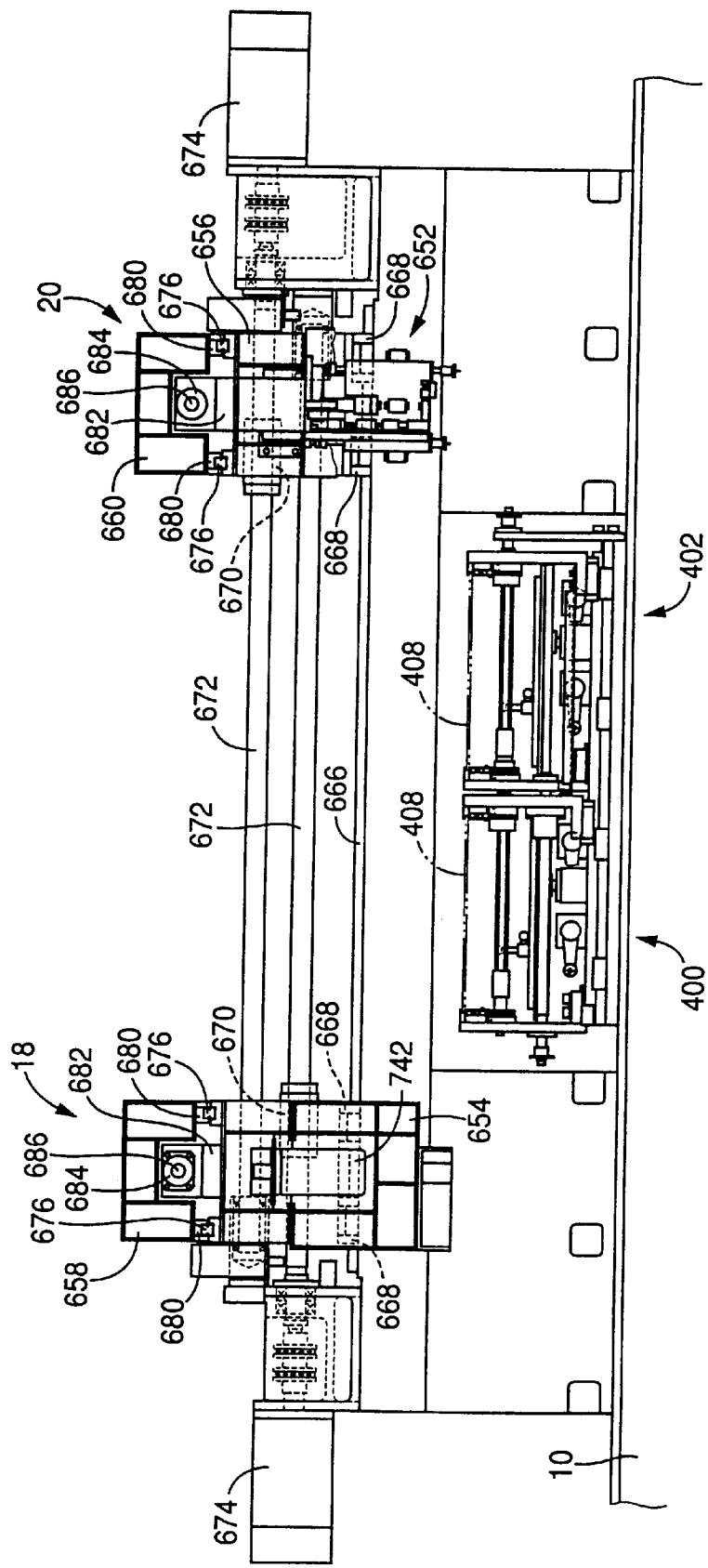
FIG. 3 is a side elevation view of the CS conveyor device and two CC mounting devices each of which provides part of the CC mounting system of FIG. 1.
Figure 7:
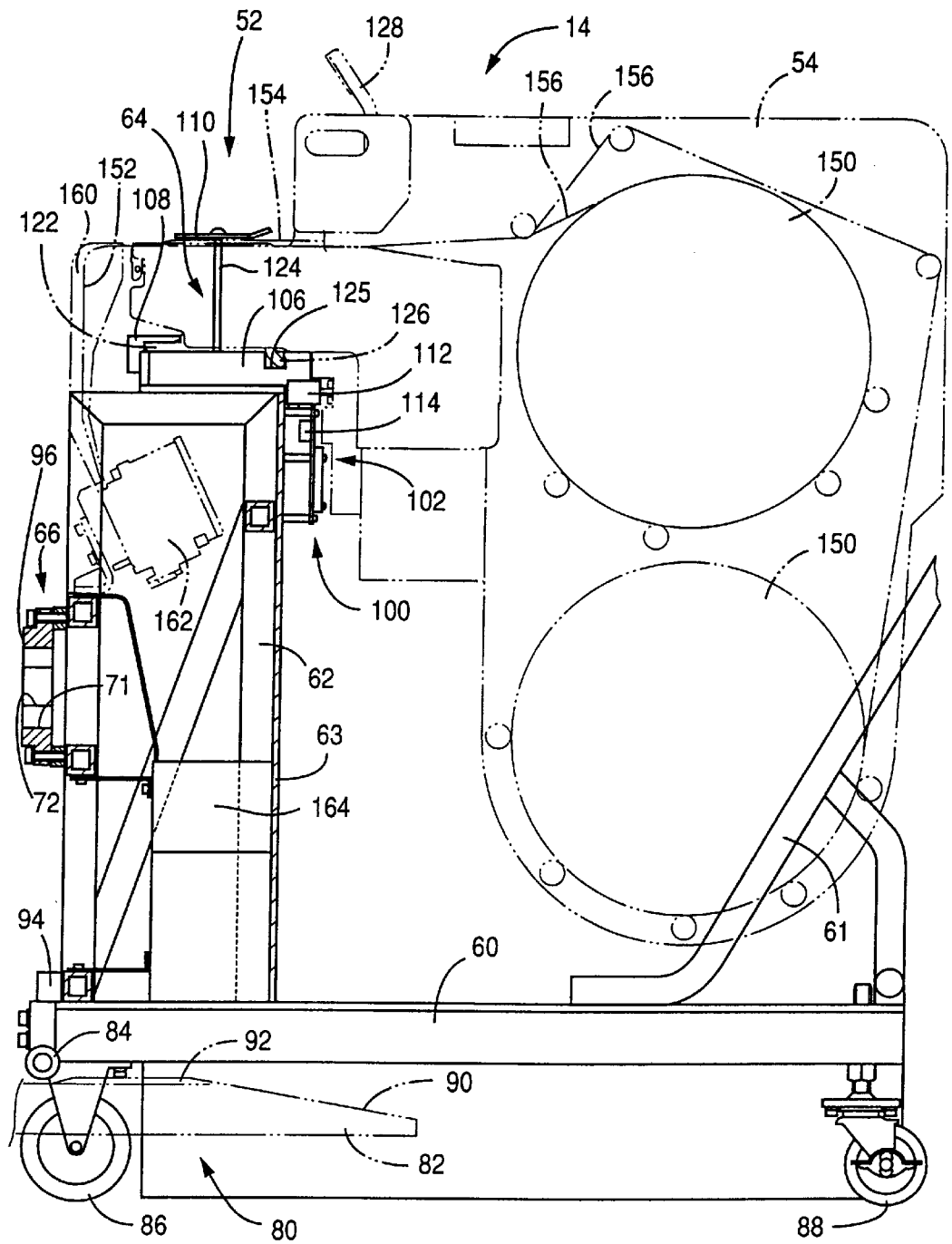
FIG. 7 is a side elevation view of a CC supplying device which provides part of the CC mounting system of FIG. 1.

As shown in FIG. 7, the CC supplying device 14 includes a support car 52 as a main member thereof, and a plurality of feeders 54 which are supported on the support car 52 and which cooperate with the support car 52 to provide the CC supplying device 14. In FIG. 7, the feeders 54 are indicated at phantom lines (i.e., two-dot chain lines). The support car 52 includes a base member 60, a handle 61, a frame 62 supported by the base member 60, a frame plate 63 attached to the frame 62, a feeder holding device 64 provided on the frame 62, and two engaging portions 66 provided on the frame 62 (only one 66 is shown in FIG. 7). FIG. 3 is the left side elevation view of the supplying apparatus 8, and FIG. 4 is the right side elevation view of the same 8.

Figure 8:
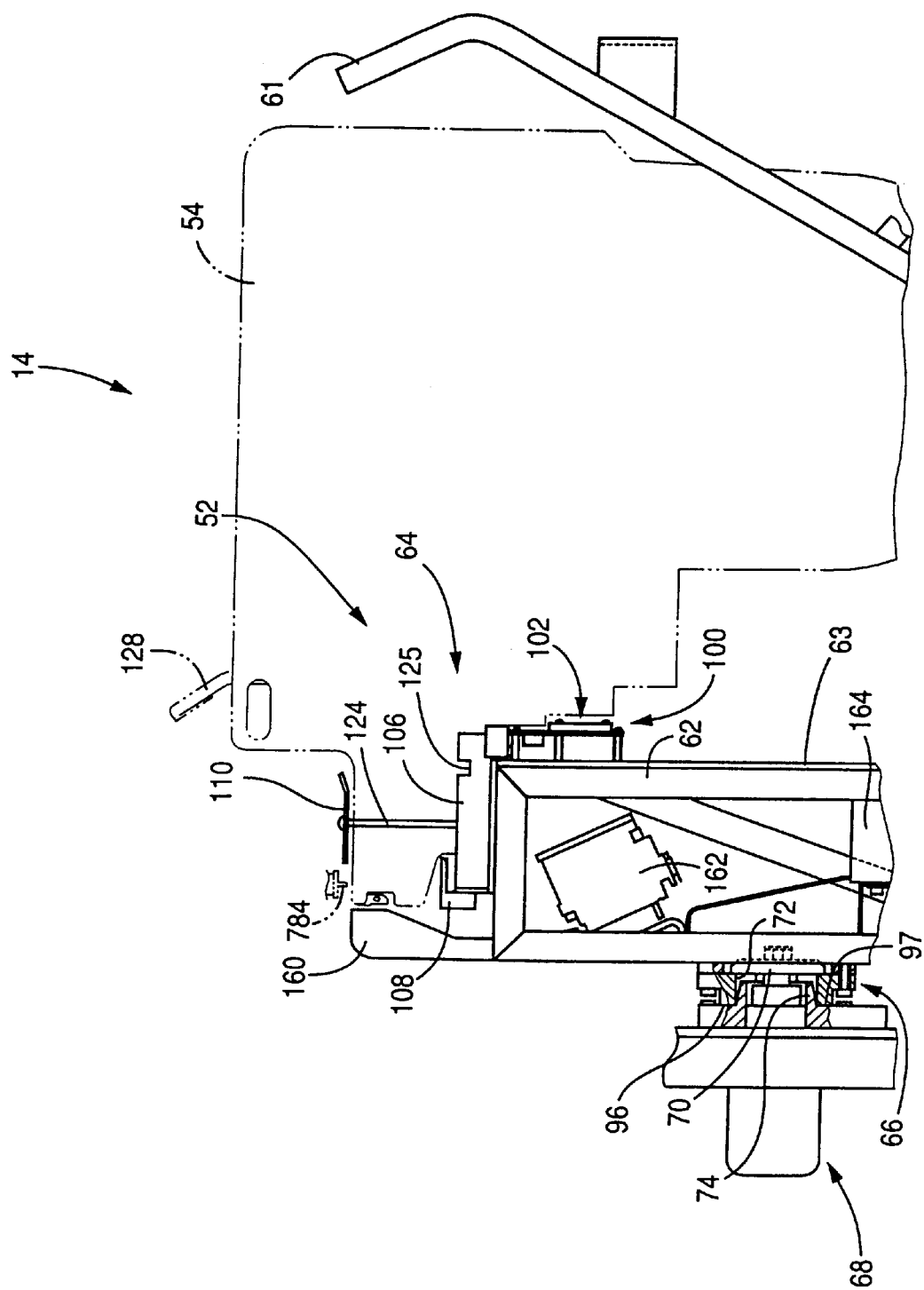
FIG. 8 is a partly cross-section, side elevation view illustrating the manner in which the CC supplying device is combined with a base of the CC mounting system.

As shown in FIG. 8, the two engaging portions 66 are engaged by two engaging devices 68, respectively, which are provided on the base 10, so that the support car 52 is combined with the base 10. Each engaging device 68 is equipped with an engaging projection 70 which has a petal-like shape and which is movable in a direction in which the support car 52 and the base 10 are arranged (i.e., the left-right direction in FIG. 8) and is rotatable about an axis line parallel to the moving direction. The above movement of the engaging projection 70 is caused by a double-action air cylinder (not shown) which is incorporated in the engaging device 68. During this movement, the projection 70 is rotated by a predetermined angle (e.g., 90 degrees) about the axis line parallel to the moving direction by a cam mechanism (not shown).

In a non-combined state in which the support car 52 is not combined with the base 10, the engaging projection 70 of each engaging device 68 projects freely in the space and takes an angular or rotational phase at which the projection 70 can fit, in an axial direction thereof, in one of the two engaging portions 66 of the support car 52. Each engaging portion 66 has an opening consisting of a circular hole 71 and a pair of side recesses 72 laterally extending from the circular hole 71 in opposite directions, respectively. When the support car 52 is moved toward the base 10 so as to be combined with the same 10, each of the two projections 70 enters the circular hole 71 and the side recesses 72 of a corresponding one of the two engaging portions 66. In this state, if air is supplied to one of two pressure chambers of the air cylinder of each engaging device 68 and air is permitted to flow out of the other pressure chamber, each projection 70 is retracted, during an initial period, while being rotated in a positive direction, so that the projection 70 engages the corresponding engaging portion 66 such that the two elements 70, 66 cannot be disengaged from each other in the axial direction of the projection 70. After this rotation, each projection 70 is moved back or retracted over a predetermined distance, so that the support car 52 is strongly combined with the base 10. If the direction of flow of air is reversed in the air cylinder, each projection 70 is moved out or advanced, during an initial period, while being not rotated, so that the support car 52 is permitted to separate from the base 10, and then each projection 70 is further advanced while being rotated in the opposite direction, so that each projection 70 is placed in a state in which it can be separated from the corresponding engaging portion 66.

Two tapered guide sleeves 74 (only one 74 is shown in FIG. 8) are provided on the base 10. The guide sleeves 74 can fit in the corresponding engaging portions 66 in such a manner that the guide sleeves 74 do not interfere with the engagement of the engaging projections 70 and the engaging portions 66. More specifically described, the guide sleeves 74 fit in the respective circular holes 71 of the engaging portions 66. Since the right-hand end of each engaging projection 70 is positioned nearer to the support car 52 than that of the corresponding guide sleeve 74 as seen in FIG. 8, the guide sleeve 74 does not interfere with the engagement of the projection 70 and the corresponding engaging portion 66. Since the two guide sleeves 74 fit in the respective circular holes 71 of the two engaging portions 66, the support car 52 is accurately positioned relative to the base 10 in all directions parallel to a vertical plane parallel to the X direction.

As shown in FIG. 7, there are provided a pair of guide mechanisms 80 each of which is associated with the base 10 and the support car 52. Each guide mechanism 80 is provided by a guide member 82 which is attached to the base 10 and a roller 84 which is attached to the base member 60 of the support car 52 (only one guide member 82 and only one roller 84 are shown in FIG. 7). FIG. 7 shows the relative position of one guide member 82 and the support car 52 in a combined state in which the car 52 is combined with the base 10. In this state, two fixed wheels 86 and two pivotal wheels 88 which are provided on the base member 60 are separate from the floor. Also, the two rollers 84 are slightly separate from the two guide members 82, respectively. In the non-combined state, the support car 52 is supported on the floor via the two fixed wheels 86 and the two pivotal wheels 88, so that the car 52 can easily be moved on the floor.

When the support car 52 is moved toward the base 10 so as to be combined therewith, the rollers 84 roll up to respective inclined surfaces 90 of the guide members 82, while being separated from the floor. When the car 52 further approaches the base 10, the two rollers 84 roll onto two guide rails 92, respectively, which are provided on the two guide members 82, respectively. The engagement of the rollers 84 with the guide rails 92 results in adjusting the position of the car 52 relative to the base 10 in the X direction so that the car 52 can easily be combined with the base 10, that is, so that the tapered guide sleeves 74 can easily fit in the circular holes 71 of the engaging portions 66, respectively. The base 10 is equipped with a combined-state detector (not shown). In the combined state in which the guide sleeves 74 have fit in the circular holes 71 and contact members 94 have contacted projections (not shown) projecting from the base 10, the combined-state detector detects an exclusive projection (not shown) provided on the car 52. When the detector detects the projection 95, the respective air cylinders of the engaging devices 68 are operated so that the projections 70 are engaged with the engaging portions 66, such that the projections 70 cannot be disengaged from the portions 66 in the axial direction of the projections 70, and the car 52 is pulled and combined with the base 10, as described above.

As shown in FIG. 8, when the support car 52 is pulled toward the base 10, respective contact surfaces 96 of the engaging portions 66 contact respective contact surfaces 97 of the engaging devices 68, and the contact members 94 of the car 52 contact respective projections (not shown) formed on the base 10. Thus, the car 52 is accurately positioned relative to the base 10 in the Y direction in which the car 52 is moved relative to the base 10 so as to be combined therewith. Hereinafter, a vertical plane which is defined by the contact surfaces 97 and the respective contact surfaces of the above-indicated projections (not shown) will be referred as the "combining plane", and a direction normal to the combining plane will be referred to as the "combining direction", when appropriate. The engaging devices 68 pull the engaging projections 70 toward the base 10, with a force greater than a force which is needed to move up the car 52 such that the pivotal wheels 88 are separated from the floor and the rollers 84 are separated from the guide rails 92. Accordingly, the car 52 is strongly combined with the base 10. For example, each engaging device 68 pulls the corresponding projection 70 with a force of about 250 kgf (i.e., about 2,450 N).

The feeders 54 are held by a plurality of feeder holding units 100 of the feeder holding device 64, respectively, on the support car 52. The feeder holding device 64 includes, as a main body member thereof, a base plate 106 (described below). In the present embodiment, the feeder holding device 64 has four feeder-holding-unit groups 102 each group of which consists of six successive feeder holding units 100 (only one feeder holding unit 100 of only one feeder-holding-unit group 102 is shown in FIG. 7). Accordingly, the feeder holding device 64 can hold at most twenty-four feeders 54.

As shown in FIG. 7, each feeder holding unit ("FHU") 100 includes a base plate 106, an engaging member 108 and a guide plate 110 which are supported by the base plate 106, an air supply section 112 which supplies pressurized air to the feeder 54, and an electric-power supply section 114 which supplies electric power to the feeder 54. The base plate 106 and the guide plate 110 are shared by all the FHUs 100, and the engaging member 108 is shared by the six FHUs 100 of each of the four FHU groups 102.

The base plate 106 has a plurality of engaging grooves (not shown) which correspond to the FHUs 100, respectively, and which extend in the Y direction in which the base 10 and the support car 52 are arranged. Each feeder 54 has an engaging projection 122 which is engageable with one of the engaging grooves and one of the engaging members 108. When each feeder 54 is held by one FHU 100, the feeder 54 is moved in the direction from the right-hand side toward the left-hand side in FIG. 7, so that finally the feeder 54 is held at a position shown in FIG. 7. Since the engaging projection 122 of the feeder 54 held by the FHU 100 is engaged with the engaging groove 120 of the base plate 106, the feeder 54 is inhibited from moving relative to the FHU 100 in the X direction. In addition, the guide plate 110 which is attached to the base plate 106 via a plurality of columns 124 permits only slight movements of the feeder 54 in a vertical direction in a plane normal to the X direction. These features enable an operator to attach or detach easily each feeder 54 to or from one FHU 100 by engaging or disengaging smoothly the engaging projection 122 with or from the engaging member 108. In the attached state shown in FIG. 7, the engaging projection 122 is engaged with the engaging member 108 and accordingly the feeder 54 is inhibited from moving relative to the base plate 106 in the Z direction.

Each feeder 54 is equipped with a generally U-shaped engaging member 126 (FIG. 10) which is engageable with an engaging groove 125 formed in the base plate 106 so as to bias the feeder 54 toward the frame 62 (i.e., leftward in FIG. 7). While a lever 128 is not operated, the engaging member 126 projects outward from the feeder 54, as shown in FIG. 7. On the other hand, while the lever 128 is operated, the member 126 is retracted into an internal space of the feeder 54. A mechanism for retracting the member 126 into the feeder 54 will be described later by reference to FIG. 10. In the process in which each feeder 54 is held by one FHU 100, the lever 128 is operated so that the engaging member 126 is retracted into the feeder 54. However, if the lever 128 is released for stopping the operation thereof, the feeder 54 is firmly held by the FHU 100. Each feeder 54 can easily be removed from the FHU 100 by first operating the lever 128 for retracting the engaging member 126 into the feeder 54 and then moving the feeder 54 rightward in FIG. 7.

The support car 52 is equipped with an electric-power receiving section (not shown) for receiving electric power from the base 10, and an air receiving section (not shown) for receiving pressurized air from the same 10.

As shown in FIG. 7, each feeder 54 can hold at most two CC tape reels 150 each of which stores a CC carrier tape 156 which carries a plurality of CCs (circuit components) of a same sort. The CC carrier tape 156, which is wound around the tape reel 150, includes a CC accommodating tape 152 having a plurality of CC accommodating pockets each for accommodating a CC, and a cover tape 154 for covering the respective upper openings of the accommodating pockets. The CC carrier tape 156 is of an emboss-type tape wherein the CC accommodating tape 152 includes a pair of opposite side portions which extend parallel to each other in the longitudinal direction of the tape 152, and the CC accommodating pockets which project downward from, and between, the two side portions such that the pockets are provided at a regular interval of distance in the longitudinal direction. The cover tape 154 is adhered to the accommodating tape 152 for preventing the CCs from coming out of the accommodating pockets. The cover tape 154 is peeled from the accommodating tape 152 at a position which is adjacent to a CC sucking position where the CCs are sucked by suction nozzles 784, that is, position where one nozzle 784 is shown in FIG. 8 and which is on the side of the tape reel 150 with respect to the nozzle 784 (i.e., on the right-hand side of the nozzle 784 in FIG. 8). The CC sucking position can also be said as a CC supplying position or a CC taking position. Hereinafter, it will be referred as the CC taking position, if appropriate. The accommodating tape 152 from which the CCs have been sucked up by the suction nozzles 784 is fed toward the side of the base 10 (i.e., leftward in FIG. 7), at a feeding pitch which is equal to a CC-accommodating pitch at which the CCs are accommodated by the tape 152 in the longitudinal direction thereof.

More specifically described, the tape 152 from which the CCs have been taken is fed to a cutting machine 162 while being guided by a tape guide 160. The tape guide 160 and the cutting machine 162 are supported by the frame 62. The cutting machine 162 cuts the tape 152 into small pieces which are collected in a container 164 provided below the frame 62. The manner in which the cover tape 154 peeled from the accommodating tape 152 is dealt with will be described later. In FIG. 7, the tape guide 160 and the cutting machine 162 are indicated at phantom lines (two-dot chain lines).

Next, the construction of each feeder 54 employed in the CC supplying device 14 will be described in detail.

Figure 9:
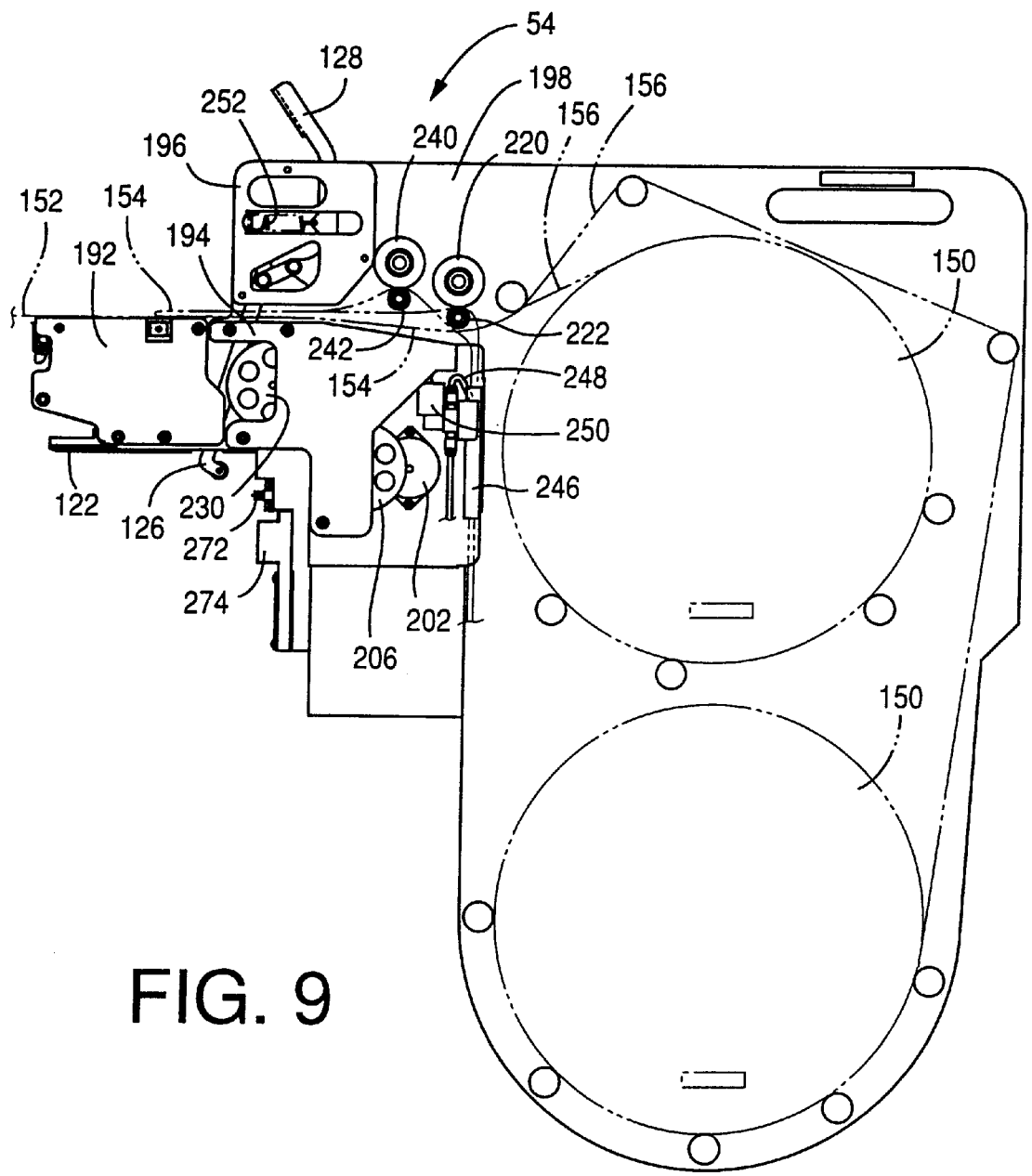
FIG. 9 is a side elevation view of a CC feeder which provides part of the CC supplying device.

FIG. 9 is a front elevation view of each feeder 54. As described above, each feeder 54 can support at most two CC tape holders 150 each of which holds a plurality of CCs of a same sort. Each feeder 54 can feed, based on a supply command or commands from a control device 1050 (FIG. 24), CCs of a first sort one by one from one of the two reels 150 and CCs of a second sort one by one from the other reel 150, such that the feeding of CCs from the one reel 150 is independent of that from the other reel 150. The first and second sorts may be the same as each other, or may be different from each other. Therefore, each feeder 54 can simultaneously feed the CCs from both of the two reels 150. However, though the CC mounting device 18 or 20 has a plurality of suction nozzles 784 as described later, the control device 1050 does not generate, under normal conditions, any supply command that the feeder 54 should simultaneously supply the CCs from both the two reels 150. Similarly, the control device 1050 does not simultaneously send a plurality of supply commands to a plurality of feeders 54, respectively.

Figure 10:
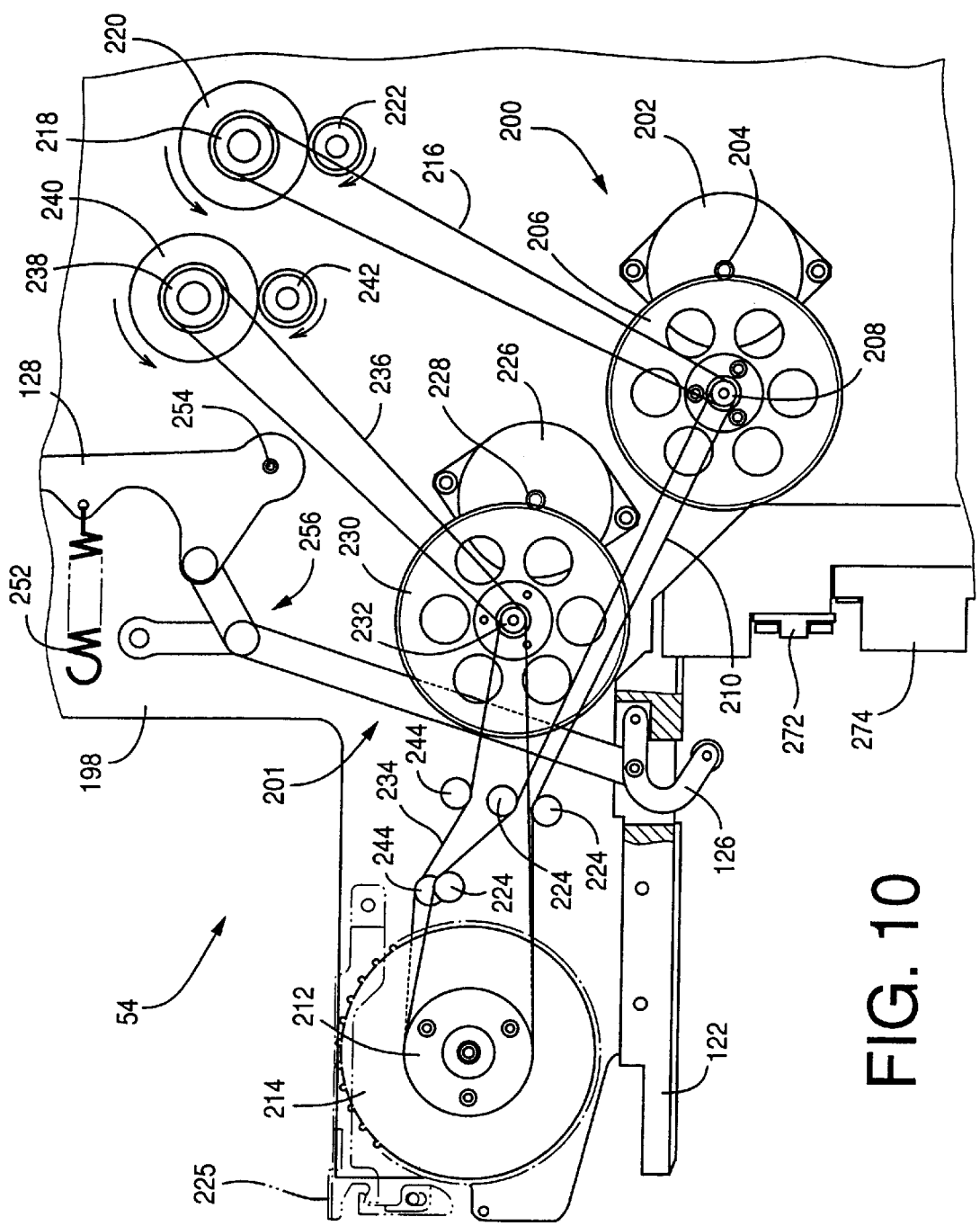
FIG. 10 is an enlarged, side elevation view of a CC-carrier-tape feeding section of the CC feeder.

FIG. 10 is a front elevation view of a part of one of the feeders 54, with a first, a second, and a third cover member 192, 194, 196 shown in FIG. 9 being removed for easier understanding purposes only. Each feeder 54 includes two drive devices 200, 201, each attached to a side plate 198, for feeding the two CC carrier tapes 156 from the two tape reels 150, respectively.

The first drive device 200 includes an electric motor 202, a drive gear 204 which is fixed to an output shaft of the motor 202, a driven gear 206 which is meshed with the drive gear 204 and has more teeth than those of the drive gear 204, a drive pulley 208 which is formed integrally with the driven gear 206, a drive belt 210 which transmits the rotation force of the drive pulley 208, a drive belt 210 which is driven by the driven belt 212, and a sprocket 214 which is formed integrally with the driven pulley 212. In addition, the first drive device 200 includes a drive belt 216 which transmits the rotation of the drive pulley 208, a driven pulley 218 which is driven by the driven belt 216, a drive pinch roller 220 which is formed integrally with the driven pulley 218, and a driven pinch 222 which is held in pressed contact with an outer circumferential surface of the driven pinch 220 with a predetermined pressure. Thus, the rotation of the motor 202 is transmitted to the sprocket 214 and the two pinches 220, 222.

The drive belt 210 circulates along a route defined by a plurality of guide rollers 224. Since the electric motor 202 is a stepper motor, the amount or angle of rotation of the sprocket 214 can be controlled by changing a number of pulse signals which are supplied to the motor 202. The ratio of a rotation angle of the motor 202 to a corresponding rotation angle of the sprocket 214 is equal to the product of a gear ratio of the drive gear 204 and the driven gear 206 and a ratio of the radius of the drive pulley 208 to the radius of the driven pulley 212. The CC accommodating tape 152 has perforations which are successive at a regular interval of distance in the longitudinal direction thereof and which are engageable with projections which are formed at a regular interval of distance on an outer circumference of the sprocket 214. A cover member 225 is provided for preventing the accommodating tape 152 from moving up away from the sprocket 214 and thereby surely engaging the tape 152 with the sprocket 214.

When the sprocket 214 is rotated, the CC carrier tape 156 is subjected to a tension caused by, e.g., frictional resistance produced when the corresponding tape reel 150 is rotated. In addition, the drive belt 210 is subjected to a tension caused by, e.g., the friction produced when the guide rollers 224 are rotated. However, in the present embodiment, each feeder 54 can easily feed the carrier tape 156 at any desired feeding pitch, by changing the number of pulse signals supplied to the electric motor 202, irrespective of whether those disturbances may be small or large. Therefore, even if a first CC carrier tape 156 may be replaced with a second CC carrier tape 156 whose CC-accommodating pitch (i.e., regular interval at which CCs are accommodated by its CC-accommodating tape 152 in the longitudinal direction thereof) is different from that of the first tape 156, each feeder 54 can easily adapt itself to that occasion. The pinches 220, 222 are held in pressed contact with each other under a predetermined pressure, and the cover tape 154 peeled from the CC accommodating tape 152 is pinched by the two pinch rollers 220, 222, as shown in FIG. 9.

When the CC carrier tape 156 is fed forward by the sprocket 214, the rollers 220, 222 cooperate with each other to send the peeled cover film 154 rearward to the side of the corresponding reel 150, so that the cover tape 154 is further peeled little by little from the accommodating tape 152. The cover-tape sending pitch at which the cover tape 154 is sent back by the pinches 220, 222 is larger than the carrier-tape feeding pitch at which the CC carrier tape 156 is fed by the sprocket 214. Since the position where the cover tape 154 is peeled from the accommodating tape 152 is defined and fixed by a cover-tape drawing slit which is formed through the thickness of the cover member 225, an excessive length of the cover-tape sending pitch is absorbed or accommodated by the sliding of the pinch rollers 220, 222 on the cover tape 154. Thus, the length of the cover tape 154 between the cover member 225 and the rollers 220, 222 is held stretched out.

Like the first drive device 200, the second drive device 201 includes an electric motor 226, a drive gear 228, a driven gear 230, a drive pulley 232, driven belts 234, 236, a driven pulley 238, pinch rollers 240, 242, and guide rollers 244. The second drive device 201 additionally includes a sprocket (not shown) similar to the sprocket 214, and a driven pulley (not shown) similar to the driven pulley 212. The sprocket and driven pulley of the second drive device 201 are aligned with the sprocket 214 and driven pulley 212 of the first drive device 200, and are not shown in FIG. 10.

The cover tape 154 sent back by the pinch rollers 220, 222 and the cover tape 154 sent back by the pinch rollers 240, 242 are passed through a pipe 246 whose axis line is vertical, as shown in FIG. 9, so that the cover tapes 154 fall down onto the base 60. Accordingly, in the attached state in which each feeder 54 is attached to one FHU 100, the waste cover tapes 154 are collected on the base 60 of the support car 52. An air nozzle 248 is provided for passing smoothly the cover tapes 154 through the pipe 246. When at least one of the electric motors 202, 226 is driven or rotated, pressurized air is supplied to the air nozzle 248 which in turn supplies the air to the pipe 246 from the top inlet thereof. A solenoid-operated valve 250 is opened to supply the pressurized air to the air nozzle 248.

Each feeder 54 is equipped with some manually operable switches (not shown). Those switches include ones for rotating each one of the electric motors 202, 226 in opposite directions, independent of the other motor; ones for selecting a speed at which each one of the motors 202, 226 is rotated for supplying CCs; ones for selecting a rotation angle of each one of the motors 202, 226 for supply each one of CCs; and ones for selecting each one of the drive devices 200, 201 for being operated.

As shown in FIG. 10, the lever 128 of each feeder 54 is biased by a biasing member in the form of a spring 252 in a direction in which the lever 128 is rotated counterclockwise about an axis member 254. This biasing force is transmitted to the engaging member 126 via a link mechanism 256, so that while the lever 128 is not operated, the engaging member 126 projects outward from the feeder 54. The engaging member 126 can be retracted into the feeder 54, by rotating the lever 128 clockwise about the axis member 254.

Each feeder 54 is equipped with an air receiving section 272 which fits on the air supply section 112 for receiving pressurized air therefrom, so that the pressurized air is supplied to the above-described solenoid valve 250. In addition, the feeder 54 is equipped with an electric-power receiving section 274 which is electrically connected to the electric-power supply section 114 for receiving electric power therefrom, so that the electric power is supplied to the electric motors 202, 226, etc. The electric power is supplied from the base 10 to the support car 52. The car 52 has a second electric-power receiving section (not shown) for receiving electric power in the non-combined state in which the car 52 is not combined with the base 10, e.g., during a preparing operation prior to the CC mounting operation.

Next, there will be described the CC mounting devices 18, 20. As shown in FIG. 1, the first CC mounting device 18 includes a CC mounting head 650, and an X-Y robot 662 which includes an X-direction slide 654 and a Y-direction slide 658 (hereinafter, referred to as the X slide 654 and the Y slide 658) and which moves the CC mounting head 650 to any position in a horizontal plane. Similarly, the second CC mounting device 20 includes a CC mounting head 652, and an X-Y robot 664 which includes an X-direction slide 656 and a Y-direction slide 660 and which moves the CC mounting head 652 to any position in a horizontal plane. Since the two CC mounting devices 18, 20 have the same construction and the X-Y robots 662, 664 have the same construction, there will be described the first CC mounting device 18 and the X-Y robot 662 thereof as a representative of the two CC mounting devices 18, 20 and a representative of the two X-Y robots 662, 664.

As shown in FIGS. 2 and 3, two straight guide rails 666 as guide members are provided at two locations on the base 10 which are distant from each other in the PCB conveying direction (i.e., the X direction), such that the guide rails 666 extend parallel to the Y direction. The Y slide 658 fits on the two guide rails 666 such that the Y slide 658 is movable in the Y direction. The Y slide 658 has an X-direction dimension greater than that of the CC support car 52 to which the feeders 54 are attached. Two guide blocks 668 (FIGS. 2 and 3) as guided members are fixed to opposite end portions of the Y slide 658 which are opposite to each other in the longitudinal direction thereof, and fit on the two guide rails 666, respectively. Thus, the Y slide 658 is movable on the guide rails 666 in the Y direction.

As shown in FIGS. 2 and 3, two nuts 670 are fixed to respective portions of the Y slide 658 which are above the two lower end portions thereof which fit on the two guide rails 666, respectively, such that the two nuts 670 are oriented parallel to the Y direction. An upper and a lower threaded shaft 672 are provided at each of two locations on the base 10 which are distant from each other in the X direction, such that the two threaded shafts 672 are rotatable about respective axis lines thereof parallel to the Y direction. One of the two nuts 670 is threadedly engaged with the upper one of the two threaded shafts 672 provided at a corresponding one of the two locations, and the other nut 670 is threadedly engaged with the lower one of the two threaded shafts 672 provided at the other location. Each nut 670 and the threaded shaft 672 threaded with the nut 670 cooperate with each other to provide a ball screw. One of the upper and lower threaded shafts 672 at each location which is not threadedly engaged with the corresponding nut 670, can enter a through-hole (not shown) formed in the corresponding end portion of the Y slide 658. Thus, the movement of the Y slide 658 is not interfered with by that threaded shaft 672.

The four threaded shafts 672 are rotated by four Y-direction servomotors 674 ("Y motors 674") as drive sources which are provided on the base 10. The Y motors 674 are AC (alternating current) servomotors. The Y slide 658 is driven by the corresponding two Y motors 674 which are connected to a common drive circuit (not shown) and are rotated in synchronism with each other. Therefore, the Y slide 658 which has an elongate shape can be smoothly moved at high speed, without vibration which would otherwise result from the inertias of the Y slide 658 itself, the X slide 654, and the CC mounting head 650 mounted on the X slide 654. The pair of guide rails 666 are commonly used for the respective Y slides 658, 660 of the two CC mounting devices 18, 20. The two Y slides 658, 660 are individually driven such that they do not interfere with each other.

As shown in FIGS. 1 and 3, two straight guide rails 676 as guide members are fixed to a lower surface of the Y slide 658, such that the two guide rails 676 extend in the X direction. Two guide blocks 680 as guided members are fixed to the X slide 654 and fit on the guide rails 676, respectively, so that the X slide 654 is movable in the X direction. As shown in FIG. 3, a nut 684 is fixed via a bracket 682 to an upper surface of the X slide 654, and is threadedly engaged with a threaded shaft 686 which is provided on the Y slide 658 such that the threaded shaft 686 extends in the X direction, is rotatable relative to the Y slide 658, and is not movable in an axial direction thereof. When the threaded shaft 686 is rotated by an X-direction servomotor 688 ("X motor 688", FIG. 2) as a drive-source device, the X slide 654 is moved in the X direction. The nut 684 and the threaded shaft 686 cooperate with each other to provide a ball screw. In FIG. 1, reference numeral 690 designates a flexible protector which protects flexible wires and pipes, such as signal transmitting lines, electricity supplying lines, pressurized-air supplying hoses, vacuum supplying hoses, and the like, which are provided between the base 10 and the Y slide 658. In FIG. 2, reference numeral 692 designates a flexible protector which protects flexible wires and pipes, such as signal transmitting lines, which are provided between the Y slide 658 and the X slide 654.

Figure 11:
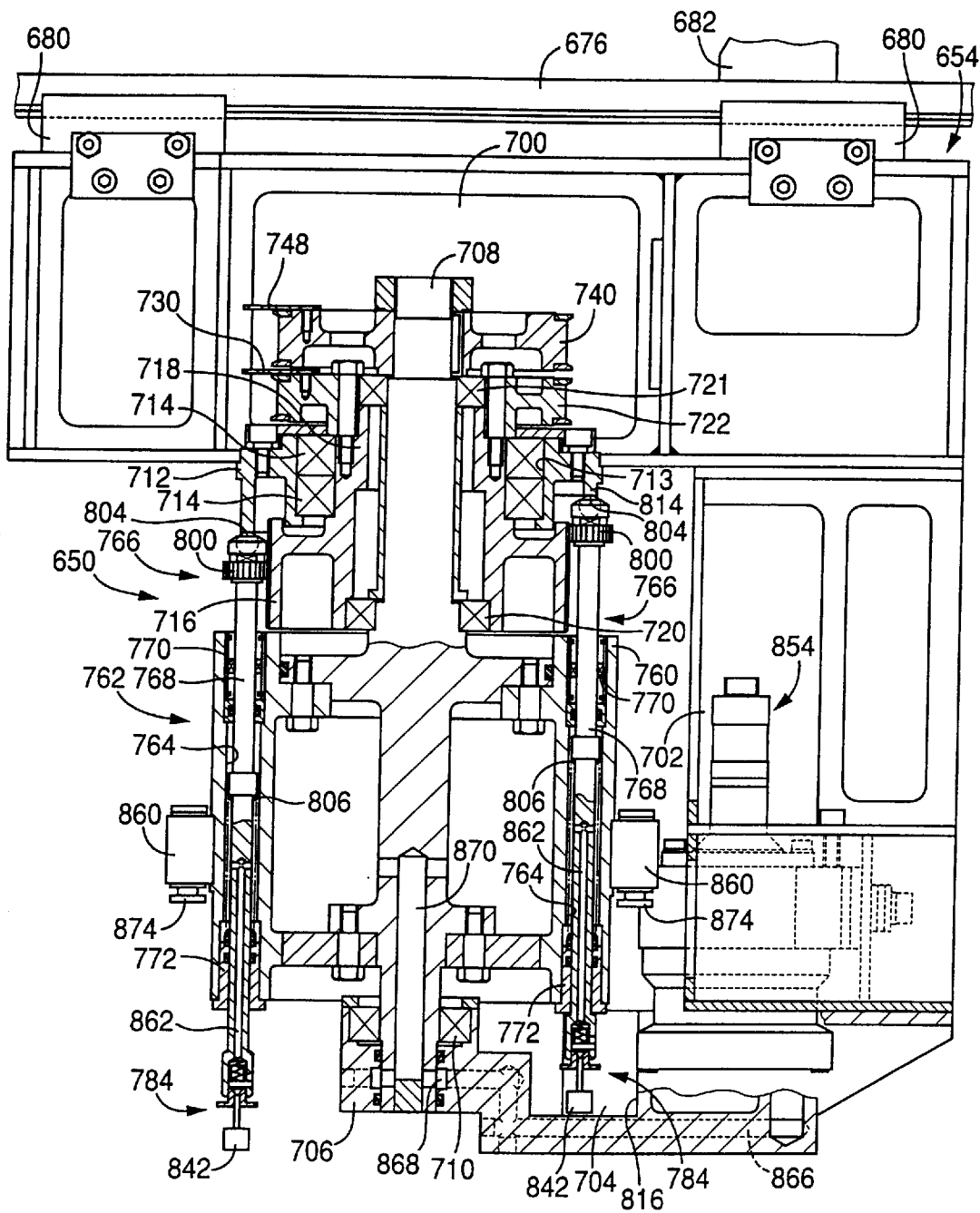
FIG. 11 is a partly cross-section, front elevation view of a CC mounting head and an X-direction slide of the CC mounting device.
Figure 13:
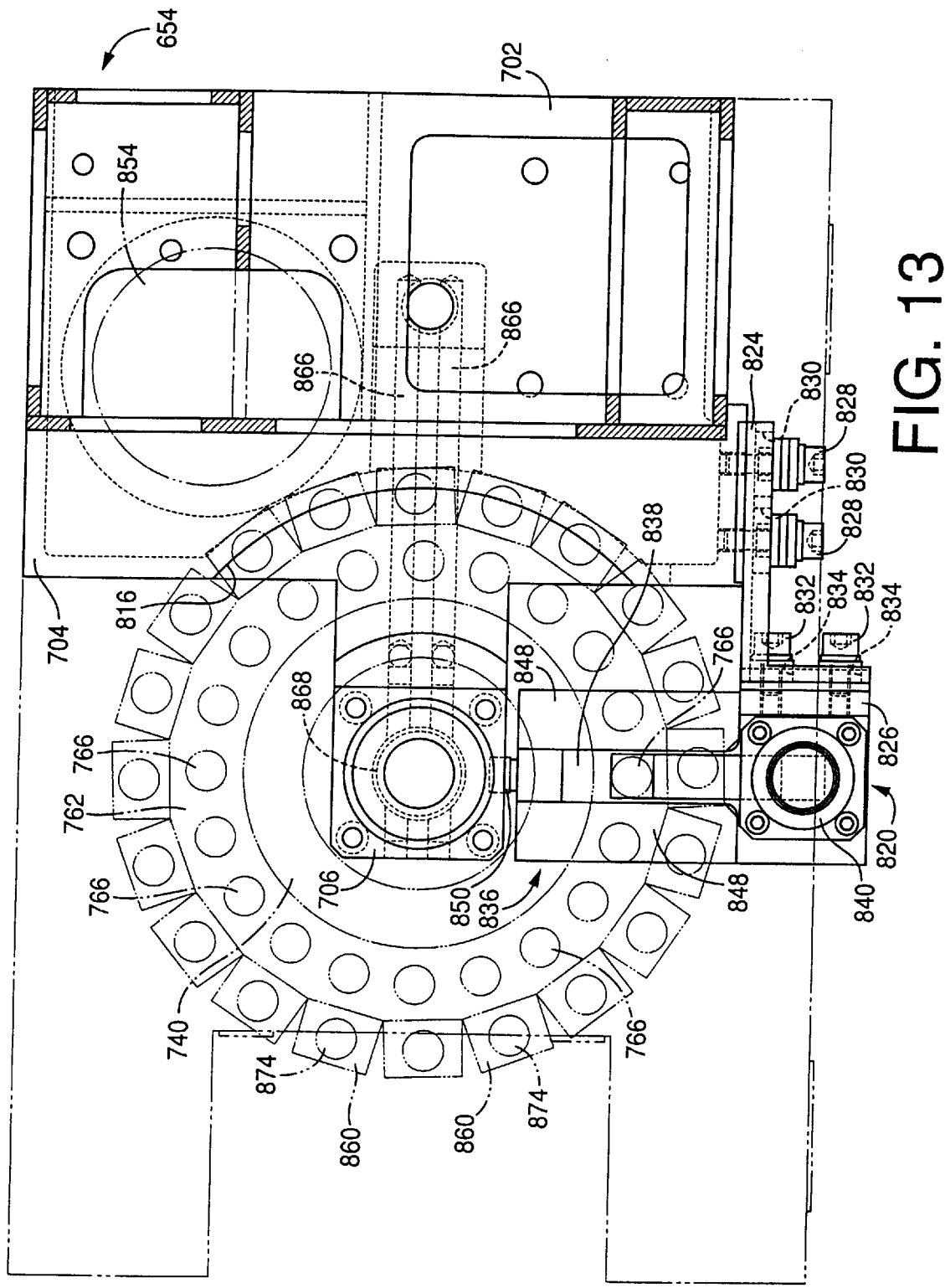
FIG. 13 is a plan view of a portion of the CC mounting head in which a CC-image pick-up device is provided.

The CC mounting head 650 is mounted on the X slide 654. As shown in FIG. 11, the X slide 654 includes a pendent portion 700 to which the guide blocks 680 are fixed and which is supported by the Y slide 658 such that the pendent portion 700 is pendent from the Y slide 658. The X slide 654 additionally includes a connection portion 702 which extends downward from one of opposite end portions of the pendent portion 700 which are opposite to each other in the X direction. As shown in FIGS. 11 and 13, a lower end portion of the pendent portion 700 includes a horizontal portion 704 which horizontally extends toward the other end portion of the pendent portion 700. A support portion 706 horizontally extends from an intermediate portion of the horizontal portion 704 as viewed in the Y direction, toward the other end portion of the pendent portion 700.

As shown in FIG. 11, the support portion 706 supports a lower end portion of a rotation shaft 708 via a bearing 710 such that the shaft 708 is rotatable about an axis line thereof, and an upper end portion of the shaft 708 is supported by the pendent portion 700 such that the shaft 708 is rotatable. A stationary cam 712 is fixed to the pendent portion 700. The cam 712 has a receiving hole 713 which is formed therethrough such that the hole 713 is concentric with the shaft 708. A fitting portion 718 of a drive gear 716 fits in the receiving hole 713 via bearings 714. A driven pulley 722 is fixed to an upper end portion of the fitting portion 718 which projects upward from the cam 712, such that the driven pulley 722 is concentric with the drive gear 716 and is rotatable as a unit with the same 716. The driven pulley 722 and the drive gear 716 cooperate with each other to support the rotation shaft 708 via bearings 720, 721 such that the shaft 708 is rotatable about its axis line that is a vertical line parallel to a perpendicular of the horizontal PCB conveying plane. Thus, the drive gear 716 and the driven pulley 722 are concentric with the rotatable shaft 708.

Figure 14:
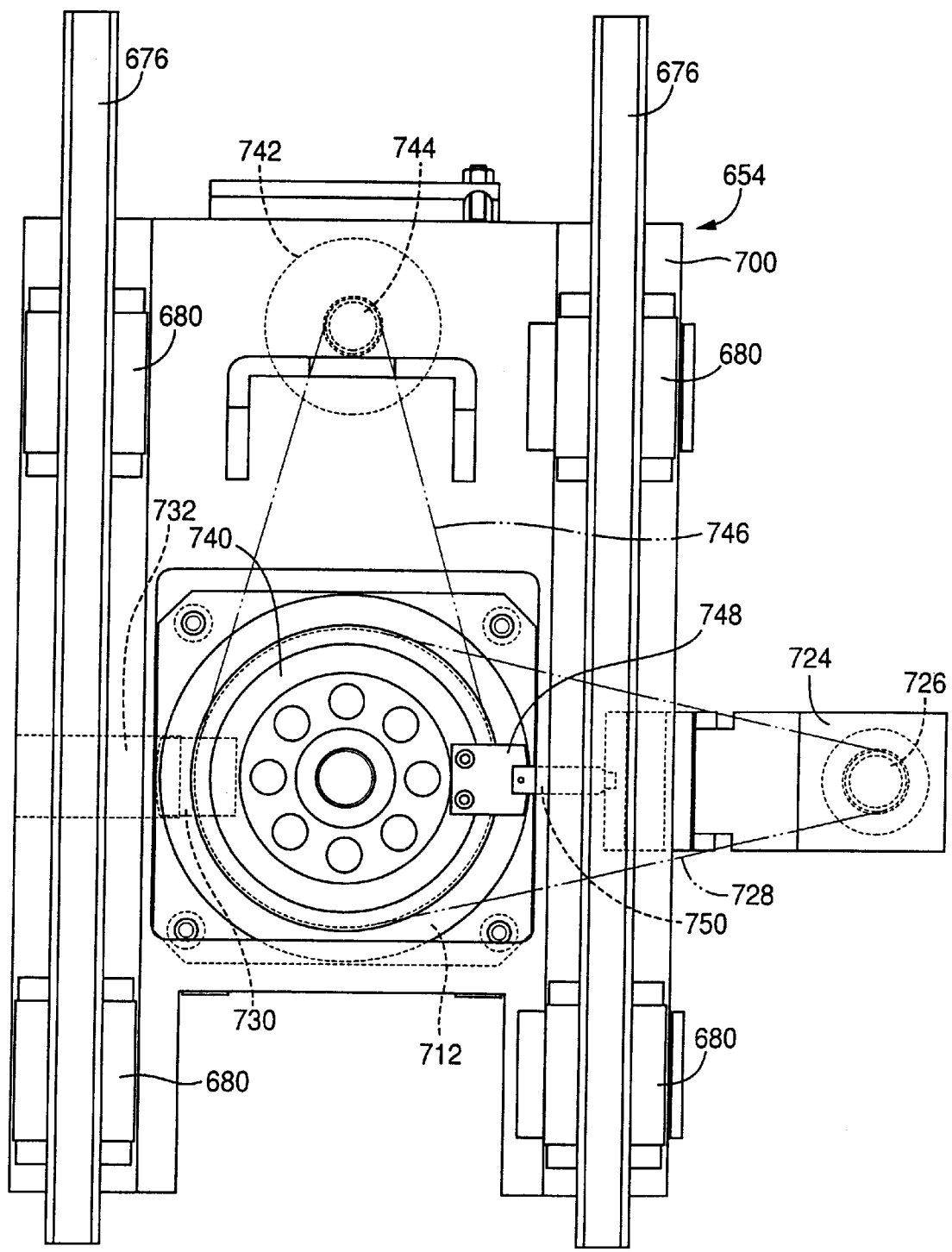
FIG. 14 is a plan view of the CC mounting head.

As shown in FIG. 14, the rotation of a rotation-position correcting and changing servomotor 724 as a drive source is transmitted to the driven pulley 722 via a drive pulley 726 and a timing (cog) belt 728 as a wound-on member, so that the drive gear 716 is rotated by any desired angle in each of opposite directions. As shown in FIG. 11, a plate-like detectable member 730 is fixed to the driven pulley 722 such that the detectable member 730 is oriented radially outwardly of the pulley 722. When the detectable member 730 is detected by a drive-gear initial-position sensor 732 (FIG. 24) which is fixed to the X slide 654, the initial position of the drive gear 716 is detected. The detection of the initial position of the drive gear 716 is carried out when an electric power is initially applied to the present CC mounting system 8, and the current angular or rotation position of the drive gear 716 is calculated based on the detected initial position.

A driven pulley 740 as a driven rotation member is fixed to an upper end portion of the rotation shaft 708 such that the driven pulley 740 is concentric with the shaft 708. As shown in FIG. 14, the rotation of a rotatable-body rotating servomotor 742 as a drive source is transmitted to the driven pulley 740 via a drive pulley 744 and a timing belt 746 as a wound-on member, so that the rotation shaft 708 is rotated by any desired angle in each of opposite directions. As shown in FIG. 11, a plate-like detectable member 748 is fixed to the driven pulley 740 such that the detectable member 748 is oriented radially outwardly of the pulley 740. When the detectable member 748 is detected by a rotation-shaft initial-position sensor 750 (FIG. 14) which is fixed to the X slide 654, the initial position of the shaft 708 is detected. The detection of the initial position of the shaft 708 is carried out when an electric power is initially applied to the present CC mounting system 8, and the current rotation position of the shaft 708 is calculated based on the detected initial position thereof.

A CC-suction-shaft holding member 760 is fixed to a lower portion of the rotation shaft 708 which is lower than the portion of the same 708 supported by the drive gear 716, such that the holding member 760 is concentric with the shaft 708. The holding member 760 cooperates with the shaft 708 to provide an intermittent-rotation member 762. The holding member 760 has a generally cylindrical shape, and the cylindrical wall thereof has twenty holding holes 764 which are located on a circle whose center rides on the axis line of rotation thereof and are equiangularly spaced from one another about the axis line and each of which is formed through the thickness thereof in a direction parallel to the axis line. A shaft member 768 as an axial portion of a CC suction shaft 766 is fitted in each holding hole 764 via a bearing 770 and a fitter member 772. When the intermittent-rotation member 762 is intermittently rotated, the twenty CC suction shafts 766 are rotated around the axis line of rotation of the rotation member 762.

Figure 12:
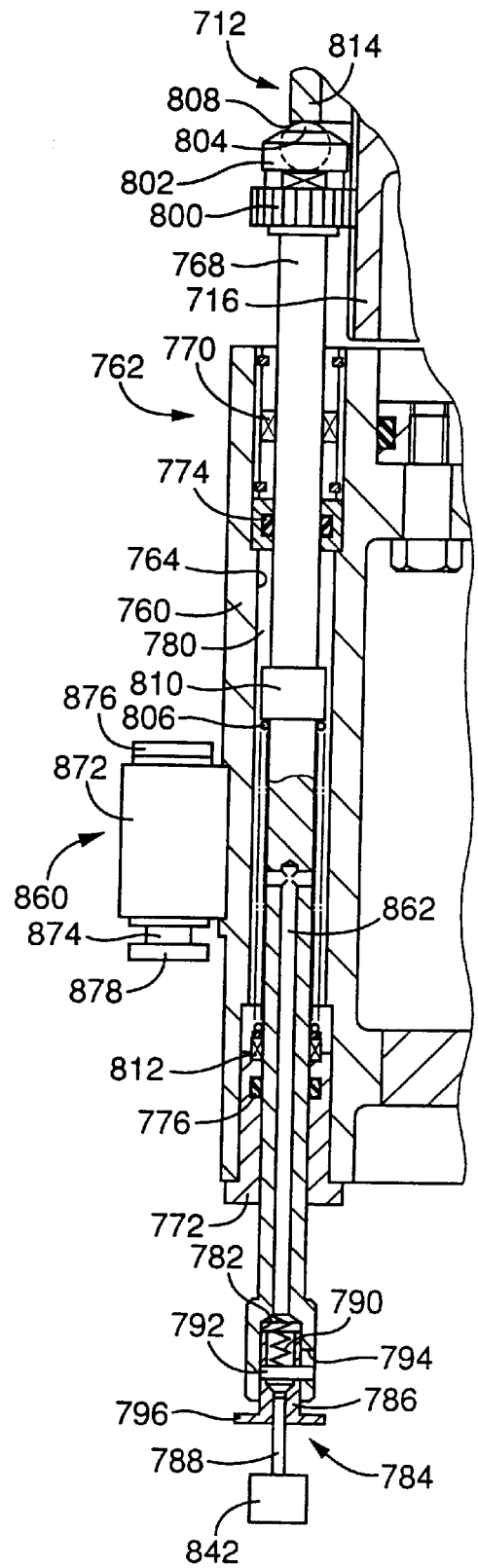
FIG. 12 is a cross-section, front elevation view of a CC suction shaft which is provided on the CC mounting head.

The diameter of each holding hole 764 is greater than that of each shaft member 768 and, as shown in FIG. 12, the shaft member 768 is fitted in the holding hole 764 such that the air tightness of the shaft member 768 is maintained by two sealing members 774, 776. Thus, an annular passage 780 is provided in the holding hole 764. The fitter member 772 is fitted in a lower opening end of the holding hole 764 and is fixed to the CC-suction-shaft holding member 760 with a bolt (not shown) as a fixing member. A lower one 776 of the two sealing members 774, 776 is held by the fitter member 772. The bearing 770 and the fitter member 772 are attached to the holding member 760 such that the former two members 770, 772 are not movable relative to the latter member 760. Thus, the two members 770, 772 provide part of the intermittent-rotation member 762. A portion of the holding hole 764 to which the bearing 770 is attached, and a hole of the fitter member 772 in which the shaft member 768 is fitted cooperate with each other to provide a holding hole in which the shaft member 768 is fitted such that the member 768 is rotatable about an axis line thereof and is movable in an axial direction thereof.

A lower end portion of the shaft member 768 of each CC suction shaft 766 projects downward from the CC-suction-shaft holding member 760, and has a nozzle holding hole 782 which is concentric with the axis line of the shaft member 768. A CC suction nozzle 784 is fitted in the hole 782 such that the nozzle 784 is movable in an axial direction thereof relative to the hole 782. Each CC suction nozzle 784 includes a suction-pipe holding member 786, and a suction pipe 788 which is held by the holding member 786, and is biased by a compression coil spring 790 as a sort of elastic member as a sort of biasing device, in a direction in which the nozzle 784 is moved downward in the nozzle holding hole 782. Since a pin 792 as an engagement member which is fitted in the suction-pipe holding member 786 is engaged with a recess 794 as an engagement portion which is formed in a wall defining the hole 782, the nozzle 784 is prevented from coming off the hole 782 and rotating relative to the shaft member 768. Reference numeral 796 designates a reflector plate which is provided on the suction-pipe holding member 786. Here, for the purpose of easier understanding only, it is assumed that the twenty CC suction nozzles 784 are of the same sort and therefore the respective suction pipes 788 thereof have the same diameter. The nozzles 784 can be selected from various sorts of nozzles which are suitable for sucking various sorts of CCs, so that the selected nozzles 784 are attached to the shaft members 768, respectively. However, each sort of nozzles can suck and hold different sorts of CCs having different sizes.

An upper end portion of each shaft member 768 projects upward from the CC-suction-shaft holding member 760, and a driven gear 800 and a cam-follower holding member 802 are fixed to the upper end portion of the shaft member 768 such that the former members 800, 802 are concentric with the latter member 768. The diameter of the driven gear 800 is smaller than that of the drive gear 716, and is meshed with the drive gear 716. When the drive gear 716 is rotated, all the driven gears 800 meshed with the drive gear 716 are concurrently rotated, so that the twenty CC suction shafts 766 are concurrently rotated by the same angle in the same direction.

Each cam-follower holding member 802 holds a ball-like cam follower 804 therein, such that the cam follower 804 is rotatable in all directions and is prevented from coming thereoff and such that a portion of the cam follower 804 projects outward therefrom. Each CC suction shaft 766 is biased upward by a compression coil spring 806 as a sort of an elastic member as a sort of a biasing device which is provided in the annular passage 780, so that the cam follower 804 is held in pressed contact with a cam surface 808 of the stationary cam 712. One end portion of the spring 806 rests on a spring seat 810 which is fixed to the shaft member 768, and the other end portion of the same 806 is held by a retainer (not shown) which is supported by a bearing 812 attached to the fitter member 772 such that the spring 806 is rotatable relative to the member 772. Therefore, when each CC suction shaft 766 is rotated about an axis line thereof, the spring 806 is rotated together with the shaft 766 without being distorted or twisted. The shaft member 768 of the CC suction shaft 766 extends through the bearing 812 such that the shaft member 768 is rotatable relative to the bearing 812 and is movable in the axial direction thereof relative to the same 812.

Figure 15:
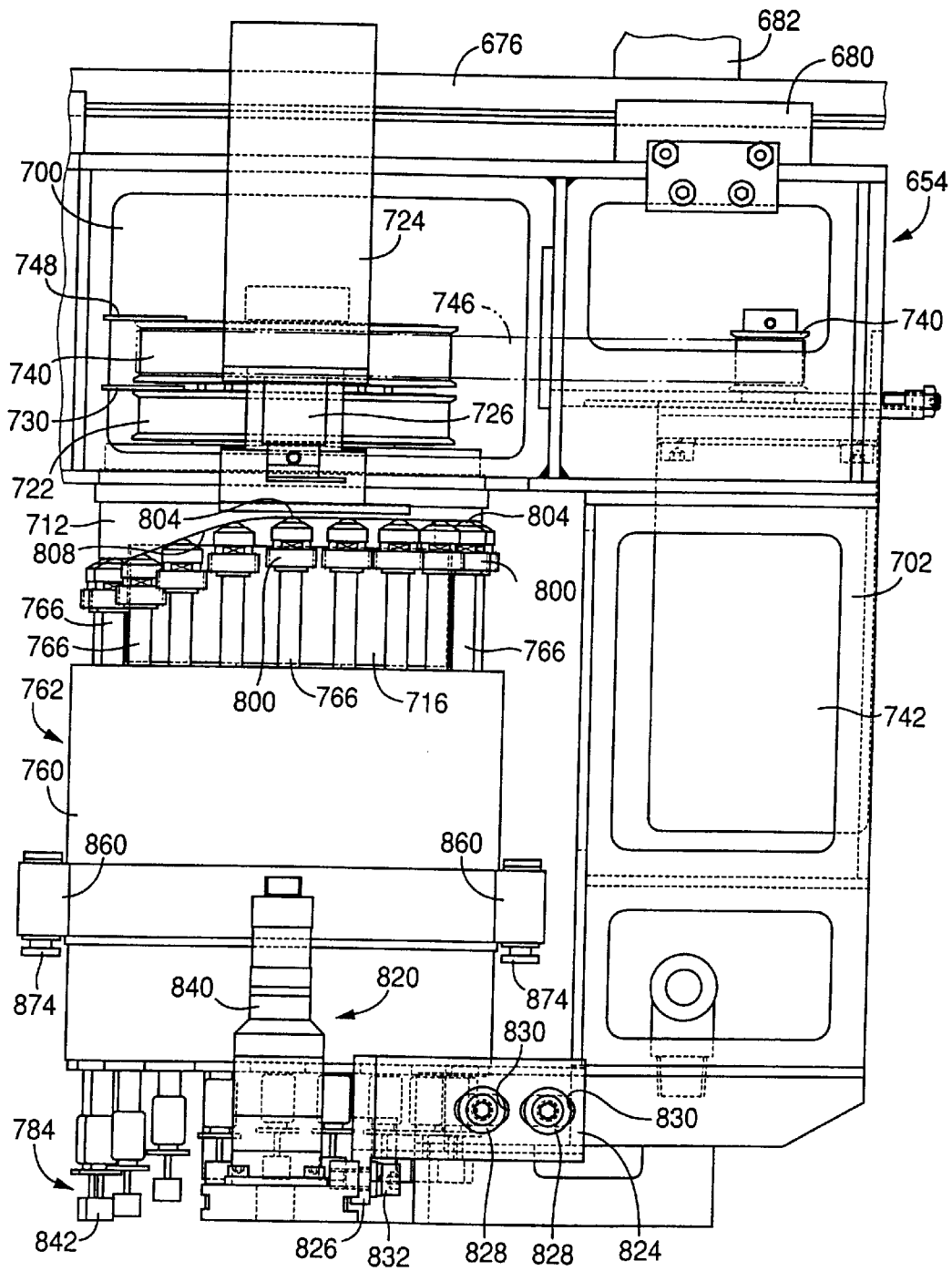
FIG. 15 is a front elevation view of the CC mounting head and the X-direction slide.

As shown in FIGS. 11 and 12, the stationary cam 712 includes a cam-surface defining cylindrical portion 814 which is concentric with the rotation shaft 708, and a lower surface of the cylindrical portion 814 defines the cam surface 808. The cam surface 808 is provided above the locus of revolution of the CC suction shafts 766 and, as shown in FIGS. 11 and 15, includes a portion whose height level or position continuously changes. Therefore, when the intermittent-rotation member 762 is rotated, each cam follower 804 is moved while rolling on the cam surface 808. Thus, the twenty CC suction shafts 766 are sequentially moved upward and downward while being revolved around the axis line of the rotation shaft 708.

When the intermittent-rotation member 762 is rotated and the CC suction shafts 766 are moved up and down while being revolved, the respective driven gears 800 fixed to the respective upper end portions of the respective shaft members 768 of the CC suction shafts 766 are moved up and down while being meshed with the drive gear 716. The width of the drive bear 716 is greater than those of the driven gears 800. That is, the dimension of the drive bear 716 as measured in a direction parallel to the axis line of rotation of the intermittent-rotation member 762 and parallel to the CC suction shafts 766, is greater than those of the driven gears 800. Therefore, even if the suction shafts 766 are moved up and down, the gears 800 remain meshed with the drive gear 716.

The horizontal portion 704 of the X slide 654 has a recess 816 (FIGS. 11 and 13) formed along a part-cylindrical surface whose center rides on the axis line of rotation of the intermittent-rotation member 762. Thus, the horizontal portion 704 does not interfere with the CC suction shafts 766 or the CCs 842 held by the shafts 766.

Figure 16:
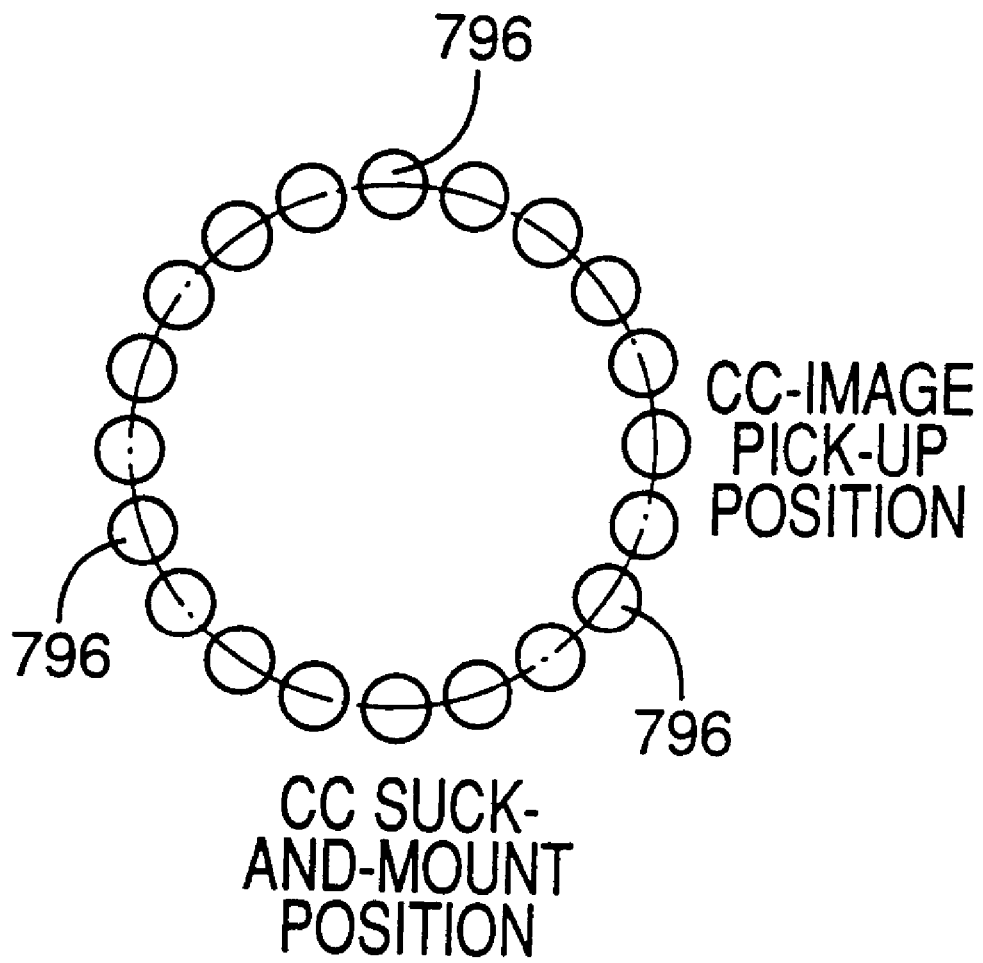
FIG. 16 is a view showing the CC suction shafts of the CC mounting head.

The height of the cam surface 808 continuously increases from the lowest point thereof toward the diametrically opposite point thereof, in each of opposite directions, such that the cam surface 808 has the highest level at a point distant by 90 degrees from the lowest point in each direction. The rotation shaft 708 is intermittently rotated, that is, rotated by an angle equal to that at which the twenty CC suction shafts 766 are equiangularly spaced from one another, and then stopped for a suitable time. Thus, while the shaft 708 is intermittently rotated by 360 degrees, each of the suction shafts 766 is stopped at twenty stop positions. In the present embodiment, one of the twenty stop positions which corresponds to the lowest point of the cam surface 808 is utilized as a CC suck-and-mount position which can be called as a CC receive-and-mount position or a CC suck-and-release position, and another stop position which corresponds to the point which is distant by 90 degrees from the lowest point in one direction and has the highest level is utilized as a CC-image pick-up position. The cam surface 808 is so formed as to ensure that each suction shaft 766 is moved in a horizontal direction in the vicinity of each of the CC suck-and-mount position and the CC-image pick-up position. FIG. 16 shows the CC suck-and-mount position and the CC-image pick-up position. In this figure, white circles represent the respective reflector plates 796 of the CC suction nozzles 784.

A CC-image pick-up device 820 is provided on the X slide 654, at a position corresponding to the CC-image pick-up position. As shown in FIGS. 13 and 15, the pick-up device 820 is attached to one end portion of the horizontal portion 704 of the X slide 654 as viewed in the Y direction via brackets 824, 826. The first bracket 824 is attached to the horizontal portion 704 by the engagement of screw members 828 with elongate holes 830, so that the position of the bracket 824 is adjustable in the X direction, and the second bracket 826 is attached to the first bracket 824 by the engagement of screw members 832 with elongate holes 834, so that the position of the bracket 826 is adjustable in the Y direction.

The CC-image pick-up device 820 includes a lighting device 836, a reflecting device 838, and a CCD (charge-coupled device) camera 840. As shown in FIG. 13, the lighting device 836 and the reflecting device 838 are provided below the CC suction shaft 766 being stopped at the CC-image pick-up position and the CC 842 held by the suction shaft 766, are oriented in a direction perpendicular to both a tangential line with respect to the locus of revolution of each suction shaft 766 at the CC-image pick-up position and the axis line of rotation of the intermittent-rotation member 762, and are opposed to the CC 842. The reflecting device 838 includes, e.g., a prism or a plurality of mirrors, and deflects the direction of propagation of an image forming light so that the deflected light is incident to the CCD camera 840. The lighting device 838 includes two lighting sections 848 which are provided on both sides of the reflecting device 838, respectively, and which emit lights toward the reflector plate 796 of each CC suction nozzle 784. The positions of the CC-image pick-up device 820 in the X and Y directions can be adjusted by changing the positions where the two brackets 824, 826 are attached to the horizontal portion 704. The lighting device 836 can be detached from the X slide 654, by operating a manually operable member 850.

Thus, the height level of the CC-image pick-up position is higher than that of the CC suck-and-mount position. The CC-image pick-up device 820 is provided in a space over which each CC suction shaft 766 is moved up by the cooperation of the stationary cam 712 and the cam follower 804. Thus, the pick-up device 820 does not interfere with each CC suction nozzle 784 and the CC 842 held thereby, and does not interfere with the CC supplying device 14 and the PCB 408. In addition, the distance over which each CC suction nozzle 784 is moved up and down for sucking or mounting the CC 842 at the CC suck and mount position, is reduced.

In the case where each CC suction shaft 766 takes the same height level at each of the CC suck and mount position and the CC-image pick-up position, it goes without saying that the pick-up device 820 must not interfere with each CC suction nozzle 784 and the CC 842 held thereby, and must not interfere with the CC supplying device 14 and the PCB 408. In this case, however, the distance over which each CC suction nozzle 784 is moved up and down for sucking or mounting the CC 842 at the CC suck-and-mount position, is increased.

As shown in FIG. 11, the X slide 654 supports a reference mark image pick-up device 854 which picks up images of reference marks provided on each PCB 408. More specifically described, the pick-up device 854 is attached to a lower portion of the pendent portion 702 which is opposite to the CC image pick-up device 820 as viewed in the Y direction, such that the pick-up device 854 is oriented downward.

Each CC suction nozzle 784 sucks the CC 842 by applying a negative pressure or vacuum to the same 842. Respective pressure switch valves 860 for the twenty CC suction shafts 766 are fixed to the outer surface of the CC-suction-shaft holding member 760 such that the switch valves 860 are equiangularly spaced from one another (only two valves 860 are shown in FIG. 15). As shown in FIG. 12, each CC suction shaft 766 has a passage 862 which extends in the axial direction of the shaft 766 and which communicates with the nozzle holding hole 782. The passage 862 also communicates with the switch valve 860 via the passage 780 provided between the holding hole 764 and the suction shaft 766 and a passage (not shown) formed in the CC-suction-shaft holding member 760.

As shown in FIG. 11, the negative pressure is supplied to a passage 866 and an annular passage 868 which are formed in the horizontal portion 704 and the support portion 706 of the X slide 654, and a passage 870 which is formed in the rotation shaft 708, and finally to the twenty pressure switch valves 860 via hoses (not shown). The passage 866 is connected to a vacuum source via a hose (not shown) which is attached to the X slide 654 with a joint member. The communication of the passage 870 with the passage 866 via the annular passage 868 is maintained while the rotation shaft 708 is rotated.

As shown in FIG. 12, each pressure switch valve 860 includes a housing 872 and a movable switch member 874 which is provided in the housing 872 such that the switch member 874 is linearly movable up and down so as to selectively supply the CC suction nozzle 784 with a negative pressure or a pressure not lower than the atmospheric pressure. When the switch member 874 is moved down to its negative-pressure ("NP") supply position, the pressure switch valve 860 changes the pressure in the nozzle 784 from the pressure not lower than the atmospheric pressure, to the negative pressure, so that the nozzle 784 can suck and hold the CC 842. The state in which the switch member 874 is at its NP supply position, will be referred to as the "NP supply state" of the switch valve 860. Meanwhile, when the switch member 874 is moved up to its NP remove position, the pressure switch valve 860 changes the pressure in the nozzle 784 from the negative pressure to the pressure not lower than the atmospheric pressure, so that the nozzle 784 can release the CC 842. The state in which the switch member 874 is at its NP remove position, will be referred to as the "NP remove state" of the switch valve 860. The switch member 874 has, at its axially opposite ends thereof, two large-diameter stopper portions 876, 878, respectively, which stop the movement of the switch member 874 in its axial direction at its NP supply and remove positions, respectively. The switch member 874 is adapted such that once it is moved to each of the NP supply and remove positions, it is held at that position.

Figure 17:
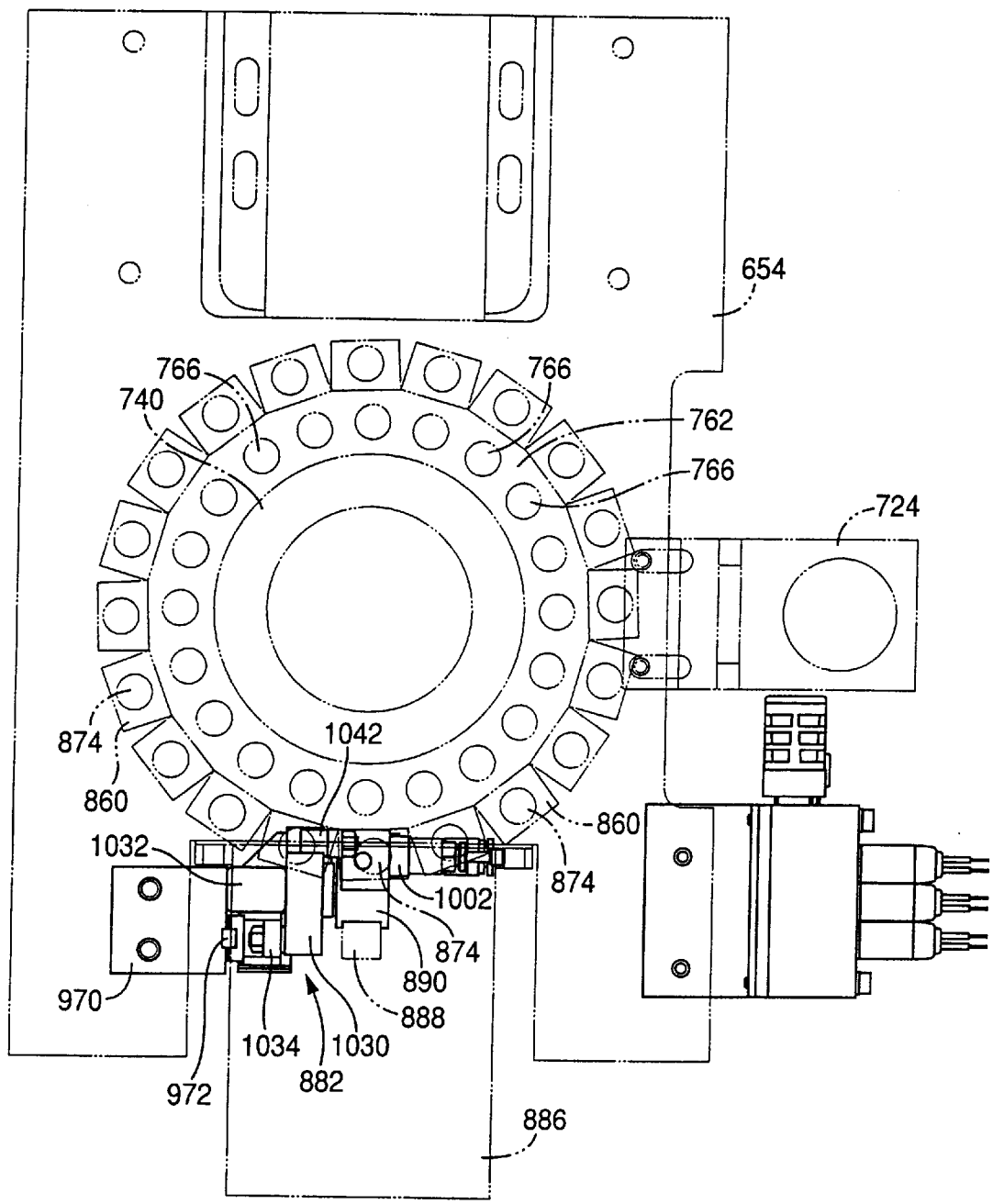
FIG. 17 is a plan view of a mechanical section of a switch-valve control device of the CC mounting head.
Figure 18:
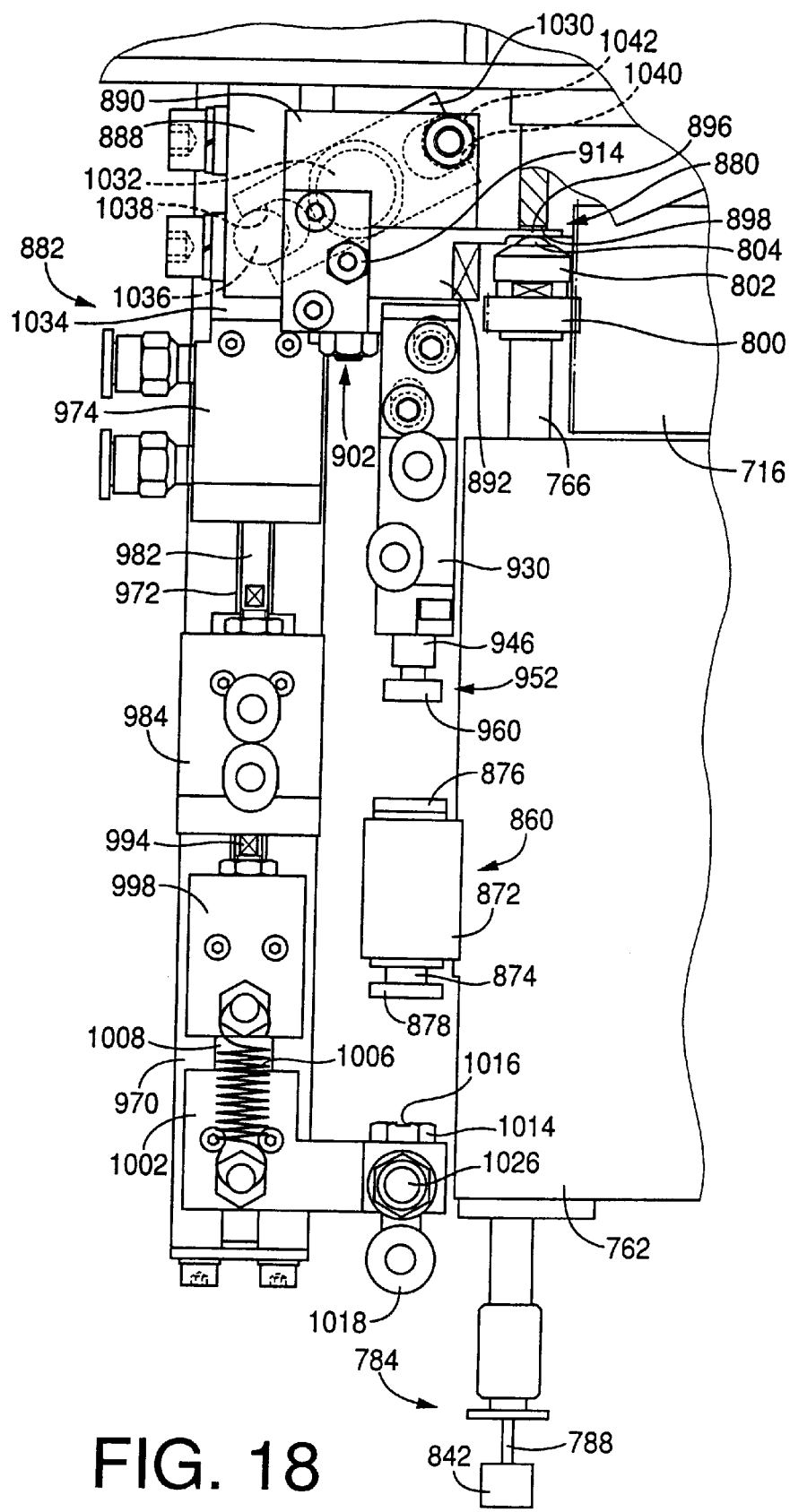
FIG. 18 is a front elevation view of the mechanical section of the switch-valve control device.
Figure 19:
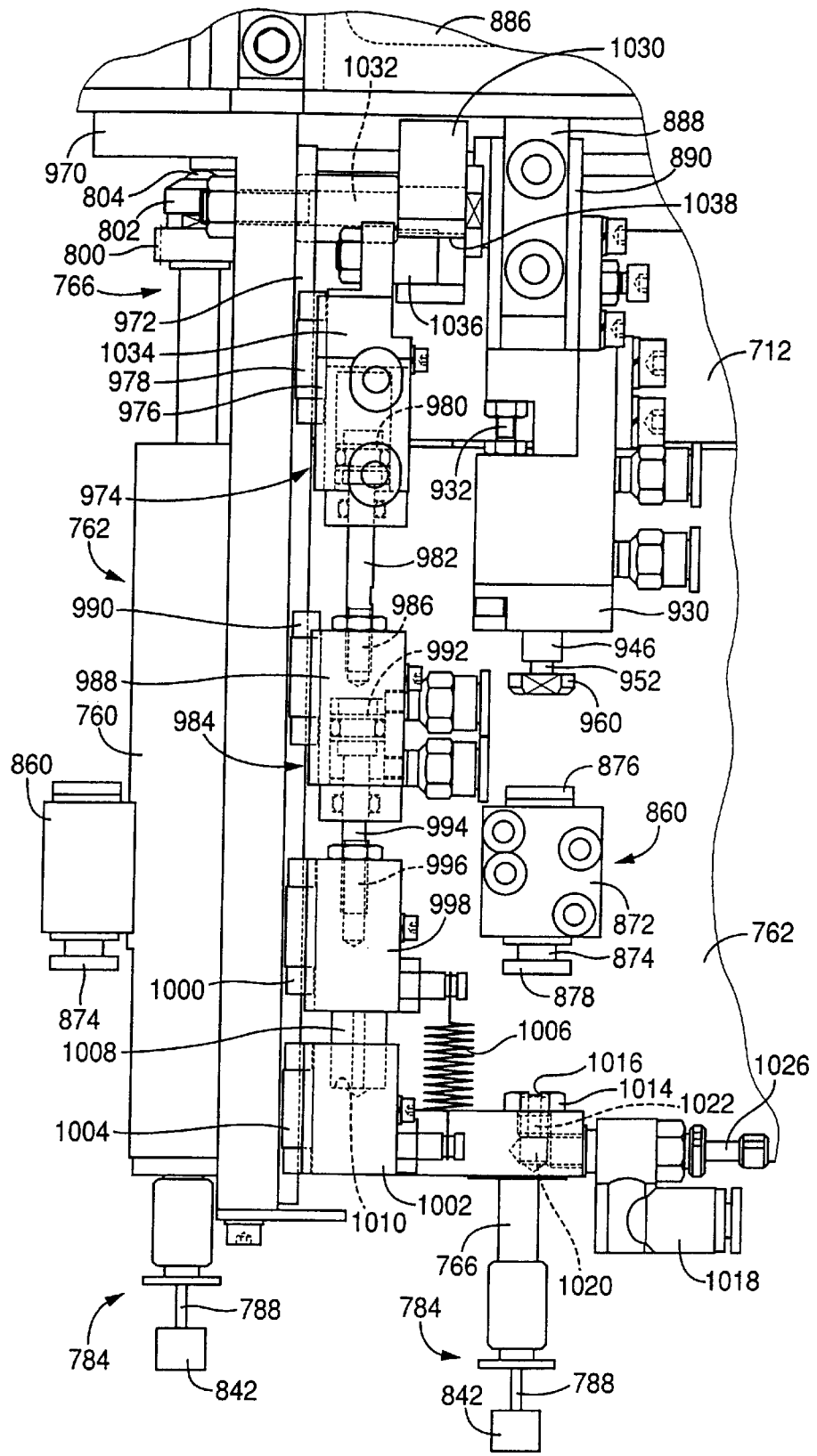
FIG. 19 is a side elevation view of the mechanical section of the switch-valve control device.

As shown in FIGS. 17, 18, and 19, there are provided, on the X slide 654 and in the vicinity of the CC suck-and-mount position, an individual-CC-suction-shaft elevating and lowering device 880 which elevates and lowers each CC suction shaft 766, and a mechanical portion of a switch-valve control device 882.

As shown in FIGS. 17 and 19, a linear motor 886 as a drive-source device is fixed to a portion of the X slide 654 which corresponds to the CC suck-and-mount position. The linear motor 886 includes an output member 888 which projects vertically downward from a housing of the motor 886 and to which a movable member 890 is fixed.

Figure 20:
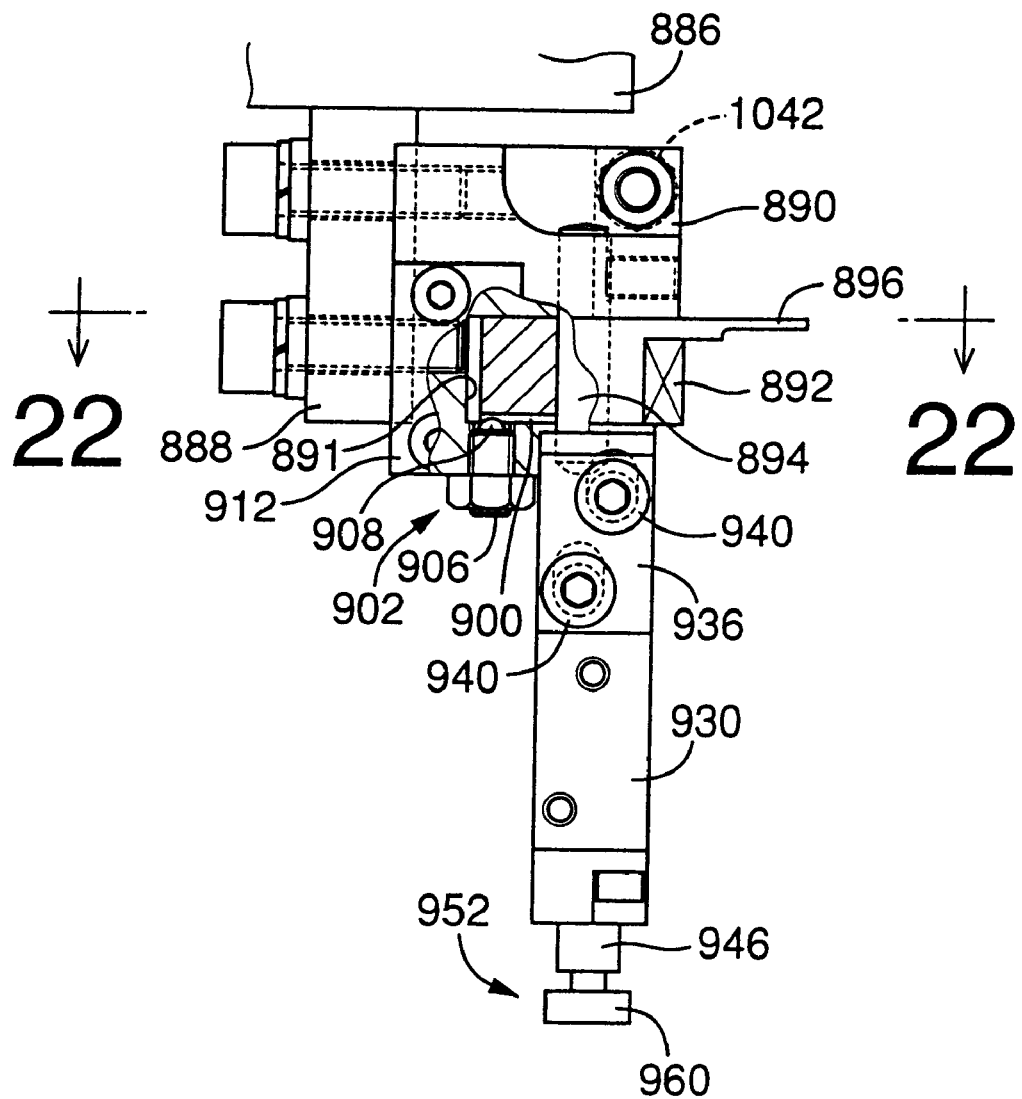
FIG. 20 is a front elevation view of a portion of the switch-valve control device which switches a pressure switch valve to its negative-pressure ("NP") supply state.
Figure 21:
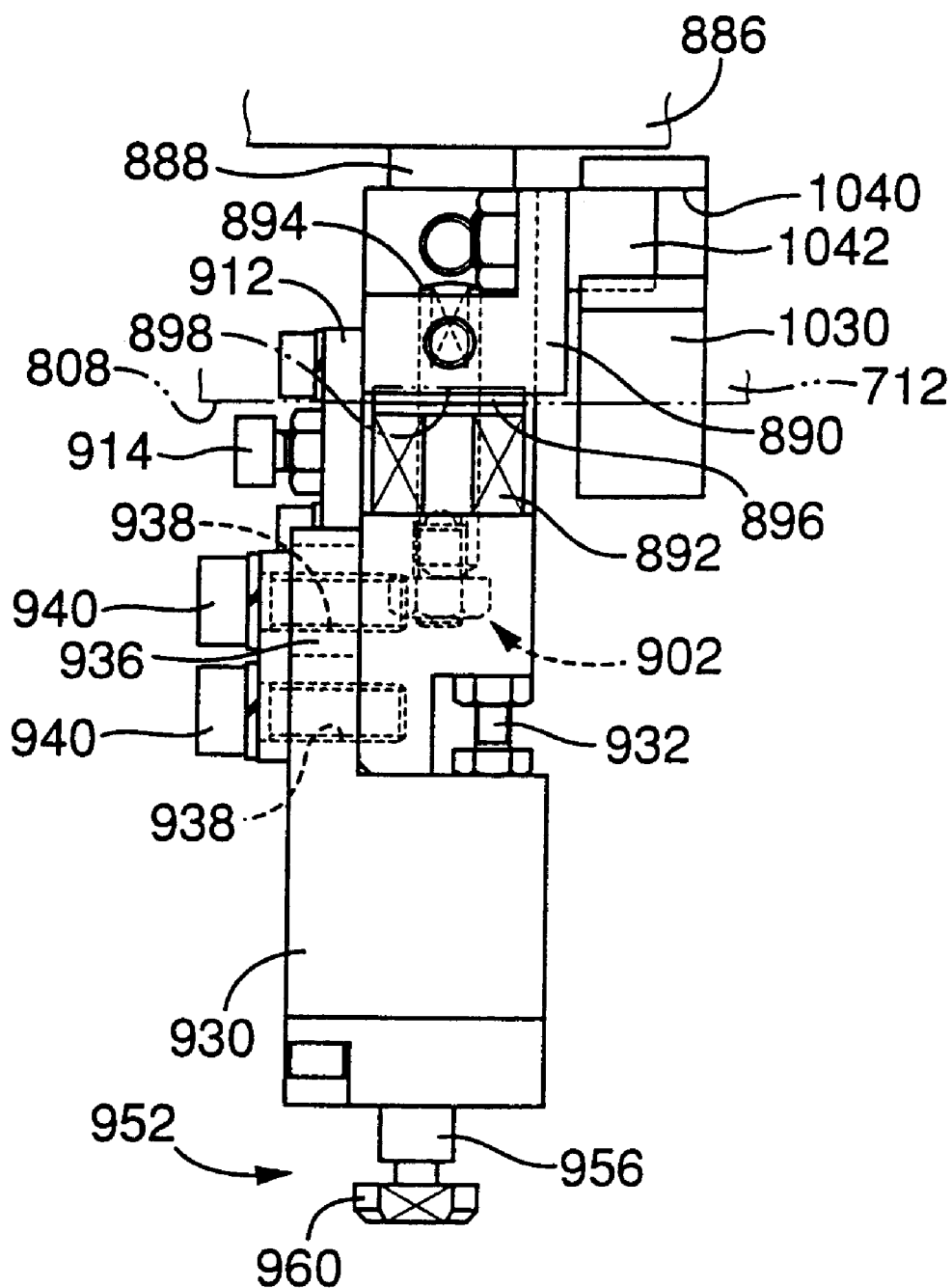
FIG. 21 is a side elevation view of the portion of the switch-valve control device which switches the pressure switch valve to its NP supply state.
Figure 22:
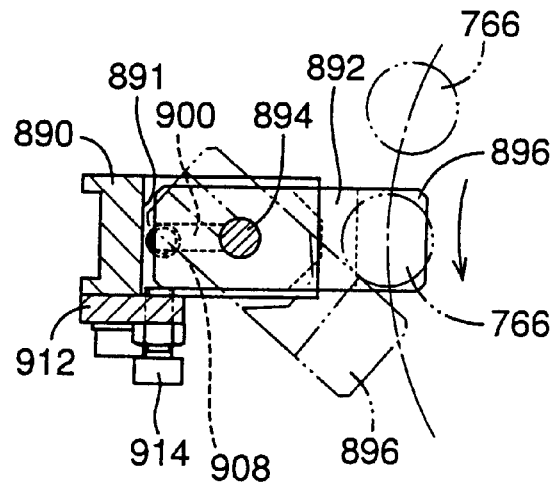
FIG. 22 is a cross-section view taken along line 22—22 in FIG. 20.

As shown in FIGS. 20 and 22, the movable member 890 has a recess 891 formed through the thickness thereof in a direction parallel to a tangential line with respect to the locus of revolution of each CC suction shaft 766 at the CC suck and mount position. An axis member 894 is fixed to the movable member 890 at a position laterally offset from the locus of revolution of the CC suction shaft 766 (indicated at one-dot chain line in FIG. 22), and a drive member 892 is attached to the axis member 894 such that the drive member 892 is rotatable about a vertical axis line, i.e., the axis member 894. As shown in FIG. 18, an end portion of the drive member 892 which projects from the axis member 894 toward the stationary cam 712 provides a thin-plate-like drive portion 896 which can fit in a recess 898 (FIGS. 18 and 21) which is formed in a portion of the cam 712 which corresponds to the CC suck-and-mount position, such that the drive portion 896 is movable downward, and upward, out of, and into, the recess 898. The recess 898 has a width (i.e, dimension in the circumferential direction of the cam 712) which allows the drive portion 896 to be fitted therein without any clearance and be released therefrom, and a depth (i.e., dimension in a direction parallel to the center line of the cam 712) which is slightly greater than the thickness of the drive portion 896 and which allows each cam follower 804 to continue moving while rolling thereover.

When the movable member 890 is elevated and lowered by the linear motor 886, the drive member 892 is elevated and lowered between an upper position where the drive portion 896 is fitted in the recess 898 such that the drive portion 896 can be elevated and lowered and where the lower surface of the drive portion 896 is flush with the cam surface 808 of the stationary cam 712, and a lower position where the drive portion 896 is released from the recess 898 and where the lower surface of the drive portion 896 is below the cam surface 808. The upper surface of the drive portion 898 has a pair of obliquely cut end portions (not shown) which are opposite to each other in the direction of revolution of each CC suction shaft 766 and which function as guide portions for guiding the drive portion 896 when the portion 896 is fitted in the recess 898.

As shown in FIG. 20, the drive member 892 has a notch 900 which is formed in the lower surface of the other end portion thereof opposite to the drive portion 896 and which extends in a longitudinal direction thereof perpendicular to the axis line of rotation thereof and functions as a positioning recess. A positioning device 902 which is called as a "ball spring" is attached to the movable member 890. The positioning device 902 includes a casing 906 which is screwed in the movable member 890, and a ball 908 as a positioning member which is accommodated in the casing 906 such that the ball 908 is movable therein and is prevented from coming thereoff. The ball 908 is biased by a spring (not shown) as a sort of elastic member as a sort of biasing member which is accommodated in the casing 906, in a direction in which the ball 908 projects outward from the casing 906.

As shown in FIGS. 21 and 22, a bracket 912 is fixed to the movable member 890, and an adjustor bolt 914 as a stopper member whose position is adjustable is screwed in the bracket 912. The adjustor bolt 914 is provided adjacent to the other end portion of the drive member 892 which is opposite to the drive portion 896 thereof, and on the downstream side of the drive member 892 in the direction of revolution of each CC suction shaft 766 indicated at arrow in FIG. 22. The adjustor bolt 914 is screwed in the bracket 912 such that the bolt 914 extends perpendicular to the axis line of revolution of the movable member 892 and in a direction parallel to the tangential line with respect to the locus of rotation of the CC suction shaft 766 at the CC suck-and-mount position. The adjustor bolt 914 stops the rotation of the drive member 892 being positioned at its lower position due to its malfunction, in a direction opposite to a direction in which the drive member 892 is rotated by the CC suction shaft 766.

The position of a free end of the adjustor bolt 914 is so adjusted that with the drive member 892 being in contact with the bolt 914, the ball 908 fits in the notch 900 such that the ball 908 engages one of a pair of opposite inner oblique surfaces of the notch 900 which is nearer to the bolt 914, and separates from the other inner oblique surface, so that the ball 908 presses the drive member 892 against the bolt 914 and thereby accurately positions the drive portion 896 at its operative position (indicated at solid line in FIG. 22) where the drive portion 896 can fit in the recess 898 formed in the stationary cam 712. Thus, the notch 900 and the positioning device 902 cooperate with each other to provide a biasing device, which cooperates with the adjustor bolt 914 to provide a positioning device as a sort of clip-stop device.

There is provided, on the X slide 654, a drive-member retraction sensor 920 (FIG. 24) which detects that the drive member 892 has been rotated to its retracted position indicated at two-dot chain line in FIG. 22. The retraction sensor 920 is provided by a transmission-type photoelectric sensor including a light emitter and a light detector, and detects that the drive member 892 has been rotated to its retracted position, when the drive portion 896 of the drive member 892 interrupts the light emitted by the light emitter, i.e., when the light detector fails to detect the light emitted by the light emitter. However, the retraction sensor 920 may be provided by a reflection-type photoelectric sensor, a proximity switch, a limit switch, or the like.

Figure 23:
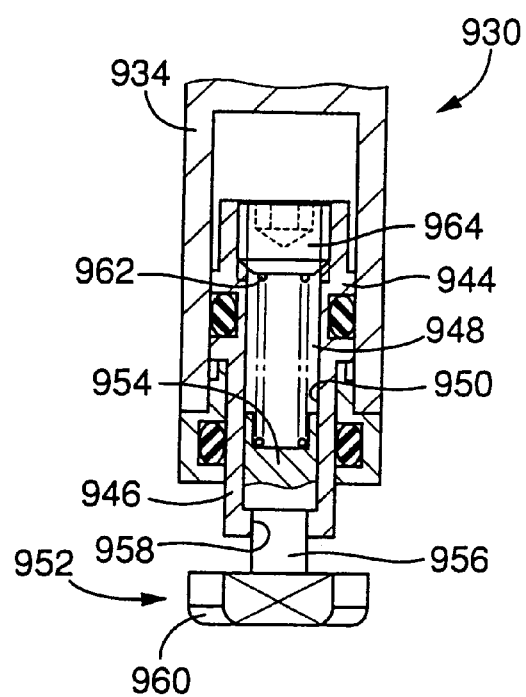
FIG. 23 is a cross-section, front elevation view of an operative member of the portion of the switch-valve control device which switches the pressure switch valve to its NP supply state.

As shown in FIGS. 19, 20, and 21, a main air cylinder 930 is attached to the movable member 890 such that the height position of the cylinder 930 is adjustable. The height position of the main air cylinder 930 relative to the movable member 890 is defined by the contact thereof with an adjustor bolt 932 which is screwed in the movable member 890 and, in this state, the cylinder 930 is fixed to the movable member 890 by screwing bolts 940 in the member 890 through elongate holes 938 of an attachment portion 936 (FIG. 21) which is integral with a cylinder tube 934 (FIG. 23).

The main air cylinder 930 is provided by an air cylinder as a sort of fluid-pressure-operated cylinder device. The cylinder 930 is of a double-action type and, as shown in FIG. 23, includes a piston 944 which is airtightly fitted in the cylinder tube 934 such that the piston 944 is movable in the axial direction of the tube 934, and a piston rod 946 which projects downward from the tube 934. A stepped through-hole 948 is formed in the piston 944 and the piston rod 946, such that the hole 948 extends through the members 944, 946 in the axial direction of the tube 934. The through-hole 948 includes a large-diameter portion 950 in which a fitting portion 954 of an operative member 952 fits such that the portion 954 is movable in the axial direction.

The operative member 952 includes a shaft portion 956 which extends from the fitting portion 954 and projects downward from the piston rod 946 through a small-diameter portion 958 of the through-hole 948, and which includes an operative portion 960. The operative member 952 is biased by a compression coil spring 962 as a sort of elastic member as a sort of biasing member which is provided in the large-diameter portion 950, in a downward direction in which the piston rod 946 projects from the cylinder tube 934. The downward movement of the operative member 952 due to the biasing force of the spring 962 is stopped or limited by the engagement of the fitting portion 954 with the bottom wall of the piston rod 946. One end of the spring 962 is seated on a plug 964 which is screwed in an opening of the piston 944. The main air cylinder 930 is provided at a position right above the switch member 874 of the pressure switch valve 860 associated with the CC suction shaft 766 being stopped at the CC suck-and-mount position. Thus, the operative member 952 is positioned right above the switch member 874.

As shown in FIGS. 17 to 19, a bracket 970 is fixed to a portion of the X slide 654 which is near to the CC suck-and-mount position, such that the bracket 970 extends downward from the X slide 654. A straight guide rail 972 as a guide member is fixed to a vertical side surface of the bracket 970, such that the guide rail 972 vertically extends. A cylinder tube 976 of a main air cylinder 974 as a sort of fluid-pressure-operated cylinder device fits on the guide rail 972 via a guide block 978 as a guided member.

The main air cylinder 974 is of a double-action type and, as shown in FIG. 19, includes a piston 980 which is airtightly accommodated in the cylinder tube 976 such that the piston 980 is movable in the tube 976. A piston rod 982 which extends from the piston 980 projects downward from the tube 976, and an auxiliary air cylinder 984 as another fluid-pressure-operated cylinder device is attached to an externally threaded lower end portion 986 of the rod 982. The threaded portion 986 is screwed in a cylinder tube 988 of the auxiliary air cylinder 984. The height position of the auxiliary air cylinder 984 relative to the main air cylinder 974 can be adjusted by changing the amount of threaded engagement of the threaded portion 986 with the cylinder tube 988.

The auxiliary air cylinder 984 is of a double-action type, and the cylinder tube 988 fits on the guide rail 972 via a guide block 990 as a guided member such that the tube 988 is movable on the rail 972. The air cylinder 984 includes a piston 992 which is airtightly fitted in the cylinder tube 988 such that the piston 992 is movable in the tube 988. A piston rod 994 which is integral with the piston 992 projects downward from the tube 988, and has an externally threaded lower end portion 996 with which a support member 998 is threadedly engaged. The support member 998 fits on the guide rail 972 via a guide block 1000 as a guided member, such that the support member 998 is movable on the rail 972. The height position of the support member 998 relative to the auxiliary air cylinder 984 can be adjusted by changing the amount of threaded engagement of the threaded portion 996 with the support member 998.

An operative member 1002 fits, via a guide block 1004 as a guided member, on a lower end portion of the guide rail 972 which is below the support member 998, such that the operative member 1002 is movable on the rail 972. A tension coil spring 1006 as a sort of elastic member as a sort of biasing member is provided between the operative member 1002 and the support member 998, so that the operative member 1002 is biased in a direction toward the support member 998. A cushion member 1008 which is formed of an elastic material (e.g., rubber) is fixed to the lower surface of the support member 998, and is fitted in a blind hole 1010 which is formed in the operative member 1002 such that the cushion member 1008 is movable relative to the hole 1010. The upward movement of the operative member 1002 due to the biasing force of the spring 1006 is stopped or limited by the contact of the cushion member 1008 with the bottom of the blind hole 1010. The cushion member 1008 absorbs the impact which is produced when the operative member 1002 is moved upward by the biasing force of the spring 1006 and is stopped at its upper position.

As shown in FIG. 17, the operative member 1002 projects horizontally toward the intermittent-rotation member 762 from a base portion of the member 1002 which fits on the guide rail 972, and an end portion of the member 1002 is positioned below the switch member 874 of the pressure switch valve 860 of the CC suction shaft 766 being stopped at the CC suck-and-mount position. Thus, the operative member 1002 has a generally L-shaped configuration as shown in FIG. 18. A contact member 1014 which is screwed in the end portion of the operative member 1002 provides an operative portion of the operative member 1002. The contact member 1014 has a groove 1016 which is formed through an upper portion thereof in a diametrical direction thereof.

As shown in FIGS. 18 and 19, the operative member 1002 is connected to an air-supply device (not shown) via a joint member 1018 and an air supply hose (not shown). The air (pressurized air) supplied from the air supply device is conducted through a passage 1020 formed in the operative member 1002 and a passage 1022 formed in the contact member 1016, so that the air blows upward. A solenoid-operated shut-off valve 1024 (FIG. 24) which is provided between the joint member 1018 and the air supply device, permits the air to be supplied to the operative member 1002 and inhibits the air from being supplied to the same 1002. The joint member 1018 is equipped with a variable throttle valve 1026 which is operable for changing the amount of air supplied from the air supply device to the operative member 1002.

As shown in FIGS. 18 and 19, a link 1030 is attached via an axis member 1032 to the bracket 970 such that the link 1030 is rotatable about an axis line parallel to a tangential line with respect to the locus of revolution of the pressure switch valve 860 of the CC suction shaft 766 being stopped at the CC suck-and-mount position. A movable member 1034 is provided as an integral part of the cylinder tube 976 of the main air cylinder 974, and a roller 1036 is attached to the movable member 1034 such that the roller 1036 is rotatable. The roller 1036 fits in a recess 1038 (FIG. 18) formed through one end portion of the link 1030, such that the roller 1036 is rotatable.

The link 1030 has another recess 1040 (FIG. 18) formed through the other end portion thereof. A roller 1042 (FIG. 21) is attached to the movable member 890 which is moved up and down by the linear motor 886, such that the roller 1042 is rotatable. The roller 1042 fits in the recess 1040 such that the roller 1042 is rotatable. Therefore, when the movable member 890 is moved upward and downward by the linear motor 886, the link 1030 is rotated, so that the movable member 1034 is moved downward and upward in synchronism with the upward and downward movements of the movable member 890, respectively. Thus, the two operative members 952, 1002 simultaneously move toward, and away from, the switch member 874 of the pressure switch valve 860. That is, when the operative member 952 moves toward, and away from, the switch member 874, the operative member 1002 also moves toward, away from, the same 874.

Figure 24:
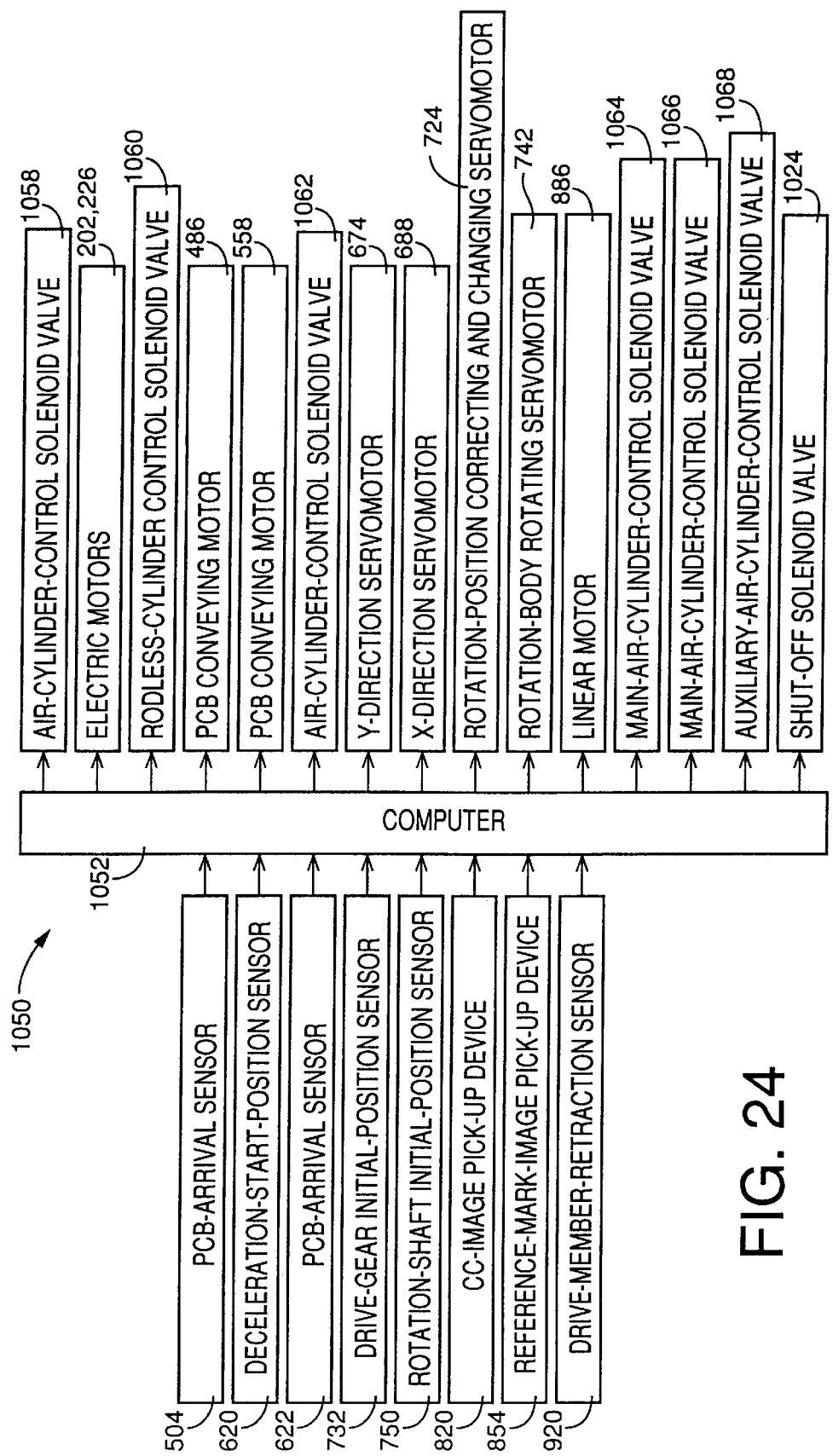
FIG. 24 is a diagrammatic view of a control device of the CC mounting system of FIG. 1.

The present CC mounting system 8 includes a control device 1050 which is provided by a computer 1052 as shown in FIG. 24. The computer 1052 includes a central processing unit (CPU), a read only memory (ROM), a random access memory (RAM), an input interface, an output interface, and a bus which connects those elements. To the computer 1052, are connected the PCB-arrival sensor 504, the deceleration-start-position sensor 620, the PCB-arrival sensor 622, the drive-gear initial-position sensor 732, the rotation-shaft initial-position sensor 750, the CC-image pick-up device 820, the reference-mark image pick-up device 854, and the drive-member retraction sensor 920. The computer 1052 is connected via respective drive circuits (not shown) to an air-cylinder-control solenoid-operated valve 1058 which controls the air cylinder of the engaging device 68; the electric motors 202, 226; a rodless-cylinder control solenoid-operated valve 1060 which controls the rodless cylinder 436; the PCB conveying motors 486, 558; an air-cylinder-control solenoid-operated valve 1062 which controls the air cylinder 634; the Y-direction servomotor 674; the X-direction servomotor 688; the rotation-position correcting and changing servomotor 724; the rotation-body rotating servomotor 742; the linear motor 886; main-air-cylinder-control solenoid-operated valves 1064, 1066 which control the main air cylinders 930, 974, respectively; an auxiliary-air-cylinder-control solenoid-operated valve 1068 which controls the auxiliary air cylinder 984; and the solenoid-operated shut-off valve 1024. The linear motor 886 which linearly moves the movable member 890 and thereby elevates and lowers the drive member 892, can be feed-back controlled to accurately position each CC suction shaft 766 and accurately decelerate and accelerate the same 766 via the movable member 890 and the drive member 892. The ROM stores various control programs which are needed for supplying, sucking, and mounting the CCs 842 and carrying in and out the PCBs 408.

Next, there will be described the operation of the present CC mounting system 8.

The first and second CC mounting devices 18, 20 alternately mount the CCs 842 on the PCB 408 which is positioned and supported by either one of the first and second main conveyors 400, 402. That is, the two CC mounting devices 18, 20 cooperate with each other to mount all the CCs 842 that are to be mounted on each PCB 408. While the two CC mounting devices 18, 20 mount the CCs 842 on one PCB 408 positioned and supported by one of the two main conveyors 400, 402, another PCB 408 is carried in onto the other main conveyor, and positioned and supported thereby, so that the PCB 408 waits for the CC mounting devices 18, 20 to mount the CCs 842 thereon. After the CC mounting devices 18, 20 finish mounting the CCs 842 on one PCB 408 on one main conveyor 400 or 402, then the devices 18, 20 start mounting the CCs 842 on another PCB 408 on the other main conveyor 402 or 400.

First, there will be described the manner in which the PCB 408 is carried in onto, positioned and supported by, and carried out from, the main conveyor 400, 402. The following description is made on the assumption that the CC mounting devices 18, 20 have already started their operations and are now in their steady operating state.

The PCB 408 is conveyed onto the carry-in conveyor 404 from the screen printing system 2 which is provided on the upstream side of the present CC mounting system 8, while the carry-in conveyor 404 is positioned at its first shift position. When the carry-in conveyor 404 is moved to its first shift position, the PCB conveying motor 486 is started, and the PCB 408 is received from the screen printing system 2 by the carry-in conveyor 404. The control device 1050 can identify which position the carry-in conveyor 404 is taking, the first or second shift position, based on the detection signal supplied from the stroke-end sensor (not shown) which detects that the piston of the rodless cylinder 436 has been moved to its stroke end. When the PCB 408 which has been conveyed onto the carry-in conveyor 404 is detected by the PCB-arrival sensor 504, the PCB conveying motor 486 is stopped, so that the PCB 408 is stopped on the carry-in conveyor 404. In the case where the carry-in conveyor 404 carries in the PCB 408 onto the first main conveyor 400, the carry-in conveyor 404 is kept at its first shift position.

However, the control device 1050 judges that an abnormality has occurred, if the PCB-arrival sensor 504 does not detect the PCB 408 even though more than a predetermined time has passed after the conveying of the PCB 408 from the screen printing system 2 has started. In this case, the control device 1050 automatically interrupts the CC mounting operations of the CC mounting devices 18, 20, and informs an operator of the occurrence of the abnormality. This interruption means that even after the devices 18, 20 have finished mounting all the CCs 842 on the current PCB 408 and then the PCB 408 has been carried out off the current main conveyor, the devices 18, 20 do not start mounting the CCs 842 on the next PCB 408 on the other main conveyor.

If, because a PCB 408 has been carried out from the first main conveyor 400 onto the carry-out conveyor 406 (the PCB carrying-out operation will be described later), another PCB 408 can be carried in onto the main conveyor 400, the carry-in conveyor 404 carries in another PCB 408 onto the main conveyor 400. The control device 1050 judges whether a PCB 408 can be carried in onto the first main conveyor 400, by judging whether the PCB-arrival sensor 622 as a CS detecting device is detecting the preceding PCB 408. In a step where a PCB 408 is carried in onto the main conveyor 400, the control device 1050 judges whether the PCB 408 has been carried in and placed on the main conveyor 400, based on the detection signal supplied from the PCB-arrival sensor 622. In other steps, the control device 1050 judges that there is no PCB 408 on the main conveyor 400 and accordingly a PCB 408 can be supplied to the main conveyor 400, if the PCB-arrival sensor 622 does not detect any PCB 408.

When a PCB 408 is carried in, the PCB conveying motor 486 of the carry-in conveyor 404 and the PCB conveying motor 558 of the main conveyors 400, 402 are started, so that the conveyor belts 546 are moved. Thus, the PCB 408 is placed onto the main conveyor 400. In this state, the stopper member 630 of the PCB stopping device 624 of the main conveyor 400 has been moved to its operative position. Subsequently, when the deceleration-start-position sensor 620 detects the PCB 408, the control device 1050 controls the PCB conveying motor 558 to start decelerating the speed of movement of the conveyor belts 546. Then, when the PCB-arrival sensor 622 detects the PCB 408, the control device 1050 stops the PCB conveying motor 558. At this moment, the PCB 408 has been stopped by the stopper member 630, while being held in butting contact with the same 630. Since the speed of movement of the PCB 408 has been decreased, the PCB 408 butts against the stopper 630 while producing only reduced impact.

However, if the PCB-arrival sensor 622 does not detect any PCB 408 even though more than a predetermined time has passed after the PCB conveying motor 558 has been started, the control device 1050 judges that an abnormality has occurred. Hence, the control device 1050 interrupts the current CC mounting operation and informs the operator of the occurrence of the abnormality.

After the PCB conveying motor 558 is stopped, the elevator table 598 is moved up, so that the PCB suction devices 602 suck and support the PCB 408 and simultaneously the thrust-up members 580 thrust up the PCB 408 and press the same 408 against the hold-down portions 570, 572. Thus, the PCB 408 being positioned and supported by the first main conveyor 400 waits for the CC mounting devices 18, 20 to mount the CCs 842 thereon. Therefore, after one of the two CC mounting devices 18, 20 mounts the last CC 842 on the PCB 408 positioned and supported by the second main conveyor 402, the one CC mounting device is moved away from the second main conveyor 402 to the corresponding CC supplying device 14, 16 and simultaneously the other CC mounting device is moved to the first main conveyor 400 to start mounting the CCs 842 on the waiting PCB 408. Thus, it needs substantially no time after the CC mounting devices 18, 20 finish the CC mounting operation on one PCB 408 and before the same 18, 20 start the same operation on another PCB 408. Accordingly, the present CC mounting system 8 can mount the CCs 842 on the PCBs 408 with high efficiency. The manner in which the CCs 842 are mounted on the PCBs 408 will be described later.

The PCB conveying motor 558 is common to the two main conveyors 400, 402. Accordingly, when the motor 558 is started, the conveyor belts 546 of both the two main conveyors 400, 402 are moved. However, while the CCs 842 are mounted on the PCB 408, the PCB 408 is thrusted up away from the conveyor belts 546. Therefore, the PCB 408 is not moved even if the conveyor belts 546 are moved. Thus, the CCs 842 can be mounted on one PCB 408 positioned and supported by one main conveyor, while concurrently another PCB 408 is carried in onto the other main conveyor or carried out from the same.

After the last CC 842 is mounted on the PCB 408, the PCB suction devices 602 are communicated with the atmosphere, so that the PCB 408 is released from the suction devices 602. Subsequently, the elevator table 598 is moved down, so that the PCB 408 is placed again on the conveyor belts 546. The PCB conveying motors 486, 558 of the carry-out conveyor 406 and the main conveyors 400, 402 are started, so that the PCB 408 is placed onto the carry-out conveyor 406. In the case where the PCB 408 is carried out from the first main conveyor 400, the carry-out conveyor 406 has already been shifted to its first shift position, and the stopper member 630 has already been moved to its inoperative position.

When the PCB-arrival sensor 504 of the carry-out conveyor 406 detects the PCB 408, the control device 1050 stops the PCB conveying motors 486, 558, so that the PCB 408 waits on the carry-out conveyor 406 for being fed to the solder reflowing system 4 provided on the downstream side of the CC mounting system 8. However, the PCB 408 may be immediately fed to the solder reflowing system 4, if possible, without stopping of the PCB conveying motor 486 of the carry-out conveyor 406. In the PCB carrying-out step, too, the control device 1050 judges that an abnormality has occurred, if the PCB-arrival sensor 504 does not detect any PCB 408 even though more than a predetermined time has passed after the PCB conveying motors 486, 558 have been started. Then, the control device 1050 interrupts the current CC mounting operation and informs the operator of the occurrence of the abnormality.

After the carry-in conveyor 404 hands over one PCB 408 to the first main conveyor 400, it receives another PCB 408 from the screen printing system. Then, the carry-in conveyor 404 is shifted to its second shift position, by the movement of its conveyor support table 426. Thus, the carry-in conveyor 404 waits for handing over the PCB 408 to the second main conveyor 402. After the last CC 842 is mounted on the preceding PCB 408 on the second main conveyor 402 and that PCB 408 is carried out therefrom, the carry-in conveyor 404 hands over the PCB 408 to the second main conveyor 402.

After the carry-out conveyor 406 hands over one PCB 408 received from the first main conveyor 400, to the solder reflowing system provided on the downstream side of the CC mounting system 8, it is shifted, by the movement of its conveyor support table 426, to its second shift position where it waits for receiving another PCB 408 from the second main conveyor 402. After the carry-out conveyor 406 receives the PCB 408 from the second main conveyor 402, it is shifted to its first shift position where it hands over the PCB 408 to the solder reflowing system.

After one PCB 408 is carried in from the carry-in conveyor 404 onto the second main conveyor 402, the PCB 408 is positioned and supported by the second main conveyor 402, in the same manner in which a PCB 408 is positioned and supported by the first main conveyor 400. Thus, the PCB 408 waits on the second main conveyor 402 for the CC mounting devices 18, 20 to mount the CCs 842 on the PCB 408. After the last CC 842 is mounted on the PCB 408 positioned and supported by the first main conveyor 400, the CC mounting devices 18, 20 start mounting the CCs 842 on the PCB 408 positioned and supported by the second main conveyor 402. After the last CC 842 is mounted on the PCB 408 on the second main conveyor 402, the PCB 408 is moved onto the carry-out conveyor 406.

When, in place of the current sort of PCBs 408 having a certain width, another sort of PCBs 408 having a different width are used, it is needed to change the current PCB conveying width of the main conveyors 400, 402, the carry-in conveyor 404, and the carry-out conveyor 406. To this end, the operator rotates the handle 510 to move the chain 470, under the state in which no PCB 408 is supported on the conveyors 400, 402, 404, 406. Thus, the respective movable frames 442, 526 of the conveyors 400 to 406 are simultaneously moved in the same direction and by the same distance, and the PCB conveying width of the conveyors 400 to 406 is changed to a new value.

Next, there will be described the manner in which CCs 842 are mounted on each PCB 408.

The two CC mounting devices 18, 20 alternately mount CCs 842 on one PCB 408. The first CC mounting device 18 is supplied with CCs 842 from the first CC supplying device 14 only, and the second CC mounting device 20 is supplied with CCs 842 from the second CC supplying device 16 only. The first CC mounting and supplying devices 18, 14 are provided on the same, one side of the conveyors 400 to 406, and the second CC mounting and supplying devices 20, 16 are provided on the same, other side of the conveyors 400 to 406. Therefore, when the respective CC mounting heads 650, 652 of the two CC mounting devices 18, 20 receive and mount the CCs 842, the respective Y slides 658, 660 of the two devices 18, 20 do not interfere with each other.

Before the CC mounting operation is started, the image of the reference marks of each PCB 408 are taken by the reference-mark-image pick-up device 854. This is done while the PCB 408 waits for the CC mounting operation after having been carried in onto the main conveyor 400 (or 402) and positioned and supported thereon. This is done by the reference-mark-image pick-up device 854 of one 18 (or 20) of the CC mounting devices which corresponds to the main conveyor 400 (or 402) supporting the waiting PCB 408. While the CC mounting operation is carried out on one PCB 408 positioned and supported on one main conveyor 400 (or 402), another PCB 408 is carried in onto the other main conveyor 402 (or 400) and is positioned and supported by the same. The CC mounting device 20 (or 18) corresponding to the other main conveyor 402 (or 400) takes the image of the reference marks of the PCB 408 on the other main conveyor, midway when it goes and fetches CCs 842 from the corresponding CC supplying device 16 (or 14) after it has mounted, on the PCB 408 on the one main conveyor 400 (or 402), all the CCs being currently held thereby. Even at a timing at which all the CCs that should be mounted on one PCB 408 have not been mounted on the PCB 408 yet, the image of the reference marks of the next PCB 408 may be taken, if the next PCB 408 has been carried in. Each PCB 408 has two reference marks on a diagonal line thereof. While the control device 1050 controls the CC mounting devices 18, 20 to suck and mount the CCs 842, the computer 1052 calculates, based on the image data representative of the taken image of the reference marks, an X-direction and a Y-direction position error of each of predetermined CC-mount places on the PCB 408, and stores the calculated errors in the RAM thereof.

There will be described the operation of the CC mounting head 650 as a representative of the two CC mounting heads 650, 652.

First, the CC mounting head 650 is moved to the CC supplying device 14, to take a predetermined number of CCs 842 from the supplying device 14. Here it is assumed that the mounting head 650 continuously mounts twenty CCs 842 on the PCB 408, each time, and accordingly each of the twenty CC suction shafts 766 of the head 650 takes one CC 842. In addition, for the purpose of easier understanding only, it is assumed that the feeders 54 which feed the respective sorts of CCs 842 to the head 650 are arranged in the same order in which the head 650 mounts the respective sorts of CCs 842 on the PCB 408. Each time the intermittent-rotation body 762 is rotated by one angular pitch (i.e., 360°/20=18°) and then stopped, and is linearly moved in the X direction by one pitch (i.e., pitch at which the feeders 54 are provided), each one of the twenty CC suction nozzles 784 is rotated to the CC suck-and-take position where the one nozzle 784 sucks a CC 842 from a corresponding feeder 54 being positioned thereunder.

More specifically described, the CCs 842 are taken from the feeders 54, while the intermittent-rotation body 762 is intermittently rotated and accordingly the twenty CC suction shafts 766 are sequentially positioned at the CC suck-and-mount position and while the body 762 is sequentially moved by the X-Y robot 662 to respective CC taking positions of the feeders 54 which feed the respective sorts of CCs 842. When the body 762 is intermittently rotated, the drive gear 716 is also rotated in the same direction at the same angular velocity. Thus, the CC suction shafts 766 are not rotated relative to the body 762.

Before each CC suction shaft 766 reaches the CC suck-and-mount position, the cam follower 804 of the suction shaft 766 engages the lower surface of the drive portion 896 of the drive member 892. Following this engagement, the linear motor 886 is started to lower the movable member 890, so that the drive member 892 is lowered and the shaft 766 is also lowered. Thus, the CC suction shaft 766 is lowered while being revolved. Before the nozzle 784 contacts the CC 842, the shaft 766 reaches the CC suck-and-mount position and stops thereat. Thus, the nozzle 784 can contact the CC 842 with high accuracy. While the shaft 766 is lowered at the CC suck-and-mount position by the drive member 892, the driven gear 800 remains meshed with the drive gear 716.

The CC carrier tapes 156 fed by the feeders 54 are emboss-type carrier tapes in which the respective upper surfaces of the CCs 842 accommodated in the respective embossed CC pockets of the tape take a predetermined height position in a vertical direction parallel to the direction of movement of the CC suction shafts 766, even though the respective sorts of CCs 842 carried by the CC carrier tapes 156 may have different height dimensions. The twenty nozzles 784 are of the same sort, and accordingly the lower end surface (i.e., suction surface) of the suction pipe 788 of each nozzle 784 being positioned at the CC suck-and-mount position takes a predetermined height position. Therefore, the distance between the lower end surface of the suction pipe 788 of each nozzle 784 being positioned at the CC suck-and-mount position, and the upper surface of the CC 842 being positioned at the CC taking position on each feeder 54, is constant even though the respective sorts of CCs 842 fed by the feeders 54 may have different height dimensions. Thus, the drive member 892 is moved down and up by a predetermined distance which is slightly greater than the distance between the lower surface of the suction pipe 788 and the upper surface of the CC 842. After the suction pipe 788 contacts the CC 842, the drive member 892 is further lowered by a small distance, so that the suction pipe 788 can surely suck the CC 842. An excessive downward movement of the nozzle 784 is accommodated or absorbed by the compression of the compression coil spring 790. The control device 1050 controls the linear motor 886 to lower each CC suction shaft 766 such that the shaft 766 is initially accelerated smoothly and then is decelerated smoothly. Thus, the suction pipe 788 can butt on the CC 842 with reduced impact only. The drive member 892 is decelerated smoothly, also when it is additionally lowered after the suction pipe 788 has contacted the CC 842. Since the linear motor 886 is used as the drive source for moving up and down each CC suction shaft 766, the control device 1050 can be programmed to move the shaft 766 at any desired speed or by any desired distance. Thus, the CCs 842 can be sucked or mounted in a shorter time.

FIG. 25 shows a time chart representing a relationship among the operation of the X-Y robot 662 (i.e., the movements of the CC mounting head 650), the intermittent rotations of the intermittent-rotation body 762, and the upward and downward movements of the CC suction shaft 766 being positioned at the CC suck-and-mount position. The curve associated with the X-Y robot 662 represents the time-wise change of speed of movement of the robot 662; the curve associated with the intermittent-rotation body 762 represents the time-wise change of speed of rotation of the body 762; and the curve associated with the CC suction shaft 766 represents the time-wise change of speed of upward and downward movements of the shaft 766. An increasing and a decreasing portion of each of the above three curves represent an increasing and a decreasing speed, respectively. In FIG. 25, CORRECTING AND CHANGING OF ROTATION POSITION OF CC means, as described later, that a possible rotation-position error of the CC 842 held by each CC suction shaft 766 is corrected, or the current rotation position of the CC is changed to its predetermined rotation position at which the CC is mounted on the PCB 408. This operation is effected by rotating the drive gear 716 and thereby rotating the shaft 766. The curve associated with CORRECTING AND CHANGING OF ROTATION POSITION OF CC represents the time-wise change of speed of rotation of the shaft 766. The curve associated with FEEDERS 54 represents the time-wise change of speed of feeding of the CC carrier tapes 156 by the feeders 54. The curve associated with CC-IMAGE PICK-UP DEVICE 820 represents the times of occurrence of events that the CC-image pick-up device 820 takes the images of the CCs 842 held by the CC suction shafts 766.

As the movable member 890 is lowered, the main air cylinder 930 is lowered, so that the operative member 952 is lowered. In addition, the link 1030 is rotated, so that the movable member 1034 is elevated and the operative member 1002 is elevated. When the CCs 842 are sucked or mounted, the control device 1050 outputs, as shown in FIG. 26, drive commands to the main air cylinders 930, 974 and the auxiliary air cylinder 984, so that the main-air-cylinder control valves 1064, 1066 and the auxiliary-air-cylinder control valve 1068 are switched. More specifically described, the control device 1050 outputs "ON" commands to those air cylinders which are required to operate for moving the operative members 952, 1002 to their operative positions, and outputs "OFF" commands to those air cylinders which are required to operate for moving the operative members 952, 1002 to their inoperative positions. When the CCs 842 are sucked, the piston rod 946 of the main air cylinder 930 is advanced from the cylinder tube 934, so that the operative member 952 is positioned at its operative position where the operative member 952 is distant from the cylinder tube 934. Simultaneously, the piston rod 982 of the main air cylinder 974 is advanced from the cylinder tube 976 and the piston rod 994 of the auxiliary air cylinder 984 is retracted into the cylinder tube 988, so that the operative member 1002 is positioned at its inoperative position. The table of FIG. 26 indicates that the respective piston rods 946, 982, 994 of the air cylinders 930, 974, 984 take their advanced or retracted positions, such that the air cylinders 930, 974, 984 take their advanced or retracted positions, for easier understanding purposes only.

Figure 27:
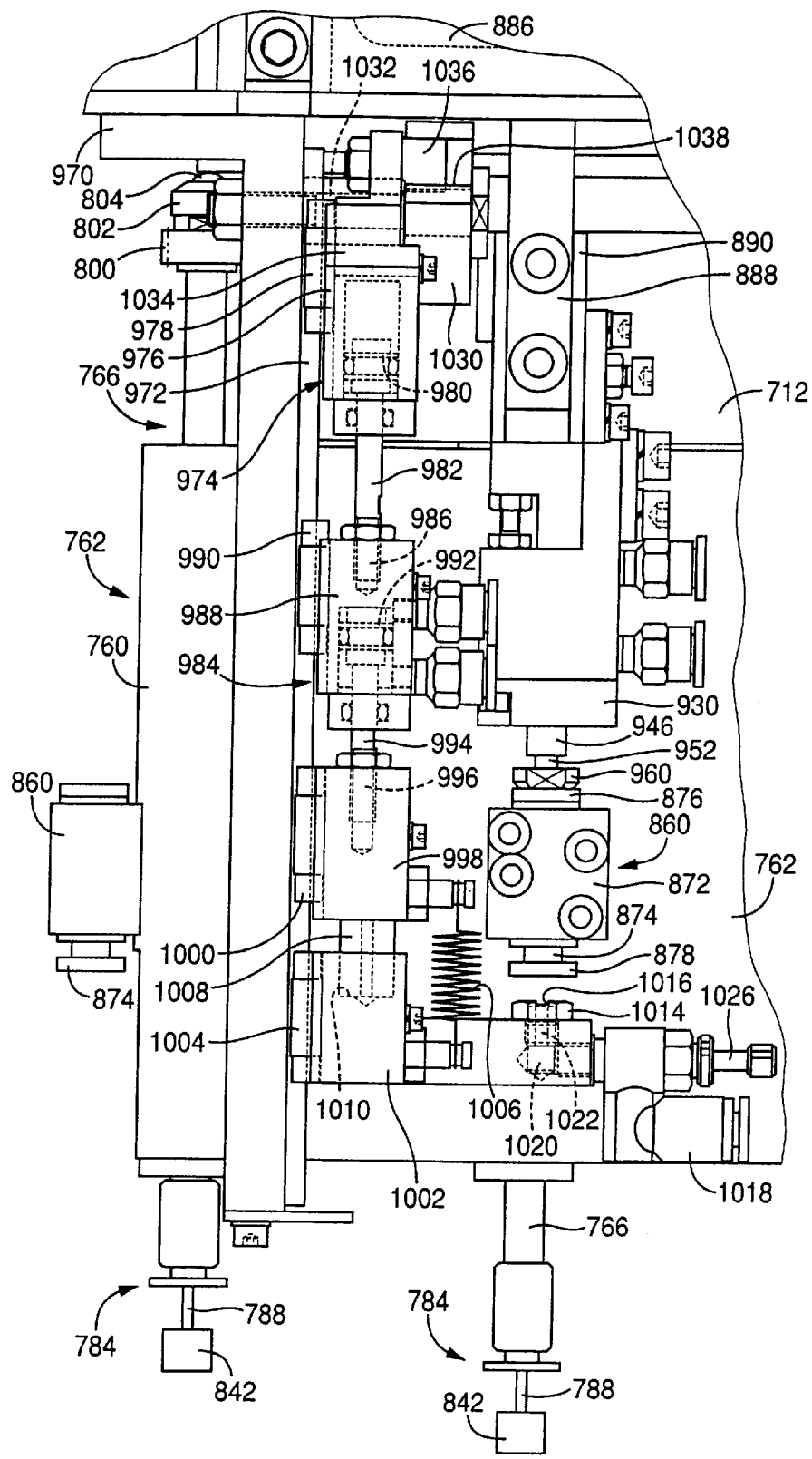
FIG. 27 is a side elevation view showing the operation state of the switch-valve control device for carrying out the CC sucking operation.

As shown in FIG. 27, as the movable member 890 is moved downward, the operative member 952 engages the switch member 874 of the pressure switch valve 860, so that the switch member 874 is moved downward. Simultaneously, the operative member 1002 is moved upward, but does not engage the switch member 874. Thus, the switch member 874 is moved to its NP (negative-pressure) supply position, and the switch valve 860 is switched to its NP supply state. As a result, the CC suction nozzle 784 is supplied with the negative pressure. In this state, the upper stopper portion 876 is held in contact with the housing 872. As the drive member 892 is lowered, the two movable members 890, 1034 are moved in opposite directions, respectively, so as to act on the switch member 874 on opposite sides thereof. However, since the two movable members 890, 1034 are moved in mechanical synchronism with each other, there is no possibility that the two operative members 950, 1002 simultaneously act on the switch member 874 because of their malfunction or that either one of the two operative members 950, 1002 acts on the switch member 874 at an inappropriate timing because of, e.g., its delayed movement. This is also true when the CCs 842 are mounted on the PCB 408.

The pressure switch valve 860 is switched to its NP supply state at such a timing that the negative pressure is supplied to the lower opening of the suction pipe 788 shortly before the suction pipe 788 contacts the CC 842. Shortly after the suction pipe 788 contacts the CC 842, the suction pipe 788 can apply a sufficiently high negative pressure to the CC 842 and thereby quickly suck and hold the same 842. The timing at which the switch valve 860 is switched can be adjusted by adjusting the height position of the main air cylinder 930 relative to the movable member 890. Since the downward movement of the CC suction nozzle 784 and the switching of the pressure switch valve 860 are performed in mechanical synchronism with each other, the negative pressure can be supplied to the suction pipe 788 at an accurate timing. Thus, the CC mounting head 650 is free from the problem of failing to suck and hold the CCs 842. This is also true when the CCs 842 are mounted on the PCB 408. That is, the negative pressure can be removed or cut from the suction pipe 788 at an accurate timing, and accordingly the CC mounting head 650 is free from the problem of failing to mount the CCs 842 on the PCB 408.

As described above, the movable member 890 or the drive member 892 is further moved downward by a small distance after the suction pipe 788 contacts the CC 842. During this downward movement, the switch member 874 is moved to its NP supply position where the upper stopper portion 876 is held in contact with the housing 872. An excessive downward movement of the movable member 890 is accommodated or absorbed by the compression coil spring 962 being compressed by the operative member 952 being moved relative to the movable member 890.

After the suction pipe 788 sucks and holds the CC 842, the movable member 890 or the drive member 892 is moved upward. During this upward movement, the CC suction shaft 766 is moved upward by the biasing force of the compression coil spring 806, to follow the drive member 892. Thus, the CC 842 is taken from the CC carrier tape 152. As the movable member 890 is moved up, the main air cylinder 930 is moved up, so that the operative member 952 is moved up away from the switch member 874. However, the switch member 874 remains held at its NP supply position and accordingly the CC 842 remains held by the suction nozzle 784. Since the movable member 1034 is moved downward, the operative member 1002 is also moved downward.

Before the movable member 890 reaches its upper stroke-end position and accordingly the drive portion 896 fits in the recess 898 of the stationary cam 712, the intermittent-rotation body 762 is caused to start rotating, so that the cam follower 804 is moved along the lower surface of the drive portion 896. That is, the CC suction shaft 766 is revolved around the axis line of the rotation body 762, while simultaneously being moved upward. Since each of the twenty CC suction shafts 766 is revolved while being moved up or down, for the sucking or mounting of CC 842, the shafts 766 can sequentially reach the CC suck-and-mount position at a shortened time interval or pitch. Thus, the efficiency of mounting of CCs 842 is improved. After the movable member 890 reaches its upper stroke-end position and the drive portion 896 fits in the recess 898, the cam follower 804 is moved onto the cam surface 808 of the stationary cam 712, so that the current CC suction shaft 766 holding the CC 842 is moved away from the CC suck-and-mount position and the following suction shaft 766 is quickly moved to the CC suck-and-mount position to suck and hold another CC 842.

During the intermittent rotation of the rotation body 762, the CC mounting head 650 is moved by the X-Y robot 662 in the X direction, so that the following suction shaft 766 is moved to right above the CC taking position of the following feeder 54. However, in the case where the following shaft 766 takes another CC 842 from the same feeder 54 as that from which the preceding shaft 766 has taken one CC 842, the head 650 is not moved in the X direction while the rotation member 762 is rotated by one angular pitch. After one CC 842 is taken from each feeder 54, the feeder 54 feeds the CC carrier tape by one pitch so that another CC 842 is positioned at the CC taking position.

When the intermittent-rotation body 762 is rotated and accordingly one CC suction shaft 766 is moved to the CC suck-and-mount position, the control device 1050 or the linear motor 886 may malfunction such that the drive member 892 starts moving downward, before the cam follower 804 engages the lower surface of the drive portion 896, and accordingly is positioned below the cam follower 804. In this case, the driven gear 800 and/or the shaft member 768 of the CC suction shaft 766 collide with the drive portion 896. However, when more than a predetermined force is exerted to the drive member 892 by the CC suction shaft 766 being rotated, the drive member 892 is rotated to its retracted position indicated at two-dot chain line in FIG. 22. Thus, the drive member 892 and/or each CC suction shaft 766 is prevented from being damaged. The drive-member retraction sensor 920 detects that the drive member 892 has been rotated to its retracted position and supplies a detection signal indicative of that situation to the control device 1050, which interrupts the current CC sucking operation. If the cause of the malfunction is removed by the operator, the CC sucking operation is resumed after the drive member 892 is returned to its operative position, the drive portion 896 is fitted in the recess 898, and the cam follower 804 of the suction shaft 766 is engaged with the lower surface of the drive portion 896. This is also true when the CCs 842 are mounted on the PCB 408.

Even if the linear motor 886 or a portion of the control device 1050 for controlling the motor 886 may so malfunction, and simultaneously the rotation-body rotating servomotor 742 or a portion of the control device 1050 for controlling the motor 742 may so malfunction, that one CC suction shaft 766 fails to stop at the CC suck-and-mount position and the drive member 892 takes its lower position away from its upper stroke-end position when the shaft 766 passes through the CC suck-and-mount position, the shaft 766 can be revolved while rotating the drive member 892 to its retracted position and the cam follower 804 can go on over the recess 898. Thus, the shaft 766 and the drive member 892 are prevented from being damaged.

After the CCs 842 are taken by the CC suction shafts 766 from the feeders 54, the CC-image pick-up device 820 takes the images of the CCs 842 held by the shafts 766, before the CCs 842 are mounted on the PCB 408. As shown in FIG. 16, the CC-image pick-up position is distant from the CC suck-and-mount position by 5 angular pitches (one angular pitch is equal to the angle contained by adjacent two CC suction shafts 766 held by the intermittent-rotation body 762). Each CC suction shaft 766 which has sucked and held one CC 842 at the CC suck-and-mount position, is moved to the CC-image pick-up position while other suction shafts 766 are sequentially moved to the CC suck-and-mount position one by one by the intermittent rotations of the rotation body 762. The image of the CC 842 held by each CC suction shaft 766 is taken by the pick-up device 820. Based on the image data indicative of the taken image, the control device 1050 calculates an X-direction and a Y-direction position error and an angular or rotation position error of the CC 842 held by the shaft 766. At the CC-image pick-up position, the pick-up device 820 may sequentially take, depending upon the number of the CCs 842 to be held, the respective images of CCs 842 while other CCs 842 are sequentially sucked or mounted at the CC suck-and-mount position. However, the pick-up device 820 may take the respective images of CCs 842 after the CCs 842 are sequentially sucked, or before the CCs 842 are sequentially mounted on the PCB 408. Those optional operations of the pick-up device 820 will be described later. In the present embodiment, the respective images of the CCs 842 held by some CC suction shafts 766 can be taken at the CC-image pick-up position, while the other shafts 766 which may, or may not, hold the CCs 842 are moved to the CC suck and mount position. Thus, the sucking of CCs 842 and the taking of CC images may be carried out concurrently, or the mounting of CCs 842 and the taking of CC images may be carried out concurrently. Thus, the control device 1050 does not need any exclusive time for calculating the respective X-direction and Y-direction position errors and the rotation position error of the CC 842 held by each shaft 766. Thus, the present CC mounting system 8 can mount the CCs 842 on the PCBs 408 with improved accuracy, while maintaining the efficiency of mounting of CCs 842.

After all of the twenty CC suction shafts 766 have sucked the CCs 842, the CC mounting head 650 is moved to above the PCB 408 by the X-Y robot 662, so that the suction shafts 766 mount the CCs 842 on the PCB 408. The position on the X slide 654 where the mounting of CCs 842 is carried out is the same as that where the sucking of CCs 842 is carried out. In order to mount the CC 842 on the PCB 408, each CC suction shaft 766 is revolved to, and positioned at, the CC suck-and-mount position by the intermittent rotation of the intermittent-rotation body 762, and the CC mounting head 650 is moved to above a CC-mount place on the PCB 408 by the X-Y robot 662. Since the sucking and mounting of CCs 842 are carried at the same position, i.e., the CC suck-and-mount position on the X slide 654, the single drive source, i.e, linear motor 886 suffices for moving each suction shaft 766 up and down for sucking and mounting the CCs 842. Thus, the present system 8 can be produced at low cost. In addition, the inertia of the X-Y robot 662 that is moved in use can be decreased, and accordingly the mounting head 650 can be moved at high speed.

While each CC suction shaft 766 is positioned at the CC suck-and-mount position by the rotation of the intermittent-rotation member 762, the rotation-position error of the CC 842 held by the shaft 766 is corrected and additionally the shaft 766 is rotated about its axis line so that the CC 842 held thereby takes a correct rotation position prescribed by the control program pre-stored in the ROM of the computer 1052. More specifically described, the drive gear 716 is rotated relative to the rotation member 762, so that the suction shaft 766 is rotated about its axis line.

The drive gear 716 is meshed with all the driven gears 800 which are fixed to the CC suction shafts 766, respectively. Accordingly, when one suction shaft 766 is rotated for correcting the rotation-position error of the CC 842 held thereby, all the other suction shafts 766 are also rotated about their axis lines. Therefore, each of the second and following suction shafts 766 is rotated based on not only its rotation-position error and its prescribed rotation position but also the rotation-position error(s) and prescribed rotation position(s) of the preceding suction shaft(s) 766. In addition, the X-direction and Y-direction distances of movement of the X-Y robot 662 are so determined as to eliminate the X-direction and Y-direction position errors of the center of the CC 842 held by each CC suction shaft 766 and the X-direction and Y-direction position errors of the corresponding CC-mount place on the PCB 408. The X-direction and Y-direction position errors of the center of the CC 842 are the sum of the position errors of the center thereof which may be produced when the CC 842 is sucked by the suction shaft 766 and the amounts of movement of the center thereof when the rotation-position error of the CC 842 is corrected and/or the rotation position of the same 842 is changed.

Like the sucking of CCs 842, the mounting of CCs 842 are carried out such that before each CC suction shaft 766 reaches the CC suck-and-mount position and after the cam follower 804 engages the lower surface of the drive portion 896 of the drive member 892, the movable member 890 is lowered and accordingly the suction shaft 766 is lowered. Before each CC suction shaft 766 actually mounts the CC 842 on the PCB 408, the shaft 766 reaches the CC suck-and-mount position. Thus, the suction shaft 766 can mount the CC 842 on the PCB 408 with accuracy.

As the movable member 890 is lowered, the operative member 952 is lowered and the operative member 1002 is elevated. When the CC suction shaft 766 mounts the CC 842, the main air cylinder 930 (i.e., piston rod 946) takes its retracted position and the operative member 952 takes its inoperative position. However, the operative member 1002 takes its operative position that is higher than the inoperative position taken thereby when the suction shaft 766 sucks the CC 842 and accordingly is nearer to the switch member 874 of the pressure switch valve 860, so that the contact member 1014 engages the switch member 874 and moves the same 874 upward. Thus, the switch member 874 is moved to its NP remove position and the switch valve 860 is switched to its NP remove state. At the NP remove position, the lower stopper portion 878 of the switch member 874 is held in contact with the housing 872.

The operative member 1002 can selectively take, as described later, a first operative position which is established when the main air cylinder 974 takes its retracted position and the auxiliary air cylinder 984 takes its advanced position as indicated in FIG. 26, and a second operative position which is established when both the main and auxiliary air cylinders 974, 984 take their retracted positions and which is higher than the first operative position.

The solenoid-operated shut-off valve 1024 which controls the supply and cut-off of air to and from the pressure switch valve 860 is opened before the contact member 1014 contacts the switch member 874. Immediately after the switch valve 860 is switched to its NP remove state, the valve 860 starts the supplying of air to the CC suction nozzle 784, thereby quickly releasing the CC 842.

When the contact member 1014 contacts the switch member 874, the air pressure in the passages 780, 862 connecting between the pressure switch valve 860 and the CC suction nozzle 784 is negative. It needs a certain time for the air supplied to the switch valve 860 to reach the lower end opening of the suction pipe 788 after the switch 860 is switched to its NP remove position. In order to release quickly the CC 842, this time should be shortened. If a greater amount of air is supplied to the valve 860, the time can be shortened. However, if an excessive amount of air is supplied, the air might move the CC 842 on the PCB 408 or even blow the same 842 off the PCB 408.

This is why the groove 1016 that permits leakage of the air is formed in the contact member 1014. While the air flows from the pressure switch valve 860 to the lower end opening of the suction pipe 788 immediately after the switch valve 860 is switched to its NP remove state, the air leaks through the groove 1016. In addition, in a time duration immediately after the switch valve 860 is switched to its NP remove state, the air pressure in the passage 780 and others connecting between the switch valve 860 and the CC suction nozzle 784 is negative. Therefore, even if the air leaks through the groove 1016 in this time duration, a major portion of the air supplied to the valve 860 flows into the nozzle 784, so that the air is quickly supplied to the lower end opening of the suction pipe 788. When the air pressure in the nozzle 784 increases up to, or exceeds, the atmospheric pressure, the air pressure in the passage 780 and others connecting the valve 860 and the nozzle 784 also increases. Thus, the amount of air leaking through the groove 1016 increases, whereas the amount of air flowing into the nozzle 784 decreases. Thus, the suction nozzle 784 is supplied with an appropriate amount of air for releasing the CC 842 off the suction pipe 788.

The degree of opening of the variable throttle valve 1026 can be adjusted to such a value which enables the air to be quickly supplied to the CC suction nozzle 784 and enables the CC 842 to be released from the suction pipe 788 because of the supplying thereto of appropriate amount of air as a result of leaking of excessive amount of air through the groove 1016 after the pressure in the nozzle 784 has increased. The total amount of the air supplied to the nozzle 784 and the air leaking into the atmosphere can be controlled by changing the degree of opening of the throttle valve 1026. Consequently the ratio of the amount of air flowing into the nozzle 784 immediately after the pressure switch valve 860 is switched to its NP remove state, to the amount of air flowing into the same 784 after the pressure in the nozzle 784 has sufficiently increased, can be controlled. In the case where the CC mounting head 650 is equipped with plural sorts of CC suction nozzles 784 having different sizes, the degree of opening of the valve 1026 may be adjusted to a value corresponding to the nozzles 784 of a middle size.

Immediately after the contact member 1014 contacts the switch valve 874, the pressure switch valve 860 has not been switched to its NP remove state yet and accordingly the passage 1022 remains closed by the switch member 874 and disconnected from the CC suction nozzle 784. Therefore, if the groove 1006 were not provided, the flowing of the air would be stopped for a while. However, since the groove 1006 is provided, the air leaks through the groove 1006, so that the air continues to flow. Thus, as soon as the switch member 874 is switched to its NP remove position and accordingly the supplying of the negative pressure is stopped, the air is supplied to the nozzle 784 without any delay and with reduced air pulsation.

In this way, the CC 842 is quickly released from the suction pipe 788 due to the air supplied thereto. Therefore, the switching of the pressure switch valve 860 to the NP remove state is carried out at such a timing that after the CC 842 contacts the PCB 408, the air reaches the lower end opening of the suction pipe 788. If the air reaches the lower end opening of the pipe 788 before the CC 842 contacts the PCB 408, the CC 842 might be placed at an incorrect position on the PCB 408.

The greater heights the CCs 842 have, the shorter distances the CC suction nozzles 784 are lowered before the CCs 842 contact the PCB 408, and the sooner the pressure switch valves 860 are switched to their NP remove positions, i.e., the sooner the CCs 842 are released from the nozzles 784. Thus, it is desirable that the timing at which each switch valve 860 is switched to its NP remove state be continuously or stepwise changed depending upon the heights of the CCs 842. In the present embodiment, the operative member 1002 can selectively take one of the first and second operative positions corresponding to two different timings of switching of the switch valves 860. Thus, different sorts of CCs 842 having different heights are grouped into two groups, a large-size group and a small-size group. For the large-size CCs 842, the movable member 890 is lowered by the shorter distance, and the operative member 1002 is moved to the second (higher) operative position, so that the switch valve 860 is switched at an earlier timing. On the other hand, for the small-size CCs 842, the movable member 890 is lowered by the longer distance, and the operative member 1002 is moved to the first (lower) operative position, so that the switch valve 860 is switched at a later timing.

More specifically described, the CCs 842 whose heights are up to 3 mm are grouped into the small-size group, and the CCs 842 whose heights are from 3 mm to 6 mm are grouped into the large-size group. For each of the two groups, the distance or stroke of downward movement of the movable member 890 is set, on the CC mounting head 650, based on the smallest one of the heights of the CCs 842 belonging to that group. As shown in FIGS. 28 and 29, assuming that the distance between the lower surface of the suction pipe 788 of the CC suction shaft 766 being positioned at the CC suck-and-mount position, and the upper surface of the PCB 408, is 14 mm, each small-size CC 842 is lowered by 14 mm+$\alpha$ ($\alpha$ is a predetermined distance), and each large-size CC 842 is lowered by 11 mm+$\alpha$. Thus, even the smallest CCs 842 can surely contact the PCB 408. The vertical distance between the first and second operative positions of the operative member 1002 is 3 mm (=14 mm−11 mm).

The timing of switching of the pressure switch valve 860 can be changed by changing the height position of the operative member 1002 relative to the movable member 1034, that is, changing the height position of the auxiliary air cylinder 984 relative to the main air cylinder 974 and/or the height position of the support member 998 relative to the auxiliary air cylinder 984. For each of the small-size and large-size CC groups, the switch valve 860 is adapted such that the valve 860 is switched at such a timing that the air is supplied to the lower end opening of the suction pipe 788 after the CC 842 which may be the smallest in each group is placed on the PCB 408. Therefore, the timing of supplying of air to the pipe 788 differs for CCs 842 having different sizes in each group. However, for every size of CC 842, it is assured that the air is supplied to the pipe 788 after the CC 842 is placed on the PCB 408. The stroke of downward movement of the movable member 890 can be adjusted to a value which enables the CCs 842 to be surely placed on the PCB 408 and which enables the switch valve 860 to be switched at the above-defined timing, that is, enables the switch member 874 to be held at its NP remove position where the lower stopper portion 878 is held in contact with the housing 872.

Figure 28A:
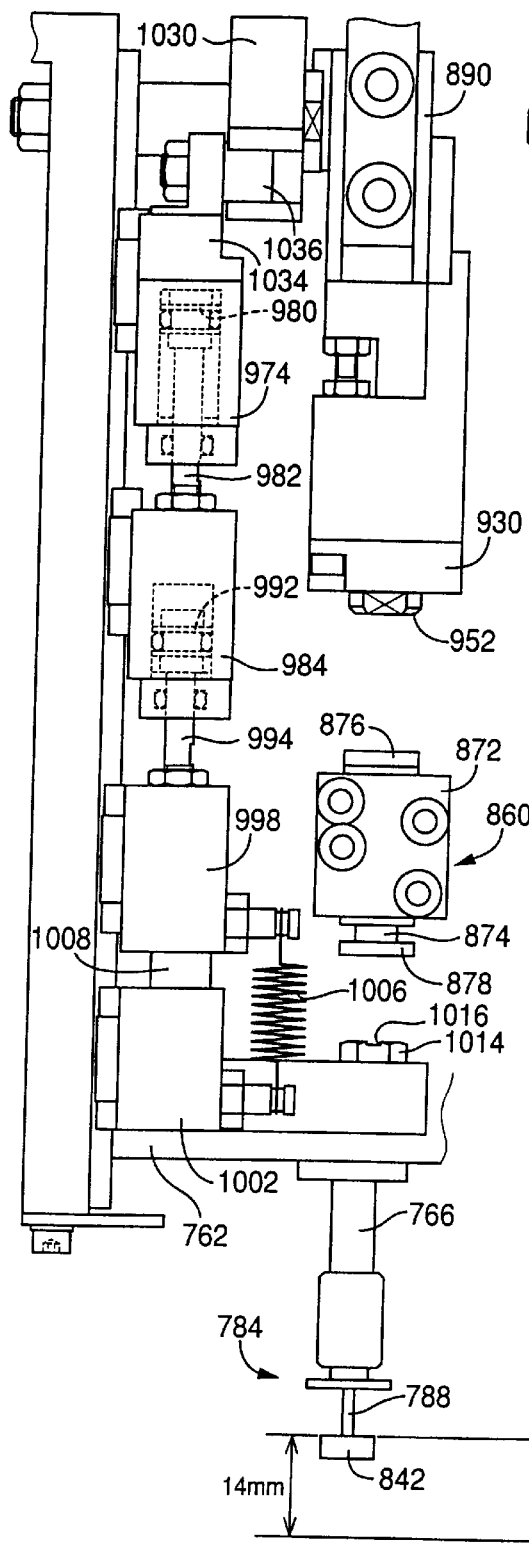
FIGS. 28(A) and 28(B) are side elevation views respectively showing two steps of the operation of the switch-valve control device for carrying out the first sort of CC mounting operation in which small-size CCs are mounted.

When the CCs 842 whose heights are greater than zero and not higher than 3 mm are mounted on the PCB 408, the main air cylinders 930, 974 and the auxiliary air cylinder 984 are driven according to the drive commands indicated in the table of FIG. 26. That is, as shown in FIG. 28(A), the main air cylinder 974 is switched to its retracted position, and the auxiliary air cylinder 984 is switched to its advanced position, so that the operative member 1002 is moved to its first (lower) operative position. Thus, the timing of switching of the pressure switch valve 860 is delayed. Simultaneously, the main air cylinder 930 is switched to its retracted position, so that the operative member 952 is moved to its inoperative position where it cannot contact the switch member 874.

Figure 28B:
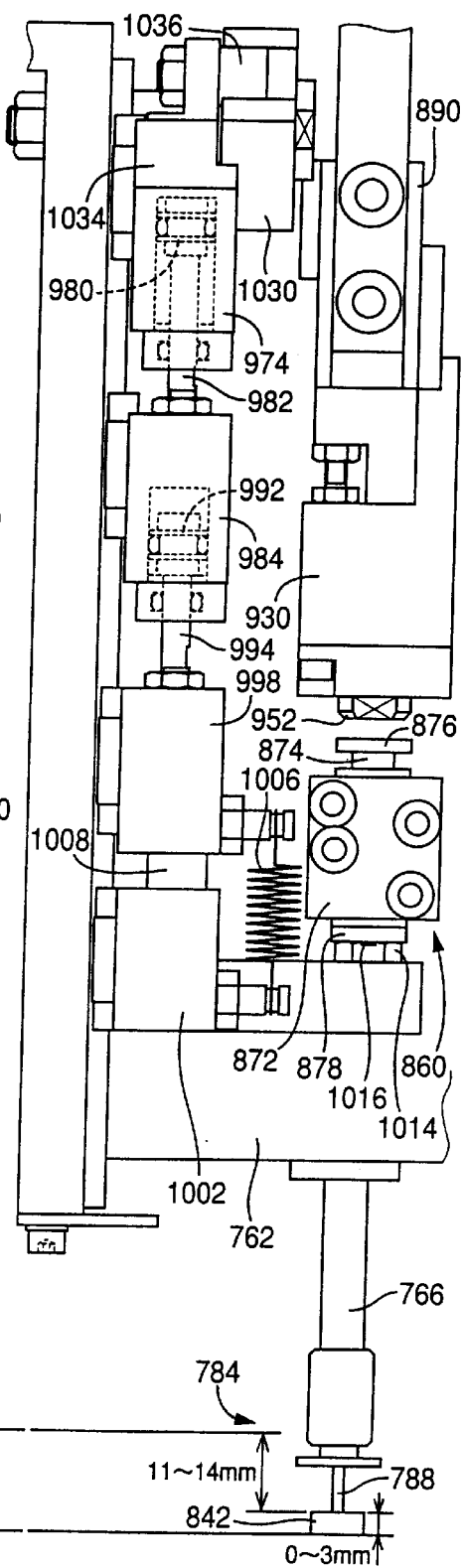

When the movable member 890 is lowered, the CC 842 contacts the PCB 408, as shown in FIG. 28(B), and then the movable member 890 is additionally moved downward by a small distance. This additional downward movement is allowed by the compression of the compression coil spring 790 of the CC suction nozzle 784.

In addition, the contact member 1014 moves the switch member 874 upward, thereby switching the pressure switch valve 860 to its NP remove position. After this switching, the movable member 890 is further moved downward, and the movable member 1034 is moved upward. This downward movement of the movable member 890 is allowed by the extension of the tension coil spring 1006 caused by the upward movement of the support member 998 relative to the operative member 1002. Thus, the contact member 1014 and the switch valve 890 are prevented from being damaged. After the air is supplied to the lower end opening of the suction pipe 788 for a predetermined time duration which is sufficient for releasing the CC 842 from the pipe 788, the solenoid-operated shut-off valve 1024 is closed, so as to cut the supplying of the air to the pipe 788.

Also when the CCs 842 are mounted on the PCB 408, the linear motor 886 is controlled such that the downward movement of the movable member 890 is accelerated and decelerated, so that each CC 842 contacts the PCB 408 with minimized impact. All the CCs 842, large or small, that belong to each one of the large- and small-size CC groups are moved downward by the same distance. However, the greater heights the CCs 842 have, the earlier they contact the PCB 408. Accordingly, the greater heights the CCs 842 which may belong to the same CC group have, the earlier they are decelerated.

Figures 29A, 29B:
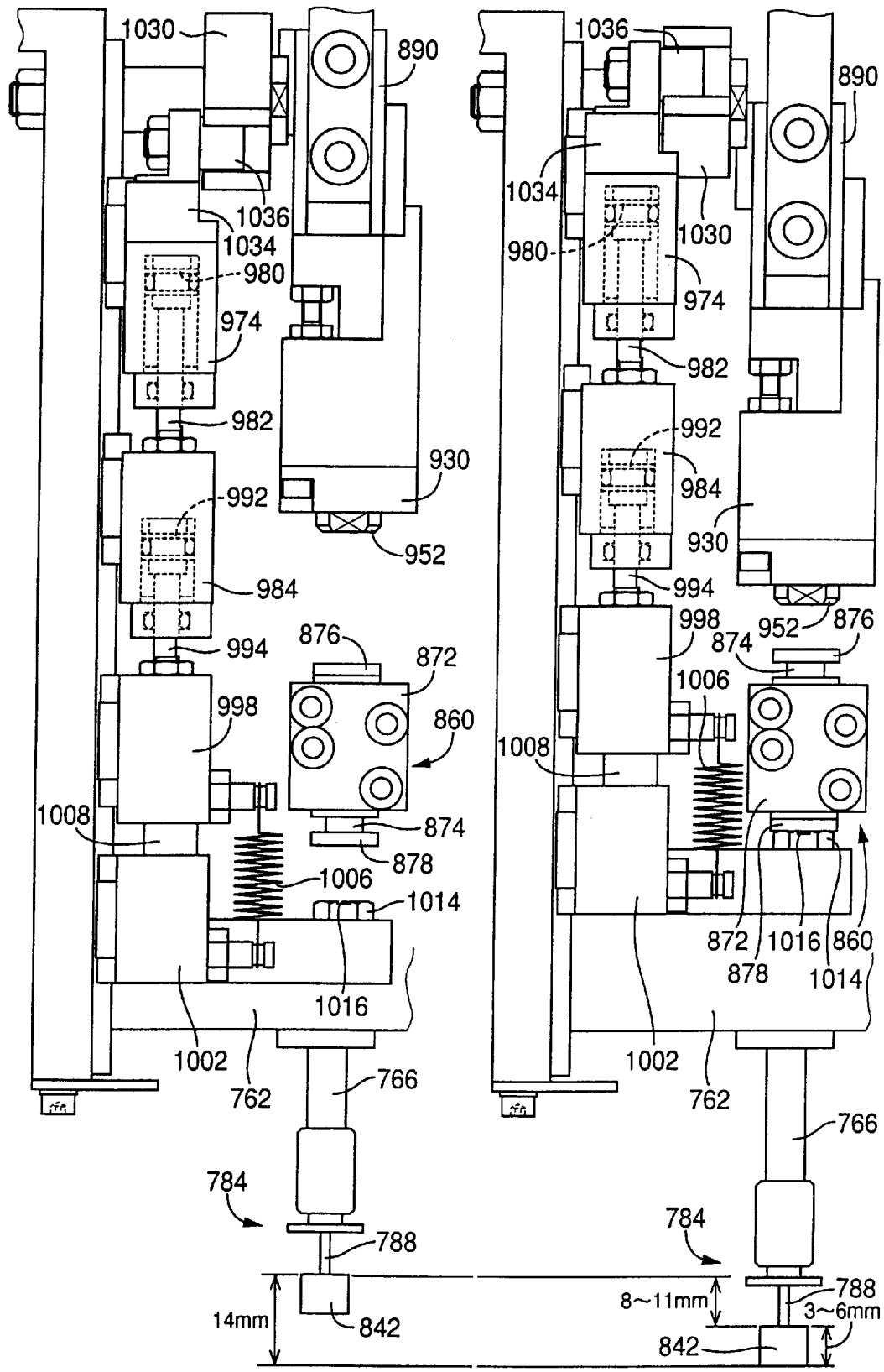
FIGS. 29(A) and 29(B) are side elevation views respectively showing two steps of the operation of the switch-valve control device for carrying out the second sort of CC mounting operation in which large-size CCs are mounted.

When the CCs 842 which belong to the large-size CC group are mounted on the PCB 408, both the main air cylinder 974 and the auxiliary air cylinder 984 are switched to their retracted positions, as shown in FIG. 29(A), so that the timing of switching of the pressure switch valve 860 becomes earlier. When the movable member 890 is moved downward, the operative member 1002 is moved upward, as shown in FIG. 29(B), so that the contact member 1014 contacts the switch member 874, thereby moving it to its NP remove position. After each CC 842 is mounted on the PCB 408, the air is supplied to the lower end opening of the suction pipe 788, so that the CC 842 is released from the pipe 788.

After each CC 842 is mounted on the PCB 408, the movable body 890 is moved upward, and the intermittent-rotation member 762 is rotated, so that the next CC suction shaft 766 is moved to, and positioned at, the CC suck-and-mount position where the next shaft 766 mounts the CC 842 on the PCB 408. Simultaneously, the CC mounting head 650 is moved by the X-Y robot 662, so that the CC suck-and-mount position of the head 650 is moved to above another CC-mount place on the PCB 408. Also when the CCs 842 are mounted on the PCB 408, the upward movement of the suction shaft 766 and the intermittent rotation of the body 762 are simultaneously carried out, so that the next suction shaft 766 is quickly moved to, and positioned at, the CC suck-and-mount position for mounting another CC 842 on the PCB 408.

It emerges from the foregoing description that when the CC 842 is sucked, the negative pressure is supplied to the lower end opening of the suction pipe 788 before the pipe 788 contacts the CC 842, so that the pipe 788 can quickly suck the CC 842 and that when the CC 842 is mounted, the movable member 890 is moved downward by an appropriate one of the two distances corresponding to the two CC groups, and the pressure switch valve 860 is switched to its NP remove state at an appropriate one of the two timings corresponding to the two CC groups. Thus, the CC mounting device 18, 20 effectively reduces useless downward movements of the movable member 890, and quickly releases the CC 842 from the suction pipe 788 after the CC 842 is placed on the PCB 408. That is, the mounting device 18, 20 can suck the CC 842 in a shortened time and mount the CC 842 in a shortened time, thereby improving the efficiency of mounting of CCs 842 on PCBs 408.

As shown in the time chart of FIG. 25, the CC mounting head 650 is horizontally moved by the X-Y robot 662, the intermittent-rotation body 762 is intermittently rotated, the rotation position of the CC 842 is corrected and changed, and the CC suction shaft 766 is moved downward and upward for mounting the CC 842. Those operations are repeated for mounting all the CCs 842 held by the mounting head 650, on the PCB 408. After all the CCs 842 held by the mounting head 650 are mounted on the PCB 408, the mounting head 650 is moved to the CC supplying device 14 for taking additional CCs 842 therefrom. While the first CC mounting device 18 mounts CCs 842 on a PCB 408, the second CC mounting device 20 takes CCs 842 from the second CC supplying device 16. Immediately after the first CC mounting device 18 has finished mounting the CCs 842 on the PCB 408, the second CC mounting device 20 starts, in place of the first device 18, mounting the CCs 842 on the same PCB 408. Thus, the two devices 18, 20 can continue mounting the CCs 842 on the PCB 408 without any interruptions. This leads to improving the efficiency of mounting of CCs 842 on PCBs 408.

If any sucking error occurs, for example, if the CC 842 sucked by one CC suction shaft 766 is not of a correct sort, or if the rotation-position error of the CC 842 held by one shaft 766 is too large, the CC 842 is not mounted on the PCB 408. In this case, if the suction shaft 766 is positioned at the CC suck-and-mount position, the linear motor 886 is not started, and the shaft 766 is not lowered. After the CC mounting head 650 mounts all the CCs (except for the "error" CC 842) held thereby, on the PCB 408, the head 650 is moved to above a CC collecting container (not shown) which is provided midway between the main conveyors 400, 402 and the CC supplying device 14, while the head 650 is moved toward the supplying device 14. The head 650 discards the "error" CC 842 into the container. In this case, the CC suction shaft 766 holding the "error" CC 842 is positioned at the CC suck-and-mount position. After the shaft 766 reaches the container, or immediately before the shaft 766 reaches the container, the linear motor 886 is started. Since the operative member 952 is at its inoperative position and the operative member 1002 is at its first or second operative position, the downward movement of the movable member 890 causes the operative member 1002 to engage the switch member 874 and move it to its NP remove position. Thus, the pressure switch valve 860 is switched to its NP remove state, and the CC 842 is released into the container. In the case where the operative member 1002 is at its second (upper) operative position, the CC 842 can be released in a shorter time after the linear motor 886 is started, than the case where it is at its first (lower) position. The head 650 being stopped above the container discards the CC 842 into the container. However, in the case where the container has an elongate shape, it is possible that the head 650 be adapted to discard a CC 842 into the container without being stopped above the container, i.e., while being moved.

As described above, after each CC suction shaft 766 sucks and holds a CC 842, the shaft 766 is moved toward the CC-image pick-up position while simultaneously the following shaft 766 is moved to the CC suck-and-mount position, as the intermittent-rotation body 762 is rotated. At the CC-image pick-up position, the image of the CC 842 held by the shaft 766 is picked up or taken by the CC-image pick-up device 820. However, the CC-image pick-up position is distant from the CC suck-and-mount position by five angular pitches. Therefore, when the CC mounting head 650 finishes sucking and holding a predetermined number of CCs 842, there may be one or more CCs 842 whose images have not been taken yet. If the predetermined number is not greater than five, there is no CC 842 whose image has already been taken when the CC mounting head 650 finishes sucking and holding the predetermined number of CCs 842.

Therefore, after the CC mounting head 650 finishes sucking and holding the predetermined number of CCs 842, the CC-image pick-up device 820 takes the image or images of the CC or CCs 842 which has or have not been taken, in an appropriate one of the following three different manners corresponding to three cases, i.e., (1) the first case where each CC mounting device 18, 20 sucks twenty CCs 842 each time, that is, all the twenty CC suction shafts 766 are used to suck the CCs 842, and the rotation-position changing angle of each of the five CCs 842 which are sucked first, second, third, fourth, and fifth falls within the ranges of 0±15 degrees (i.e., from −15 degrees to +15 degrees), 90±15 degrees, 180±15 degrees, and 270±15 degrees; (2) the second case where each CC mounting device 18, 20 sucks twenty CCs 842 each time, that is, all the twenty CC suction shafts 766 are used to suck the CCs 842, and the rotation-position changing angle of at least one of the five CCs 842 which are sucked first, second, third, fourth, and fifth does not fall within the ranges of 0±15 degrees, 90±15 degrees, 180±15 degrees, and 270±15 degrees; and (3) the third case where each CC mounting device 18, 20 sucks smaller than twenty CCs 842 each time.

The CC 842 held by each CC suction shaft 766 may be mounted on the PCB 408, while having a rotation position different from the rotation position thereof at the time when the CC 842 is supplied from the CC supplying device 14, 16. The rotation-position changing angle of each CC 842 is defined as an angle by which the CC 842 should be rotated for changing the current rotation position of the CC 842 (which is assumed to have no rotation-position error) when the CC 842 is supplied to the shaft 766, to that of the CC 842 when the CC 842 is mounted on the PCB 408. The respective rotation-position changing angles of the CCs 842 are prescribed by the CC mounting control program, depending upon the sorts of the CCs 842, the CC-mount places where the CCs 842 are mounted on the PCB 408, etc. The rotation-position changing angle of each CC 842 is defined in terms of an angle by which the CC 842 should be rotated in a predetermined direction. However, in an actual operation, each CC 842 is rotated in an appropriate one of opposite directions in which the rotation position of the CC 842 at which the CC 842 is supplied is changed, by the rotation of the CC 842 over the smallest angle, to the rotation position at which the CC 842 is mounted.

In the above-indicated first case (1), the present CC mounting system 8 is operated as follows:

In the case where twenty CCs 842 are sucked each time (No. 1 to No. 20 in FIG. 30), the respective images of the first to fifteenth CCs 842 are taken while concurrently the sixth to twentieth CCs 842 are sucked (No. 6 to No. 20), as indicated in the table of FIG. 30. Thus, the respective rotation-position error angles, θ1$a$ to θ15$a$, of the first to fifteenth CCs 842 are obtained as respective image-based recognized angles. When the intermittent-rotation body 762 is rotated by one angular pitch after the last shaft 766 sucks the twentieth CC 842 (No. 20), the first shaft 766 holding the first CC 842 is returned to the CC suck-and-mount position where the shaft 766 can mount the first CC 842 on the PCB 408 (No. 21).

However, when the sucking of all the CCs 842 is finished, the respective images of the sixteenth to twentieth CCs 842 have not been taken yet. Therefore, if the rotation-position changing angle of each of the first to fifth CCs 842 falls within the ranges of 0±15 degrees, 90±15 degrees, 180±15 degrees, and 270±15 degrees, the respective images of the sixteenth to twentieth CCs 842 are taken while the first to fifth CCs 842 are mounted on the PCB 408.

Meanwhile, when the image taken from each CC 842 indicates that the rotation position of the CC 842 does not fall within the ranges of 0±30 degrees, 90±30 degrees, 180±30 degrees, and 270±30 degrees, the present CC mounting system 8 judges that a sucking error has occurred to the CC 842, and does not mount the CC 842 on the PCB 408. The reason for this is as follows: In the present CC mounting system 8, the respective driven gears 800 fixed to the twenty CC suction shafts 766 are meshed with the common drive gear 716. Therefore, when the CC 842 held by one CC suction shaft 766 is rotated, all the other shafts 766 are rotated by the same angle in the same direction. Thus, in the case where the mounting of some CCs 842 and the taking of images of other CCs 842 are concurrently carried out, the rotation position of each CC 842 whose image is being taken contains not only its own rotation-position error angle but also the rotation-position error correcting angle and rotation-position changing angle of another CC 842 being concurrently mounted. Therefore, in the case where whether the CC 842 whose image is being taken has an excessive rotation-position error or not is judged using a simple rule which does not take into account the rotation-position error correcting angle and rotation-position changing angle of the CC 842 being concurrently mounted, it is needed to judge that an excessive rotation-position error has occurred to the CC 842, if the position angle of the CC 842 does not fall with in the ranges of 0±α degrees, 90±α degrees, 180±α degrees, and 270±α degrees, and it is needed to determine the reference value, α (>0), by taking into account not only the rotation-position error angle of the CC 842 whose image is being taken but also the rotation-position error correcting angle and rotation-position changing angle of the CC 842 being concurrently mounted. In an extreme case where it is assumed that each of the CCs 842 does not have any rotation-position error angle, i.e., does not need any rotation-position-error correcting angle, the reference value α may take any value other than 45 (degrees). However, in fact, each CC 842 has some rotation-position error angle and needs some rotation-position-error correcting angle. Therefore, it is needed to employ the value α which is not greater than 45−β (degrees, β>0).

In the present CC mounting system 8, the rotation-position error angles fall within the ranges of ±5 degrees in almost all cases, and do not go beyond the ranges of ±10 degrees unless an abnormality occurs. Therefore, the ranges of ±α are determined as the ranges of ±30 degrees as indicated above. In the case where the respective rotation-position changing angles of the first to fifth CCs 842 fall within the ranges of 0±15 degrees, 90±15 degrees, 180±15 degrees, and 270±15 degrees, then the angle by which each of the first to fifth CCs 842 is rotated when being mounted on the PCB 408 is not greater than 20 degrees in almost all cases. For example, if the rotation-position error angle of one CC 842 is +5 degrees and the rotation-position changing angle of the same is −15 degrees, the angle of rotation of the CC 842 is 20 degrees. Therefore, the angle of rotation of each CC 842 does not go beyond the range of ±30, because the angle of rotation of each CC 842 is at most 25 degrees even if the rotation-position error angle of the CC 842 whose image is taken may be +5 degrees and the CC 842 may be additionally rotated by the 20 degrees. In the case where the rotation-position error angle of each of the first to fifth CCs 842 is +10 degrees and the rotation-position error angle of the CC 842 whose image is taken is +10 degrees, the angle of rotation of the CC 842 whose image is taken is at most 35 degrees. However, this case is very rare to occur. Accordingly, the possibility that a CC 842 which is actually a normal one is discarded as an "error" one is very low. Thus, the mounting of some CCs 842 and the taking of images of other CCs 842 can be concurrently carried out without raising any practical problems.

In the case where the first to fifth CCs 842 are mounted on the PCB 408 and concurrently the images of the sixteenth to twentieth CCs 842 are taken (No. 21 to No. 25), the intermittent-rotation body 762 is horizontally moved by the X-Y robot 662, after the twenty CCs 842 are sucked (No. 1 to No. 20), so that the CC suck-and-mount position is moved to above the first CC-mount place on the PCB 408. During this horizontal movement of the body 762, the member 762 is rotated by one angular pitch while the CC suction shaft 766 being positioned at the CC suck-and-mount position is rotated about its axis line as needed. Thus, the shaft 766 holding the first CC 842 is moved to the CC suck-and-mount position (No. 21), and the rotation-position error angle the first CC 842 is corrected and/or the rotation position of the same 842 is changed by its rotation-position changing angle. Immediately after the first CC 842 reaches the first CC-mount place on the PCB 408, the CC 842 is placed there on the PCB 408.

As indicated in the table of FIG. 30, the angle by which the CC suction shaft 766 holding the first CC 842 is rotated when the CC 842 is mounted on the PCB 408, is the sum of $-\theta 1a$ and $\theta 1b$ (No. 21). Thus, the CC-image-based recognized angle of the sixteenth CC 842 contains the summed rotation angle, $(-\theta 1a+\theta 1b)$, of the first CC 842. Therefore, the angle by which the shaft 766 holding the sixteenth CC 842 is rotated when the CC 842 is mounted on the PCB 408, is equal to $(-\theta 16a+\theta 1a-\theta 1b)+\theta 16b$ that is obtained by adding its rotation-position changing angle, $\theta 16b$, to an angle for eliminating its rotation-position error angle, $(\theta 16a-\theta 1a+\theta 1b)$. The respective summed rotation angles of the shafts 766 holding the seventeenth to twentieth CCs 842 (No. 22 to No. 25) can be calculated in a similar manner. Each of the second and following CCs 842 is rotated each time its preceding CC or CCs 842 are rotated. Therefore, the rotation angle and direction of each of the second and following CCs 842 are determined based on not only the rotation-position error angle and changing angle of each CC 842 but also the respective rotation-position error angle(s) and changing angle(s) of its preceding CC or CCs 842. In an actual operation, each CC 842 is rotated in an appropriate one of opposite directions in which the current rotation position of each CC 842 is changed, by the rotation thereof over the smallest angle, to the predetermined rotation position thereof at which it is to be mounted on the PCB 408.

Next, there will be described the manner in which the CC mounting system 8 is operated in the above-indicated second case (2).

In the case where the rotation-position changing angle of at least one of the first to fifth CCs 842 does not fall within the ranges of 0±15 degrees, 90±15 degrees, 180±15 degrees, and 270±15 degrees, then the respective images of the sixteen to twentieth CCs 842 are taken (No. 21 to No. 25) before the first to fifth CCs 842 are mounted on the PCB 408 (No. 26 to No. 30). Since in the above case there is some possibility that at least one CC 842 go beyond the permission ranges of ±30 and be judged as an "error" CC, the mounting of those CCs 842 is not carried out while the images of other CCs 842 are taken.

As indicated in the time chart of FIG. 25, the images of the sixteen to twentieth CCs 842 are taken while the CC mounting head 650 is horizontally moved by the X-Y robot 662 and accordingly the CC suck-and-mount position is moved to above the first CC-mount place on the PCB 408. Concurrently, the intermittent-rotation body 762 is intermittently rotated by five angular pitches, i.e., 90 degrees in total. Thus, the CC suction shaft 766 holding the first CC 842 is revolved from the CC suck-and-mount position toward the CC-image pick-up position by four angular pitches. Accordingly, after the image of the twentieth CC 842 is taken (No. 25), the body 762 is rotated by four angular pitches in the reverse direction, so that the shaft 766 holding the first CC 842 is moved to the CC suck-and-mount position. Simultaneously, the shaft 766 holding the first CC 842 is rotated about its axis line as needed for correcting the rotation-position error angle of the first CC 842 and changing the rotation position of the first CC 842 by its rotation-position changing angle.

In the case where the time needed for taking the images of the sixteenth to twentieth CCs 842 is longer than that needed for horizontally moving the CC mounting head 650, the rotation of the intermittent-rotation body 762 and the rotation of the CC suction shaft 766 are completed in a time duration in which the head 650 is horizontally moved, as indicated in the time chart of FIG. 25. On the other hand, if not, the body 762 and the shaft 766 continue their rotations after the horizontal movement of the head 650.

As indicated in the table of FIG. 31, the rotation-position error angle of the first CC 842 is $\theta 1a$ (No. 6), and this error is corrected by rotating the first CC 842 by $-\theta 1a$ (No. 26). If it is assumed that the rotation-position changing angle of the first CC 842 is $\theta 1b$, the angle by which the first CC 842 is rotated when the CC 842 is mounted on the PCB 408, is the sum of $-\theta 1a$ and $\theta 1b$ (degrees). The respective summed angles of the second and following CCs 842, by which the CCs 842 are rotated for being mounted on the PCB 408, are calculated in a similar manner. Each CC suction shaft 766 is rotated about its axis line while it is moved to the CC suck-and-mount position by a single intermittent rotation of the intermittent-rotation body 762. Like in the first case (1), the rotation angle and direction of each of the second and following CCs 842 are determined based on not only its rotation-position error angle and changing angle but also the respective rotation-position error angle(s) and changing angle(s) of its preceding CC or CCs 842.

Next, there will be described the manner in which the CC mounting system 8 is operated in the above-indicated third case (3).

This manner relates to the cases where the CC mounting head 650, 652 takes a predetermined number, N (N=a natural number of from 16 to 19) of CCs 842, each time, from the CC supplying device 14, 16. If the rotation-position changing angle of at least one of the first to (N−15)-th CC or CCs 842 does not fall within any of the ranges of 0±15 degrees, 90±15 degrees, 180±15 degrees, and 270±15 degrees, then the CC suction shaft 766 holding the first CC 842 is returned, like in the above-described second case (2), to the CC suck-and-mount position where the first CC 842 is mounted on the PCB 408, after all the CCs 842 are sucked and held by the CC suction shafts 766 and the images of all the CCs 842 are taken.

In the case where the predetermined number N is fifteen, the number, (N−15), is zero. Accordingly, there is no case where one CC 842 reaches the CC-image pick-up position and simultaneously another CC 842 reaches the CC suckand-mount position. Therefore, after the sucking of the CCs is finished, five intermittent rotations of the intermittent-rotation body 762 occur without any CC mounting, so that the taking of images of all the CCs 842 is finished.

On the other hand, if the rotation-position changing angle of each of the first to (N−15)-th CC or CCs 842 falls within the ranges of 0±15 degrees, 90±15 degrees, 180±15 degrees, and 270±15 degrees, only the taking of an image or images of a CC or CCs 842 held by the CC suction shaft or shafts 766 which reaches or reach the CC-image pick-up position as the body 762 is intermittently rotated, occurs (No. 18 to No. 20) before the CC suction shaft 766 holding the first CC 842 reaches the CC suck-and-mount position. After the first CC 842 reaches the CC suck-and-mount position, the CC mounting and CC-image taking operations simultaneously occur (No. 21 and No. 22). In other words, (20–N) times intermittent rotations of the body 762 occur without any CC mounting.

For example, in the case where the predetermined number, N, is seventeen (N=17), three intermittent rotations of the body 762 occur without any CCs 842 being mounted on the PCB 408 after all the CCs 842 are sucked and held by the CC suction shafts 766, as indicated in the table of FIG. 32. Thus, the first CC 842 is moved toward the CC suck-and-mount position, while the images of the thirteenth to fifteenth CCs 842 are sequentially taken (No. 18 to No. 20). During the fourth intermittent rotation of the body 762, the shaft 766 holding the first CC 842 is moved or revolved to the CC suck-and-mount position, while it is rotated about its axis line for correcting its rotation-position error angle and changing its current rotation position by its rotation-position changing angle. The taking of images of the sixteenth and seventeenth CCs 842 occur concurrently with the mounting of the first and second CCs 842 (No. 21 and No. 22). Thus, the image-based recognized angles of the sixteenth and seventeenth CCs 842 reflect the summed rotation angles of the first and second CCs 842, respectively.

After the seventeen CCs 842 are sucked by the CC mounting head 650, 652, the head 650, 652 is horizontally moved to above the PCB 408. During this horizontal movement, the images of the thirteenth to fifteenth CCs 842 are sequentially taken. If the taking of those images is finished before the horizontal movement is finished, then the shaft 766 holding the first CC 842 is moved to the CC suck-and-mount position while being rotated about its axis line as needed. On the other hand, if not, the taking of those images is finished after the horizontal movement, and then the shaft 766 holding the first CC 842 is moved to the CC suck-and-mount position while being rotated about its axis line as needed.

In the case where the predetermined number, N, is not greater than fourteen (N≦14), there is no case where one CC 842 reaches the CC-image pick-up position and simultaneously another CC 842 reaches the CC suck-and-mount position. Particularly, in the case where the predetermined number, N, is not greater than fourteen and not smaller than six (6≦N≦14), after the sucking of all the CCs 842 is finished, five intermittent rotations of the intermittently rotatable body 762 occur, so that the taking of the images of all the CCs 842 is finished. In the case where the predetermined number, N, is not greater than five (N≦5), the body 762 is intermittently rotated by the same number of times as the predetermined number, N. In this case, however, the shaft 766 holding the first CC 842 has not reached the CC-image pick-up position yet when the sucking of all the CCs 842 is finished. Hence, in order to move the shaft 766 holding the first CC 842 to the CC-image pick-up position, the body 762 is continuously rotated by an angle equal to the angle between the current angular position of the first CC 842 and the pick-up position, after the sucking of all the CCs 842 is finished.

Also in the case where the predetermined number, N, is not greater than fourteen (N≦14), the CC-image taking operation occurs concurrently with the horizontal movement of the intermittent-rotation body 762. If the CC-image taking operation is finished before the horizontal movement is finished, the body 762 is rotated with the horizontal movement, so that the shaft 766 holding the first CC 842 is moved to the CC suck-and-mount position while being rotated about its axis line as needed. On the other hand, if not, the image taking operation is finished after the horizontal movement, and then the shaft 766 holding the first CC 842 is moved to the CC suck-and-mount position while being rotated about its axis line as needed. When the body 762 is rotated to revolve the shaft 766 holding the first CC 842 to the CC suck-and-mount position, the body 762 is rotated in an appropriate one of opposite directions in which the first CC 842 reaches the CC suck-and-mount position by the rotation thereof over the smallest angle.

As is apparent from the foregoing description, in the present embodiment, each of the CC suction shafts 766 provides a CC sucker as a sort of CC holder, or a CC holding shaft as a sort of CC holder; and each of the CC suction nozzles 784 provides a CC sucking portion as a CC holding portion of each CC suction shaft 766. The rotation-body rotating servomotor 742 and a portion of the control device 1050 which controls the servomotor 742 to intermittently rotate the intermittent-rotation body 762 cooperate with each other to provide a holder positioning device which sequentially positions each of the CC suction shafts 766 at each of the CC suck-and-mount position and the CC-image pick-up position; and each of the X-Y robots 662, 664 including a corresponding one of the X slides 654, 656 as a holder-revolving-device supporting movable member, provides a holder-revolving-device moving device.

The elevator table 598, the elevator-table elevating and lowering device 600, the PCB suction devices 602, and the hold-down portions 570, 572 of the guide members 566, 568, of each of the main conveyors 400, 402 cooperate with one another to provide a CS supporting device. The intermittent-rotation body 762, the driven pulley 740, the drive pulley 744, and others cooperate with the holder positioning device to provide a sucker revolving device as a sort of a holder revolving device. The holder-revolving-device supporting movable member is moved while supporting the holder revolving device. The sucker revolving device cooperates with each of the X-Y robots 662, 664 to provide a sucker moving device.

The linear motor 886 provides a drive device which elevates and lowers the drive member 892; and the linear motor 886 cooperates with the drive member 892 to provide the individual-CC-suction-shaft elevating and lowering device 880 which elevates and lowers each one of the CC suction shafts 766 which is positioned in the vicinity of the CC suck-and-mount position as a CC receiving and mounting position. The stationary cam 712 as a cam member cooperates with the cam followers 804 and the compression coil springs 806 to provide an elevating and lowering device which sequentially elevates and lowers the CC suction shafts 766 (i.e., the CC holders) along the cam surface 808 of the cam 712. A portion of the control device 1050 which controls the CC suction shafts 766 to receive, at the CC suck-and-mount position, the CCs 842 supplied from the CC supplying device 14, 16, and mount the CCs 842 on the PCB 408, provides a CC receiving and mounting control device. That is, the control device 1050 controls the holder revolving device, the holder-revolving-device moving device, the individual-CC-suction-shaft elevating and lowering device, and the CC receiving and mounting control device. The CC suction shafts 766, the holder revolving device, the holder-revolving-device moving device, the individual-CC-suction-shaft elevating and lowering device, and the CC receiving and mounting control device cooperate with one another to provide a CC mounting unit. In the present embodiment, two mounting units are employed.

A portion of the control device 1050 which controls the two mounting units to alternately receive or mount the CCs 842, provides an alternate-CC-mounting control device. A portion of the control device 1050 which corrects the distance of movement of the holder-revolving-device moving device based on the X-direction and/or Y-direction position error of the CC 842 held by each CC suction shaft 766, and thereby corrects the position of the shaft 766 (i.e., the CC holder) established by the holder revolving device relative to the CS supporting device, provides a CC-suction-shaft position error correcting device. The drive gear 716 cooperates with each of the driven gears 800 and the rotation-position correcting and changing servomotor 724 as a drive device, to provide a holder rotating device; and a portion of the control device 1050 which controls the holder rotating device based on the rotation-position error of the CC 842 held by each CC suction shaft 766 and thereby eliminating the error, provides a rotation-position error correcting device. As described above by reference to FIGS. 30 and 32, a portion of the control device 1050 which controls the CC suction shafts 766 to mount the CCs 842 and concurrently controlling the CC-image pick-up device 820 to take the respective images of the CCs 842 held by the shafts 766, provides a concurrent-image-taking control device.

The intermittent-rotation body 762 provides a movable member which holds the CC holders such that the respective shaft portions of the CC holders are rotatable about their axis lines and are movable in their axial directions, and which is movable in a direction intersecting those axis lines. The intermittent-rotation body 762 also provides part of a CC transferring device which transfers the CCs 842 by the intermittent rotations thereof.

A portion of the control device 1050 which controls the main air cylinders 930, 974 and the auxiliary air cylinders 984 provides an actuator control device, which cooperates with the air cylinders 930, 974, 984 to provide the switch-valve control device 882 which moves, when the drive member 892 lowers the CC suction nozzle 784, the switch member 874 to its NP supply position and thereby switches the pressure switch valve 860 to its NP supply state in which the nozzle 784 is supplied with the negative pressure in place of the air pressure not lower than the atmospheric pressure, and which alternatively moves, when the drive member 892 lowers the CC suction nozzle 784, the switch member 874 to its NP remove position and thereby switches the pressure switch valve 860 to its NP remove state in which the nozzle 784 is supplied with the air pressure not lower than the atmospheric pressure, in place of the negative pressure. The link 1030 and the rollers 1036, 1042 cooperate with each other to provide a coupling device which converts the upward and downward movements of the drive member 892 to the downward and upward movements of the movable member 1034; the tension coil spring 1006 biasing the operative member 1002 provides a relative-movement permitting device which applies an elastic force to the operative member 1002 and permits the same 1002 to be moved relative to the air cylinders 974, 984, when the force applied thereto by the air cylinders 974, 984 exceeds a predetermined value; and the compression coil spring 962 biasing the operative member 952 provides another relative-movement permitting device. The passages 1020, 1022 provide a positive-pressure supply passage which is formed in the operative member 1002; and the passage (not shown) which is formed in the switch member 874 and which is supplied with air from the passages 1020, 1022, cooperates with the passages 1020, 1022 to provide a positive-pressure supply passage.

A width changing device which changes the PCB conveying width of the carry-in and carry-out conveyors 404, 406 is provided by the spline shaft 456 as a carry-in-conveyor-side drive shaft, the spline shaft 456 as a carry-out-conveyor-side drive shaft, the spline tube 458 as a driven rotatable member, a motion converting device including the screw shaft 448, the nut 452, the sprockets 460, 462, and the chain 464, and a rotation transmitting device including the sprockets 468, 516, 518, 542, 544 and the chain 470.

Referring next to FIGS. 33 to 37, there will be described a second embodiment of the present invention, which also relates to a CC (circuit component) mounting system but includes two CC mounting heads 1100 in place of the CC mounting heads 650, 652 of the CC mounting system 8 as the first embodiment. The second embodiment is different from the first embodiment in that a plurality of CC suction shafts 1170 are supported by an intermittent-rotation body 1164 such that the suction shafts 1170 have, as respective axis lines thereof, a plurality of generators of a circular cone whose center line is defined by an axis line of the rotation body 1164, i.e., a common axis line around which the suction shafts 1170 are revolved, and that the common axis line is inclined with respect to a perpendicular of a rotation-body moving plane in which the rotation body 1164 is moved by an X-Y robot 1102, by an angle at which one of the generators is perpendicular to the rotation-body moving plane. The following description addresses only the differences between the first and second embodiments.

Figure 33:
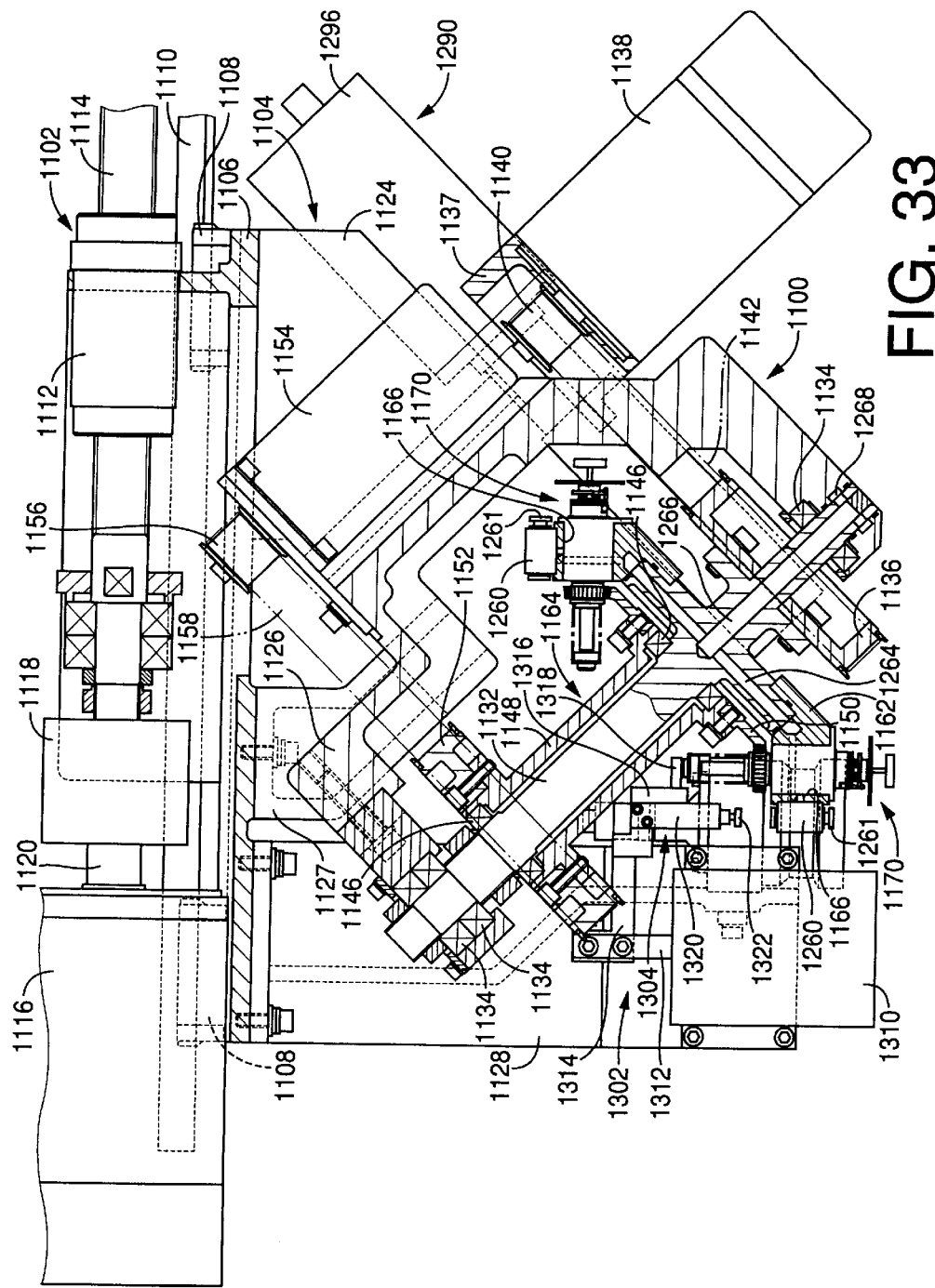
FIG. 33 is a partly cross-section, front elevation view of a CC mounting head and an X-direction slide of a CC mounting device of a CC mounting system as a second embodiment of the present invention.

Like the CC mounting heads 650, 652, each CC mounting head 1100 is horizontally moved by an X-Y robot 1102 including an X-direction slide 1104. As shown in FIG. 33, the X-direction slide 1104 is provided by a plurality of members which are fixed to one another. One of those members is a connection member 1106 to which a pair of block members 1108 as guided members are fixed. The connection member 1106 fits via the block members 1108 on a pair of guide rails 1110 as guide members which are provided on a Y-direction slide (not shown), such that the connection member 1106 is movable relative to the guide rails 1110 in the X direction. A nut 1112 is fixed to the connection member 1106 on one hand, and is threadedly engaged with a screw shaft 1114 which is attached to the Y-direction slide such that the screw shaft 1114 is rotatable about its axis line. The nut 1112 and the screw shaft 1114 cooperate with each other to provide a ball screw. The rotation of an X-direction servomotor 1116 is transmitted to the screw shaft 1114 via a coupling 1118 so that the screw shaft 1114 is rotated and the X-direction slide 1104 is moved in the X direction. The coupling 1118 can transmit the rotation of the servomotor 1116 to the shaft 1114, even if an output shaft 1120 of the motor 1116 may be offset from the axis line of the shaft 1114.

Figure 34:
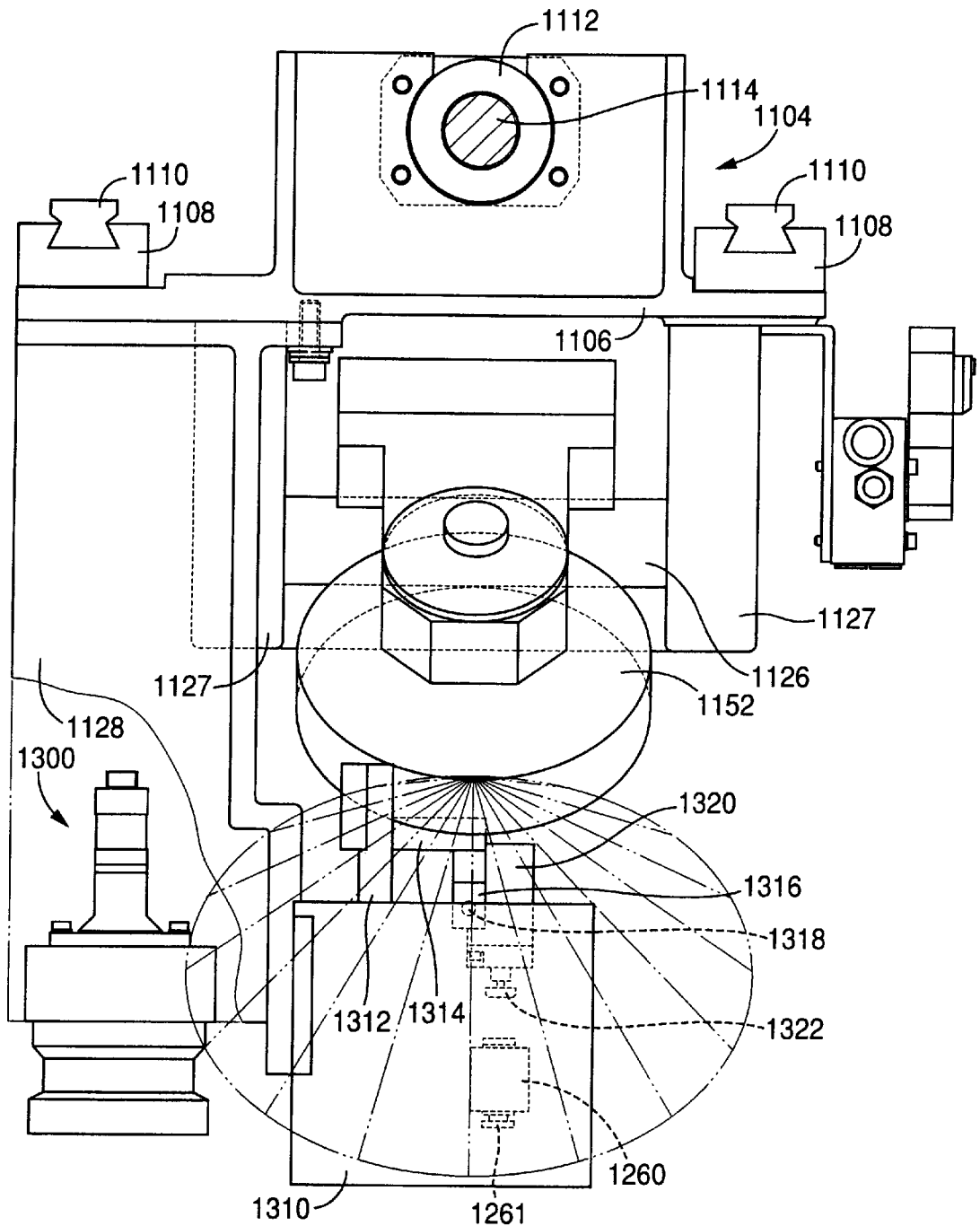
FIG. 34 is a left-hand side elevation view of the CC mounting head and the X-direction slide of FIG. 33.
Figure 35:
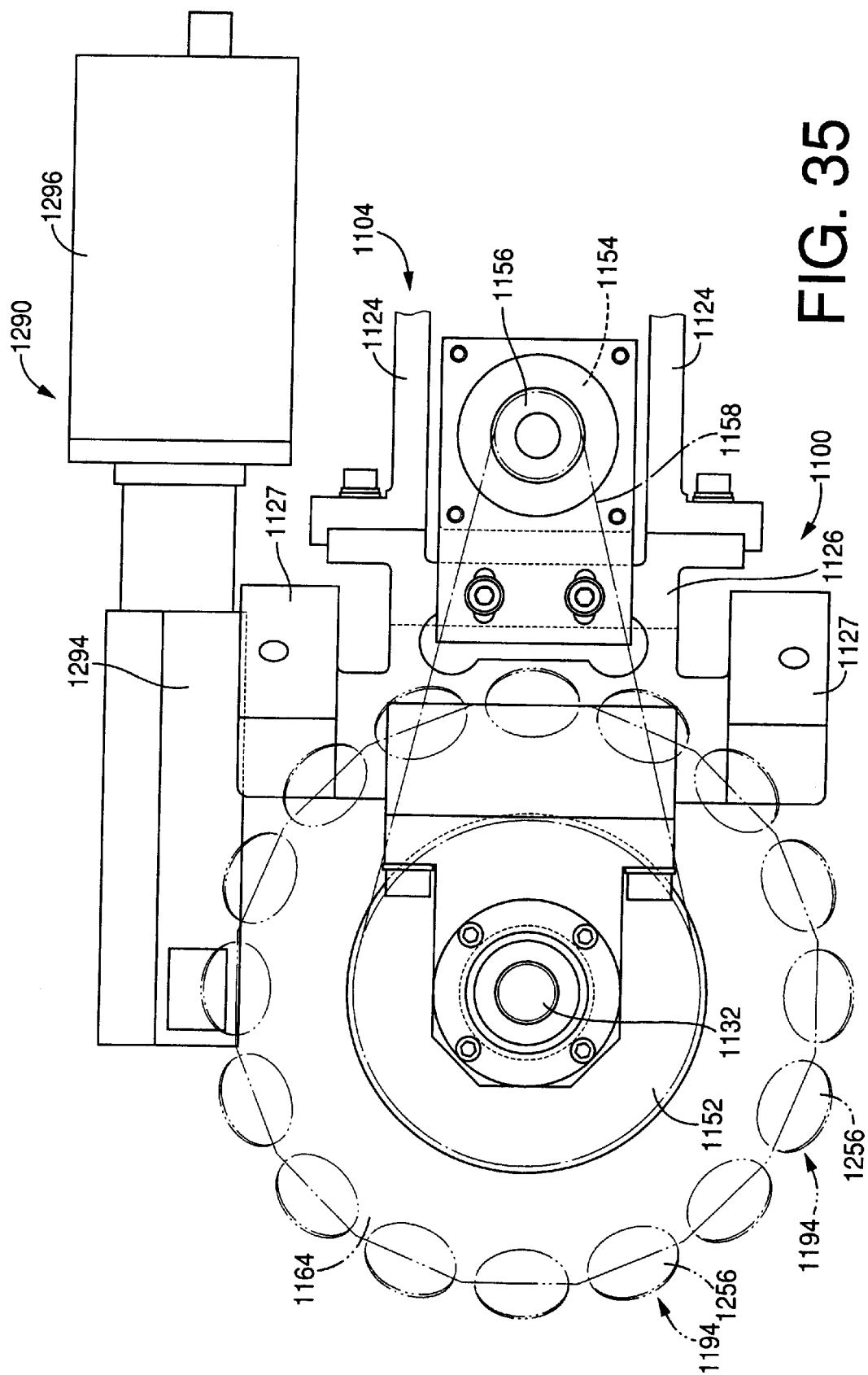
FIG. 35 is a plan view of an upper portion of an intermittent-rotation body of the CC mounting head of FIG. 33.

As shown in FIGS. 33 and 35, a pair of support portions 1124 (only one 1124 is shown in FIG. 33) project downward from one of two end portions of the connection member 1106 which are opposite to each other in the X direction, and extend toward the other end portion of the same 1106. A support member 1126 is fixed to the two support portions 1124. As shown in FIGS. 33 and 34, the support member 1126 has a pair of arm portions 1127 which are also fixed to the connection member 1106. Another support member 1128 is fixed to the other end portion of the connection member 1106 such that the support member 1128 extends downward.

As shown in FIG. 33, the first support member 1126 supports a rotatable axis member 1132 via a plurality of bearings 1134 such that the axis member 1132 is rotatable about its axis line. For easier assembling, the support member 1126 is provided by a plurality of portions which are fixed to each other. One of those portions which supports an upper portion of the axis member 1132 is detachably attached to another portion of the support member 1126 which is fixed to the connection member 1106.

A driven pulley 1136 is fixed to a lower portion of the axis member 1132. The rotation of a rotation-body rotating servomotor 1138 as a drive source which is attached to the support member 1126 via a bracket 1137, is transmitted to the driven pulley 1136 via a drive pulley 1140 and a transmission belt 1142. Thus, the axis member 1132 can be rotated by any desired angle in each of opposite directions.

A hollow shaft member 1148 fits on the rotatable shaft member 1132 via bearings 1146 such that the hollow shaft member 1148 is rotatable about its axis line. A drive bevel gear 1150 as a drive gear is fixed to a lower end portion of the hollow shaft member 1148, and a driven pulley 1152 is fixed to an upper end portion of the shaft member 1148. The rotation of a rotation-position correcting and changing servomotor 1154 as a drive source which is attached to the support member 1126 is transmitted to the driven pulley 1152 via a drive pulley 1156 and a timing belt 1158. Thus, the drive bevel gear 1150 can be rotated by any desired angle in each of opposite directions.

A CC-suction-shaft holding member 1162 is fixed to a projecting end portion of the rotatable shaft 1132 which projects downward from the hollow shaft 1148, and cooperates with the rotatable shaft 1132 to provide the intermittent-rotation body 1164. The holding member 1162 has sixteen holding holes 1166 (only two holes 1166 are shown in FIG. 33). The holding holes 1166 have, as their center lines, sixteen generators of a circular cone whose center line is defined by the axis line of rotation of the rotatable shaft 1132, and the rotatable shaft 1132 is attached to the support member 1126 such that the axis line of the shaft 1132 is inclined with respect to a perpendicular of the horizontal rotation-body moving plane in which the rotation body 1164 is moved by the X-Y robot 1102, by an angle at which one of the generators is perpendicular to the rotation-body moving plane. The two servomotors 1138, 1154 are attached to the support member 1126 such that respective output shafts of the motors 1138, 1154 are so inclined as to be parallel to the axis line of the rotatable shaft 1132.

Figure 37:
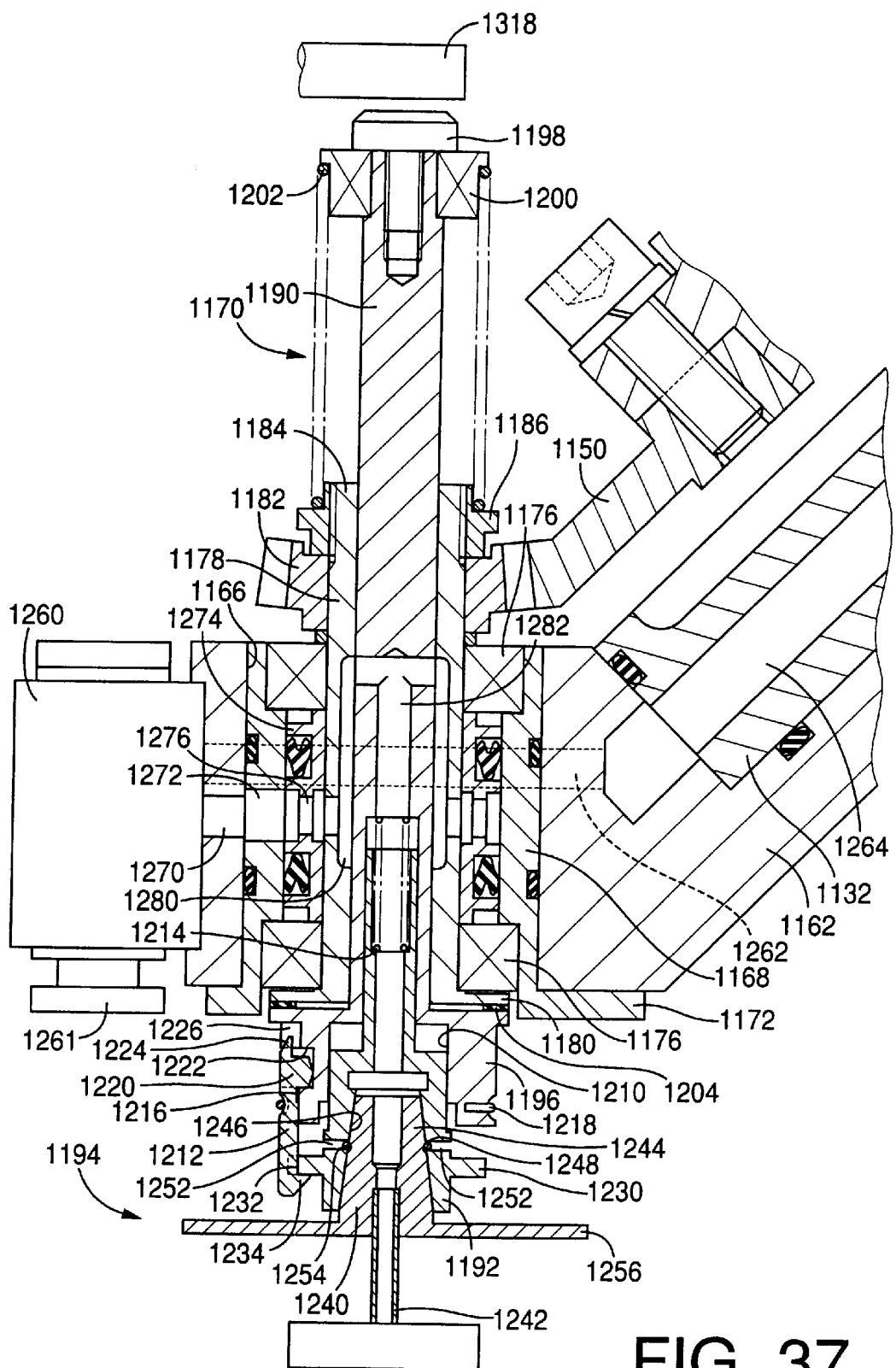
FIG. 37 is a cross section, front elevation view of a CC suction shaft and a CC-suction-shaft holding member of the CC mounting head of FIG. 33.

As shown in FIG. 37, a sleeve 1168 is fitted and fixed in each of the sixteen holding holes 1166. Each sleeve 1168 includes a fixed portion which is fixed with a bolt (not shown) as a fixing member to a corresponding one of sixteen outer surfaces of the holding member 1162 which define respective portions of the sixteen outer surfaces of a 16-pyramid.

A rotatable member 1178 is fitted in each sleeve 1168 via a pair of bearings 1176 such that the member 1178 is rotatable about its axis line. Each rotatable member 1178 includes a lower end portion providing a large-diameter contact portion 1180, an upper end portion on which a driven bevel gear 1182 as a driven gear fits, and an externally threaded portion 1184 with which a nut 1186 is threadedly engaged. Thus, the driven bevel gear 1182 is fixed to the rotatable member 1178 such that the pair of bearings 1176 are provided between the bevel gear 1182 and the contact portion 1180 and such that the bevel gear 1182 is meshed with the drive bevel gear 1150.

A CC suction shaft 1170 is fitted in each rotatable member 1178. Each CC suction shaft 1170 includes a shaft member 1190, and a CC suction nozzle 1194 which is attached to the shaft member 1190 with an adaptor 1192. The shaft member 1190 is fitted in the rotatable member 1178 such that the shaft member 1190 is movable relative to the rotatable member 1178 in an axial direction of the shaft member 1190. A projecting lower end portion of the shaft member 1190 which projects downward from the rotatable member 1178 provides a large-diameter nozzle holding portion 1196. A bearing 1200 is attached with an attaching member 1198 to a projecting upper end portion of the shaft member 1190 which projects upward from the rotatable member 1178. A compression coil spring 1202 as an elastic member as a sort of biasing member is provided between the bearing 1200 and the nut 1186, for biasing the CC suction shaft 1170 upward. The limit of the upward movement of the suction shaft 1170 due to the biasing force of the spring 1202 is defined by the contact of the nozzle holding portion 1196 with a friction ring 1204 fixed to a lower surface of the contact portion 1180 of the rotatable member 1178. The friction ring 1204 is formed of a material having a high friction factor (e.g., rubber). The rotation of the rotatable member 1178 is transmitted to the shaft member 1190 by the frictional engagement of the ring 1204 and the holding portion 1196.

The nozzle holding portion 1196 has a stepped hole 1210 which opens downward, and the adaptor 1192 is fitted in the stepped hole 1210 such that the adaptor 1192 is movable in an axial direction of the holding portion 1196. The adaptor 1192 is held by a plurality of holding members 1212 which are attached to the nozzle holding portion 1196 such that the holding members 1212 are equiangularly spaced from each other about the axis line of the holding portion 1196. A compression coil spring 1214 as an elastic member as a sort of biasing member biases the adaptor 1192 in a downward direction in which the adaptor 1192 advances out of the stepped hole 1210 of the nozzle holding portion, 1196.

The nozzle holding portion 1196 has a plurality of recesses 1216 which extend parallel to the axis line of the shaft member 1190 and which are equiangularly spaced from each other about the axis line of the holding portion 1196. The holding members 1212 are fitted in the recesses 1216, respectively, such that each holding member 1212 is rotatable, and are held on the holding portion 1196 with a ring-like spring member 1218 which is wound around the holding portion 1196. Each holding member 1212 includes a projecting portion 1220 which is located above a portion thereof being fitted in the recess 1216, which projects toward the center axis line of the holding portion 1196, and which is fitted in a recess 1222 which is formed in the holding portion 1196. Thus, each holding member 1212 is rotatable about its axis line which passes through the projecting portion 1220 being fitted in the recess 1222, which is perpendicular to a lengthwise direction thereof and which is parallel to a tangent of an outer circumferential surface of the holding portion 1196 at a position where the holding member 1212 is attached to the holding portion 1196. The holding member 1212 further includes an operative portion 1224 which projects upward from the projecting portion 1222 and which fits in a recess 1226 formed in the holding portion 1196. Since the holding member 1212 fits in the recess 1216 and the operative portion 1224 thereof fits in the recess 1226, the holding member 1212 is prevented from rotating about an axis line perpendicular to the axis line of the CC suction shaft 1170.

A lower end portion of each holding member 1212 is fitted in a recess 1232 which is formed in a large-diameter engagement portion 1230 of the adaptor 1192. Thus, the adaptor 1192 is prevented from being rotated relative to the holding portion 1196. Each holding member 1212 includes an engagement projection 1234 which projects from the lower end portion thereof toward the adaptor 1192 and which engages a lower surface of the engagement portion 1230, thereby preventing the adaptor 1192 from coming off the stepped hole 1210. In this state, the adaptor 1192 can be removed from the holding portion 1196, by pushing the respective operative portions 1224 of the holding members 1212 against the biasing force of the spring member 1218, rotating the holding members 1212 about their axis lines, respectively, and thereby disengaging the engagement projections 1234 of the holding members 1212 from the engagement portion 1230 of the adaptor 1192.

Each CC suction nozzle 1194 includes a suction-pipe holding member 1240, and a suction pipe 1242 which is held by the holding member 1240. The holding member 1240 includes a tapered portion 1244 which is fitted in a tapered hole 1246 formed in the adaptor 1192 and is held by the adaptor 1192 with the help of a spring member 1248. The spring member 1248 has a generally U-shaped configuration including a pair of arms which are fitted in a pair of recesses 1252 formed in the adaptor 1192, respectively. The distance between the two arms gradually decreases in a direction toward respective free end portions thereof. The free end portions of the two arms are bent toward each other, so that the spring member 1248 is prevented from coming off the adaptor 1192.

When the tapered portion 1244 is fitted in the tapered hole 1246, the spring member 1248 is fitted in an annular groove 1254 which is formed in the tapered portion 1244, so that the spring member 1248 engages the tapered portion 1244, thereby holding the holding member 1240, and drags the tapered portion 1244 into the tapered hole 1246, thereby positioning the holding member 1240 in the tapered portion 1244. In a state in which the tapered portion 1244 is naturally fitted in the tapered hole 1246 of the adaptor 1192, the center of the semi-circular cross section of the annular groove 1254 of the tapered portion 1244 is slightly upward offset from the center of the circular cross section of the spring member 1248 attached to the adaptor 1192. Therefore, the spring member 1248 engages an upper portion of the annular groove 1254, thereby pulling the holding member 1240 into the tapered hole 1246. Reference numeral 1256 designates a reflector plate associated with the nozzle 1194. Thus, the nozzle 1194 and the adaptor 1192 which holds the nozzle 1194 are detachably attached as a unit to the shaft member 1190.

Sixteen pressure switch valves 1260 are fixed to the outer surface of the CC-suction-shaft holding member 1162, such that the sixteen valves 1260 correspond to the sixteen CC suction shafts 1170, respectively. Each switch valve 1260 includes a switch member 1261, and is fixed to the holding member 1162 such that the switch valve 1260 extends parallel to the axis line of the corresponding suction shaft 1170. As shown in FIGS. 33 and 37, the switch valve 1260 is connected to a vacuum device (not shown) via a passage 1262 formed in the holding member 1162, passages 1264, 1266 formed in the rotatable shaft 1132, and an annular passage 1268 formed in the support member 1126.

As shown in FIG. 37, each pressure switch valve 1260 is connected to a passage 1282 formed in the shaft member 1190 of the corresponding CC suction shaft 1170 via another passage 1270 formed in the CC-suction-shaft holding member 1162, a passage 1272 formed in the sleeve 1168, a passage 1276 formed in a sealing member 1274, and an annular passage 1280 formed in the rotatable member 1178. The annular passage 1280 is elongate in the axial direction of the shaft member 1290. Therefore, even when the suction shaft 1170 is rotated, or axially moved, relative to the rotatable member 1178, the communication between the two passages 1280, 1282 is maintained.

Figure 36:
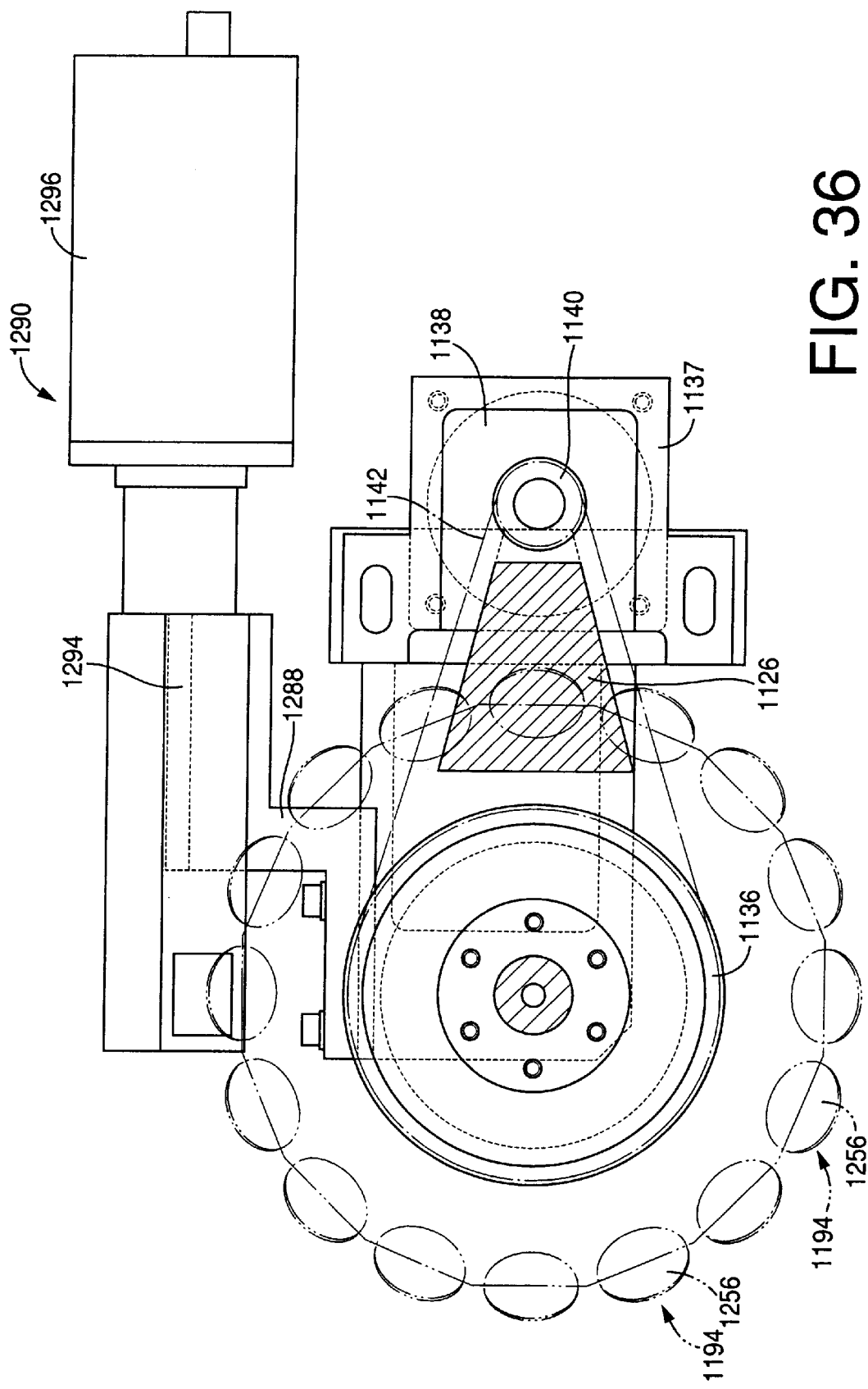
FIG. 36 is a plan view of a lower portion of the intermittent-rotation body of the CC mounting head of FIG. 33.

Each CC suction shaft 1170 is sequentially stopped at sixteen stop positions while it is intermittently revolved by the intermittent-rotation body 1164. One of the sixteen stop positions where the axis line of each CC suction shaft 1170 perpendicularly intersects the horizontal rotation-body moving plane is a CC suck-and-mount position, and another stop position angularly distant from the CC suck-and-mount position by 90 degrees is a CC-image pick-up position. At the CC suck-and-mount position, each CC suction shaft 1170 takes its lowest position, while it is intermittently revolved by the rotation body 1164, and the CC-image pick-up position is higher than the CC suck-and-mount position. As shown in FIG. 36, a CC-image pick-up device 1290 is fixed via a bracket 1288 to a portion of the support member 1126 which corresponds to the CC-image pick-up position. The CC-image pick-up device 1290 has a construction similar to that of the CC-image pick-up device 820, that is, includes a lighting device (not shown), a reflecting device 1294, and a CCD camera 1296. At the CC-image pick-up position, the axis line of each CC suction shaft 1170 is inclined with respect to a perpendicular of the horizontal rotation-body moving plane. The CC-image pick-up device 1290 is fixed to the support member 1126 such that the optical axis of the pick-up device 1290 is perpendicular to the axis line of each CC suction shaft 1170 being stopped at the pick-up position. As shown in FIG. 33, the optical axis of the pick-up device 1290 is inclined with respect to the horizontal rotation-body moving plane.

As shown in FIG. 34, a reference-mark-image pick-up device 1300 is supported by the second support member 1128 which provides part of the X-direction slide 1104. As shown in FIG. 33, respective mechanical parts of an individual-CC-suction-shaft elevating and lowering device 1302 and a switch-valve control device 1304 are supported by a portion of the support member 1128 which corresponds to the CC suck-and-mount position. A linear motor 1310 is attached to the support member 1128, and a drive member 1316 is fixed to a movable member 1314 which is fixed to a movable element 1312 of the linear motor 1310. The drive member 1314 includes an engagement portion 1318 as a drive portion which extends to above the CC suction shaft 1170 being positioned at the CC suck-and-mount position.

The switch-valve control device 1304 has a construction similar to that of the switch-valve control device 882. The movable member 1314 supports a main air cylinder 1320 as a main actuator, and an operative member 1322 which is moved by the main air cylinder 1320 to its operative and inoperative positions for switching the pressure switch valve 1260 to its negative-pressure ("NP") supply position. Additionally, the support member 1128 supports a second main air cylinder as a main actuator, an auxiliary air cylinder as an auxiliary actuator, a second movable member, and a second operative member (all not shown) which cooperate with one another to switch the switch valve 1260 to its NP remove position. When the first movable member 1314 is moved by the linear motor 1310, the first and second movable members are moved in opposite directions, respectively, in mechanical synchronism with each other, so that the first and second operative members are moved in opposite directions, respectively, so as to selectively act on the switch member 1261. Thus, the switch valve 1260 is switched between its NP supply and remove states.

The second CC mounting system constructed as described above operates for mounting CCs 842 on a PCB 408, in a manner similar to that in which the first CC mounting system 8 does. That is, each X-Y robot 1102 is operated and the corresponding intermittent-rotation body 1164 is intermittently rotated, so that the CC suction shafts 1170 are sequentially moved to the CC suck-and-mount position where the suction shafts 1170 suck the CCs 842 and subsequently are moved to above the PCB 408 for mounting the CCs 842 on the PCB 408.

When the CCs 842 are sucked, the sixteen CC suction shafts 1170 are sequentially moved to the CC suck-and-mount position while the intermittent-rotation body 1164 is intermittently rotated. Since the drive bevel gear 1150 is rotated in the same direction and at the same angular velocity as those of the rotation body 1164, each CC suction shaft 1170 is prevented from being rotated about its axis line. After each CC suction shaft 1170 reaches the CC suck-and-mount position, the movable member 1314 is lowered and accordingly the drive member 1316 and the suction shaft 1170 are lowered. When the suction shaft 1170 is lowered, the nozzle holding portion 1196 of the shaft member 1190 is separated from the friction ring 1204. However, the suction shaft 1170 is not rotated relative to the rotatable member 1178. For example, if a torsion is produced in the compression coil spring 1202, a torque is produced which rotates the suction shaft 1170 relative to the rotatable member 1178. However, since one end of the spring 1202 is supported by the suction shaft 1170 via the bearing 1200, the spring 1202 is rotated relative to the suction shaft 1170 and accordingly the suction shaft 1170 is not rotated.

At a timing during the downward movement of the CC suction shaft 1170, the pressure switch valve 1260 is switched to its NP supply state so that the NP (negative pressure) is supplied to the CC suction nozzle 1194 to suck and hold the CC 842. After the sucking of the CC 842, the drive member 1316 is elevated. Then, the suction shaft 1170 is elevated due to the biasing force of the compression coil spring 1202. Thus, the CC 842 is taken from a feeder 54.

When the CC suction shaft 1170 holding the CC 842 is moved to the CC-image pick-up position due to the rotation of the intermittent-rotation body 1164, the image of the CC 842 held by the suction shaft 1170 is taken by the CC-image pick-up device 1290. Like in the first embodiment, the image or images of one or more CCs 842 may be taken concurrently with, or prior to, the mounting of the first to fifth CCs 842 on the PCB 408, depending upon the total number of the CCs 842 held by the sixteen suction shafts 1170 each time and the magnitudes of the rotation-position changing angles of the first to fourth CCs 842.

When the CCs 842 are mounted on the PCB 408, the CC suction shafts 1170 are sequentially positioned at the CC suck-and-mount position. While the CC suction shaft 1170 holding the CC 842 is moved to the CC suck-and-mount position for mounting the CC 842 on the PCB 408, as the intermittent-rotation body 1164 is rotated by one angular pitch, the drive bevel gear 1150 is rotated relative to the rotation body 1164, so that the suction shaft 1170 is rotated about its axis line for correcting its rotation-position error and changing its current rotation position by its rotation-position changing angle. The rotation of the drive bevel gear 1150 is transmitted to the CC suction nozzle 1194 via the driven bevel gear 1182, the rotatable member 1178, the friction ring 1204, the nozzle holding portion 1196, the holding members 1212, and the adaptor 1192. Thus, the CC 842 is rotated about the axis line of the nozzle 1194. After the suction shaft 1170 reaches the CC suck-and-mount position, the drive member 1316 is lowered and accordingly the suction shaft 1170 is lowered for mounting the CC 842 on the PCB 408. In addition, since the movable member 1314 is lowered, the pressure switch valve 1260 is switched to its NP remove state, so that after the CC 842 contacts the PCB 408, air is supplied to the CC suction nozzle 1194 for releasing the CC 842 from the nozzle 1194. Like in the first embodiment, the distance or stroke of upward and downward movements of each CC suction shaft 1170 and the timing at which each pressure switch valve 1260 is switched to its NP remove state can be selected from two different strokes and two different timings, respectively, depending upon the heights of the CCs 842.

In the second CC mounting system, the common axis line around which the CC suction shafts 1170 are revolved is inclined with respect to the horizontal rotation-body moving plane. Accordingly, when the intermittent-rotation body 1164 is rotated, each suction shaft 1170 is moved up and down (i.e., moved toward, and away from, the horizontal rotation-body moving plane) while it is revolved. Each suction shaft 1170 takes the lowest position at the CC suck-and-mount position, and the CC-image pick-up position is higher than the CC suck-and-mount position. Thus, the CC-image pick-up device 1290 may be provided in a space between the CC suck-and-mount position and the CC-image-pick-up position. Therefore, the CC-image pick-up device 1290 is effectively prevented from interfering with each suction shaft 1170, the CC 842 held by the shaft 1170, or the corresponding CC supplying device 14, 16. In addition, this arrangement contributes to reducing the distance or stroke of upward and downward movements of each CC suction shaft 1170 at the CC suck-and-mount position. Moreover, the optical axis of the CC-image pick-up device 1290 is also inclined with respect to the horizontal rotation-body moving plane. Accordingly, the dimension of the pick-up device 1290 in a direction perpendicular to the rotation-body moving plane is smaller than that of the same 1290 which would be provided at a stop position where each suction shaft 1170 takes a horizontal attitude and the optical axis of the device 1290 is perpendicular to the rotation-body moving plane. Thus, the X-direction slide 1104 can enjoy a compact construction and can move the intermittent-rotation body 1164 at high speed.

Figure 38:
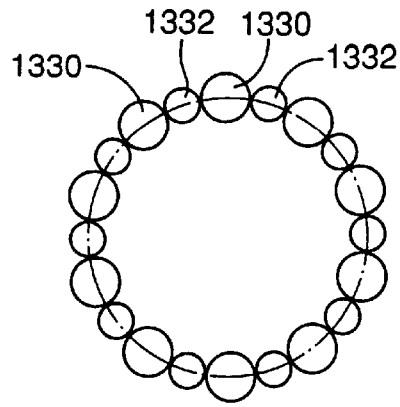
FIG. 38 is an illustrative view of a CC mounting head of a CC mounting device of a CC mounting system as a third embodiment of the invention, the CC mounting head holding two sorts of CC suction nozzles.

In the first or second embodiment shown in FIGS. 1 to 32 or FIGS. 33 to 37, it is assumed that the twenty or sixteen CC suction nozzles 784, 1194 are of the same sort, that the respective suction pipes 788, 1242 thereof have the same diameter, and that the suction nozzles 784, 1194 are equiangularly spaced from one another as illustratively shown in FIG. 16 or FIG. 35. However, in a third embodiment shown in FIG. 38, ten first CC suction nozzles 1330 whose suction pipes have a large diameter and ten second CC suction nozzles 1332 whose suction pipes have a small diameter are alternately provided, and the twenty nozzles 1330, 1332 in total are equiangularly spaced from each other. In this figure, the nozzles 1330, 1332 are represented by their reflector plates.

Figure 39:
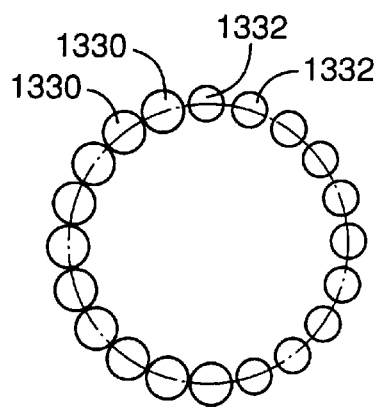
FIG. 39 is an illustrative view of a CC mounting head of a CC mounting device of a CC mounting system as a fourth embodiment of the invention, the CC mounting head holding two sorts of CC suction nozzles in a manner different from that in which the CC mounting head of FIG. 38 does.

In a fourth embodiment shown in FIG. 39, the ten first CC suction nozzles 1330 are provided adjacent to one another, and the ten second CC suction nozzles 1332 are provided adjacent to one another and are separated from the first nozzles 1330.

Figure 40:
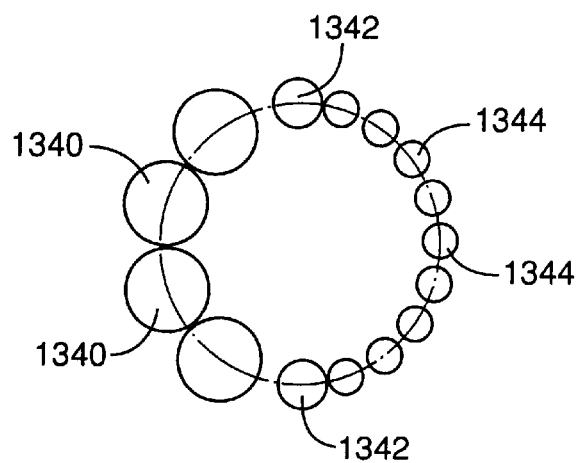
FIG. 40 is an illustrative view of a CC mounting head of a CC mounting device of a CC mounting system as a fifth embodiment of the invention, the CC mounting head holding three sorts of CC suction nozzles.

In a fifth embodiment shown in FIG. 40, three sorts of CC suction nozzles 1340, 1342, 1344 whose suction pipes have different diameters are provided. In the case where the three sorts of nozzles 1340, 1342, 1344 are supported by respective CC suction shafts whose shaft portions have the same diameter irrespective of the different diameters of their suction pipes and accordingly each of the shaft portions can be freely fitted in any of twenty holding holes of the intermittent-rotation body 762, 1164, the suction shafts supporting the nozzles whose pipes have the largest diameter may be fitted in every second or third holes. On the other hand, in the case where the three sorts of nozzles 1340, 1342, 1344 are supported by respective CC suction shafts whose shaft portions have different diameters corresponding to the different diameters of their suction pipes, respectively, the rotation body 762, 1164 may have holding holes which have different diameters corresponding to the different diameters of the shaft portions of the suction shafts, respectively.

In a modified form of the fifth embodiment, all the CC suction shafts held by the intermittent-rotation body 762, 1164 are provided by those which support the CC suction nozzles 1344 whose pipes have the largest diameter of the three sorts of nozzles 1340, 1342, 1344. In this case, the rotation body 762, 1164 may hold ten CC suction shafts which are equiangularly spaced from one another. Otherwise, the rotation body 762, 1164 may hold CC suction shafts which support CC suction nozzles whose suction pipes have a diameter larger than that of the suction pipes of the CC suction nozzles 1344. Moreover, the rotation body 762, 1164 may be adapted to support four or more sorts of CC suction nozzles.

In the case where the intermittent-rotation body 762, 1164 is equipped with CC suction nozzles whose suction pipes have a diameter or diameters corresponding to the size or sizes of CCs 842, the rotatable body 762, 1164 can surely suck and hold the CCs 842. Therefore, while the suction nozzles are intermittently revolved by the rotation body 762, 1164, the CCs 842 are effectively prevented from being moved relative to the suction pipes, without having to lowering the speed of rotation of the rotation body 762, 1164. Thus, the efficiency of mounting of CCs 842 can be maintained.

In each of the illustrated embodiments, the variable throttle valve 1026 adjusts the amount of air flowing from the CC suction nozzle 784, 1194 as the CC holding portion after the air pressure in the suction nozzle 784, 1194 has been increased, and the throttle valve 1026 is connected in series with the pressure switch valve 860 associated with the suction nozzle 784. However, in a sixth embodiment shown in FIG. 41, a variable throttle valve 1402 as a variable restrictor device is provided in parallel with a pressure switch valve 1400 which is in communication with the atmosphere. In this case, before an operative member (not shown) contacts and pushes a movable switch member (not shown) of the switch valve 1400, a solenoid-operated shut-off valve 1404 is opened, so that the switch valve 1400 is supplied with air from an air supplying device 1406 via a restrictor 1408. The symbol "o" (white circle) represents the state in which the operative member contacts the switch member. If the switch valve 1400 is switched to its NP remove position, a suction pipe 1410 is supplied with the air. Till the air pressure in the suction pipe 1410 increases up to, or exceeds, the atmospheric pressure, a major portion of the air is supplied to the suction pipe 1410. After this pressure increase, the amount of air flowing into the atmosphere through the variable throttle valve 1402 increases. Thus, the suction pipe 1410 is supplied with an appropriate amount of air for releasing the CC 842 therefrom.

As the degree of opening of the variable throttle valve 1402 decreases, i.e., as the amount of air leaking into the atmosphere decreases, the amount of air supplied to the suction pipe 1410 after the air pressure in the pipe 1410 has increased up to, or exceeded, the atmospheric pressure increases, and vice versa. The twenty or sixteen CC suction shafts 766, 1170 have their pressure switch valves 860, 1400. When the current sort of CC suction nozzles 784, 1194 for mounting the current sort of CCs 842, 1194 are replaced with another sort of nozzles 784, 1194 for mounting another sort of CCs 842, the degree of opening of the variable throttle valve 1402 is adjusted corresponding to the diameter of the suction pipes 788, 1242 of the new sort of nozzles 784. Thus, each suction pipe 788, 1242 is supplied with an appropriate amount of air corresponding to the diameter thereof, and the CC 842 held by the suction pipe 788, 1242 is effectively prevented from being blown off due to the supplying thereto of an excessive amount of air. That is, the CC 842 is quickly and surely released from the suction pipe 788, 1242.

Figure 41:
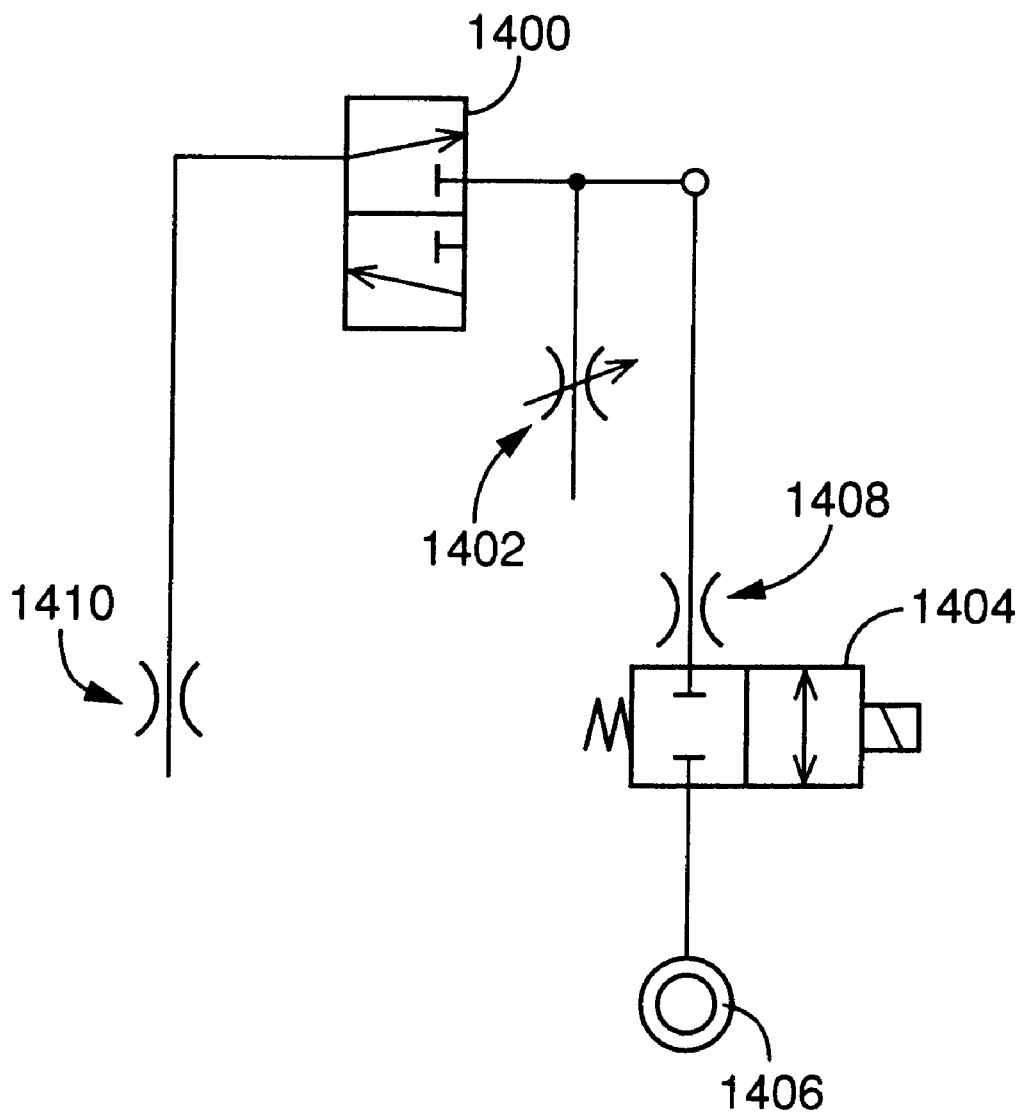
FIG. 41 is a diagrammatic view of an air-supply control circuit of a switch-valve control device of a CC mounting device of a CC mounting system as a sixth embodiment of the invention.

In the sixth embodiment of FIG. 41, the restrictor 1408 may be provided by a variable restrictor which adjusts the amount of air supplied to the pressure switch valve 1400 from the air supplying device 1406. In this case, the ratio of the amount of air flowing into the CC suction nozzle 784, 1194 immediately after the switching of the pressure switch valve 1400 to its NP remove position, to the amount of air flowing into the CC suction nozzle 784, 1194 after the increase of air pressure in the nozzle 784, can be adjusted with higher accuracy.

Figure 43:
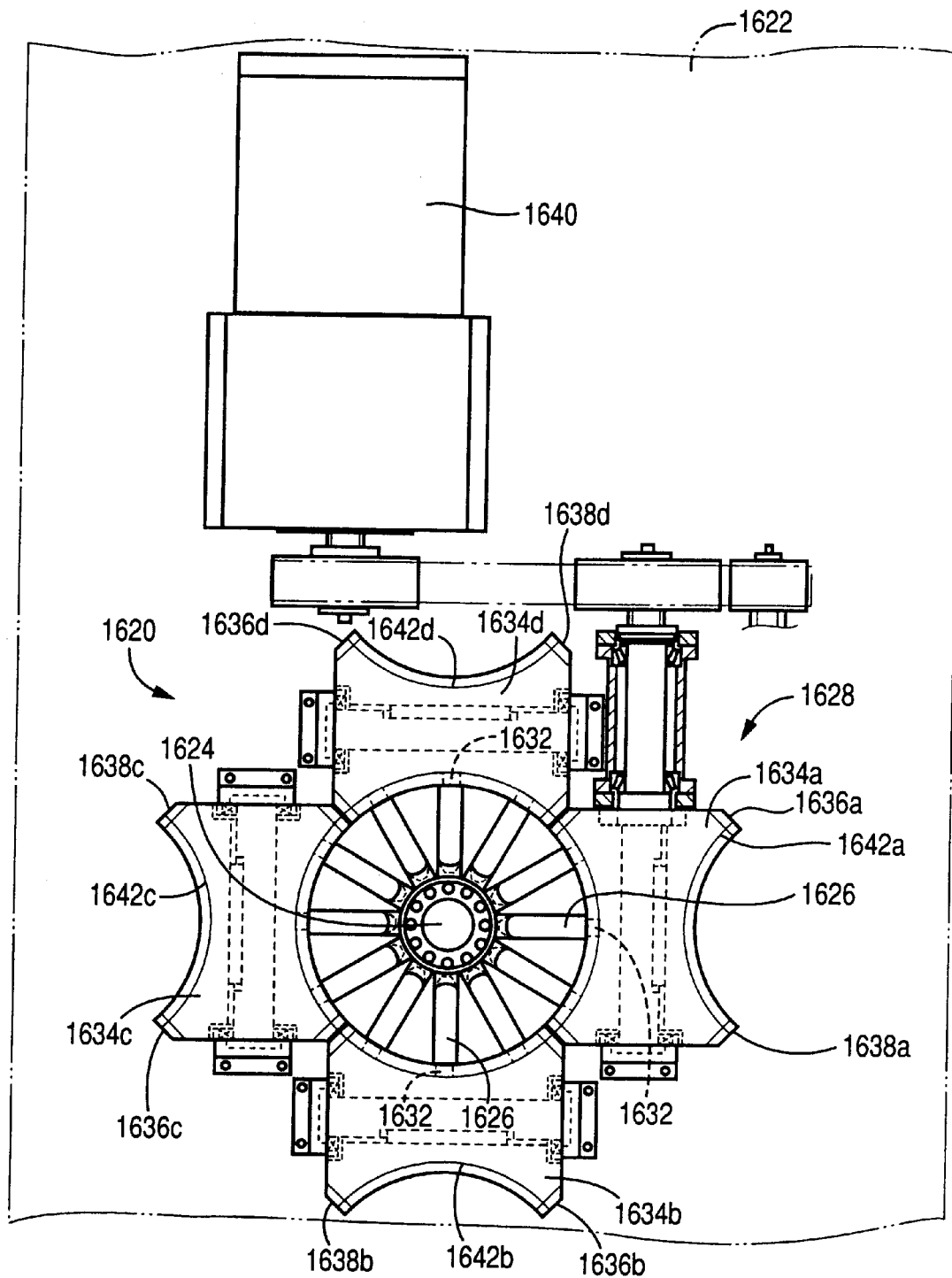
FIG. 43 is a plan view of a CC mounting head of a CC mounting device of a CC mounting system as a seventh embodiment of the invention.

FIG. 43 shows a CC mounting head 1620 of a CC mounting device of a CC mounting system as a seventh embodiment of the present invention. The CC mounting head 1620 includes a vertical axis member 1624 which is supported by an X-direction movable slide 1622 of an X-Y robot (not shown), and a plurality of rotary plates 1626 (twelve rotary plates 1626 in the present embodiment) as a plurality of rotary members which are attached to the axis member 1624 such that the rotary plates 1626 are rotatable about the axis member, independent of each other. Each of the rotary plates 1626 includes a holding portion which holds a CC suction head (not shown) such that the CC suction head is movable in an axial direction thereof, i.e., movable up and down. When the rotary plates 1626 are rotated by a rotary-plate rotating device 1628 as a rotary-motion applying device, the twelve CC suction heads are revolved around the vertical axis member 1624, i.e., a vertical axis line thereof. Each of the twelve CC suction heads includes a CC suction nozzle which is rotatable about an axis line thereof.

The rotary-plate rotating device 1628 includes twelve cam-follower rollers 1632 attached to the twelve rotary plates 1626, respectively, and four concave globoidal cams 1634a, 1634b, 1634c, 1634d as rotary-motion applying cams which sequentially engage each of the cam-follower rollers 1632 for moving the roller 1632 and thereby rotating the corresponding rotary plate 1626. The four concave globoidal cams 1634d—1634d are disposed at respective positions which are axial-symmetric with one another with respect to the vertical axis member 1624, such that the inner lines of intersection of respective outer circumferential surfaces of the concave globoidal cams 1634 with a plane including respective axis lines of the globoidal cams and perpendicular to the axis member 1624 cooperate with each other to define a substantially continuous circle whose center rides on the axis member 1624.

The four cams 1634*a*, 1634*b*, 1634*c*, 1634*d* have respective bevel gears 1636*a*, 1636*b*, 1636*c*, 1636*d* at their one axial ends, and respective bevel gears 1638*a*, 1638*b*, 1638*c*, 1638*d* at their other axial ends. The bevel gears 1636*a*, 1638*d* are meshed with each other; the bevel gears 1636*b*, 1638*a* are meshed with each other; the bevel gears 1636*c*, 1638*b* are meshed with each other; and the bevel gears 1636*d*, 1638*c* are meshed with each other. When the first cam 1634*a* is rotated by a drive source in the form of a drive servomotor 1640 as a sort of electric motor, the four cams 1634*a*–1634*d* are contemporaneously rotated in synchronism with one another. The cam-follower roller 1632 of each of the rotary plates 1626 engages respective cam grooves 1642*a*, 1642*b*, 1642*c*, 1642*d* of the four cams 1634*a*, 1634*b*, 1634*c*, 1634*d*, in the order of description. Thus, the twelve rotary plates 1626 are rotated while being sequentially stopped at each of a CC suck-and-mount position where the CC suction head of each rotary plate 1626 sucks a CC 842 from the CC supplying device 14, 16, or mounts the CC 842 on a PCB 408, and a CC-image pick-up position where the image of the CC 842 held by each CC suction head is taken by a CC-image pick-up device (not shown). More specifically described, while one or two of the rotary plates 1626 is or are stopped at the CC suck-and-mount position or/and the CC-image pick-up position, the other rotary plates 1626 are rotated. Thus, it can be said that the rotary plates 1626 are rotated independent of one another. The cam grooves 1642*a*–1642*d* are designed such that while the rotary plates 1626 are rotated, each of the rotary plates 1626 has a predetermined time difference from its preceding rotary plate 1626. In the present embodiment, the CC suction heads held by the rotary plates 1626 can be sequentially moved to the CC suck-and-mount position at a short time of interval. Thus, the present CC mounting system enjoys improved CC-sucking and CC-mounting efficiencies.

Like the CC mounting heads 650, 652 of the CC mounting system 8, the CC mounting head 1620 of the present CC mounting system includes a stationary cam member (not shown) which is fixed to the X-direction slide 1622 and which has a cam surface including a position-changing portion whose height position in a vertical direction changes along the locus of revolution of the CC suction heads held by the rotary plates 1626. Each of the CC suction heads has a spherical cam follower (not shown) and is biased by a biasing device (not shown) toward the cam surface. When the rotary plates 1626 are rotated about the axis member 1624, the CC suction head held by each rotary plate 1626 is revolved while being moved up and down due to the rolling engagement of its cam follower with the position-changing portion of the cam surface. A portion of the X-direction slide 1622 in the vicinity of the CC suck-and-mount position supports an individual-CC-suction-head elevating and lowering device (not shown), and a switch-valve control device (not shown) for switching each of a plurality of pressure switch valves which are provided for the plurality of CC suction heads, respectively. The elevating and lowering device lowers and elevates the CC suction head being positioned at the CC suck-and-mount position, and the switch-valve control device switches the pressure switch valve provided for the CC suction head being positioned at the CC suck-and-mount position, so that a negative pressure is supplied to, and cut off from, a CC suction nozzle of the CC suction head. A CC-suction-nozzle rotating device which is provided for each of the CC suction heads corrects a possible rotation-position error of the CC held by the each CC suction head and/or changes the current rotation position of the CC to a desired rotation position.

In the first embodiment, the contact member 1014 has the groove 1016 and, even in the state in which the contact member 1014 is held in contact with the switch member 874, the passage 1022 remains communicated with the atmosphere. However, the contact member 1014 may have a through-hole in place of the groove 1016. The through-hole is formed through the contact member 1014 such that the through-hole intersects the passage 1022 which opens in the upper surface of the contact member 1014. The through-hole permits air to flow from the passage 1022 into the atmosphere.

In the first embodiment, the feeders 54 which feed respective sorts of CCs 842 are arranged in the same order as that in which those sorts of CCs 842 are mounted on each PCB 408, and the twenty CC suction nozzles 784 of the intermittent-rotation body 762 suck or mount the CCs 842 in the same order as that in which the nozzles 784 are held by the rotation body 762 in one of opposite circumferential directions of the same 762. This arrangement leads to minimizing the total distance of movement of the rotation body 762 needed for sucking and mounting the CCs 842. However, for example, in the case where the feeders 54 which feed the respective sorts of CCs 842 are used for mounting CCs 842 on two or more sorts of PCBs 408, it is impossible to arrange the feeders 54 in the same order as the order of mounting of those sorts of CCs 842 on every sort of PCB 408.

In the above case, if the twenty CC suction nozzles 784 suck respective sorts of CCs 842 from feeders 54 which are not arranged in any orders, in the same order as the order of mounting of those sorts of CCs 842 on each sort of PCB 408 while the intermittent-rotation body 762 is intermittently rotated at a regular angular pitch, it is needed to move the rotation body 762 in the X direction to each position where a corresponding one of the feeders 54 is located which feeds the CC of the sort to be next sucked. This operation mode leads to increasing the total distance of movement of the rotation body 762 needed for sucking the CCs 842. Meanwhile, the suction nozzles 784 may be adapted to suck respective sorts of CCs 842 from feeders 54, in the same order as the order of arrangement of the feeders 54 on the rotation body 762, while the rotation body 762 is intermittently rotated at a regular angular pitch. The second operation mode leads to minimizing the total distance of movement of the rotation body 762 needed for sucking the CCs 842. The distance of movement of the rotation body 762 is increased if the rotation body 762 passes by one or more feeders 54 which feeds or feed one or more sorts of CCs 842 which is or are not mounted on the PCB 408. This increase cannot be avoided. However, it is more important that the second manner leads to increasing the total distance of X-direction and Y-direction movements of the rotation body 762 needed for mounting the CCs 842 on the PCB 408. The CC mounting system 8 may be adapted to be operated in only a pre-selected one of the two operation modes. However, from the standpoint of improvement of the CC mounting efficiency, it is preferred to employ a third operation mode in which a CC sucking order and a CC mounting order are so determined as to minimize the sum of the respective distances of movement of the rotation body 762 needed for sucking CCs 842 and mounting the CCs 842 on a PCB 408. In addition to, or in place of, this measure employed for minimizing the summed distances, it is possible to adapt, for improving the CC mounting efficiency, the rotation body 762 such that the rotation body 762 can be continuously rotated by an angle equal to two or more angular pitches and/or can be rotated in the reserve direction.

The first embodiment has been described on the assumption that the intermittent-rotation body 762 holds the single sort of CC suction shafts 766, however, for easier understanding purposes only. Therefore, the rotation body 762 may be adapted to hold two or more sorts of CC suction shafts, 766. In the latter case, it is preferred that taking the sorts of the suction shafts 766 and the order of arrangement of the same 766 on the rotation body 762 into account, the orders of sucking and mounting of CCs 842 be so determined as to improve the efficiency of sucking and mounting of CCs 842. For example, in the case where two sorts of CC suction shafts 766 is alternately held by the rotation body 762, the rotation body 766 may be rotated in the forward direction, and/or in the reverse direction, by an angle different from the regular angular pitch at which the suction shafts 766 are equiangularly spaced from each other about the axis line of the rotation body 762, so that the suction shafts 766 suck and/or mount CCs 842 in an order different from the order of arrangement of the suction shafts 766 on the rotation body 762. Thus, the sucking and/or mounting of CCs 842 can be carried out with improved efficiency.

In the first embodiment, the two main conveyors 400, 402 are employed. However, three or more main conveyors may be employed. In the latter case, a plurality of fluid-pressure-operated cylinders may be employed and combined as a drive source for shifting the carry-in and carry-out conveyors 404, 406 to three or more shift positions at each of which the conveyors 404, 406 are aligned with a corresponding one of the three or more main conveyors. Alternatively, a servomotor may be employed as a drive source for the same purpose. In the last case, for example, a screw shaft is provided on the guide support table 420 such that the screw shaft extends over the range of movement of the carry-in conveyor 404, and a nut which is fixed to the conveyor support table 426 is threadedly engaged with the screw shaft, which is rotated by the servomotor for selectively moving the carry-in conveyor 404 to one of the three or more shift positions.

In the case where the carry-in and carry-out conveyors 404, 406 are moved by a servomotor, those conveyors can be stopped at any desired position that may be different from the shift positions. For example, in the case where the upstream-side device provided on the upstream side of the CC mounting system 8 including the carry-in and carry-out conveyors 404, 406 and the two main conveyors 400, 402, is a fluid applying system which includes a high-viscosity-fluid applying device such as a screen printing machine or an adhesive applying device, and two hand-over conveyors which are provided in parallel with each other for handing over CSs to the main conveyors, the distance between the two hand-over conveyors may be different from that between the two main conveyors. In this case, the carry-in conveyor should be moved to the two shift positions where the carry-in conveyor is aligned with the two main conveyors, respectively, and also to two CS-receive positions where the carry-in conveyor receives CSs from the two hand-over conveyors, respectively. The servomotor as the drive source may be controlled according to a predetermined control program for moving and stopping the carry-in conveyor to and at the two CS-receive positions as well as the two shift positions.

The screen printing system 2 as the upstream-side device provided on the upstream side of the CC mounting system 8 is a sort of fluid applying system which includes a screen printing machine as a sort of high-viscosity-fluid applying device and which prints a solder cream as a sort of high-viscosity fluid, on a CS such as a PCB. However, the upstream-side device may be provided by a different fluid applying system such as an adhesive applying system which includes an adhesive applying device and which applies an adhesive to a CS.

The solder reflowing system 4 as the downstream-side device provided on the downstream side of the CC mounting system 8 may be replaced by a CC mounting system including a device which mounts such a sort of CCs (e.g., capacitors) that are mounted in a small number only on each PCB 408.

In the first embodiment, if the rotation-position changing angle of at least one of the first to fifth CCs 842 does not fall within the angular ranges of 0±15, 90±15, 180±15, and 270±15, the respective images of the sixteenth to twentieth CCs 842 are taken while the CC mounting head 650, 562 is moved to the PCB 408 after the head 650, 652 has taken all the CCs 842 from the CC supplying device 14, 16, so that after the movement to the PCB 408, the head 650, 562 can quickly start mounting the CCs 842 on the PCB 408. However, the head 650, 652 may be moved to the PCB 408 after the images of the sixteenth to twentieth CCs 842 have been taken. This is also true with the cases where the CC mounting head 650, 652 holds not more than nineteen CCs 842 and the image or images of one or more CCs 842 are taken after the head 650, 652 has sucked and held all the CCs 842.

In the first embodiment, the CC carrier tapes 156 are employed which are the emboss-type tapes that hold different sorts of CCs 842 such that the respective upper surfaces of the different sorts of CCs 842 take the same height position, i.e., position in the direction parallel to the respective axis lines of the CC suction shafts 766. However, the CC mounting system 8 may use CC carrier tapes of a different type. For example, a CC carrier tape may be one which includes a paper-based tape having a number of through-holes which are formed at a regular interval of distance in a longitudinal direction thereof; a bottom tape which is adhered to the bottom surface of the paper tape for closing the respective lower openings of the through-holes and thereby providing a number of CC accommodating pockets in which CCs are accommodated, respectively; and a cover tape which covers the respective upper openings of the CC accommodating pockets. In the latter case, the respective upper surfaces of different sorts of CCs 842 accommodated in the CC accommodating pockets may take different height positions. Accordingly, the timing at which the negative pressure is supplied to each suction shaft 766 for sucking a CC 842, and the distance by which the suction shaft 766 is moved down and up for the same purpose should be changed depending upon the different heights of CCs 842. For example, like the manner in which the timing at which each pressure switch valve 860 is switched to its NP remove state for mounting a CC 842 can be changed depending upon the different sizes of CCs 842, a main and an auxiliary air cylinder may be employed as a main and an auxiliary actuator for moving the operative member 1002 to its two different operative positions corresponding to the different height positions of respective upper surfaces of two sorts of CCs 842. In addition, the drive member 892 is moved down and up by a shorter distance for sucking a taller CC 842 than a distance for sucking a smaller CC 842.

The timing at which each pressure switch valve 860 is switched from its NP supply state to its NP remove state, or vice versa, may be changed among three or more timings. In the latter case, two or more auxiliary actuators may be provided in series.

The images of the reference marks of each PCB 408 may be taken during a time duration different from the time duration in which the CCs 842 are mounted on the PCB 408. For example, those images may be taken when, or immediately before, the mounting of CCs 842 on the PCB 408 ends. The control device 1050 can know, from the CC mounting control program, the timing at which one of the CC mounting devices 18, 20 which corresponds to one of the main conveyors 400, 402 which supports the current PCB 408 mounts its last CC 842 on the PCB 408. Therefore, when the one mounting device 18, 20 mounts its last CC 842, the control device 1050 can control its reference-mark pick-up device 854 to take the images of the reference marks while the one mounting device 18, 20 is moved to the corresponding CC supplying device 14, 16 for taking CCs 842 therefrom. If the mounting of all CCs 842 on the PCB 408 ends with the mounting of the last CC 842 of the one mounting device 18, 20, then it can be said that the images are taken when the mounting of CCs 842 on the PCB 408 ends. On the other hand, if the mounting of all CCs 842 on the PCB 408 ends with the mounting of the last CC 842 of the other mounting device 18, 20, then it can be said that the images are taken immediately before the mounting of CCs 842 on the PCB 408 ends. The computer 1052 calculates position errors of the CC-mount places on the PCB 408 based on the image data indicative of the taken images, while simultaneously controlling the mounting of CCs 842 and the carrying-in and carrying-out of PCBs 408. The computer 1052 stores the calculated errors in its RAM. However, it is not essentially required that before the mounting of CCs 842 on the PCB 404 is started, the calculation of position errors of all the CC-mount places on the PCB 408 be finished. The position errors of the CC-mount places may be calculated concurrently with the mounting of CCs 842 on the PCB 404. In the last case, the computer 1052 can employ a memory whose capacity is small, for storing the rotation-position errors and the X-direction and Y-direction position errors.

In the first embodiment, if a CC 842 has a rotation-position error greater than +30 degrees or smaller than −30 degrees, the CC mounting system 8 does not mount the CC 842 on a PCB 408. However, the reference angle range used for identifying the sucking errors may be widened to, e.g., ±40 degrees. In the latter case, even if a CC 842 may have a rotation-position error which is greater than +30 degrees and smaller than +40 degrees, or smaller than −30 degrees and greater than −40 degrees, the CC mounting system 8 does not identify the rotation-position error as a CC sucking error and accordingly can carry out the mounting of CCs 842 and the taking of images of other CCs 842 concurrently with each other.

In the case where the mounting of CCs 842 and the taking of images of other CCs 842 may be carried out concurrently with each other, the rotation-position changing angle of each CC 842 may be so selected as to fall in an angle range different from the range of from −15 degrees to +15 degrees. For example, if in almost all cases the rotation-position errors of CCs 842 fall in the range of −5 degrees to +5 degrees, the rotation-position changing angles of the CCs 842 may be so selected as to fall in the range of −30 degrees to +30 degrees, by employing the range of −40 degrees to +40 degrees as the reference angle range.

In the first embodiment, the respective rotation-position errors of the CCs 842 are corrected by rotating the suction shafts 766 as the CC holders by using the common drive gear 716 and the common drive source 724, and the respective rotation positions of the CCs 842 are changed by using the same 716, 724. However, a CC-holder rotating device which rotates each CC suction shaft 766 may be provided at one of the stop positions of the CC holders, or between adjacent two stops positions. In this case, each CC holder includes an engagement portion which is engageable with an engagement member of the CC-holder rotating device. The engagement member is engaged with the engagement portion of each CC holder, at a position where the engagement member is engageable with the engagement portion. Then, each CC holder is rotated about its axis line, so that the rotation-position error of the CC holder is corrected and the rotation position of the same is changed.

In the first embodiment, the CC suction shafts 766 as the CC holders are moved down and up while being revolved, on both the prior and subsequent sides of each of the stop positions. However, it is possible that the CC suction shafts 766 be moved down and up while being revolved, on only one of the two sides of each stop position.

Each of the CC suction shafts 766 as the CC holders may be moved down and up while it is revolved around the axis line of the rotation table 762, if the lower surface of the drive member 892 has, in the direction of revolution of each suction shaft 766, a length greater than the distance of revolution of the suction shaft 766 during the downward and upward movements of the same 766. In this case, each CC suction shaft 766 may be revolved at a constant speed, or may be decelerated and then accelerated around the CC suck-and-mount position where each suction shaft 766 is moved down and up. In the last case, each suction shaft 766 is revolved at a low speed around the CC suck-and-mount position.

In the above case, too, if the drive member 892 takes its low position due to its malfunction or the like though no CC suction shaft 766 should be moved down or up, the drive member 892 is retracted to its retracted position as one suction shaft 766 is revolved. Thus, the drive member 892 is prevented from being damaged. In addition, since the recess 898 is shallow, the cam follower 804 can roll over the recess 898. Thus, the cam follower 804 is not forcedly moved while being fitted in the recess 898, and is prevented from being damaged. When the retracting rotation of the drive member 892 is detected by the drive-member retraction sensor 920, the control device 1050 stops the CC suction shafts 766 based on the detection signal supplied from the retraction sensor 920. Even though the suction shafts 766 may be revolved before being stopped by the control device 1050, the cam followers 804 can roll over the recess 898 and accordingly are not damaged. Even if no retraction sensor 920 is employed and therefore the suction shafts 766 cannot be stopped based on the detection signal supplied from the retraction sensor 920, the suction shafts 766 are prevented from being damaged.

In the case where the CC suction shafts 766 as the CC holders can be stopped by the control device 1050, even though the revolution of the suction shafts 766 may be started for some reason with the cam follower 804 of one suction shaft 766 being fitted in the recess 898, the cam follower 804 is prevented from being damaged because it can roll over the recess 898.

In the first embodiment, the drive member 892 is rotated to its retracted position by one suction shaft 766, if it takes its low position due to, e.g., the malfunction of the linear motor 886 while the CC suction shafts 766 are revolved for sucking or mounting the CCs 842. The drive member 892 may be adapted such that it is rotated to its retracted position by one suction shaft 766, if it takes its low position due to, e.g., the malfunction of the linear motor 886 also while the suction shafts 766 are rotated in the reverse direction.

In the first embodiment, the speed of downward movement of the movable member 890 which is driven by the linear motor 886 for mounting the CC 842, is accelerated and then decelerated, so that the CC 842 can contact the PCB 408 with reduced impact. That is, the deceleration of the movable member 890 is continued till the movable member 890 reaches its lower stroke end. However, after the CC 842 contacts the PCB 408, the movable member 890 may be accelerated so as to quickly reach its stroke end.

In the first embodiment shown in FIGS. 1 to 32, the width of the drive gear 716 is wider than that of each driven gear 800. However, the width of the drive gear 716 may be smaller than that of each driven gear 800.

In the first embodiment, the CC-image pick-up device 820 may be adapted to take a front elevation image of the CC 842 held by each CC suction shaft 766 as the CC holder.

In the first or second embodiment, the rotation-position error of each CC 842 is corrected, and the rotation position of the CC 842 is changed, by rotating the CC suction shaft 766 holding the CC 842, about the axis line of the same 766. However, the CCs 842 may be mounted on the PCB 408, without any change of the rotation positions of the CCs 842, and with only correction of the rotation-position errors of the CCs 842.

In each of the first and second embodiments, the CC mounting heads 650, 652 are moved by the servomotors 674, 688 each of which is an electric rotary motor as a sort of electric motor. However, each of the servomotors 674, 688 may be replaced by a different sort of electric rotary motor whose rotation angle or position is accurately controllable, such as a stepper motor. Alternatively, each servomotor 674, 688 may be replaced by a linear motor as a sort of electric motor. A linear motor which linearly moves a movable element thereof may be provided by a servomotor which is so controllable as to accurately position the movable element and accurately accelerate and decelerate the speed of the movable element; or a stepper motor.

In each of the first and second embodiments, the individual-CC-suction-shaft elevating and lowering device 880, 1302 includes the feedback-controlled linear motor 886, 1310 as the drive source for elevating and lowering each CC suction shaft 766, 1170 at the CC suck-and-mount position. However, the feedback-controlled linear motor 886, 1310 may be replaced by a linear stepper motor. The drive source is not limited to a linear motor but may be a rotary motor such as a servomotor or a stepper motor.

The third feature (3) recited in SUMMARY OF INVENTION may be embodied independent of the first or second feature (1) or (2). That is, according to another aspect of the present invention, there is provided a system for mounting circuit components on a circuit substrate, comprising: a substrate supporting device which supports the circuit substrate; two component supplying devices each of which supplies circuit components and which are provided on both sides of the substrate supporting device; and two component mounting units each of which comprises (a) a plurality of component holders each of which holds a circuit component, (b) a holder revolving device which holds the component holders, revolves the holders around a common axis line, and sequentially stops the holders at at least one predetermined position, (c) a holder-revolving-device moving device which includes a movable support member supporting the holder revolving device and which moves the movable support member, thereby moving the holder revolving device to a desired position in a holder-revolving-device moving plane facing the substrate supporting device and a corresponding one of the two component supplying devices, (d) an elevating and lowering device which is supported by the movable support member and which elevates and lowers each of the component holders at the at least one predetermined position, and (e) a component-receiving-and-mounting control device which controls each of the component holders to receive the circuit component supplied from the corresponding component supplying device, and mount the circuit component on the circuit substrate supported by the substrate supporting device, at the at least one predetermined position, wherein the two component supplying devices and the substrate supporting device are not moved during at least a time duration in which the two component mounting units mount the circuit components supplied from the two component supplying devices, on the circuit substrate supported by the substrate supporting device; and a devices control device which controls the respective holder revolving devices, the respective holder-revolving-device moving devices, the respective elevating and lowering devices, and the respective component-receiving-and-mounting control devices of the two component mounting units, wherein the devices control device comprises an alternate-component-mounting control means for controlling one of the two component mounting units to receive circuit components from a corresponding one of the two component supplying devices and mounting the circuit components on the circuit substrate and controlling the other component mounting unit to receive circuit components from the other component supplying device and mounting the circuit components on the circuit substrate, such that the two component mounting units alternately receive the circuit components from the corresponding component supplying devices, respectively, and alternately mount the circuit components on the circuit substrate, and such that while the one component mounting unit receives the circuit components from the one component supplying device, the other component mounting unit mounts the circuit components on the circuit substrate and, while the other component mounting unit receives the circuit components from the other component supplying device, the one component mounting unit mounts the circuit components on the circuit substrate.

In the above circuit-component mounting system, each of the holder revolving devices, and each of the elevating and lowering devices, of the two component mounting units may be provided by ones of various kinds of holder revolving devices and various kinds of elevating and lowering devices, for example, the holder revolving device and the elevating and lowering device disclosed in the previously-identified Japanese document No. 6-196546 wherein each of a plurality of component holders can be stopped at any desired position where each component holder is moved up and down for receiving and mounting a circuit component.

One or more members of each one of the illustrated embodiments may be replaced by one or more members of another or other embodiments.

It is to be understood that the present invention may be embodied with other changes, improvements, and modifications that may occur to those skilled in the art without departing from the scope and spirit of the invention defined in the appended claims.

What is claimed is:

1. A system for mounting circuit components on a circuit substrate, comprising:

a component supplying device which supplies the circuit components;

a substrate supporting device which supports the circuit substrate;

a plurality of component holders each of which holds one of the circuit components;

a holder revolving device which holds the plurality of component holders such that each of the component holders is rotatable about an axis line thereof, and which revolves the plurality of component holders around a common axis line and sequentially stops the plurality of components holders at a component receiving and mounting position which is predetermined on a locus of the revolution of the component holders, the component receiving and mounting position being common to the plurality of component holders;

a holder rotating device which rotates said each of the component holders about the axis line thereof;

a devices moving device which includes a movable support member supporting the holder revolving device and the holder rotating device and which moves the movable support member, thereby moving the holder revolving device and the holder rotating device to a desired position in a reference plane which extends parallel to the circuit substrate supported by the substrate supporting device and faces the component supplying device and the substrate supporting device;

an elevating and lowering device which is supported by the movable support member and which elevates and lowers said each of the plurality of component holders at at least the component receiving and mounting position;

a component-receiving-and-mounting control device which controls said each component holder to receive, at the component receiving and mounting position, the circuit component supplied from the component supplying device and mount, at the component receiving and mounting position, the circuit component on the circuit substrate supported by the substrate supporting device; and a devices control device which controls the holder revolving device, the holder rotating device, the devices moving device, the elevating and lowering device, and the component-receiving-and-mounting control device.

2. A system according to claim 1, comprising:

two said component supplying devices which are provided on both sides of the substrate supporting device, respectively; and two component mounting units each of which comprises the component holders, the holder revolving device, the holder rotating device, the devices moving device, the elevating and lowering device, and the component-receiving-and-mounting control device, wherein respective positions of the two component supplying devices and the substrate supporting device are not changed during at least a time duration in which the two component mounting units mount the circuit components supplied from the two component supplying devices, on the circuit substrate supported by the substrate supporting device, and wherein the devices control device comprises an alternate-component-mounting control means for controlling one of the two component mounting units to receive circuit components from a corresponding one of the two component supplying devices and mounting the circuit components on the circuit substrate and controlling the other component mounting unit to receive circuit components from the other component supplying device and mounting the circuit components on the circuit substrate, such that the two component mounting units alternately receive the circuit components from the corresponding component supplying devices, respectively, and alternately mount the circuit components on the circuit substrate, and such that while said one component mounting unit receives the circuit components from said one component supplying device, the other component mounting unit mounts the circuit components on the circuit substrate and, while said other component mounting unit receives the circuit components from said other component supplying device, said one component mounting unit mounts the circuit components on the circuit substrate.

3. A system according to claim 1, further comprising:

a component-image pick-up device which is supported by the movable support member such that the component-image pick-up device can be opposed to the circuit component held by said each component holder and which takes an image of the circuit component; and a position correcting means for obtaining, based on the image of the circuit component taken by the component-image pick-up device, a position error of the circuit component held by said each component holder, and correcting, based on the obtained position error, a position to, and at, which the devices moving device moves, and stops, the holder revolving device relative to the substrate supporting device.

4. A system according to claim 1, wherein the system further comprises:

a component-image pick-up device which is supported by the movable support member such that the component-image pick-up device can be opposed to the circuit component held by said each component holder and which takes an image of the circuit component; and a rotation-position correcting means for obtaining, based on the image of the circuit component taken by the component-image pick-up device, a rotation-position error of the circuit component held by said each component holder, and controlling, based on the obtained rotation-position error, the holder rotating device to rotate said each component holder and thereby correct the rotation-position error of the circuit component.

5. A system according to claim 3, wherein the elevating and lowering device comprises:

a cam member having a cam surface which extends along the locus of revolution of the component holders as seen in a direction parallel to the common axis line and includes a height-changing portion; and a plurality of cam followers each of which is provided on a corresponding one of the component holders such that said corresponding one component holder is movable upward and downward together with said each cam follower, and each of which is engaged with the cam surface, wherein when said one component holder is revolved by the holder revolving device, said one component holder is moved upward and downward because of the engagement of said each cam follower and the cam surface, wherein the component-image pick-up device is provided at a position corresponding to a first portion of the cam surface which is higher than second portion of the cam surface which corresponds to the component receiving and mounting position.

6. A system according to claim 2, wherein the elevating and lowering device comprises:
   a cam member having a cam surface which extends along the locus of revolution of the component holders as seen in a direction parallel to the common axis line and includes a height-changing portion; and
   a plurality of cam followers each of which is provided for a corresponding one of the component holders such that said corresponding one component holder is movable upward and downward together with said each cam follower, and each of which is engaged with the cam surface, wherein when said one component holder is revolved by the holder revolving device, said one component holder is moved upward and downward because of the engagement of said each cam follower and the cam surface,
   wherein a lowest portion of the cam surface corresponds to the component receiving and mounting position.

7. A system according to claim 3, wherein the holder revolving device comprises an intermittently rotatable body which is intermittently rotatable such that the intermittently rotatable body is rotated about an axis line thereof by a predetermined intermittent-rotation angle in a first step and is stopped in a second step and the first and second steps are repeated, the intermittently rotatable body holding the component holders such that the component holders are equi-angularly spaced from each other about the axis line of the intermittently rotatable body, at a predetermined regularly-spacing angle which is equal to an integral-number multiple of the predetermined intermittent-rotation angle, wherein the component-image pick-up device is provided at a component-image taking position as one of a plurality of stop positions at each of which said each component holder is stopped while the intermittently rotatable body is intermittently rotated, and wherein the holder revolving device stops said each component holder at the component receiving and mounting position as a different one of the stop positions from said one stop position as the component-image taking position.

8. A system according to claim 8, wherein the holder rotating device concurrently rotates the component holders about the respective axis lines thereof, and wherein the system further comprises:
   a concurrent-mounting-and-image-taking control means for, in a state in which the component holders have received all the circuit components supplied from the component supplying device in a circuit-component supplying operation thereof and the component-image pick-up device have taken the image of at least one of the circuit components held by the component holders and have not taken the respective images of all the circuit components, controlling the devices moving device to move the holder revolving device to above the circuit substrate and controlling the elevating and lowering device to lower the component holder being at the component receiving and mounting position, for mounting the circuit component held thereby, on the circuit substrate, while controlling the component-image pick-up device to take the image of the circuit component held by the component holder being at the component-image taking position.

9. A system according to claim 1, wherein said each component holder includes an axial portion and a component holding portion which is provided at a lower end of the axial portion and which holds the circuit component.

10. A system according to claim 9, wherein the holder revolving device comprises a plurality of rotary members all of which are rotatable about the common axis line, independent of each other, such that each one of the rotary members does not take, at any timing, a same angular phase as an angular phase being taken by any other rotary member of the rotary members; and a rotary-motion applying device which applies a rotary motion to each of the rotary members such that said each rotary member is rotated while having a predetermined time difference from the preceding rotary member and that while said each rotary member is rotated by 360 degrees about the common axis line, said each rotary member is stopped at least one time, the rotary members having, at a common distance from the common axis line, respective holding portions each of which holds a corresponding one of the component holders such that said one component holder is movable in an axial direction thereof.

11. A system according to claim 9, wherein the holder revolving device comprises a rotatable body which is rotatable about the common axis line and which has, at a common distance from the common axis line, a plurality of holding portions each of which holds a corresponding one of the component holders such that said one component holder is movable in an axial direction thereof.

12. A system according to claim 6, wherein the cam member is provided above the locus of revolution of the component holders and the cam surface is defined by a lower surface of the cam member, wherein said each cam follower comprises a spherical cam follower which is held by an upper end of said corresponding one component holder such that the spherical cam follower is rotatable in all directions and which is rollable on the cam surface of the cam member, and wherein the system further comprises at least one biasing device which biases the component holders toward the cam member.

13. A system according to claim 12, wherein the elevating and lowering device comprises a drive member and a drive device which elevates and lowers the drive member, wherein the cam member has a recess in a portion thereof corresponding to the component receiving and mounting position, and wherein the drive device elevates and lowers the drive member between an upper position thereof at which the drive member is fitted in the recess of the cam member such that a lower surface of the drive member is flush with the cam surface, and a lower position thereof at which the lower surface of the drive member is lower than the cam surface.

14. A system according to claim 1, wherein said each component holder comprises a component sucker which sucks the circuit component by applying a negative pressure thereto.

15. A system according to claim 14, wherein further comprising a pressure control device which controls a pressure in the component sucker so that the component sucker sucks and releases the circuit component.

16. A system for mounting circuit components on a circuit substrate, comprising:
   a component supplying device which supplies the circuit components;
   a substrate supporting device which supports the circuit substrate;
   a plurality of components holders each of which holds one of the circuit components;
   a holder revolving device which holds the plurality of component holders such that each of the component holders is rotatable about an axis line thereof, and which revolves the plurality of component holders around a common axis line and sequentially stops the plurality of components holders at a component receiving position and a component mounting position which are predetermined on a locus of the revolution of the component holders, each of the component receiving position and the component mounting position being common to the plurality of component holders;

a holder rotating device which rotates said each of the component holders about the axis line thereof;

a device moving device which includes a movable support member supporting the holder revolving device and the holder rotating device and which moves the movable support member, thereby moving the holder revolving device and the holder rotating device to a desired position in a reference plane which extends parallel to the circuit substrate supported by the substrate supporting device and faces the component supplying device and the substrate supporting device;

an elevating and lowering device which is supported by the movable support member and which elevates and lowers said each of the plurality of component holders at at least the component receiving position and the component mounting position;

a component-receiving-and-mounting control device which controls said each component holder to receive, at the component receiving position, the circuit component supplied from the component supplying device and mount, at the component mounting position, the circuit component on the circuit substrate supported by the substrate supporting device; and a devices control device which controls the holder revolving device, the holder rotating device, the devices moving device, the elevating and lowering device, and the component-receiving-and-mounting control device, wherein said each component holder is held by the holder revolving device such that said each component holder is movable in an axial direction thereof, wherein the system further comprises a drive gear which is coaxial with the common axis line and which is rotated by a desired angle by a drive source; and a plurality of driven gears which are fixed to the component holders, respectively, such that each of the driven gears is concentric with a corresponding one of the component holders and is meshed with the drive gear, and wherein when the elevating and lowering device moves said each component holder in the axial direction thereof, the meshing of the driven gear fixed to said each component holder with the drive gear is maintained.

17. A system according to claim 1, further comprising a plurality of main conveyors each of which conveys, positions, and supports a circuit substrate, the plurality of main conveyors extending parallel to each other in a plane parallel to the reference plane and in a direction parallel to a circuit-substrate conveying direction in which said each main conveyor conveys the circuit substrate; at least one of (a) a carry-in conveyor which conveys the circuit substrate to said each main conveyor and loads the circuit substrate thereon, and (b) a carry-out conveyor which loads the circuit substrate off said each main conveyor and conveys the circuit substrate away therefrom; and a conveyor shifting device which selectively shifts said at least one of the carry-in conveyor and the carry-out conveyor to one of a plurality of shift positions at each of which said one conveyor is aligned with a corresponding one of the main conveyors.

18. A system according to claim 16, wherein the drive gear has a width greater than respective widths of the driven gears.

19. A system according to claim 17, wherein the component holders, the holder revolving device, the holder rotating device the devices moving device, the elevating and lowering device, and the component-receiving-and-mounting control device cooperate with each other to provide a component mounting unit which mounts circuit components on the circuit substrate positioned and supported by said each main conveyor.

20. A system for mounting circuit components on each of a plurality of circuit substrates, comprising:

two component supplying devices each of which supplies circuit components;

two main conveyors each of which conveys, positions, and supports a circuit substrate, the two main conveyors extending parallel to each other in a plane parallel to a reference plane which extends parallel to the respective circuit substrates supported by the two main conveyors and faces the two component supplying devices and the two main conveyors and in a direction parallel to a circuit-substrate conveying direction in which said each main conveyor conveys the circuit substrate, the two component supplying devices being provided outside the two main conveyors such that the two main conveyors are positioned between the two component supplying devices;

at least one of (a) a carry-in conveyor which conveys the circuit substrate to said each main conveyor and loads the circuit substrate thereon, and (b) a carry-out conveyor which loads the circuit substrate off said each main conveyor and conveys the circuit substrate away therefrom;

a conveyor shifting device which selectively shifts said at least one of the carry-in conveyor and the carry-out conveyor to one of a plurality of shift positions at each of which said one conveyor is aligned with a corresponding one of the two main conveyors; and two component mounting units each of which comprises;

a plurality of component holders each of which holds one of the circuit components, a holder revolving device which holds the plurality of component holders such that each of the component holders is rotatable about an axis line thereof, and which revolves the plurality of component holders around a common axis line and sequentially stops the plurality of component holders at a component receiving position and a component mounting position which are predetermined on a locus of the revolution of the component holders, each of the component receiving position and the component mounting position being common to the plurality of component holders, a holder rotating device which rotates said each of the component holders about the axis line thereof, a devices moving device which includes a movable support member supporting the holder revolving device and the holder rotating device and which moves the movable support member, thereby moving the holder revolving device and the holder rotating device to a desired position in the reference plane, an elevating and lowering device which is supported by the movable support member and which elevates and lowers said each of the plurality of component holders at at least the component receiving position and the component mounting position;

a component-receiving-and-mountings control device which controls the component holders to receive, at the component receiving position, the circuit components supplied from a corresponding one of the two component supplying devices, and mount, at the component mounting position, the circuit components on the circuit substrate supported by each of the two main conveyors; and a devices control device which controls the holder revolving device, the holder rotating device, the holder rotating device, the devices moving device, the elevating and lowering device, and the component-receiving-and-mounting control device, wherein said each component mounting unit receives the circuit components from said corresponding one of the two component supplying devices, conveys the circuit components to above said each of the two main conveyors, and mounts the circuit components on the circuit substrate positioned and supported by said each main conveyor.

21. A system according to claim 17, wherein the system comprises both (a) the carry-in conveyor provided on an upstream side of the main conveyors in the circuit-substrate conveying direction and (b) the carry-out conveyor provided on a downstream side of the main conveyors in the circuit-substrate conveying direction, and wherein the system further comprises an upstream-side device which is provided in alignment with a reference position as one of the plurality of shift positions of the carry-in conveyor and which hands over the circuit substrate to the carry-in conveyor, and a downstream-side device which is provided in alignment with a reference position as one of the plurality of shift positions of the carry-out conveyor and which receives the circuit substrate from the carry-out conveyor.

22. A system according to claim 1, wherein the elevating and lowering device is provided on the movable support member, at the component receiving and mounting position, such that when the component holders are revolved by the holder revolving device supported by the movable support member, the component holders are moved relative to the elevating and lowering device provided at the component receiving and mounting position, and such that when the component holders are sequentially stopped by the holder revolving device at the component receiving and mounting position, the elevating and lowering device elevates and lowers said each of the component holders at the component receiving and mounting position.

\* \* \* \* \*